(12) United States Patent
Feng et al.

(10) Patent No.: US 12,230,188 B2
(45) Date of Patent: Feb. 18, 2025

(54) SHIFT REGISTER, SCAN DRIVING CIRCUIT AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/005,017

(22) PCT Filed: Aug. 20, 2021

(86) PCT No.: PCT/CN2021/113852
§ 371 (c)(1),
(2) Date: Jan. 10, 2023

(87) PCT Pub. No.: WO2023/019574
PCT Pub. Date: Feb. 23, 2023

(65) Prior Publication Data
US 2024/0257712 A1    Aug. 1, 2024

(51) Int. Cl.
*G09G 3/3266* (2016.01)
*G09G 3/32* (2016.01)
*G11C 19/28* (2006.01)

(52) U.S. Cl.
CPC .............. *G09G 3/32* (2013.01); *G11C 19/28* (2013.01); *G09G 2310/0267* (2013.01); *G09G 2310/0286* (2013.01); *G09G 2330/021* (2013.01)

(58) Field of Classification Search
CPC ............ G09G 3/32; G09G 2310/0267; G09G 2310/0286; G09G 2330/021; G11C 19/28
See application file for complete search history.

(56) References Cited

U.S. PATENT DOCUMENTS

| | | | |
|---|---|---|---|
| 2019/0189060 A1 | 6/2019 | Takasugi | |
| 2019/0206294 A1* | 7/2019 | Tian | G11C 19/28 |

(Continued)

FOREIGN PATENT DOCUMENTS

| | | |
|---|---|---|
| CN | 108319049 A | 7/2018 |
| CN | 113241034 A | 8/2021 |
| CN | 113362772 A | 9/2021 |

OTHER PUBLICATIONS

International Search Report (with English translation) and Written Opinion for PCT Application No. PCT/CN2021/113852, dated May 7, 2022, 13 pages.

*Primary Examiner* — Antonio Xavier
(74) *Attorney, Agent, or Firm* — Dority & Manning, P.A.

(57) ABSTRACT

A shift resister includes a first scan unit and a black insertion circuit. The first scan unit includes a first input circuit and a first output circuit. The first input circuit is configured to transmit a display input signal to a first pull-up node. The first output circuit is configured to, in a case where the first input circuit transmits the display input signal to the first pull-up node, transmit a first clock signal to a first scan signal terminal. The black insertion circuit is configured to transmit a black insertion input signal to the first pull-up node. The first output circuit is further configured to, in a case where the black insertion circuit transmits the black insertion input signal to the first pull-up node, transmit the first clock signal to the first scan signal terminal.

20 Claims, 42 Drawing Sheets

(56) References Cited

U.S. PATENT DOCUMENTS

2019/0206503 A1* 7/2019 Zhang .................... G09G 3/20
2020/0168162 A1* 5/2020 Feng .................. G09G 3/3266
2022/0309978 A1  9/2022 Feng et al.

* cited by examiner

SHIFT REGISTER, SCAN DRIVING CIRCUIT AND DISPLAY APPARATUS

CROSS-REFERENCE TO RELATED APPLICATION

The present application is a national phase entry under 35 USC 371 of International Patent Application No. PCT/CN2021/113852, filed on Aug. 20, 2021, which is incorporated herein by reference in its entirety.

TECHNICAL FIELD

The present disclosure relates to the field of display technologies, and in particular, to a shift register, a scan driving circuit and a display apparatus.

BACKGROUND

A scan driving circuit is an important component of a display apparatus. The scan driving circuit may include a plurality of stages of shift registers that are cascaded, and each stage of shift register may be electrically connected to at least one line in the display apparatus. The scan driving circuit may input scan signals to a plurality of lines (e.g., gate lines or enable signal lines) in the display apparatus row by row, so that the display apparatus is able to display images.

The scan driving circuit is provided in the display apparatus, which is able to effectively reduce a cost and improve a yield.

SUMMARY

In an aspect, a shift register is provided. The shift register is configured to be applied to a display apparatus, and the display apparatus includes a plurality of rows of sub-pixels. The shift register is configured to be electrically connected to at least one row of sub-pixels. The shift register includes a first scan unit and a black insertion circuit. The first scan unit includes a first input circuit and a first output circuit. The first input circuit is electrically connected to a display input signal terminal and a first pull-up node; the first input circuit is configured to, in response to a display input signal received at the display input signal terminal, transmit the display input signal to the first pull-up node. The first output circuit is electrically connected to the first pull-up node, a first clock signal terminal and a first scan signal terminal; the first output circuit is configured to, in a case where the first input circuit transmits the display input signal to the first pull-up node, transmit a first clock signal received at the first clock signal terminal to the first scan signal terminal under control of a voltage of the first pull-Lip node, so as to drive the at least one row of sub-pixels to display an image. The black insertion circuit is electrically connected to a first control signal terminal, a black insertion cascade signal terminal, a second control signal terminal, a black insertion input signal terminal, the first pull-up node and a first voltage signal terminal; the black insertion circuit is configured to transmit a black insertion input signal received at the black insertion input signal terminal to the first pull-up node under control of a first control signal transmitted by the first control signal terminal, a black insertion cascade signal transmitted by the black insertion cascade signal terminal and a second control signal transmitted by the second control signal terminal. The first output circuit is further configured to, in a case where the black insertion circuit transmits the black insertion input signal to the first pull-up node, transmit the first clock signal to the first scan signal terminal under control of another voltage of the first pull-up node, so as to drive the at least one row of sub-pixels to display a black image.

In some embodiments, the shift register further includes a second scan unit. The shift register is configured to be electrically connected to at least two rows of sub-pixels. The second scan unit includes a second input circuit and a second output circuit. The second input circuit is electrically connected to the display input signal terminal and a second pull-up node; the second input circuit is configured to, in response to the display input signal, transmit the display input signal to the second pull-up node. The second output circuit is electrically connected to the second pull-up node, a second clock signal terminal and a second scan signal terminal; the second output circuit is configured to, in a case where the second input circuit transmits the display input signal to the second pull-up node, transmit a second clock signal received at the second clock signal terminal to the second scan signal terminal under control of a voltage of the second pull-up node, so as to drive another at least one row of sub-pixels to display an images. The black insertion circuit is further electrically connected to the second pull-up node; the black insertion circuit is further configured to transmit the black insertion input signal to the second pull-up node while the black insertion input signal is transmitted to the first pull-up node. The second output circuit is further configured to, in a case where the black insertion circuit transmits the black insertion input signal to the second pull-up node, transmit the second clock signal to the second scan signal terminal under control of another voltage of the second pull-up node, so as to drive the another at least one row of sub-pixels to display a black image.

In some embodiments, the black insertion circuit includes a black insertion control sub-circuit, a black insertion input sub-circuit and a first black insertion transmission sub-circuit. The black insertion control sub-circuit is electrically connected to the first control signal terminal, the black insertion cascade signal terminal, the first voltage signal terminal and a first black insertion node; the black insertion control sub-circuit is configured to transmit the black insertion cascade signal to the first black insertion node under the control of the first control signal. The black insertion input sub-circuit is electrically connected to the first black insertion node, the black insertion input signal terminal and a second black insertion node; the black insertion input sub-circuit is configured to transmit the black insertion input signal to the second black insertion node under control of a voltage of the first black insertion node. The first black insertion transmission sub-circuit is electrically connected to the second control signal terminal, the second black insertion node and the first pull-up node; the first black insertion transmission sub-circuit is configured to transmit the black insertion input signal from the second black insertion node to the first pull-up node under the control of the second control signal. Alternatively, the shift register further includes a second scan unit, the second scan unit includes a second input circuit and a second output circuit, the second input circuit is electrically connected to the display input signal terminal and a second pull-up node, and the second output circuit is electrically connected to the second pull-up node, a second clock signal terminal and a second scan signal terminal; the black insertion circuit includes a black insertion control sub-circuit, a black insertion input sub-circuit and a first black insertion transmission sub-circuit, and a second black insertion transmission sub-circuit. The black insertion control sub-circuit is electrically connected to the first control signal terminal, the black insertion cascade signal terminal, the first voltage signal terminal and a first black insertion node; the black insertion control sub-circuit is configured to transmit the black insertion cascade signal to the first black insertion node under the control of the first control signal. The black insertion input sub-circuit is electrically connected to the first black insertion node, the black insertion input signal terminal and a second black insertion node; the black insertion input sub-circuit is configured to transmit the black insertion input signal to the second black insertion node under control of a voltage of the first black insertion node. The first black insertion transmission sub-circuit is electrically connected to the second control signal terminal, the second black insertion node and the first pull-up node; the first black insertion transmission sub-circuit is configured to transmit the black insertion input signal from the second black insertion node to the first pull-up node under the control of the second control signal. The second black insertion transmission sub-circuit is electrically connected to the second control signal terminal, the second black insertion node and the second pull-up node; the second black insertion transmission sub-circuit is configured to transmit the black insertion input signal coming from the second black insertion node to the second pull-up node under the control of the second control signal.

In some embodiments, the first output circuit is further electrically connected to a third clock signal terminal and a first sensing signal terminal. The first output circuit is further configured to: in the case where the first input circuit transmits the display input signal to the first pull-up node, transmit a third clock signal received at the third clock signal terminal to the first sensing signal terminal under the control of the voltage of the first pull-up node, so as to drive the at least one row of sub-pixels to be reset; or in the case where the black insertion circuit transmits the black insertion input signal to the first pull-up node, transmit the third clock signal to the first sensing signal terminal under the control of the another voltage of the first pull-up node, so as to drive the at least one row of sub-pixels to display a black image. Alternatively, the shift register further includes a second scan unit, the shift register configured to be electrically connected to at least two rows of sub-pixels; the second scan unit includes a second input circuit and a second output circuit. The second input circuit is electrically connected to the display input signal terminal and a second pull-up node, and the second output circuit is electrically connected to the second pull-up node, a second clock signal terminal and a second scan signal terminal; the first output circuit is further electrically connected to a third clock signal terminal and a first sensing signal terminal; the first output circuit is further configured to: in the case where the first input circuit transmits the display input signal to the first pull-up node, transmit a third clock signal received at the third clock signal terminal to the first sensing signal terminal under the control of the voltage of the first pull-up node, so as to drive the at least one row of sub-pixels to be reset; or in the case where the black insertion circuit transmits the black insertion input signal to the first pull-up node, transmit the third clock signal to the first sensing signal terminal under the control of the another voltage of the first pull-up node, so as to drive the at least one row of sub-pixels to display a black image. The second output circuit is further electrically connected to a fourth clock signal terminal and a second sensing signal terminal. The second output circuit is configured to: in a case where the second input circuit transmits the display input signal to the second pull-up node, transmit a fourth clock signal received at the fourth clock signal terminal to the second sensing signal terminal under the control of the voltage of the second pull-up node, so as to drive another at least one row of sub-pixels to be reset; or in a case where the black insertion circuit transmits the black insertion input signal to the second pull-up node, transmit the fourth clock signal to the second sensing signal terminal under the control of the voltage of the second pull-up node, so as to drive the another at least one row of sub-pixels to display black images.

In some embodiments, the first output circuit is further electrically connected to a fifth clock signal terminal and a first shift signal terminal. The first output circuit is further configured to transmit a fifth clock signal received at the fifth clock signal terminal to the first shift signal terminal under the control of the voltage of the first pull-up node.

In some embodiments, the shift register further includes a second scan unit, the second scan unit includes a second input circuit and a second output circuit; the second input circuit is electrically connected to the display input signal terminal and a second pull-up node, the second output circuit is electrically connected to the second pull-up node, a second clock signal terminal and a second scan signal terminal; the second output circuit is further electrically connected to a sixth clock signal terminal and a second shift signal terminal. The second output circuit is further configured to transmit a sixth clock signal received at the sixth clock signal terminal to the second shift signal terminal under control of a voltage of a second pull-up node.

In some embodiments, the first scan unit further includes a first reset circuit and a second reset circuit. The first reset circuit is electrically connected to a first reset signal terminal, the first pull-up node and the first voltage signal terminal; the first reset circuit is configured to transmit a first voltage signal received at the first voltage signal terminal to the first pull-up node under control of a first reset signal transmitted by the first reset signal terminal. The black insertion circuit includes a black insertion control sub-circuit, and the black insertion control sub-circuit is electrically connected to the first control signal terminal, the black insertion cascade signal terminal, the first voltage signal terminal and a first black insertion node; the second reset circuit is electrically connected to a second reset signal terminal, the first black insertion node, the first pull-up node and the first voltage signal terminal; the second reset circuit is configured to transmit the first voltage signal to the first pull-up node under control of a voltage of the first black insertion node and a second reset signal transmitted by the second reset signal terminal. Alternatively, the shift register further includes a second scan unit, the second scan unit includes a second input circuit and a second output circuit; the second input circuit is electrically connected to the display input signal terminal and a second pull-up node, and the second output circuit is electrically connected to the second pull-up node, a second clock signal terminal and a second scan signal terminal. The first scan unit further includes a first reset circuit and a second reset circuit; the first reset circuit is electrically connected to a first reset signal terminal, the first pull-up node and the first voltage signal terminal; the first reset circuit is configured to transmit a first voltage signal received at the first voltage signal terminal to the first pull-up node under control of a first reset signal transmitted by the first reset signal terminal. The black insertion circuit includes a black insertion control sub-circuit, and the black insertion control sub-circuit is electrically connected to the first control signal terminal, the black insertion cascade signal terminal, the first voltage signal terminal and a first black insertion node. The second reset circuit is electrically connected to a second reset signal terminal, the first black insertion node, the first pull-up node and the first voltage signal terminal; the second reset circuit is configured to transmit the first voltage signal to the first pull-up node under control of a voltage of the first black insertion node and a second reset signal transmitted by the second reset signal terminal. The second scan unit further includes a third reset circuit and a fourth reset circuit. The third reset circuit is electrically connected to the first reset signal terminal, the second pull-up node and the first voltage signal terminal; the third reset circuit is configured to transmit the first voltage signal to the second pull-up node under the control of the first reset signal. The fourth reset circuit is electrically connected to the second reset signal terminal, the first black insertion node, the second pull-up node and the first voltage signal terminal; the fourth reset circuit is configured to transmit the first voltage signal to the second pull-up node under control of the voltage of the first black insertion node and the second reset signal.

In some embodiments, the first scan unit further includes a first control circuit electrically connected to the first pull-up node, a first pull-down node, the first voltage signal terminal and a second voltage signal terminal. The first control circuit is configured to: transmit the second voltage signal to the first pull-down node in response to a second voltage signal received at the second voltage signal terminal; and transmit a first voltage signal received at the first voltage signal terminal to the first pull-down node under the control of the voltage of the first pull-up node. Alternatively, the shift register further includes a second scan unit, the second scan unit includes a second input circuit and a second output circuit, the second input circuit is electrically connected to the display input signal terminal and a second pull-up node, and the second output circuit is electrically connected to the second pull-up node, a second clock signal terminal and a second scan signal terminal. The first scan unit further includes: a first control circuit electrically connected to the first pull-up node, a first pull-down node, the first voltage signal terminal and a second voltage signal terminal; the first control circuit is configured to: transmit the second voltage signal to the first pull-down node in response to a second voltage signal received at the second voltage signal terminal; and transmit a first voltage signal received at the first voltage signal terminal to the first pull-down node under the control of the voltage of the first pull-up node. The second scan unit further includes a second control circuit electrically connected to the second pull-up node, a second pull-down node, the first voltage signal terminal and a third voltage signal terminal. The second control circuit is configured to: transmit the third voltage signal to the second pull-down node in response to a third voltage signal received at the third voltage signal terminal; and transmit the first voltage signal to the second pull-down node under the control of the voltage of the second pull-up node.

In some embodiments, the first scan unit further includes a fifth reset circuit, a sixth reset circuit and a seventh reset circuit. The fifth reset circuit is electrically connected to the first pull-down node, the first pull-up node and the first voltage signal terminal; the fifth reset circuit is configured to transmit the first voltage signal to the first pull-up node under control of a voltage of the first pull-down node. The sixth reset circuit is electrically connected to the first pull-down node, the first scan signal terminal and a fourth voltage signal terminal; the sixth reset circuit is configured to transmit a fourth voltage signal received at the fourth voltage signal terminal to the first scan signal terminal under the control of the voltage of the first pull-down node. The first output circuit is further electrically connected to a third clock signal terminal and a first sensing signal terminal, the sixth reset circuit is further electrically connected to the first sensing signal terminal; the sixth reset circuit is further configured to transmit the fourth voltage signal to the first sensing signal terminal under the control of the voltage of the first pull-down node. The first output circuit is further electrically connected to a fifth clock signal terminal and a first shift signal terminal, the sixth reset circuit is further electrically connected to the first shift signal terminal and the first voltage signal terminal; the sixth reset circuit is further configured to transmit the first voltage signal to the first shift signal terminal under the control of the voltage of the first pull-down node. The black insertion circuit includes a black insertion control sub-circuit, the seventh reset circuit is electrically connected to a first black insertion node, the second control signal terminal, the first pull-down node and the first voltage signal terminal; the seventh reset circuit is configured to transmit the first voltage signal to the first pull-down node under control of a voltage of the first black insertion node and the second control signal. In a case where the shift register further comprises a second scan unit, the second scan unit further includes an eighth reset circuit, a ninth reset circuit and a tenth reset circuit. The eighth reset circuit is electrically connected to the second pull-down node, the second pull-up node and the first voltage signal terminal; the eighth reset circuit is configured to transmit the first voltage signal to the second pull-up node under control of a voltage of the second pull-down node. The ninth reset circuit is electrically connected to the second pull-down node, the second scan signal terminal and the fourth voltage signal terminal; the ninth reset circuit is configured to transmit the fourth voltage signal to the second scan signal terminal under the control of the voltage of the second pull-down node. The second output circuit is further electrically connected to a fourth clock signal terminal and a second sensing signal terminal, the ninth reset circuit is further electrically connected to the second sensing signal terminal; the ninth reset circuit is further configured to transmit the fourth voltage signal to the second sensing signal terminal under the control of the voltage of the second pull-down node. The second output circuit is further electrically connected to a sixth clock signal terminal and a second shift signal terminal, the ninth reset circuit is further electrically connected to the second shift signal terminal and the first voltage signal terminal; the ninth reset circuit is further configured to transmit the first voltage signal to the second shift signal terminal under the control of the voltage of the second pull-down node. The tenth reset circuit is electrically connected to the first black insertion node, the second control signal terminal, the second pull-down node and the first voltage signal terminal; the tenth reset circuit is configured to transmit the first voltage signal to the second pull-down node under the control of the voltage of the first black insertion node and the second control signal.

In some embodiments, the fifth reset circuit is further electrically connected to the second pull-down node; the fifth reset circuit is further configured to transmit the first voltage signal to the first pull-up node under the control of the voltage of the second pull-down node. The sixth reset circuit is further electrically connected to the second pull-down node; the sixth reset circuit is further configured to, under the control of the voltage of the second pull-down node, transmit the fourth voltage signal to the first scan signal terminal, transmit the fourth voltage signal to the first sensing signal terminal, and transmit the first voltage signal to the first shift signal terminal. The eighth reset circuit is further electrically connected to the first pull-down node; the eighth reset circuit is further configured to transmit the first voltage signal to the second pull-up node under the control of the voltage of the first pull-down node. The ninth reset circuit is further electrically connected to the first pull-down node; the ninth reset circuit is further configured to, under the control of the voltage of the first pull-down node, transmit the fourth voltage signal to the second scan signal terminal, transmit the fourth voltage signal to the second sensing signal terminal, and transmit the first voltage signal to the second shift signal terminal.

In some embodiments, the shift register further includes a blanking circuit. The blanking circuit is electrically connected to a third control signal terminal, the display input signal terminal, a seventh clock signal terminal, the first pull-up node and the first voltage signal terminal. The blanking circuit is configured to transmit the seventh clock signal to the first pull-up node under control of a third control signal transmitted by the third control signal terminal, the display input signal and a seventh clock signal transmitted by the seventh clock signal terminal. Alternatively, the shift register further includes the second scan unit, the shift register further includes a blanking circuit, the blanking circuit is electrically connected to a third control signal terminal, the display input signal terminal, a seventh clock signal terminal, the first pull-up node and the first voltage signal terminal; the blanking circuit is configured to transmit the seventh clock signal to the first pull-up node under control of a third control signal transmitted by the third control signal terminal, the display input signal and a seventh clock signal transmitted by the seventh clock signal terminal; the blanking circuit is further electrically connected to the second pull-up node; the blanking circuit is further configured to transmit the seventh clock signal to the second pull-up node.

In some embodiments, the blanking circuit includes a selection control sub-circuit a blanking input sub-circuit, a first blanking transmission sub-circuit and a second blanking transmission sub-circuit. The selection control sub-circuit is electrically connected to the third control signal terminal, the display input signal terminal, a first blanking node and the first voltage signal terminal; the selection control sub-circuit is configured to transmit the display input signal to the first blanking node under the control of the third control signal. The blanking input sub-circuit is electrically connected to the first blanking node, the seventh clock signal terminal and a second blanking node; the blanking input sub-circuit is configured to transmit the seventh clock signal to the second blanking node under control of a voltage of the first blanking node. The first blanking transmission sub-circuit is electrically connected to the seventh clock signal terminal, the second blanking node and the first pull-up node; the first blanking transmission sub-circuit is configured to transmit the seventh clock signal from the second blanking node to the first pull-up node under the control of the seventh clock signal. The second blanking transmission sub-circuit is electrically connected to the seventh clock signal terminal, the second blanking node and the second pull-up node; the second blanking transmission sub-circuit is configured to transmit the seventh clock signal coming from the second blanking node to the second pull-up node under the control of the seventh clock signal.

In some embodiments, the first scan unit further includes an eleventh reset circuit, a twelfth reset circuit and a thirteenth reset circuit. The eleventh reset circuit is electrically connected to a global reset signal terminal, the first pull-up node and the first voltage signal terminal; the eleventh reset circuit is configured to transmit the first voltage signal to the first pull-up node under control of a global reset signal transmitted by the global reset signal terminal. The twelfth reset circuit is electrically connected to the display input signal terminal, the first pull-down node and the first voltage signal terminal; the twelfth reset circuit is configured to transmit the first voltage signal to the first pull-down node under the control of the display input signal. The blanking circuit includes a selection control sub-circuit, the selection control sub-circuit is electrically connected to the third control signal terminal, the display input signal terminal, a first blanking node and the first voltage signal terminal; the thirteenth reset circuit is electrically connected to the first blanking node, the seventh clock signal terminal, the first pull-down node and the first voltage signal terminal; the thirteenth reset circuit is configured to transmit the first voltage signal to the first pull-down node under control of a voltage of the first blanking node and the seventh clock signal. The second scan unit further includes a fourteenth reset circuit, a fifteenth reset circuit and a sixteenth reset circuit. The fourteenth reset circuit is electrically connected to the global reset signal terminal, the second pull-up node and the first voltage signal terminal; the fourteenth reset circuit is configured to transmit the first voltage signal to the second pull-up node under the control of the global reset signal. The fifteenth reset circuit is electrically connected to the display input signal terminal, the second pull-down node and the first voltage signal terminal; the fifteenth reset circuit is configured to transmit the first voltage signal to the second pull-down node under the control of the display input signal. The sixteenth reset circuit is electrically connected to the first blanking node, the seventh clock signal terminal, the second pull-down node and the first voltage signal terminal; the sixteenth reset circuit is configured to transmit the first voltage signal to the second pull-down node under the control of the voltage of the first blanking node and the seventh clock signal.

In some embodiments, the shift register further includes a first anti-leakage circuit. The first anti-leakage circuit is electrically connected to the first blanking node, a fifth voltage signal terminal and a first anti-leakage node; the first anti-leakage circuit is configured to transmit a fifth voltage signal received at the fifth voltage signal terminal to the first anti-leakage node under the control of the voltage of the first blanking node. The selection control sub-circuit is further electrically connected to the first anti-leakage node.

In some embodiments, the shift register further includes a second anti-leakage circuit. The second anti-leakage circuit is electrically connected to the first pull-up node, a fifth voltage signal terminal and a second anti-leakage node; the second anti-leakage circuit is configured to transmit a fifth voltage signal received at the fifth voltage signal terminal to the second anti-leakage node under the control of the voltage of the first pull-up node. The first input circuit is further electrically connected to the second anti-leakage node.

In some embodiments, the shift register further includes a third anti-leakage circuit. The third anti-leakage circuit is electrically connected to the first black insertion node, a fifth voltage signal terminal and a third anti-leakage node; the third anti-leakage circuit is configured to transmit a fifth voltage signal received at the fifth voltage signal terminal to the third anti-leakage node under the control of the voltage of the first black insertion node. The black insertion control sub-circuit is further electrically connected to the third anti-leakage node.

In another aspect, a scan driving circuit is provided. The scan driving circuit includes a plurality stages of shift registers each as described in any one of the above embodiments that are cascaded.

In some embodiments, the plurality stages of shift registers include a plurality of first shift register groups and a plurality of second shift register groups, and the first shift register groups and the second shift register groups are alternately arranged. In a case where the shift register includes the first scan unit and a second scan unit, the first shift register group includes 2N stages of shift registers, and the second shift register group includes 2N stages of shift registers; where N is a positive integer. The scan driving circuit further includes: a first control signal line group including a first control signal sub-line and a second control signal sub-line, the first control signal sub-line being electrically connected to first control signal terminals of all the shift registers in the first shift register group, and the second control signal sub-line being electrically connected to first control signal terminals of all the shift registers in the second shift register group; and a first clock signal line group including 8N first clock signal sub-lines, and the 8N first clock signal sub-lines being electrically connected to first clock signal terminals and second clock signal terminals of all the shift registers in the first shift register group and first clock signal terminals and second clock signal terminals of all the shift registers in the second shift register group, respectively. Alternatively, the plurality of shift registers include a plurality of first shift register groups and a plurality of second shift register groups, and the first shift register groups and the second shift register groups are alternately arranged; the shift register includes the first scan unit and a second scan unit, a first shift register group includes 2N stages of shift registers, and a second shift register group includes 2N stages of shift registers; N is a positive integer. The scan driving circuit further includes: a first control signal line group including a first control signal sub-line and a second control signal sub-line; the first control signal sub-line being electrically connected to first control signal terminals of all the shift registers in the first shift register group, and the second control signal sub-line is electrically connected to first control signal terminals of all the shift registers in the second shift register group; and a first clock signal line group including 8N first clock signal sub-lines; the 8N first sub-clock signal lines being electrically connected to first clock signal terminals and second clock signal terminals of all the shift registers in the first shift register group and first clock signal terminals and second clock signal terminals of all the shift registers in the second shift register group, respectively. The second scan unit includes a second output circuit, the second output circuit is electrically connected to the second pull-up node, a second clock signal terminal and a second scan signal terminal; the first output circuit of the shift register is further electrically connected to a third clock signal terminal and a first sensing signal terminal, and the second output circuit is further electrically connected to a fourth clock signal terminal and a second sensing signal terminal, the scan driving circuit further includes a second clock signal line group. The second clock signal line group includes 4N second clock signal sub-lines; the 4N second clock signal sub-lines are electrically connected to third clock signal terminals and fourth clock signal terminals of all the shift registers in the first shift register group, respectively, and are electrically connected to third clock signal terminals and fourth clock signal terminals of all the shift registers in the second shift register group, respectively; or the second clock signal line group includes 8N second clock signal sub-lines; the 8N second clock signal sub-lines are electrically connected to the third clock signal terminals and the fourth clock signal terminals of all the shift registers in the first shift register group and the third clock signal terminals and the fourth clock signal terminals of all the shift registers in the second shift register group, respectively. Alternatively, the plurality of stages of shift registers include a plurality of first shift register groups and a plurality of second shift register groups, and the first shift register groups and the second shift register groups are alternately arranged; the shift register includes the first scan unit and a second scan unit, a first shift register group includes 2N stages of shift registers, and a second shift register group includes 2N stages of shift registers; N is a positive integer. The scan driving circuit further includes: a first control signal line group including a first control signal sub-line and a second control signal sub-line; the first control signal sub-line being electrically connected to first control signal terminals of all the shift registers in the first shift register group, and the second control signal sub-line is electrically connected to first control signal terminals of all the shift registers in the second shift register group; and a first clock signal line group including 8N first clock signal sub-lines; the 8N first sub-clock signal lines being electrically connected to first clock signal terminals and second clock signal terminals of all the shift registers in the first shift register group and first clock signal terminals and second clock signal terminals of all the shift registers in the second shift register group, respectively. The second scan unit includes a second output circuit, the second output circuit is electrically connected to the second pull-up node, a second clock signal terminal and a second scan signal terminal; the first output circuit of the shift register is further electrically connected to a fifth clock signal terminal and a first shift signal terminal, and the second output circuit is further electrically connected to a sixth clock signal terminal and a second shift signal terminal, the scan driving circuit further includes a third clock signal line group. The third clock signal line group includes 4N third clock signal sub-lines; the 4N third clock signal sub-lines are electrically connected to fifth clock signal terminals and sixth clock signal terminals of all the shift registers in the first shift register group, respectively, and are electrically connected to fifth clock signal terminals and sixth clock signal terminals of all the shift registers in the second shift register group, respectively; or 2N third clock sub-lines of the 4N third clock signal sub-lines are electrically connected to the fifth clock signal terminals of all shift registers in the first shift register group, respectively, and another 2N third clock signal sub-lines of the 4N third clock signal sub-lines are electrically connected to the fifth clock signal terminals of all shift registers in the second shift register group, respectively, and another 2N third clock signal sub-lines of the 4N third clock signal sub-lines are electrically connected to the fifth clock signal terminals of all shift registers in the second shift register group, respectively; or the third clock signal line group includes 8N third clock signal sub-lines; the 8N third clock signal sub-lines are electrically connected to the fifth clock signal terminals and the sixth clock signal terminals of all shift registers in the first shift register group and the fifth clock signal terminals and the sixth clock signal terminals of all shift registers in the second shift register group, respectively.

In some embodiments, the scan driving circuit further includes a second control signal line group. The second control signal line group includes a third control signal sub-line and a fourth control signal sub-line. The third sub-control signal line is electrically connected to second control signal terminals of all shift registers in the first shift register group, and the fourth sub-control signal line is electrically connected to second control signal terminals of all shift registers in the second shift register group.

In some embodiments, the third control signal sub-line is further electrically connected to black insertion input signal terminals of all the shift registers in the first shift register group, and the fourth control signal sub-line is further electrically connected to black insertion input signal terminals of all the shift registers in the second shift register group.

In some embodiments, in the plurality stages of shift registers, except for first at least one stage of shift register, a display input signal terminal of each of remaining shift registers is electrically connected to a first shift signal terminal of a certain stage, before a current stage, of shift register; and except for first at least two stages of shift registers, a black insertion cascade signal terminal of each of remaining shift registers is electrically connected to a second shift signal terminal of a certain stage, before the current stage, of shift register, or the shift register further includes a second anti-leakage circuit, except for the first at least two stages of shift registers, a black insertion cascade signal terminal of each of the remaining shift registers is electrically connected to a second anti-leakage node of a certain stage, before the current stage, of shift register.

In some embodiments, in the plurality stages of shift registers, except for first at least one stage of shift register, a display input signal terminal of each of remaining shift registers is electrically connected to a second shift signal terminal of a certain stage, before a current stage, of shift register; and except for first at least two stages of shift registers, a black insertion cascade signal terminal of each of remaining shift registers is electrically connected to a first shift signal terminal of a certain stage, before a current stage, of shift register.

In some embodiments, in the first shift register group, at least two stages of shift registers share a single black insertion circuit. In the second shift register group, at least two stages of shift registers share a single black insertion circuit.

In yet another aspect, a display apparatus is provided. The display apparatus includes a plurality of rows of sub-pixels; and the scan driving circuit as described in any one of the above embodiments. A stage of shift register in the scan driving circuit is electrically connected to at least one row of sub-pixels.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
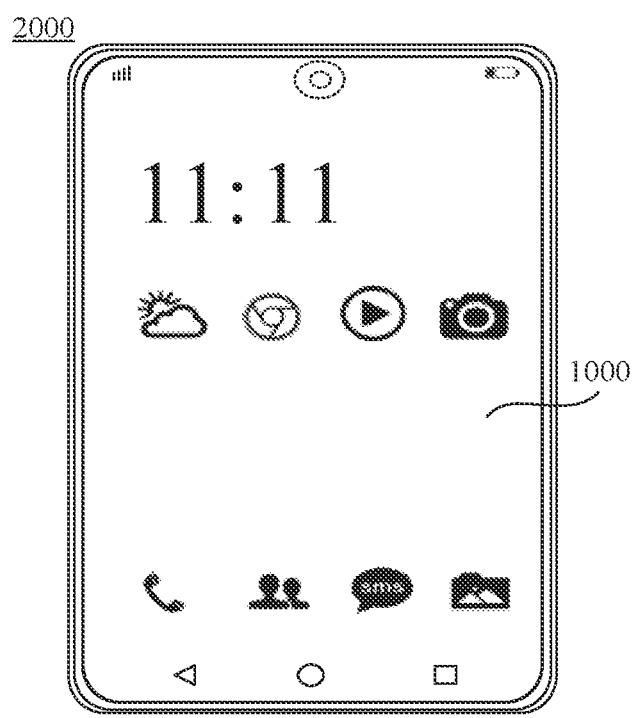
FIG. 1 is a structural diagram of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and derivatives thereof may be used. For example, the term "connected" may be used in the description of some embodiments to indicate that two or more components are in physical or electrical contact with each other. The embodiments disclosed here are not necessarily limited to the contents herein.

In addition, in some embodiments, the term "electrically connected" may indicate a direct electrical connection or an indirect electrical connection.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

Additionally, the phase "based on" as used herein is meant to be open and inclusive, since a process, a step, a calculation or other action that is "based on" one or more of the stated conditions or values may, in practice, be based on additional conditions or values beyond those stated.

As used herein, terms such as "about" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Transistors used in circuits provided in the embodiments of the present disclosure may be thin film transistors, field effect transistors (e.g., oxide thin film transistors) or other switching devices with the same characteristics, and the embodiments of the present disclosure are described by taking the thin film transistors as an example.

In some embodiments, a control electrode of each transistor used in a shift register is a gate of the transistor, a first electrode of the transistor is one of a source and a drain of the transistor, and a second electrode of the transistor is the other of the source and the drain of the transistor. Since a source and a drain of a transistor may be symmetrical in structure, the source and the drain thereof may be indistinguishable in structure. That is, the first electrode and the second electrode of the transistor in the embodiments of the present disclosure may be indistinguishable in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits provided in the embodiments of the present disclosure, nodes such as a pull-up node and a pull-down node do not represent actual existing components, but represents junction points of relevant electrical connections in circuit diagrams.

In the embodiments of the present disclosure, the term "pull up" refers to charging a node or an electrode of a transistor to increase an absolute value of a voltage of the node or the electrode, thereby achieving an operation (e.g., turning on) of corresponding transistor(s). The term "pull down" refers to discharging a node or an electrode of a transistor to decrease an absolute value of a voltage of the node or the electrode, thereby achieving an operation (e.g., turning off) of corresponding transistor(s).

Hereinafter, the circuits provided in the embodiments of the present disclosure will be described by taking an example where the transistors are all the N-type transistors.

Some embodiments of the present disclosure provide a shift register, a scan driving circuit and a display apparatus. The shift register, the scan driving circuit and the display apparatus are respectively introduced below.

Some embodiments of the present disclosure provide the display apparatus 2000 as shown in FIG. 1. The display apparatus 2000 may be any apparatus that displays text or images whether in motion (e.g., a video) or stationary (e.g., a still image). More specifically, it is anticipated that the embodiments may be implemented in a variety of electronic apparatuses or associated with a variety of electronic apparatuses. The variety of electronic apparatuses include (but are not limited to): mobile phones, wireless apparatuses, personal digital assistants (PDAs), hand-held or portable computers, global positioning system (GPS) receivers or navigators, cameras, moving picture experts group 4 (MP4) video players, video cameras, game consoles, watches, clocks, calculators, television monitors, flat panel displays, computer monitors, automobile displays (e.g., odometer displays), navigators, cockpit controllers and/or displays, camera view displays (e.g., displays of rear-view cameras in vehicles), electronic photos, electronic billboards or signs, projectors, building structures, packaging and aesthetic structures (e.g., displays for displaying an image of a piece of jewelry).

In some examples, the display apparatus 2000 may include a frame, and a display panel, a circuit board, a display driver integrated circuit (IC) and other electronic accessories that are provided in the frame.

The type of the display panel varies, which may be set according to actual needs.

For example, the display panel may be an organic light emitting diode (OLED) display panel, a quantum dot light emitting diodes (QLED) display panel or a micro light emitting diodes (Micro LED) display panel, which is not limited in the present disclosure.

Hereinafter, some embodiments of the present disclosure are schematically described below by taking an example where the display panel is the OLED display panel (that is, the display apparatus 2000 is an OLED display apparatus).

Figure 2:
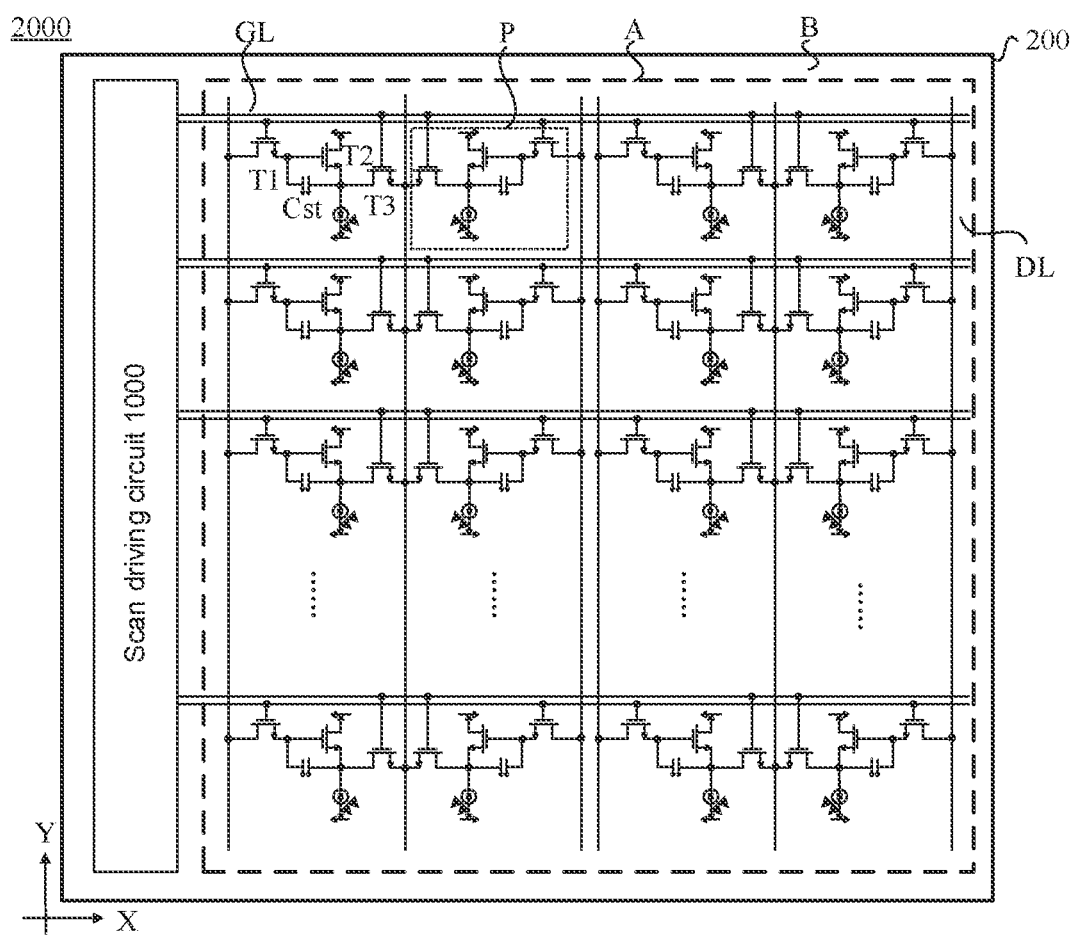
FIG. 2 is a structural diagram of another display apparatus, in accordance with some embodiments of the present disclosure.
Figure 3:
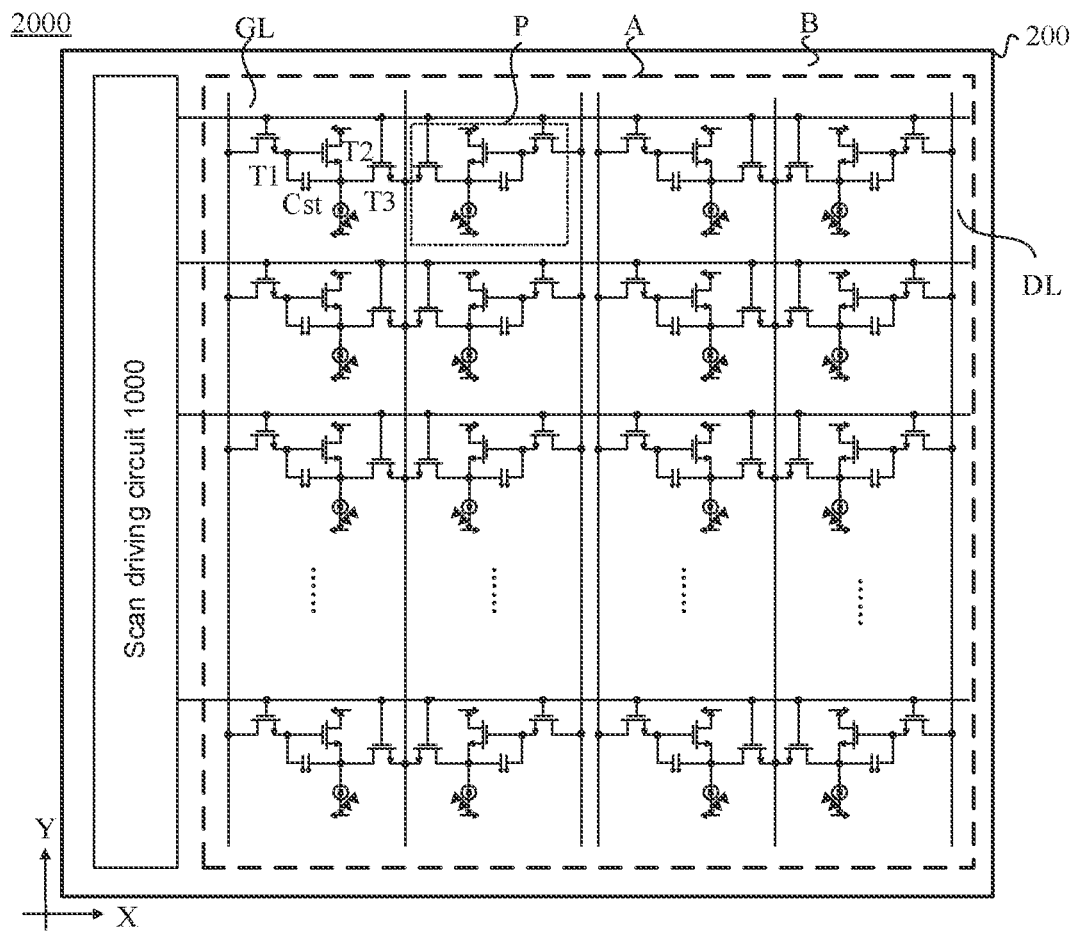
FIG. 3 is a structural diagram of yet another display apparatus, in accordance with some embodiments of the present disclosure.

In some embodiments, as shown in FIGS. 2 and 3, the display apparatus 2000 has a display area A and a bezel area B disposed on side(s) of the display area A. The "side(s)" refers to a side, two sides, three sides or a peripheral side of the display area A. That is, the bezel area B may be located on a side, two sides or three sides of the display area A. Alternatively, the bezel area B may be located on the peripheral side of the display area A.

In some embodiments, as shown in FIGS. 2 and 3, the display apparatus 2000 may include a substrate 200, a plurality of sub-pixels P and a scan driving circuit 1000. The substrate 200 is used to carry the plurality of sub-pixels and the scan driving circuit 1000.

For example, as shown in FIGS. 2 and 3, the scan driving circuit 1000 may be located in the bezel area B. Of course, the scan driving circuit 1000 may also be disposed in another position, which is not limited in the present disclosure.

Here, the scan driving circuit 1000 may be, for example, a light-emitting control circuit or a gate driving circuit. The embodiments of the present disclosure are schematically described by taking an example where the scan driving circuit 1000 is the gate driving circuit.

The type of the substrate 200 varies, which may be determined according to actual needs.

For example, the substrate 200 may be a rigid substrate. The rigid substrate may be, for example, a glass substrate or a polymethyl methacrylate (PMMA) substrate.

For example, the substrate 200 may be a flexible substrate. The flexible substrate may be, for example, a polyethylene terephthalate (PET) substrate, a polyethylene naphthalate two formic acid glycol ester (PEN) substrate or a polyimide (PI) substrate. In this case, the display apparatus 2000 may be a flexible display apparatus.

For example, as shown in FIGS. 2 and 3, the plurality of sub-pixels P may be located in the display area A. For example, the plurality of sub-pixels P may be arranged in a plurality of rows in a second direction Y, and may be arranged in a plurality of columns in a first direction X. Each row of sub-pixels P may include multiple sub-pixels P, and each column of sub-pixels P may include multiple sub-pixels P.

The first direction X and the second direction Y intersect each other. An angle between the first direction X and the second direction Y may be set according to actual needs. For example, the angle between the first direction X and the second direction Y may be 85°, 89° or 90°.

In some examples, as shown in FIGS. 2 and 3, the display apparatus 2000 may further include a plurality of gate lines GL and a plurality of data lines DL that are disposed on a side of the substrate 200. The plurality of gate lines GL each extend in the first direction X, and the plurality of data lines DL each extend in the second direction Y.

For example, sub-pixels P arranged in a row in the first direction X may be referred to as a same row of sub-pixels P, and sub-pixels P arranged in a column in the second direction Y may be referred to as a same column of sub-pixels P. The same row of sub-pixels P may be electrically connected to at least one gate line GL, and the same column of sub-pixels P may be electrically connected to a single data line DL.

Figure 4:
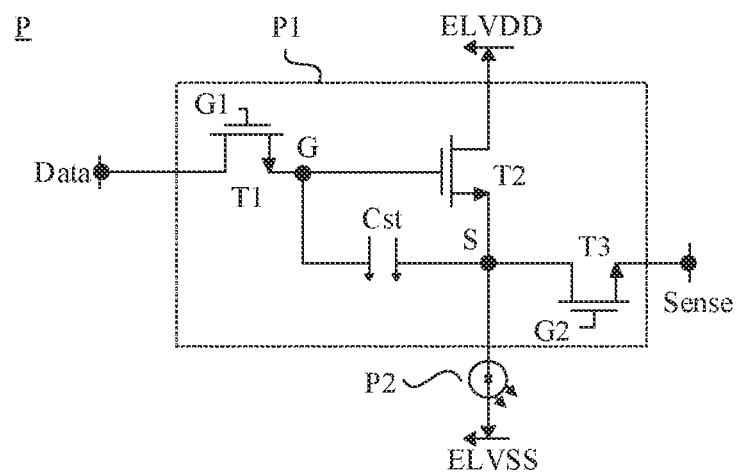
FIG. 4 is a circuit diagram of a sub-pixel, in accordance with some embodiments of the present disclosure.

In some examples, as shown in FIG. 4, in the plurality of sub-pixels P, each sub-pixel P may include a pixel driving circuit P1 and a light-emitting device P2 electrically connected to the pixel driving circuit P1. The light-emitting device may be an OLED.

For example, a gate line GL may be electrically connected to pixel driving circuits P1 in the same row of sub-pixels P, and a data line DL may be electrically connected to pixel driving circuits P2 in the same column of sub-pixels P.

The structure of the pixel driving circuit P1 varies, which may be set according to actual needs. For example, the pixel driving circuit P1 may have a structure of "3T1C", "6T1C", "7T1C", "6T2C", or "7T2". "T" represents a transistor, the number preceding "T" represents the number of transistors, "C" represents a storage capacitor, and the number preceding "C" represents the number of storage capacitors.

Here, in a process of using the display apparatus 2000, a stability of the transistors in the pixel driving circuit P1 and the light-emitting device P2 may decrease (for example, a threshold voltage of a driving transistor drifts), which affects a display effect of the display apparatus 2000. As a result, the sub-pixel P needs to be compensated.

The method in which the sub-pixel P is compensated may vary, which may be set according to actual needs. For example, the sub-pixel P may be provided therein with a pixel compensation circuit, so as to apply an internal compensation to the sub-pixel P by the pixel compensation circuit. For another example, a transistor in the sub-pixel P may be used to sense the driving transistor or the light-emitting device, and the sensed data may be transmitted to an external sensing circuit, so as to determine a driving voltage value to be compensated and send it back by the external sensing circuit, thereby achieving an external compensation of the sub-pixel P.

In the embodiments of the present disclosure, the structure and a working process of the sub-pixel P will be schematically described by taking an example where the method of the external compensation (i.e., sensing the driving transistor) is adopted, and the pixel driving circuit has a structure of "3T1C".

For example, as shown in FIG. 4, the pixel driving circuit P1 may include a switching transistor T1, a driving transistor T2, a sensing transistor T3 and a storage capacitor Cst.

For example, as shown in FIG. 4, a control electrode of the switching transistor T1 is electrically connected to a first gate signal terminal G1, a first electrode of the switching transistor T1 is electrically connected to a data signal terminal Data, and a second electrode of the switching transistor T1 is electrically connected to a first node G. The switching transistor T1 is configured to, in response to a first scan signal received at the first gate signal terminal G1, transmit a data signal received at the data signal terminal Data to the first node G.

Here, the data signal includes, for example, a detection data signal and a display data signal. The detection data signal is used in a blanking period, and the display data signal is used in a display period. As for the blanking period and the display period, reference may be made to the description of some of the following embodiments, and details will not be repeated here.

For example, as shown in FIG. 4, a control electrode of the driving transistor T2 is electrically connected to the first node G, a first electrode of the driving transistor T2 is electrically connected to a sixth voltage signal terminal ELVDD, and a second electrode of the driving transistor T2 is electrically connected to a second node S. The driving transistor T2 is configured to: be turned on under control of a voltage of the first node G; generate a driving signal according to the voltage of the first node G and a sixth voltage signal received at the sixth voltage signal terminal ELVDD; and transmit the driving signal to the second node S.

For example, as shown in FIG. 4, a first terminal of the storage capacitor Cst is electrically connected to the first node G, and a second terminal of the storage capacitor Cst is electrically connected to the second node S. The switching transistor T1 simultaneously charges the storage capacitor Cst in a process of charging the first node G.

For example, as shown in FIG. 4, an anode of the light-emitting device P2 is electrically connected to the second node S, and a cathode of the light-emitting device P2 is electrically connected to a seventh voltage signal terminal ELVSS. The light-emitting device P2 is configured to be driven by the driving signal to emit light.

For example, as shown in FIG. 4, a control electrode of the sensing transistor T3 is electrically connected to a second gate signal terminal G2, a first electrode of the sensing transistor T3 is electrically connected to the second node S, and a second electrode of the sensing transistor T3 is electrically connected to a sensing signal terminal Sense. The sensing transistor T3 is configured to, in response to a second scan signal received at the second gate signal terminal G2, detect an electrical property of the driving transistor T2 to achieve the external compensation. The electrical property includes, for example, threshold voltage and/or carrier mobility of the driving transistor T2.

The sensing signal terminal Sense may provide a reset signal or acquire a sensing signal. The reset signal is used to reset the second node S in the display period, and the acquisition of the sensing signal refers to acquiring the threshold voltage and/or the carrier mobility of the driving transistor T2 in the blanking period.

Based on the structure of the pixel driving circuit P1, as shown in FIG. 2, the pixel driving circuits P1 in the same row of sub-pixels P may be electrically connected to two gate lines GL (i.e., a first gate line and a second gate line). For example, each first gate signal terminal G1 may be electrically connected to the first gate line and receive the first scan signal transmitted by the first gate line, and each second gate signal terminal G2 may be electrically connected to the second gate line and receive the second scan signal transmitted by the second gate line.

It will be noted that, a display phase of a frame may include, for example, a display period and a blanking period in sequence.

Figure 5:
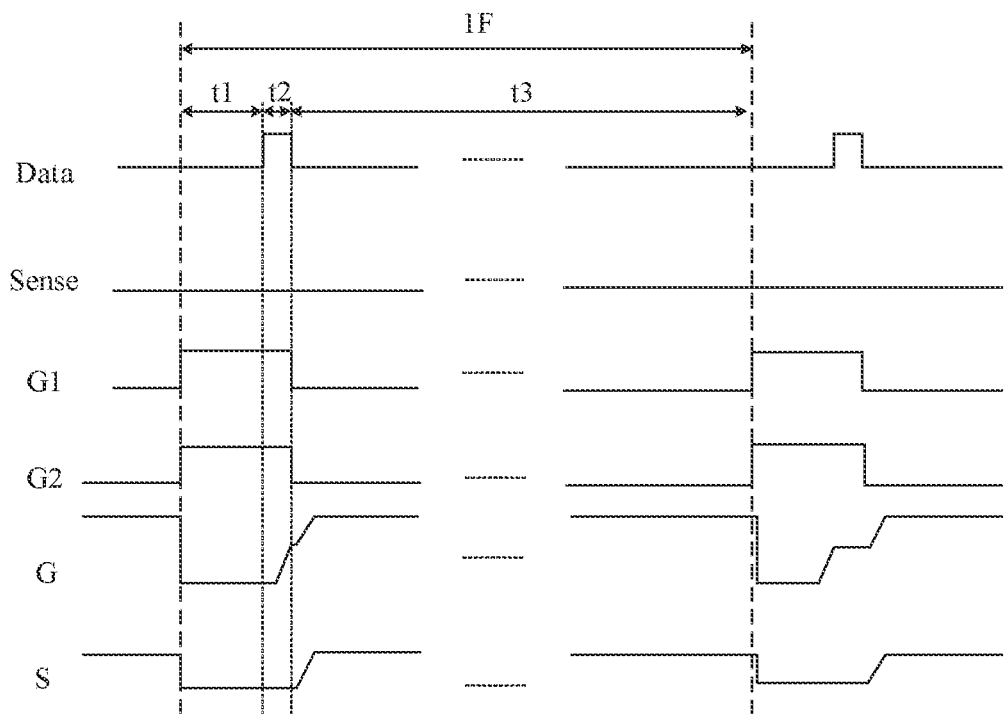
FIG. 5 is a timing diagram corresponding to the sub-pixel shown in FIG. 4, in the related art.

In the display period of the display phase of a frame, as shown in FIG. 5, the working process of the sub-pixel P includes, for example, a reset period t1, a data writing period t2 and a light-emitting period t3.

In the reset period t1, the first scan signal is at a high level, the data signal terminal is, for example, at a low level, the second scan signal is at a high level, and the reset signal provided by the sensing signal terminal Sense is at a low level. The switching transistor T1 is turned on under control of the first scan signal, receives the data signal, and transmits the data signal to the first node G, so as to reset the first node G. The sensing transistor T3 is turned on under control of the second scan signal, receives the reset signal, and transmits the reset signal to the second node S, so as to reset the second node S.

In the data writing period t2, the first scan signal is at a high level, and the data signal (i.e., the display data signal) is at a high level. The switching transistor T1 remains in a turn-on state under the control of the first scan signal, receives the display data signal, and transmits the display data signal to the first node G while charging the storage capacitor Cst.

In the light-emitting period t3, the first scan signal is at a low level, the second scan signal is at a low level, and the sixth voltage signal is at a high level. The switching transistor T1 is turned off under the control of the first scan signal, and the sensing transistor T3 is turned off under the control of the second scan signal. The storage capacitor Cst starts to discharge, so that the voltage of the first node G remains at a high level. The driving transistor T2 is turned on under the control of the voltage of the first node G, receives the sixth voltage signal, generates the driving signal, and transmits the driving signal to the second node S, so as to drive the light-emitting device P2 to emit light.

In the blanking period of the display phase of the frame, the working process of the sub-pixel P includes, for example, a first period and a second period.

In the first period, the first scan signal and the second scan signal are both at a high level, and the data signal (i.e., the detection data signal) is at a high level. The switching transistor T1 is turned on under the control of the first scan signal, receives the detection data signal, and transmits the detection data signal to the first node G, so as to charge the first node G. The sensing transistor T3 is turned on under the control of the second scan signal, receives the reset signal provided by the sensing signal terminal Sense, and transmits the reset signal to the second node S.

In the second period, the sensing signal terminal Sense is in a floating state. The driving transistor T2 is turned on under the control of the voltage of the first node G, receives the sixth voltage signal, and transmits the sixth voltage signal to the second node S, so as to charge the second node S. As a result, a voltage of the second node S increases until the driving transistor T2 is turned off. In this case, a voltage difference Vgs between the first node G and the second node S is equal to the threshold voltage Vth of the driving transistor T2.

Since the sensing transistor T3 is in a turn-on state and the sensing signal terminal Sense is in a floating state, in a process of charging the second node S by the driving transistor T2, the sensing signal terminal Sense is charged simultaneously. By sampling a voltage of the sensing signal terminal Sense (i.e., acquiring sensing signal), it may be possible to determine the threshold voltage Vth of the driving transistor T2 according to a relationship between the voltage of the sensing signal terminal Sense and the voltage of the detection data signal.

After the threshold voltage Vth of the driving transistor T2 is determined, it may be possible to compensate a display data signal for the threshold voltage Vth in a display period of a display phase of a next frame, so as to accomplish the external compensation of the sub-pixel P.

In some examples, the scan driving circuit 1000 and the plurality of sub-pixels P are located on the same side of the substrate 200. The scan driving circuit 1000 may include a plurality stages of shift registers 100 that are cascaded. A shift register 100 is electrically connected to, for example, at least one row of sub-pixels P (i.e., pixel driving circuits P1 in these sub-pixels P).

It will be noted that in the display phase of the frame, the scan driving circuit 1000 provides the first scan signal transmitted by the first gate signal terminal G1 and the second scan signal transmitted by the second gate signal terminal G2. That is, each shift register 100 in the scan driving circuit 1000 may be electrically connected to the first gate signal terminals G1 through the first gate line and transmit the first scan signal to the first gate signal terminals G1 through the first gate line, and may be electrically connected to the second gate signal terminals G2 through the second gate line and transmit the second scan signal to the second gate signal terminals G2 through the second gate line.

Of course, as shown in FIG. 3, the pixel driving circuits P1 in the same row of sub-pixels P may also be electrically connected to a same gate line L. In this case, the first scan signal and the second scan signal are the same. That is, each shift register 100 in the scan driving circuit 1000 may be electrically connected to the first gate signal terminals G1 and the second gate signal terminals G2 through a respective gate line, and transmits a scan signal to the first gate signal terminals G1 and the second gate signal terminals G2 through this gate line GL.

In the related art, in a display process of the display apparatus 2000, there will be an image smear phenomenon occurred in a process of motion image switching. That is, when the display apparatus 2000 switches an image of a frame to an image of another frame, the viewer will observe image smear of an image of a previous frame (which is also referred to as motion image smear), which affects an image display effect.

In light of this, as shown in FIGS. 38 to 42, some embodiments of the present disclosure provide a scan driving circuit 1000. The scan driving circuit 1000 includes a plurality stages of shift registers 100 that are cascaded. The shift register 100 is applied to the display apparatus 2000, and each shift register 100 is electrically connected to at least one row of sub-pixels P.

Here, the number of rows of sub-pixels P electrically connected to each shift register 100 may be determined according to the structure of the shift register 100.

Figure 8:
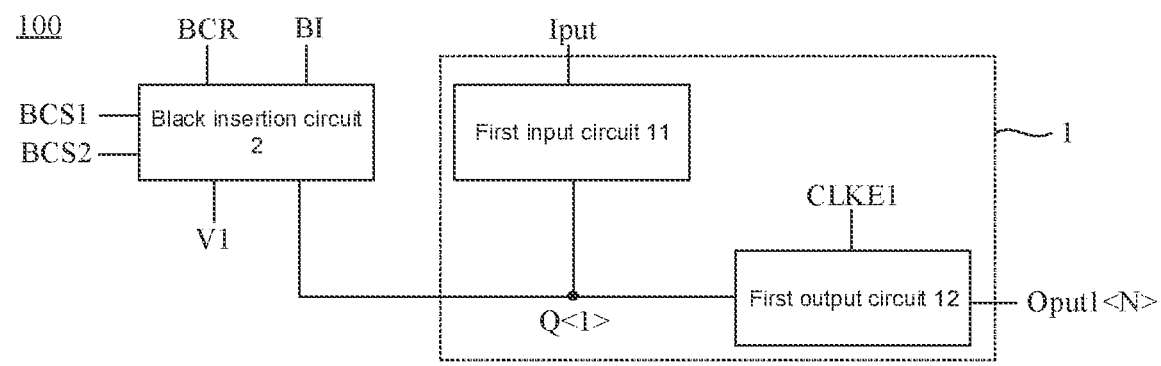
FIG. 8 is a structural diagram of a shift register, in accordance with some embodiments of the present disclosure.
Figure 9:
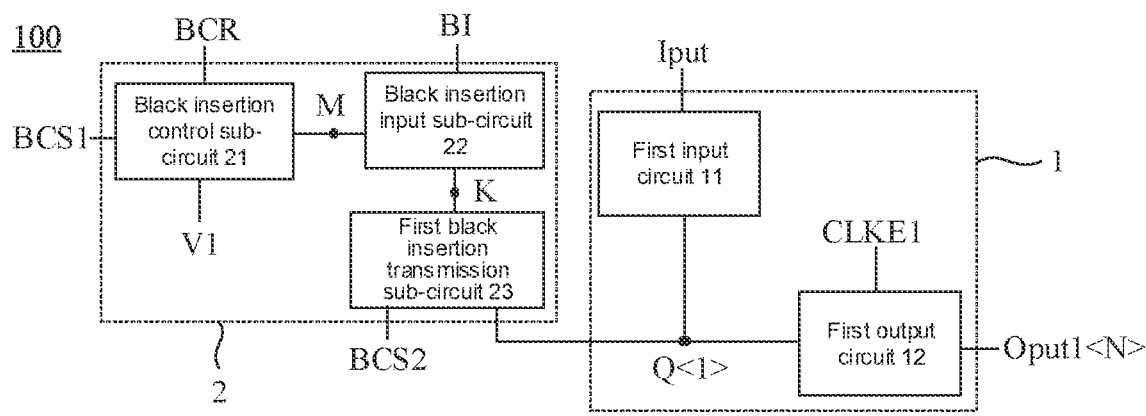
FIG. 9 is a structural diagram of another shift register, in accordance with some embodiments of the present disclosure.
Figure 10:
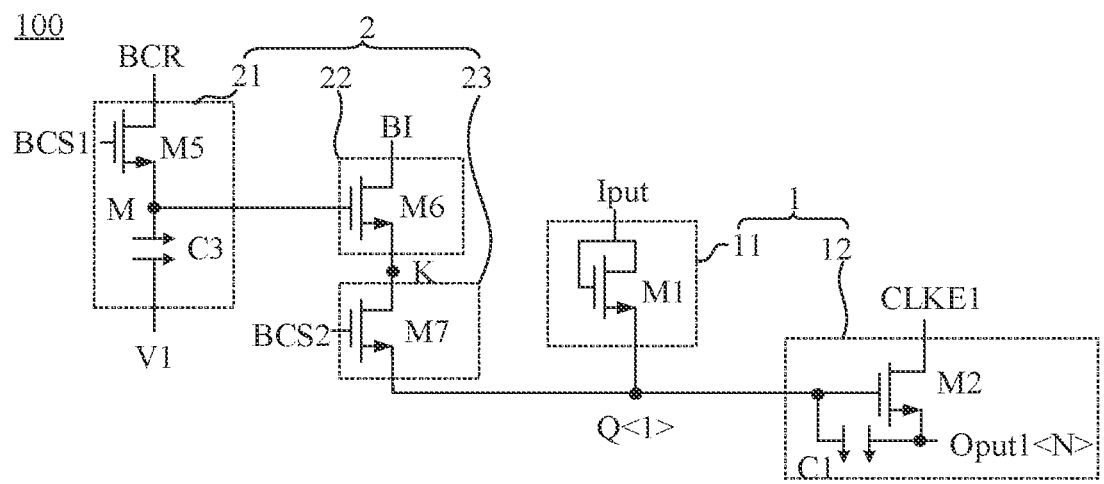
FIG. 10 is a circuit diagram of a shift register in accordance with some embodiments of the present disclosure.

In some embodiments, as shown in FIGS. 8 to 10, the shift register 100 includes a first scan unit 1 and a black insertion circuit 2. The first scan unit 1 includes a first input circuit 11 and a first output circuit 12.

In some examples, as shown in FIGS. 8 to 10, the first input circuit 11 is electrically connected to a display input signal terminal Iput and a first pull-up node Q<1>. The first input circuit 11 is configured to, in response to a display input signal received at the display input signal terminal Iput, transmit the display input signal to the first pull-up node Q<1>.

For example, in a case where the display input signal is at a high level, the first input circuit 11 may be turned on due to an action of the display input signal, receive the display input signal and transmit the display input signal to the first pull-up node Q<1>, so as to charge the first pull-up node Q<1>. As a result, a voltage of the first pull-up node Q<1> increases.

In some examples, as shown in FIGS. 8 and 10, the first output circuit 12 is electrically connected to the first pull-up node Q<1>, a first clock signal terminal CLKE1 and a first scan signal terminal Oput1<N>. The first output circuit 12 is configured to, in a case where the first input circuit 11 transmits the display input signal to the first pull-up node Q<1>, transmit a first clock signal received at the first clock signal terminal CLKE1 to the first scan signal terminal Oput1<N> under control of the voltage of the first pull-up node Q<1>, so as to drive the at least one row of sub-pixels P to display an image.

For example, in a case where the voltage of the first pull-up node Q<1> is at a high level, the first output circuit 12 may be turned on under the control of the voltage of the first pull-up node Q<1>, transmit the first clock signal received at the first clock signal terminal CLKE1 to the first scan signal terminal Oput1<N>, and output the first clock signal as the first scan signal from the first scan signal terminal Oput1<N>.

In this case, pixel driving circuits P1 in a same row of sub-pixels P may be electrically connected to a same gate line GL. A first scan signal terminal Oput1<N> of a shift register 100 may be electrically connected to first gate signal terminals G1 and second gate signal terminals G2 of pixel driving circuits P1 in a corresponding row of sub-pixels P through the gate line L. The first scan signal output by the first scan signal terminal Oput1<N> may be transmitted to the first gate signal terminals G1 and the second gate signal terminals G2 of the pixel driving circuits P1 through the gate line GL.

In some examples, as shown in FIGS. 8 to 10, the black insertion circuit 2 is electrically connected to a first control signal terminal BCS1, a black insertion cascade signal terminal BCR, a second control signal terminal BCS2, a black insertion input signal terminal B, the first pull-up node Q<1> and a first voltage signal terminal V1. The black insertion circuit 2 is configured to transmit a black insertion input signal received at the black insertion input signal terminal B to the first pull-up node Q<1> under control of a first control signal transmitted by the first control signal terminal BCS1, a black insertion cascade signal transmitted by the black insertion cascade signal terminal BCR and a second control signal transmitted by the second control signal terminal BCS2.

For example, in a case where the first control signal is at a high level, the black insertion cascade signal is at a high level, and the second control signal is at a high level, the black insertion circuit 2 may be turned on under the control of the first control signal, the black insertion cascade signal and the second control signal, receive the black insertion input signal, and transmit the black insertion input signal to the first pull-up node Q<1>, so as to charge the first pull-up node Q<1>. As a result, the voltage of the first pull-up node Q<1> increases.

Here, the first voltage signal terminal V1 is configured to, for example, transmit a direct current low-level signal (e.g., lower than or equal to a low-level section of a clock signal). For example, the first voltage signal terminal V1 is grounded.

For example, the first output circuit 12 is further configured to, in a case where the black insertion circuit 2 transmits the black insertion input signal to the first pull-up node Q<1>, transmit the first clock signal to the first scan signal terminal Oput1<N> under control of another voltage of the first pull-up node Q<1>, so as to drive the at least one row of sub-pixels P to display a black image.

For example, in the case where the voltage of the first pull-up node Q<1> is at the high level, the first output circuit 12 may be turned on under the control of the voltage of the first pull-up node Q<1>, transmit the first clock signal received at the first clock signal terminal CLKE1 to the first scan signal terminal Oput1<N>, and output the first clock signal as the first scan signal from the first scan signal terminal Oput1<N>.

It will be noted that in the embodiments of the present disclosure, in the display period of the display phase of the frame, the first input circuit 11 and the black insertion circuit 2 are turned on at different times.

As shown in FIG. 3, in an example where the first gate signal terminals G1 and the second gate signal terminals G2 of the pixel driving circuits P1 in the same row of sub-pixels P are electrically connected to the same gate line GL. The first scan signal output by the first scan signal terminal Oput1<N> corresponds to the scan signal received by the first gate signal terminal G1 and the second gate signal terminal G2.

Figure 6:
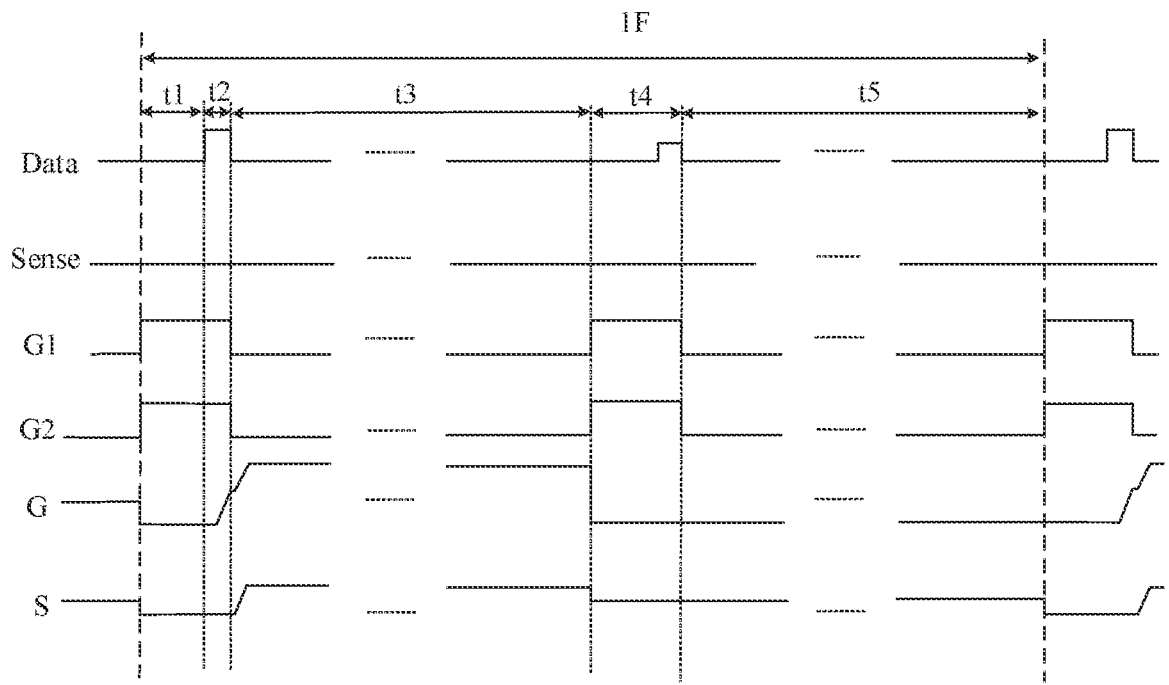
FIG. 6 is a timing diagram corresponding to the sub-pixel shown in FIG. 4, in accordance with some embodiments of the present disclosure.

In the display period of the display phase of the single frame, the voltage of the first pull-up node Q<1> is increased by the first input circuit 11 first. After the first input circuit 11 is turned on and charges the first pull-Lip node Q<1>, the first output circuit 12 may be turned on under the control of the voltage of the first pull-up node Q<1> and output the first clock signal as the first scan signal from the first scan signal terminal Oput1<N>. As shown in FIG. 6, in the reset period t1 and the data writing period t2, the first input circuit 11 is turned off, the voltage of the first pull-up node Q<1> remains at a high level, and the first output circuit 12 remains in the turn-on state due to an action of the voltage of the first pull-up node Q<1>. Since the first clock signal is at a high level, the first scan signal output by the first output circuit 12 is at the high level. In the light-emitting phase t3, the voltage of the first pull-up node Q<1> is at a low level, the first output circuit 12 is turned off, and the first scan signal is at a low level; the driving transistor T2 is turned on under control of the voltage of the first node G (that is, the storage capacitor Cst discharges), so as to drive the light-emitting device P2 to emit light, and accordingly, the at least one row of sub-pixels P corresponding to the shift register 100 display an image.

At a certain moment in a light-emitting process of the light-emitting device P2 (i.e., a moment when the light-emitting period t3 alternates with a black insertion writing period t4 as shown in FIG. 6), the black insertion circuit 2 is turned on and charges the first pull-up node Q<1>, and the first output circuit 12 may be turned on under the control of the voltage of the first pull-up node Q<1>. In this case, the first clock signal may be output as a black insertion signal from the first scan signal terminal Oput1<N> and transmitted to the first gate signal terminals G1 and the second gate signal terminals G2 of the pixel driving circuits P1 in the corresponding row. Since the black insertion signal is at a high level, the switching transistor T1 may be turned on under control of the black insertion signal and transmit a low-level or relatively low-level data signal (which may be also referred to as a black insertion data signal) to the first node G, and the sensing transistor T3 may also be turned on under the control of the black insertion signal and transmit a low-level reset signal to the second node S. In this case, the voltage difference Vgs between the first node G and the second node S is less than the threshold voltage Vth of the driving transistor T2, so that the sub-pixel P stops emitting light. Thus, a black image is displayed. In a black insertion holding period t5, the sub-pixels P continue to display the black image.

Therefore, in the shift register 100 provided in some embodiments of the present disclosure, by providing the black insertion circuit 2, it is possible to insert a black image in a process that the sub-pixels P emit light to normally display an image, thereby shortening a duration for the sub-pixels P to emit light normally, and shortening a duration for the display apparatus 2000 to display an image normally. In this way, the motion picture response time (MPRT) may be increased on the basis of not increasing a refresh rate, so as to ameliorate the problem of the motion image smear and improve the image display effect.

In addition, by controlling the moment when the light-emitting period t3 alternates with the black insertion writing period t4 of the black insertion circuit 2, a ratio of the duration for the sub-pixels P to emit light normally to a duration for the sub-pixels P to maintain the black image may be controlled, which facilitates the adjustment of the MPRT, and then, it is conducive to ameliorating the problem of the motion image smear and improving the image display effect.

It will be noted that the method of controlling the light-emitting process of the sub-pixels P to insert the black image varies, which may be specifically set according to actual needs and is not limited in the present disclosure.

Figure 13:
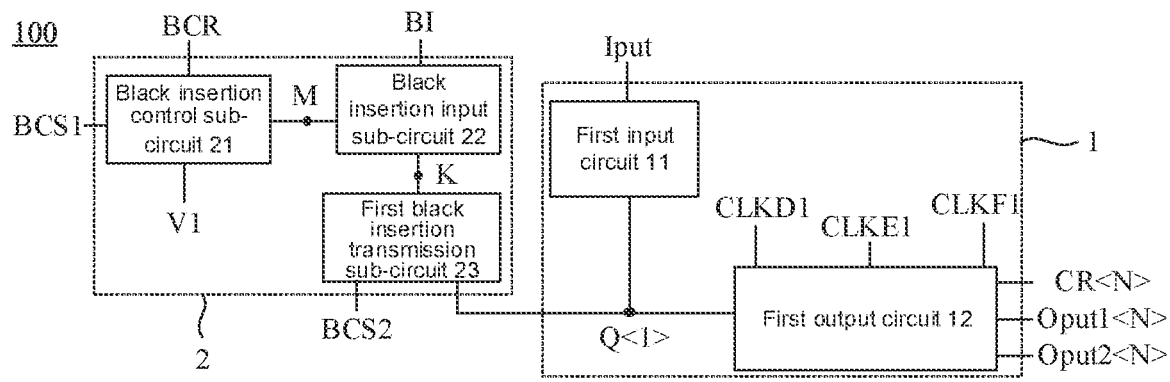
FIG. 13 is a structural diagram of yet another shift register, in accordance with some embodiments of the present disclosure.
Figure 14:
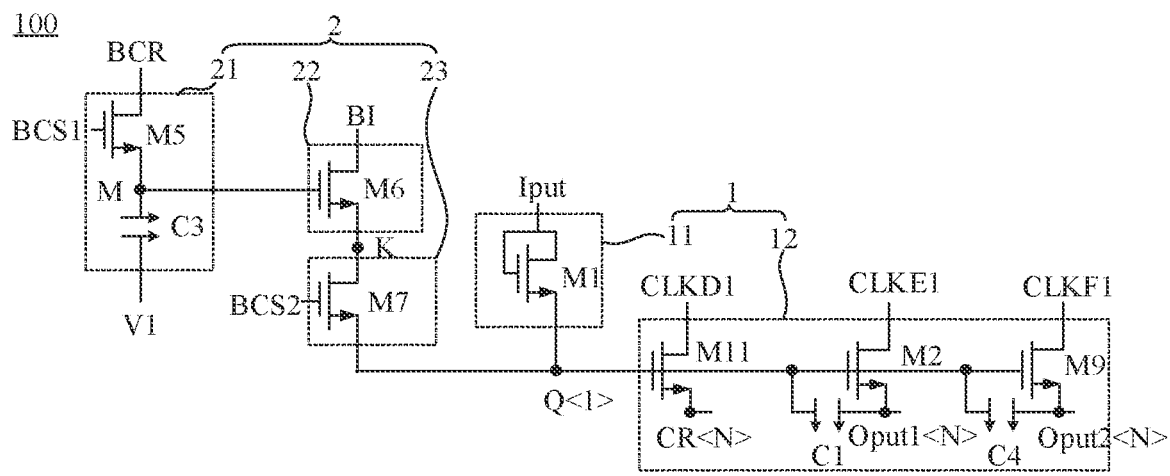
FIG. 14 is a circuit diagram of yet another shift register, in accordance with some embodiments of the present disclosure.
Figure 15:
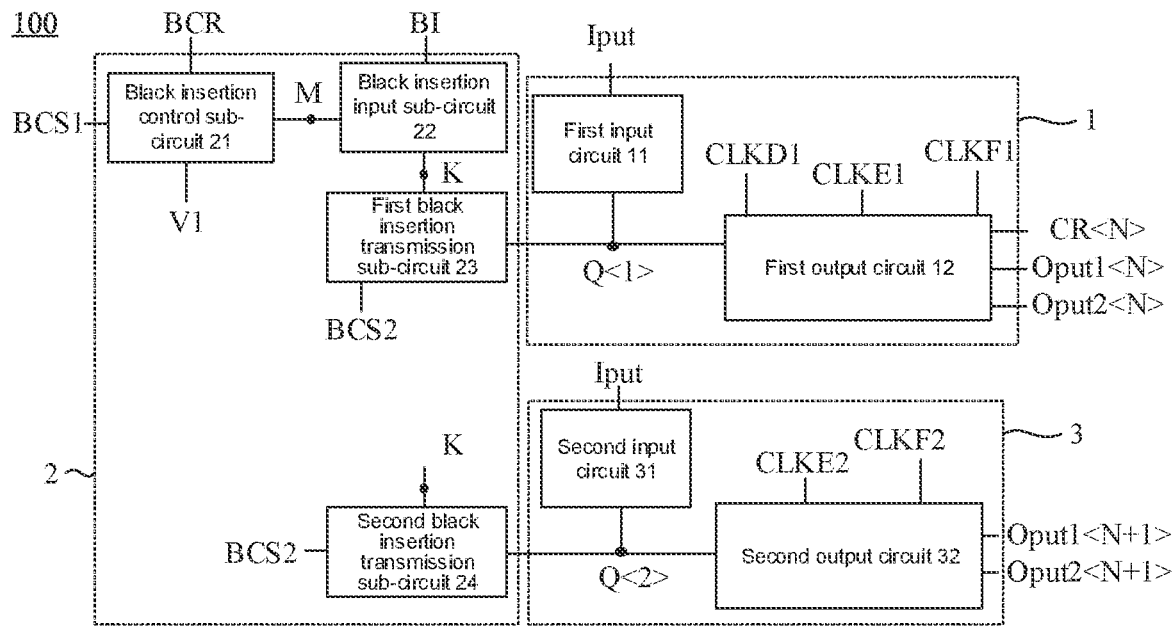
FIG. 15 is a structural diagram of yet another shift register, in accordance with some embodiments of the present disclosure.

In some embodiments, as shown in FIGS. 13 and 14, the first output circuit 12 is further electrically connected to a third clock signal terminal CLKF1 and a first sensing signal terminal Oput2<N>. The first output circuit 12 is further configured to, in the case where the first input circuit 11 transmits the display input signal to the first pull-up node Q<1>, transmit a third clock signal received at the third clock signal terminal CLKF1 to the first sensing signal terminal Oput2<N> under the control of the voltage of the first pull-up node Q<1>, so as to drive the at least one row of sub-pixels P to be reset; or in the case where the black insertion circuit 2 transmits the black insertion input signal to the first pull-up node Q<1>, transmit the third clock signal to the first sensing signal terminal Oput2<N> under the control of the another voltage of the first pull-up node Q<1>, so as to drive the at least one row of sub-pixels P to display black image.

For example, in the case where the voltage of the first pull-up node Q<1> is at the high level, the first output circuit 12 may be turned on under control of the voltage of the first pull-up node Q<1>, transmit the third clock signal received at the third clock signal terminal CLKF1 to the first sensing signal terminal Oput2<N>, and output the third clock signal as a first sensing signal from the first sensing signal terminal Oput2<N>.

In this case, pixel driving circuits in a same row of sub-pixels P are electrically connected to two gate lines GL. A first scan signal terminal Oput1<N> of a shift register 100 may be electrically connected to the first gate signal terminals G1 of the pixel driving circuits P1 in the corresponding row of sub-pixels P through one of the two gate lines GL, and the first scan signal output by the first scan signal terminal Oput1<N> may be transmitted to the first gate signal terminals G1 of the pixel driving circuits P1 through the gate line GL; a first sensing signal terminal Oput2<N> of the shift register 100 may be electrically connected to the second gate signal terminals G2 of the pixel driving circuits P1 in the corresponding row of sub-pixels P through the other of the two gate lines GL, and the first sensing signal output by the first sensing signal terminal Oput2<N> may be transmitted as the second scan signal to the second gate signal terminals G2 of the pixel driving circuits P1 through the other gate line L.

For example, in the display period of the display phase of the frame, as shown in FIG. 6, in the reset period t1 and the data writing period t2, the first input circuit 11 is turned off, the voltage of the first pull-up node Q<1> remains at a high level, and the first output circuit 12 remains in the turn-on state due to the action of the voltage of the first pull-up node Q<1>. Since the first clock signal and the third clock signal are both at a high level, the first scan signal and the first sensing signal output by the first output circuit 12 are both at a high level. The switching transistor T1 is turned on under the control of the first scan signal (from the first scan signal terminal Oput1<N>), receives the data signal, and transmits the data signal to the first node G; the sensing transistor T3 is turned on under the control of the second scan signal (from the first sensing signal terminal Oput2<N>), receives the reset signal, and transmits the reset signal to the second node S, so as to reset the second node S. In this way, it may be possible to prepare for the subsequent light-emitting period t3 (i.e., the image display).

At a certain moment in the light-emitting process of the light-emitting device P2 (e.g., the moment when the light-emitting period t3 alternates with the black insertion writing period t4 as shown in FIG. 6), the black insertion circuit 2 is turned on and charges the first pull-up node Q<1>, and the first output circuit 12 may be turned on under the control of the voltage of the first pull-up node Q<1>. In this case, the first clock signal may be output as a first black insertion signal from the first scan signal terminal Oput1<N> and transmitted to the first gate signal terminals G1 of the pixel driving circuits P1 in the corresponding row, and the third clock signal may be output as a second black insertion signal from the first sensing signal terminal Oput2<N> and transmitted to the second gate signal terminals G2 of the pixel driving circuits P1 in the corresponding row, so that the sub-pixels P display the black image subsequently.

The method of inserting the black image is schematically described by taking an example where the first gate signal terminals G1 and the second gate signal terminals G2 of the pixel driving circuits in the same row of sub-pixels P are respectively electrically connected to a gate line GL.

Figure 7:
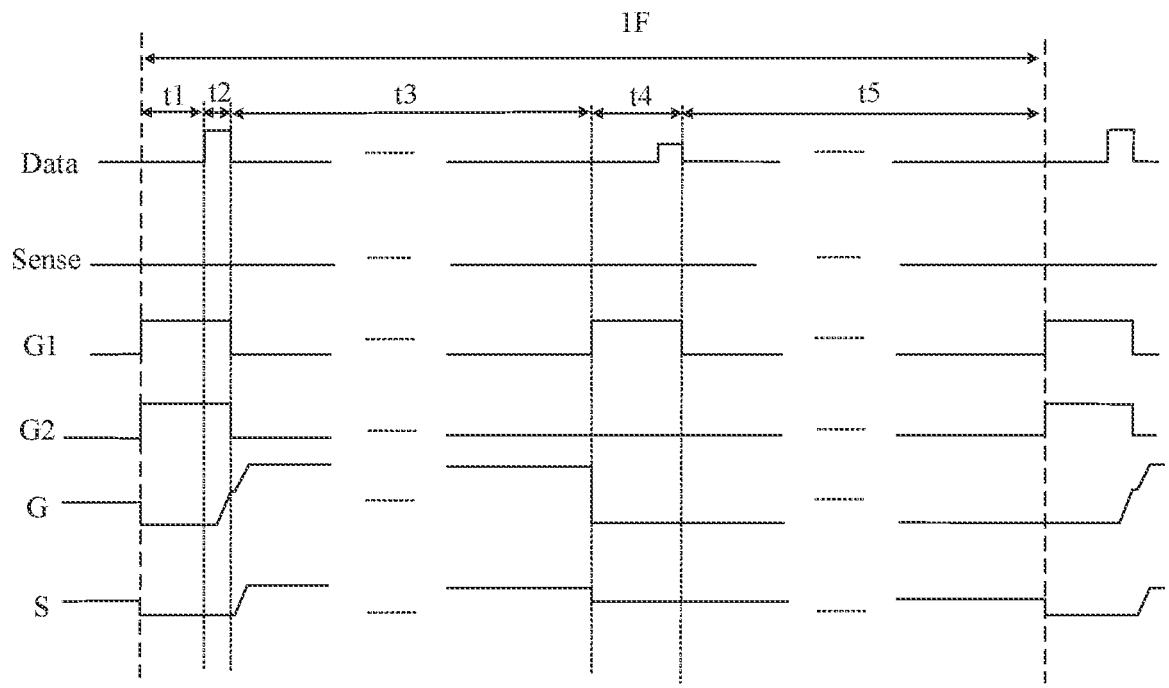
FIG. 7 is another timing diagram corresponding to the sub-pixel shown in FIG. 4, in accordance with some embodiments of the present disclosure.

For example, as shown in FIG. 7, in a process that the light-emitting device P2 emits light, and the black insertion circuit 2 is turned on and charges the first pull-up node Q<1>, the first scan signal (i.e., the first black insertion signal) output by the first scan signal terminal Oput1<N> may be at a high level, and the first sensing signal (i.e., the second black insertion signal) output by the first sensing signal terminal Oput2<N> may be at a low level. Based on this, the sensing transistor T3 may be turned off under the control of the second black insertion signal. The switching transistor T1 may be turned on under the control of the first black insertion signal, transmits the low-level or relatively low-level data signal (which may be also referred to as the black insertion data signal) to the first node G, so that the voltage difference Vgs is less than the threshold voltage Vth. As a result, the driving transistor T2 is turned off, so that the sub-pixel P stops emitting light. Thus, the black image is displayed.

For another example, in the process that the light-emitting device P2 emits light, and the black insertion circuit 2 is turned on and charges the first pull-up node Q<1>, the first scan signal (i.e., the first black insertion signal) output by the first scan signal terminal Oput1<N> may be at a low level, and the first sensing signal (i.e., the second black insertion signal) output by the first sensing signal terminal Oput2<N> may be at a high level. Based on this, the switching transistor T1 may be turned off under the control of the first black insertion signal; the sensing transistor T3 may be turned on under the control of the second black insertion signal, transmit a high-level or relatively high-level sensing signal (which may be also referred to as a black insertion sensing signal) to the second node S, so that the voltage difference Vgs is less than the threshold voltage Vth. As a result, the driving transistor T2 is turned off, so that the sub-pixel P stops emitting light. Thus, the black image is displayed.

For example, a period in which the first input circuit 11 is turned on may be referred to as a display sub-period, and a period in which the black insertion circuit 2 is turned on may be referred to as a black insertion sub-period. The display sub-period and the black insertion sub-period are arranged in sequence.

Figure 11:
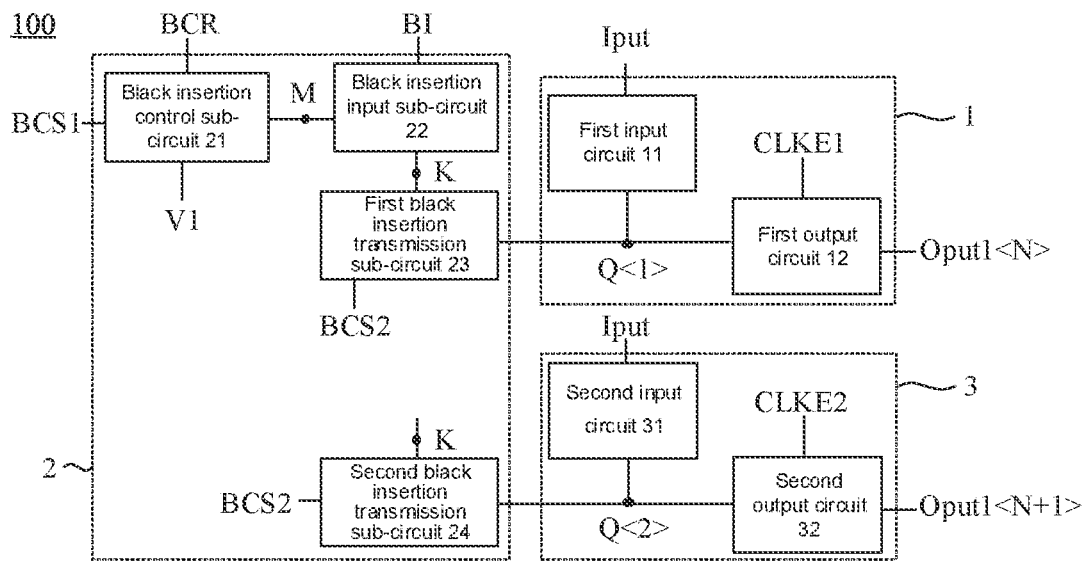
FIG. 11 is a structural diagram of yet another shift register, in accordance with some embodiments of the present disclosure.
Figure 12:
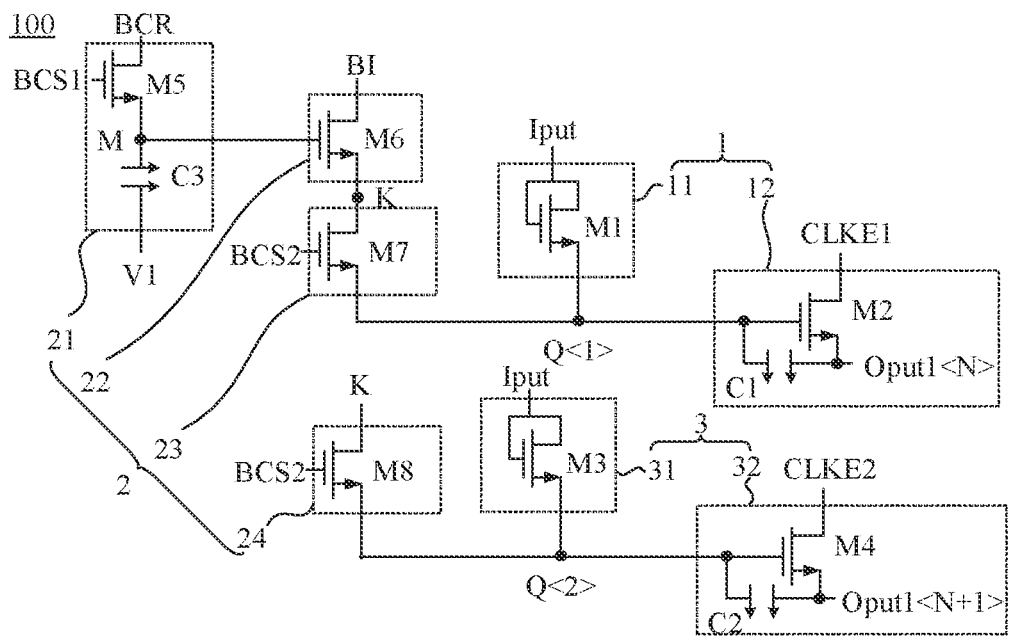
FIG. 12 is a circuit diagram of another shift register, in accordance with some embodiments of the present disclosure.

In some embodiments, as shown in FIGS. 11 and 12, the shift register 100 further includes a second scan unit 3. The second scan unit 3 includes a second input circuit 31 and a second output circuit 32.

In some examples, as shown in FIGS. 11 and 12, the second input circuit 31 is electrically connected to the display input signal terminal Iput and a second pull-up node Q<2>. The second input circuit 31 is configured to, in response to the display input signal, transmit the display input signal to the second pull-up node Q<2>.

For example, in the case where the display input signal is at the high level, the second input circuit 31 may be turned on due to the action of the display input signal, receive the display input signal, and transmit the display input signal to the second pull-Lip node Q<2>, so as to charge the second pull-up node Q<2>. As a result, a voltage of the second pull-up node Q<2> increases.

In some examples, as shown in FIGS. 11 and 12, the second output circuit 32 is electrically connected to the second pull-up node Q<2>, a second clock signal terminal CLKE2 and a second scan signal terminal Oput1<N+1>. The second output circuit 32 is configured to, in a case where the second input circuit 31 transmits the display input signal to the second pull-up node Q<2>, transmit a second clock signal received at the second clock signal terminal CLKE2 to the second scan signal terminal Oput1<N+1> under control of the voltage of the second pull-up node Q<2>, so as to drive at least one row of sub-pixels P to display an image.

For example, in a case where the voltage of the second pull-up node Q<2> is at a high level, the second output circuit 32 may be turned on under the control of the voltage of the second pull-up node Q<2>, transmit the second clock signal received at the second clock signal terminal CLKE2 to the second scan signal terminal Oput1<N+1>, and output the second clock signal as the second scan signal from the second scan signal terminal Oput1<N+1>.

The first input circuit 11 and the second input circuit 31 are both electrically connected to the display input signal terminal Iput, and thus, in the case where the display input signal is at the high level, the first input circuit 11 and the second input circuit 31 may be both turned on to respectively charge the first pull-up node Q<1> and the second pull-up node Q<2>, so that the first output circuit 12 and the second output circuit 32 may be both turned on.

In the display sub-period of the display period, the first scan signal output by the first output circuit 12 and the second scan signal output by the second output circuit 32 may be, for example, different. In this way, it is convenient to drive different rows of sub-pixels P to scan and display an image row by row.

In some examples, as shown in FIGS. 11 and 12, the black insertion circuit 2 is further electrically connected to the second pull-up node Q<2>. The black insertion circuit 2 is further configured to transmit the black insertion input signal to the second pull-up node Q<2> while the black insertion input signal is transmitted to the first pull-up node Q<1>. The second output circuit 32 is further configured to, in a case where the black insertion circuit 2 transmits the black insertion input signal to the second pull-up node Q<2>, transmit the second clock signal to the second scan signal terminal Oput1<N+1> under the control of the voltage of the second pull-up node Q<2>, so as to drive the at least one row of sub-pixels P to display a black image.

For example, in the case where the first control signal is at the high level, the black insertion cascade signal is at the high level, and the second control signal is at the high level, the black insertion circuit 2 may be turned on under the control of the first control signal, the black insertion cascade signal and the second control signal, receive the black insertion input signal, and transmit the black insertion input signal to the second pull-up node Q<2>, so as to charge the second pull-up node Q<2>. As a result, the voltage of the second pull-up node Q<2> increases. The second output circuit 32 may be turned on under the control of the voltage of the second pull-up node Q<2>, transmit the second clock signal received at the second clock signal terminal CLKE2 to the second scan signal terminal Oput1<N+1>, and output the second clock signal as the second scan signal from the second scan signal terminal Oput1<N+1>.

The black insertion circuit 2 is not only electrically connected to the first pull-up node Q<1>, but also electrically connected to the second pull-up node Q<2>, which means that the black insertion circuit 2 is electrically connected to both the first scan unit 1 and the second scan unit 3. Thus, in a case where the black insertion circuit 2 is turned on, a high-level black insertion input signal may be transmitted to the first pull-up node Q<1> and the second pull-up node Q<2> at the same time, so that the first output circuit 12 and the second output circuit 32 are turned on simultaneously. The second output circuit 32 outputs the second clock signal as the second scan signal in a process that the first output circuit 12 outputs the first clock signal as the first scan signal.

In the black insertion sub-period of the display period, the first scan signal output by the first output circuit 12 and the second scan signal output by the second output circuit 32 may be, for example, the same. In this way, the corresponding row(s) of sub-pixels P electrically connected to the first scan signal terminal Oput1<N> and the corresponding row(s) of sub-pixels P electrically connected to the second scan signal terminal Oput1<N+1> may be driven to display a black image simultaneously.

Here, in a case where the shift register 100 includes the first scan unit 1, each shift register 100 may be electrically connected to at least one row of sub-pixels P, so that the plurality of rows of sub-pixels P included in the display apparatus 2000 may be scanned row by row or may display a black image row by row through the plurality stages of shift registers 100.

In a case where the shift register 100 includes the first scan unit 1 and the second scan unit 3, each shift register 100 may be electrically connected to at least two rows of sub-pixels P, and at least one row of sub-pixels P to which the first scan unit 1 is connected are different from at least one row of sub-pixels P to which the second scan unit 3 is connected. In this way, the at least two rows of sub-pixels P electrically connected to the shift register 100 may be driven to display a black image simultaneously, which is conducive to reducing a duration needed to insert the black images, ameliorating the problem of the motion image smear and improving the image display effect.

In some examples, as shown in FIGS. 15 to 18, the second output circuit 32 may be further electrically connected to a fourth clock signal terminal CLKF2 and a second sensing signal terminal Oput2<N+1>. The second output circuit 32 is further configured to: in the case where the second input circuit 31 transmits the display input signal to the second pull-up node Q<2>, transmit a fourth clock signal received at the fourth clock signal terminal CLKF2 to the second sensing signal terminal Oput2<N+1> under the control of the voltage of the second pull-up node Q<2>, so as to drive the at least one row of sub-pixels P to be reset; or in the case where the black insertion circuit 2 transmits the black insertion input signal to the second pull-up node Q<2>, transmit the fourth clock signal to the second sensing signal terminal Oput2<N+1> under the control of the another voltage of the second pull-up node Q<2>, so as to drive the at least one row of sub-pixels P to display a black image.

For example, in the case where the voltage of the second pull-up node Q<2> is at the high level, the second output circuit 32 is turned on under the control of the voltage of the second pull-up node Q<2>, transmits the fourth clock signal received at the fourth clock signal terminal CLKF2 to the second sensing signal terminal Oput2<N+1>, and outputs the fourth clock signal as a second sensing signal from the second sensing signal terminal Oput2<N+1>.

It will be noted that a process of using the second scan unit 3 to drive the corresponding row(s) of sub-pixels P to display an image or a black image is the same as a process of using the first scan unit 1 to drive the corresponding row(s) of sub-pixels P to display an image or a black image, reference may be specifically made to the description of some of the above embodiments, and details will not be repeated here.

Here, the number of scan units included in the shift register 100 provided in the embodiments of the present disclosure is not limited to two.

The structure of the black insertion circuit 2 is schematically described below with reference to the accompanying drawings. Of course, the structure of the black insertion circuit 2 in the embodiments of the present disclosure is not limited thereto.

In some embodiments, as shown in FIGS. 9 to 18, the black insertion circuit 2 includes a black insertion control sub-circuit 21, a black insertion input sub-circuit 22 and a first black insertion transmission sub-circuit 23. As shown in FIGS. 11, 12, 15 to 18, in a case where the shift register 100 further includes the second scan unit 3, the black insertion circuit 2 may further include a second black insertion transmission sub-circuit 24.

In some examples, as shown in FIGS. 9 to 18, the black insertion control sub-circuit 21 is electrically connected to the first control signal terminal BCS1, the black insertion cascade signal terminal BCR, the first voltage signal terminal V1 and a first black insertion node M. The black insertion control sub-circuit 21 is configured to transmit the black insertion cascade signal to the first black insertion node M under the control of the first control signal.

For example, in the case where the first control signal is at the high level, the black insertion control sub-circuit 21 is turned on under the control of the first control signal, receives the black insertion cascade signal, and transmits the black insertion cascade signal to the first black insertion node M, so as to charge the first black insertion node M. As a result, a voltage of the first black insertion node M increases.

In some examples, as shown in FIGS. 9 to 18, the black insertion input sub-circuit 22 is electrically connected to the first black insertion node M, the black insertion input signal terminal BI and a second black insertion node K. The black insertion input sub-circuit 22 is configured to transmit the black insertion input signal to the second black insertion node K under control of the voltage of the first black insertion node M.

For example, in a case where the voltage of the first black insertion node M is at a high level, the black insertion input sub-circuit 22 is turned on under the control of the voltage of the first black insertion node M, receives the black insertion input signal, and transmits the black insertion input signal to the second black insertion node K, so as to charge the second black insertion node K. As a result, a voltage of the second black insertion node K increases.

In some examples, as shown in FIGS. 9 to 18, the first black insertion transmission sub-circuit 23 is electrically connected to the second control signal terminal BCS2, the second black insertion node K and the first pull-up node Q<1>. The first black insertion transmission sub-circuit 23 is configured to transmit the black insertion input signal from the second black insertion node K to the first pull-up node Q<1> under control of the second control signal.

For example, in a case where the second control signal is at a high level, the first black insertion transmission sub-circuit 23 is turned on under the control of the second control signal, receives the black insertion input signal, and transmits the black insertion input signal to the first pull-up node Q<1>, so as to charge the first pull-up node Q<1>. As a result, the voltage of the first pull-up node Q<1> increases.

In some examples, as shown in FIGS. 11, 12, and 15 to 18, the second black insertion transmission sub-circuit 24 is electrically connected to the second control signal terminal BCS2, the second black insertion node K and the second pull-up node Q<2>. The second black insertion transmission sub-circuit 24 is configured to transmit the black insertion input signal from the second black insertion node K to the second pull-up node Q<2> under the control of the second control signal.

For example, in the case where the second control signal is at the high level, the second black insertion transmission sub-circuit 24 is turned on under the control of the second control signal, receives the black insertion input signal, and transmits the black insertion input signal to the second pull-up node Q<2>, so as to charge the second pull-up node Q<2>. As a result, the voltage of the second pull-up node Q<2> increases.

In some examples, the second control signal terminal BCS2 and the black insertion input signal terminal BI are electrically connected to the same signal terminal. That is, the second control signal terminal BCS2 and the black insertion input signal terminal BI receive the same signal and transmit the same signal. That is, a timing of the second control signal is the same as a timing of the black insertion input signal.

For example, the second control signal and the black insertion input signal are both a clock signal; alternatively, the second control signal and the black insertion input signal are both a shift signal.

In other examples, the second control signal terminal BCS2 and the black insertion input signal terminal BI are respectively electrically connected to different signal terminals.

For example, the second control signal transmitted by the second control signal terminal BCS2 may be a clock signal, and the black insertion input signal transmitted by the black insertion input signal terminal BI may be a direct current high-level signal. The direct current high-level signal may be, for example, a fifth voltage signal. As for the fifth voltage signal, reference may be made to the following description, and details will not be repeated here.

In this way, it is conducive to simplifying the structures of the shift register 100 and the scan driving circuit 1000, and it is also conducive to improving the yields of the shift register 100 and the scan driving circuit 1000.

The structures of the first scan unit 1, the black insertion circuit 2 and the second scan unit 3 are schematically described below with reference to the accompanying drawings.

In some examples, as shown in FIGS. 10, 12, 14, 16 and 18, the black insertion control sub-circuit 21 includes a fifth transistor M5 and a third capacitor C3.

For example, as shown in FIGS. 10, 12, 14, 16 and 18, a control electrode of the fifth transistor M5 is electrically connected to the first control signal terminal BCS1, a first electrode of the fifth transistor M5 is electrically connected to the black insertion cascade signal terminal BCR, and a second electrode of the fifth transistor M5 is electrically connected to the first black insertion node M.

For example, in the case where the first control signal is at the high level, the fifth transistor M5 is turned on under the control of the first control signal, and transmits the black insertion cascade signal received at the black insertion cascade signal terminal BCR to the first black insertion node M, so as to charge the first black insertion node M. As a result, the voltage of the first black insertion node M increases.

For example, as shown in FIGS. 10, 12, 14, 16 and 18, a first terminal of the third capacitor C3 is electrically connected to the first black insertion node M, and a second terminal of the third capacitor C3 is electrically connected to the first voltage signal terminal V1.

For example, in a process that the fifth transistor M5 is turned on and charges the first black insertion node M, the third capacitor C3 is also charged. After the fifth transistor M5 is turned off, the third capacitor C3 may discharge, so that the voltage of the first black insertion node M remains at a high level.

In some examples, as shown in FIGS. 10, 12, 14, 16 and 18, the black insertion input sub-circuit 22 includes a sixth transistor M6.

For example, as shown in FIGS. 10, 12, 14, 16 and 18, a control electrode of the sixth transistor M6 is electrically connected to the first black insertion node M, a first electrode of the sixth transistor M6 is electrically connected to the black insertion input signal terminal BI, and a second electrode of the sixth transistor M6 is electrically connected to the second black insertion node K.

For example, in a case where the fifth transistor M5 is turned on and charges the first black insertion node M to increase the voltage of the first black insertion node M, the sixth transistor M6 is turned on under the control of the voltage of the first black insertion node M, receives the black insertion input signal, and transmits the black insertion input signal to the second black insertion node K.

In some examples, as shown in FIGS. 10, 12, 14, 16 and 18, the first black insertion transmission sub-circuit 23 includes a seventh transistor M7.

For example, as shown in FIGS. 10, 12, 14, 16 and 18, a control electrode of the seventh transistor M7 is electrically connected to the second control signal terminal BCS2, a first electrode of the seventh transistor M7 is electrically connected to the second black insertion node K, and a second electrode of the seventh transistor M7 is electrically connected to the first pull-up node Q<1>.

For example, in the case where the second control signal is at the high level, the seventh transistor M7 is turned on under the control of the second control signal, and transmits the black insertion input signal from the second black insertion node K to the first pull-up node Q<1>, so as to charge the first pull-up node Q<1>. As a result, the voltage of the first pull-up node Q<1> increases.

Figure 16:
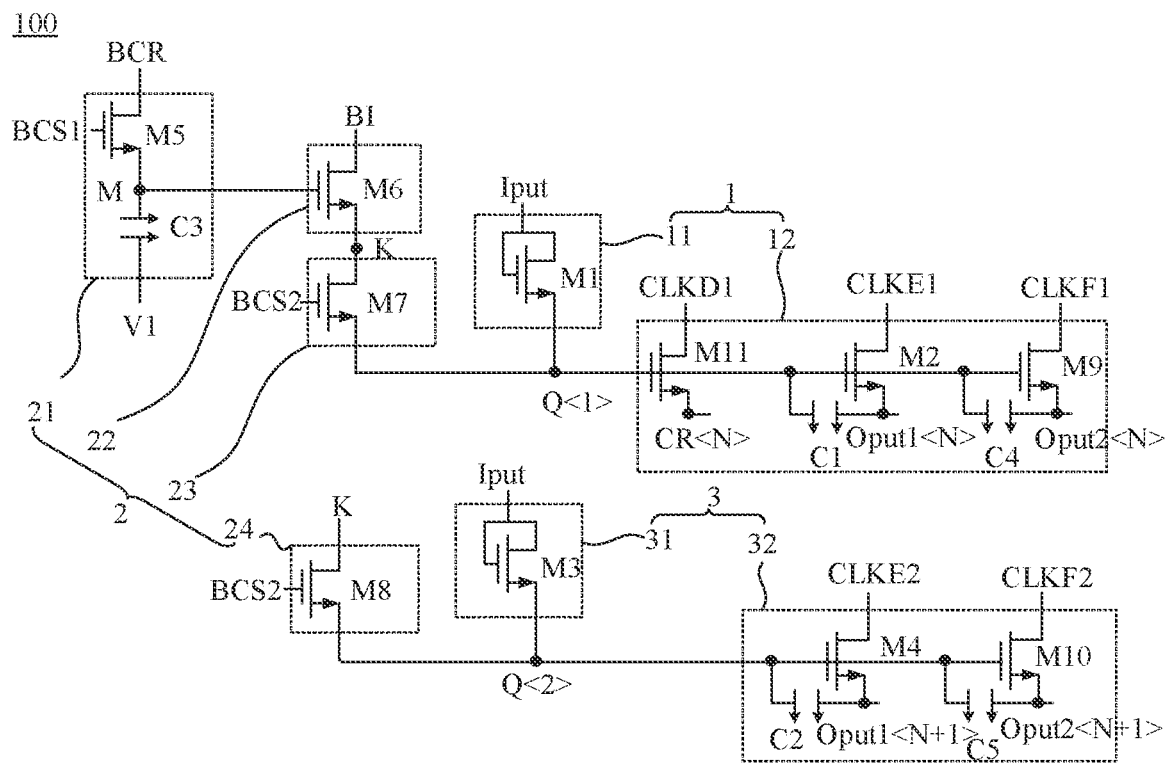
FIG. 16 is a circuit diagram of yet another shift register, in accordance with some embodiments of the present disclosure.
Figure 18:
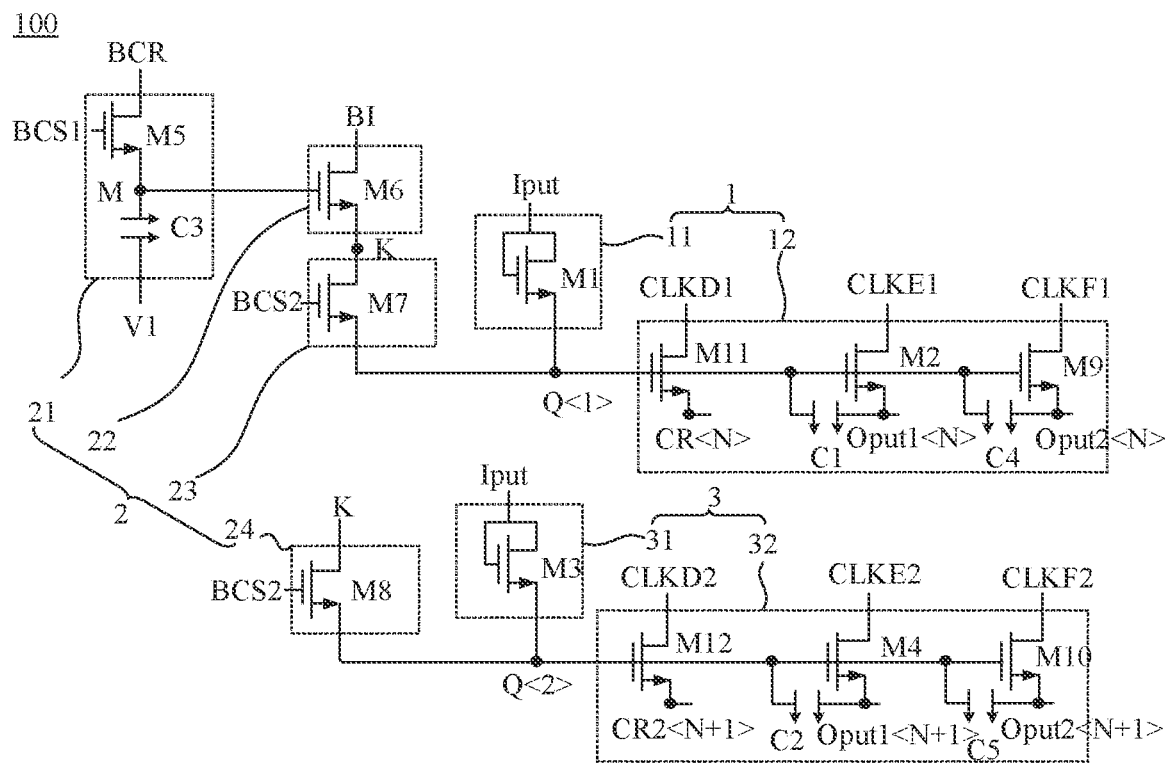
FIG. 18 is a circuit diagram of yet another shift register, in accordance with some embodiments of the present disclosure.
Figure 19:
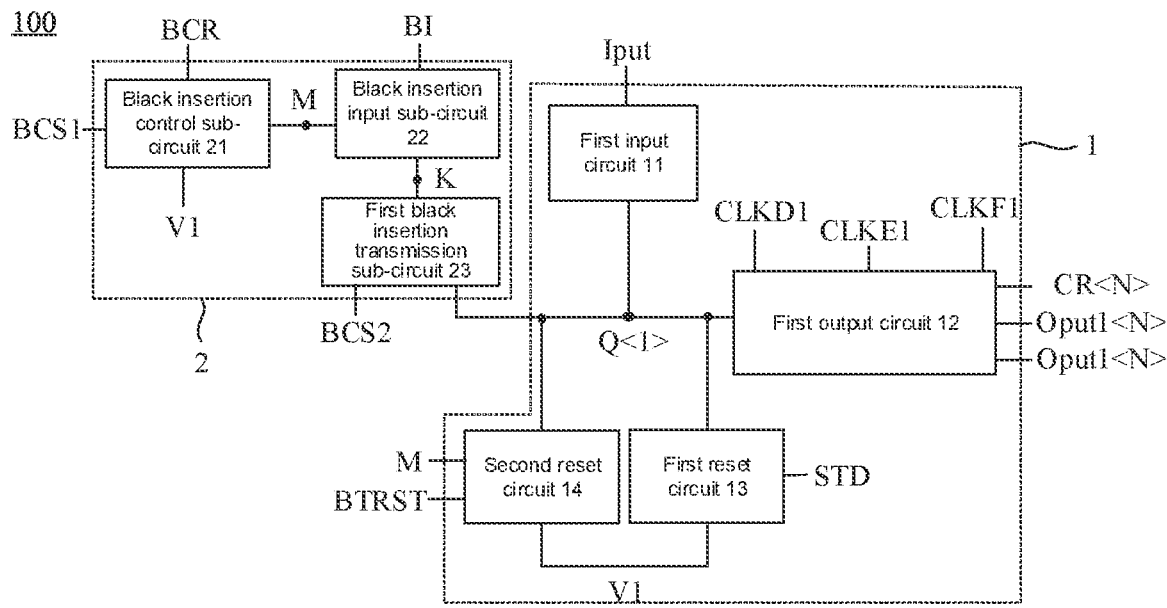
FIG. 19 is a structural diagram of yet another shift register in accordance with some embodiments of the present disclosure.

In some examples, as shown in FIGS. 12, 16 and 18, the second black insertion transmission sub-circuit 24 includes an eighth transistor M8.

For example, as shown in FIGS. 12, 16 and 18, a control electrode of the eighth transistor M8 is electrically connected to the second control signal terminal BCS2, a first electrode of the eighth transistor M8 is electrically connected to the second black insertion node K, and a second electrode of the eighth transistor M8 is electrically connected to the second pull-up node Q<2>.

For example, in the case where the second control signal is at the high level, the eighth transistor M8 is turned on under the control of the second control signal, and transmits the black insertion input signal from the second black insertion node K to the second pull-up node Q<2>, so as to charge the second pull-up node Q<2>. As a result, the voltage of the second pull-up node Q<2> increases.

In some examples, as shown in FIGS. 10, 12, 14, 16 and 18, the first input circuit 11 includes a first transistor M1.

For example, as shown in FIGS. 10, 12, 14, 16 and 18, a control electrode of the first transistor M1 is electrically connected to the display input signal terminal Iput, a first electrode of the first transistor M1 is electrically connected to the display input signal terminal Iput, and a second electrode of the first transistor M1 is electrically connected to the first pull-up node Q<1>.

For example, in the case where the display input signal is at the high level, the first transistor M1 is turned on due to the action of the display input signal, receives the display input signal, and transmits the display input signal to the first pull-up node Q<1>, so as to charge the first pull-up node Q<1>. As a result, the voltage of the first pull-up node Q<1> increases.

In some examples, as shown in FIGS. 10, 12, 14, 16 and 18, the first output circuit 12 includes a second transistor M2 and a first capacitor C1.

For example, as shown in FIGS. 10, 12, 14, 16 and 18, a control electrode of the second transistor M2 is electrically connected to the first pull-up node Q<1>, a first electrode of the second transistor M2 is electrically connected to the first clock signal terminal CLKE1, and a second electrode of the second transistor M2 is electrically connected to the first scan signal terminal Oput1<N>.

For example, in the case where the voltage of the first pull-up node Q<1> is at the high level, the second transistor M2 may be turned on under control of the first pull-up node Q<1>, and output the first clock signal received at the first clock signal terminal CLKE1 from the first scan signal terminal Oput1<N>. The first scan signal output by the first scan signal terminal Oput1<N> has different functions when the second transistor M2 is turned on in different periods, reference may be specifically made to the description of some of the above examples, and details will not be repeated here.

For example, as shown in FIGS. 10, 12, 14, 16 and 18, a first terminal of the first capacitor C1 is electrically connected to the first pull-up node Q<1>, and a second terminal of the first capacitor C1 is electrically connected to the first scan signal terminal Oput1<N>.

For example, in a process that the first transistor M1 in the first input circuit 12 is turned on and charges the first pull-up node Q<1>, the first capacitor C1 is also charged. After the first transistor M1 is turned off, the first capacitor C1 may discharge, so that the voltage of the first pull-up node Q<1> remains at a high level.

For another example, in a process that the black insertion circuit 2 is turned on and charges the first pull-up node Q<1>, the first capacitor C1 is also charged. After the black insertion circuit 2 is turned off, the first capacitor C1 may discharge, so that the voltage of the first pull-up node Q<1> remains at a high level.

In some examples, as shown in FIGS. 14, 16 and 18, in a case where the first output circuit 12 is further electrically connected to the third clock signal terminal CLKF1 and the first sensing signal terminal Oput2<N>, the first output circuit 12 further includes a ninth transistor M9 and a fourth capacitor C4.

For example, as shown in FIGS. 14, 16 and 18, a control electrode of the ninth transistor M9 is electrically connected to the first pull-up node Q<1>, a first electrode of the ninth transistor M9 is electrically connected to the third clock signal terminal CLKF1, and a second electrode of the ninth transistor M9 is electrically connected to the first sensing signal terminal Oput2<N>.

For example, in the case where the voltage of the first pull-up node Q<1> is at the high level, the ninth transistor M9 may be turned on under the control of the first pull-up node Q<1>, and output the third clock signal received at the third clock signal terminal CLKF1 from the first sensing signal terminal Oput2<N>. The first sensing signal output by the first sensing signal terminal Oput2<N> has different functions when the ninth transistor M9 is turned on in different periods, reference may be specifically made to the description of some of the above examples, and details will not be repeated here.

For example, as shown in FIGS. 14, 16 and 18, a first terminal of the fourth capacitor C4 is electrically connected to the first pull-up node Q<1>, and a second terminal of the fourth capacitor C4 is electrically connected to the first sensing signal terminal Oput2<N>.

For example, in a process that the first transistor M1 in the first input circuit 11 is turned on and charges the first pull-up node Q<1>, the fourth capacitor C4 is also charged. After the first transistor M1 is turned off, the fourth transistor C4 may discharge, so that the voltage of the first pull-up node Q<1> remains at a high level.

For another example, in the process that the black insertion circuit 2 is turned on and charges the first pull-up node Q<1>, the fourth capacitor C4 is also charged. After the black insertion circuit 2 is turned off, the fourth capacitor C4 may discharge, so that the voltage of the first pull-up node Q<1> remains at a high level.

In some examples, as shown in FIGS. 12, 16 and 18, the second input circuit 31 includes a third transistor M3.

For example, as shown in FIGS. 12, 16 and 18, a control electrode of the third transistor M3 is electrically connected to the display input signal terminal Iput, a first electrode of the third transistor M3 is electrically connected to the display input signal terminal Iput, and a second electrode of the third transistor M3 is electrically connected to the second pull-up node Q<2>.

For example, in the case where the display input signal is at the high level, the third transistor M3 may be turned on due to the action of the display input signal, receive the display input signal, and transmit the display input signal to the second pull-up node Q<2>, so as to charge the second pull-up node Q<2>. As a result, the voltage of the second pull-up node Q<2> increases.

In some examples, as shown in FIGS. 12, 16 and 18, the second output circuit 32 includes a fourth transistor M4 and a second capacitor C2.

For example, as shown in FIGS. 12, 16 and 18, a control electrode of the fourth transistor M4 is electrically connected to the second pull-up node Q<2>, a first electrode of the fourth transistor M4 is electrically connected to the second clock signal terminal CLKE2, and a second electrode of the fourth transistor M4 is electrically connected to the second scan signal terminal Oput1<N+1>.

For example, in the case where the voltage of the second pull-up node Q<2> is at the high level, the fourth transistor M4 may be turned on under control of the second pull-up node Q<2>, and output the second clock signal received at the second clock signal terminal CLKE2 from the second scan signal terminal Oput1<N+1>. The second scan signal output by the second scan signal terminal Oput1<N+1> has different functions when the fourth transistor M4 is turned on in different periods, reference may be specifically made to the description of some of the above examples, and details will not be repeated here.

For example, as shown in FIGS. 12, 16 and 18, a first terminal of the second capacitor C2 is electrically connected to the second pull-up node Q<2>, and a second terminal of the second capacitor C2 is electrically connected to the second scan signal terminal Oput1<N+1>.

For example, in a process that the third transistor M3 in the second input circuit 31 is turned on and charges the second pull-up node Q<2>, the second capacitor C2 is also charged. After the third transistor M3 is turned off, the second capacitor C2 may discharge, so that the voltage of the second pull-up node Q<2> remains at a high level.

For another example, in the process that the black insertion circuit 2 is turned on and charges the second pull-up node Q<2>, the second capacitor C2 is also charged. After the black insertion circuit 2 is turned off, the second capacitor C2 may discharge, so that the voltage of the second pull-up node Q<2> remains at a high level.

In some examples, as shown in FIG. 16, in a case where the second output circuit 32 is further electrically connected to the fourth clock signal terminal CLKF2 and the second sensing signal terminal Oput2<N+1>, the second output circuit 32 further includes a tenth transistor M10 and a fifth capacitor C5.

For example, as shown in FIG. 16, a control electrode of the tenth transistor M10 is electrically connected to the second pull-up node Q<2>, a first electrode of the tenth transistor M10 is electrically connected to the fourth clock signal terminal CLKF2, and a second electrode of the tenth transistor MID is electrically connected to the second sensing signal terminal Oput2<N+1>.

For example, in the case where the voltage of the second pull-up node Q<2> is at the high level, the tenth transistor M10 may be turned on under the control of the second pull-up node Q<2>, and output the fourth clock signal received at the fourth clock signal terminal CLKF2 from the second sensing signal terminal Oput2<N+1>. The second sensing signal output by the second sensing signal terminal Oput2<N+1> has different functions when the tenth transistor M10 is turned on in different periods, reference may be specifically made to the description of some of the above examples, and details will not be repeated here.

For example, as shown in FIGS. 16 and 18, a first terminal of the fifth capacitor C5 is electrically connected to the second pull-up node Q<2>, and a second terminal of the fifth capacitor C5 is electrically connected to the second sensing signal terminal Oput2<N+1>.

For example, in the process that the third transistor M3 in the second input circuit 31 is turned on and charges the second pull-up node Q<2>, the fifth capacitor C5 is also charged. After the third transistor M3 is turned off, the fifth capacitor C5 may discharge, so that the voltage of the second pull-up node Q<2> remains at a high level.

For another example, in the process that the black insertion circuit 2 is turned on and charges the second pull-up node Q<2>, the fifth capacitor C5 is also charged. After the black insertion circuit 2 is turned off, the fifth capacitor C5 may discharge, so that the voltage of the second pull-up node Q<2> remains at a high level.

In some embodiments, as shown in FIGS. 13 to 18, the first output circuit 12 is further electrically connected to a fifth clock signal terminal CLKD1 and a first shift signal terminal CR<N>. The first output circuit 12 is further configured to transmit a fifth clock signal received at the fifth clock signal terminal CLKD1 to the first shift signal terminal CR<N> under the control of the voltage of the first pull-up node Q<1>.

For example, in the case where the voltage of the first pull-up node Q<1> is at the high level, the first output circuit 12 may be turned on under the control of the voltage of the first pull-up node Q<1>, and output the fifth clock signal received at the fifth clock signal terminal CLKD1 as a first shift signal from the first shift signal terminal CR<N>.

The structure of the first output circuit 12 is schematically described below with reference to the accompanying drawings.

In some examples, as shown in FIG. 14, the first output circuit 12 further includes an eleventh transistor M11.

For example, as shown in FIG. 14, a control electrode of the eleventh transistor M11 is electrically connected to the first pull-up node Q<1>, a first electrode of the eleventh transistor M11 is electrically connected to the fifth clock signal terminal CLKD1, and a second electrode of the eleventh transistor M11 is electrically connected to the first shift signal terminal CR<N>.

For example, in the case where the voltage of the first pull-up node Q<1> is at the high level, the eleventh transistor M11 may be turned on under the control of the voltage of the first pull-up node Q<1>, and output the fifth clock signal received at the fifth clock signal terminal CLKD1 as the first shift signal from the first shift signal terminal CR<N>.

Figure 17:
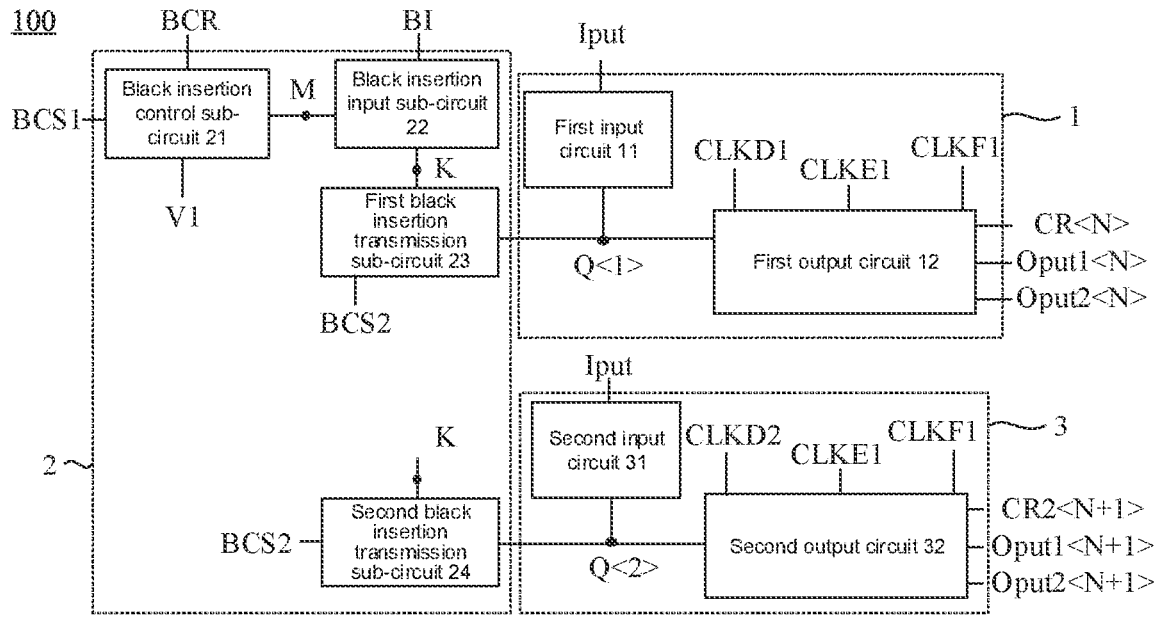
FIG. 17 is a structural diagram of yet another shift register, in accordance with some embodiments of the present disclosure.

In some embodiments, as shown in FIGS. 17 and 18, in the case where the shift register 100 further includes the second scan unit 3, the second output circuit 32 is further electrically connected to a sixth clock signal terminal CLKD2 and a second shift signal terminal CR2<N+1>. The second output circuit 32 is further configured to transmit a sixth clock signal received at the sixth clock signal terminal CLKD2 to the second shift signal terminal CR2<N+1> under the control of the voltage of the second pull-up node Q<2>.

For example, in the case where the voltage of the second pull-up node Q<2> is at the high level, the second output circuit 32 may be turned on under the control of the voltage of the second pull-up node Q<2>, and output the sixth clock signal received at the sixth clock signal terminal CLKD2 as a second shift signal from the second shift signal terminal CR2<N+1>.

The structure of the second output circuit 32 is schematically described below with reference to the accompanying drawings.

In some examples, as shown in FIG. 18, the second output circuit 32 further includes a twelfth transistor M12.

For example, a control electrode of the twelfth transistor M12 is electrically connected to the second pull-up node Q<2>, a first electrode of the twelfth transistor M12 is electrically connected to the sixth clock signal terminal CLKD2, and a second electrode of the twelfth transistor M12 is electrically connected to the second shift signal terminal CR2<N+1>.

For example, in the case where the voltage of the second pull-up node Q<2> is at the high level, the twelfth transistor M12 may be turned on under the control of the voltage of the second pull-up node Q<2>, and output the sixth clock signal received at the sixth clock signal terminal CLKD2 as the second shift signal from the second shift signal terminal CR2<N+1>.

It will be noted that the first shift signal terminal CR<N> and the second shift signal terminal CR2<N+1> are both used for cascading, so as to simplify the structure of the scan driving circuit 1000 and reduce the area occupied by the scan driving circuit 1000 in the bezel area B. That is, in a case where shift registers are cascaded by using the shift signal terminals, the first output circuit 12 or the second output circuit 32 may be electrically connected to the corresponding shift signal terminal, in a case where shift registers are not cascaded by using the shift signal terminals, the first output circuit 12 or the second output circuit 32 may not be electrically connected to the corresponding shift signal terminal (i.e., not including the corresponding transistor).

In the embodiments of the present disclosure, the cascade manner varies, and reference may be made to the description of the following embodiments, which will not be described in detail here.

In a case where the display input signal terminal Iput is electrically connected to a certain shift signal terminal, and the black insertion cascade signal terminal BCR is electrically connected to a certain shift signal terminal, the shift signal terminals electrically connected to the two belong to different scan units, respectively. In this way, it may be possible to avoid a case where the first input circuit 11, the second input circuit 31 and the black insertion circuit in the same shift register 100 are simultaneously turned on caused by being connected to the same shift signal terminal, so that a problem that a process of displaying an image normally and a process of inserting a black image are in conflict with each other may be avoided.

In some embodiments, the shift register 100 may further include other circuit structures, which may be specifically set according to actual needs.

Figure 29:
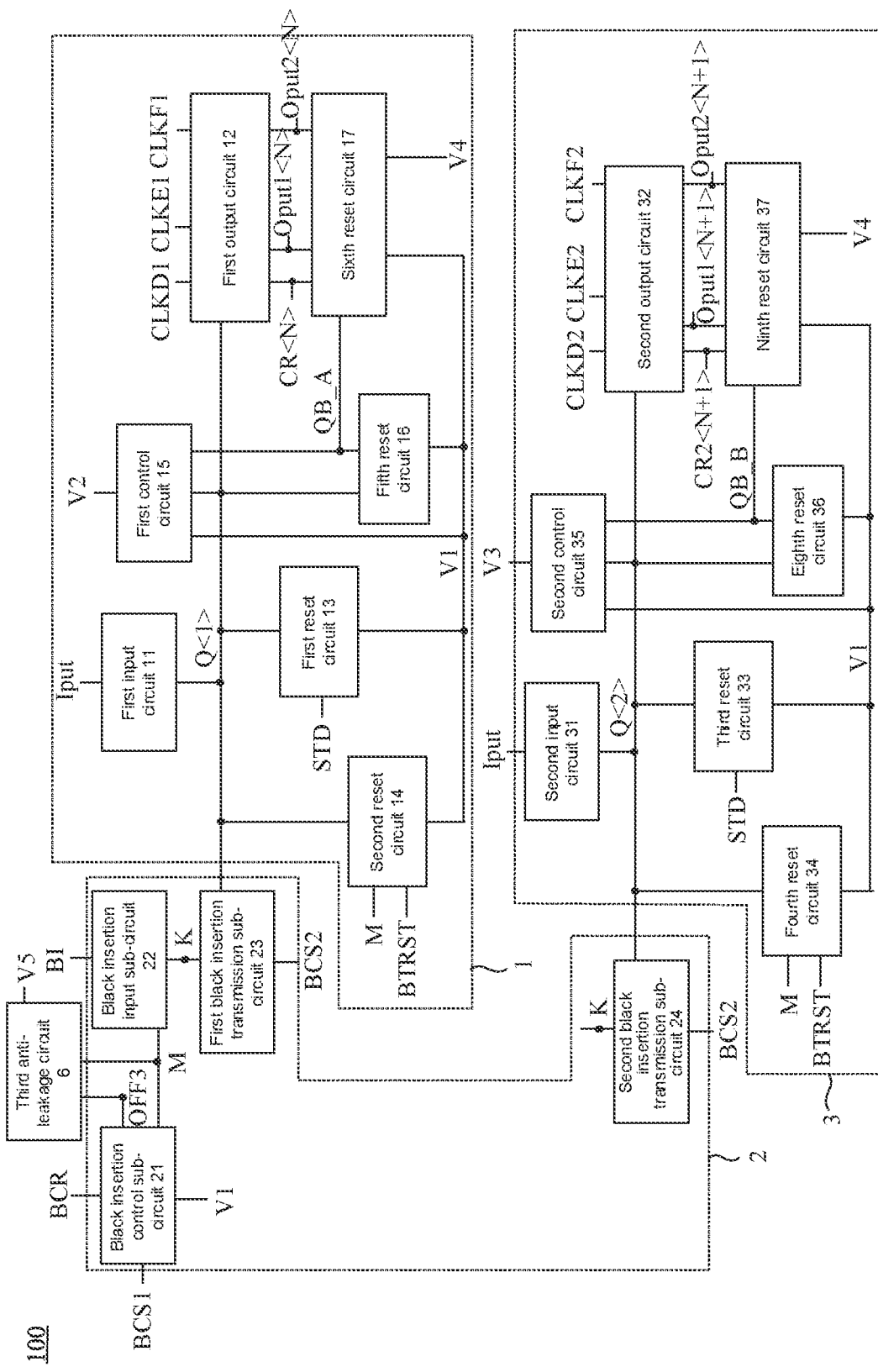
FIG. 29 is a structural diagram of yet another shift register, in accordance with some embodiments of the present disclosure.
Figure 30:
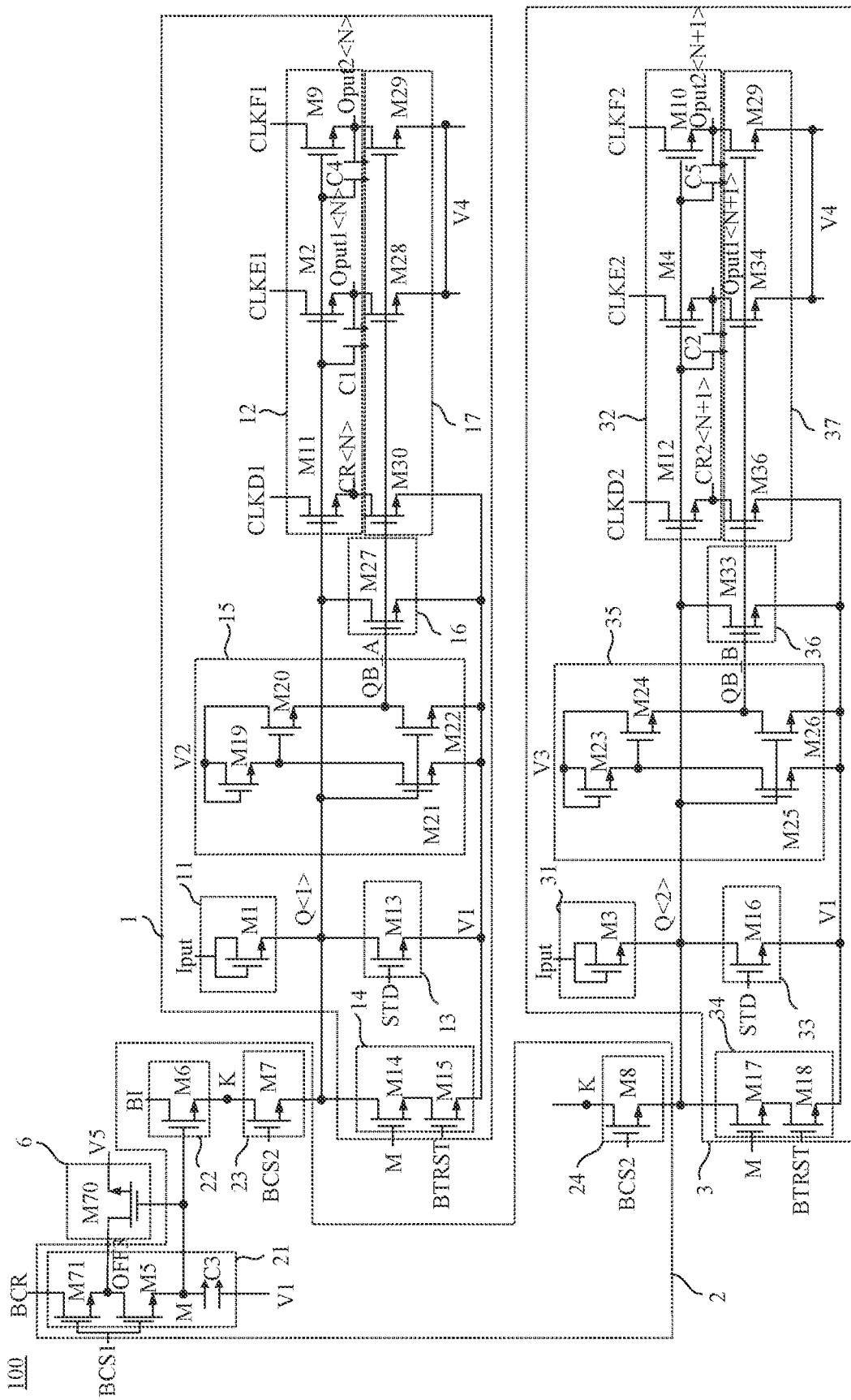
FIG. 30 is a circuit diagram of yet another shift register, in accordance with some embodiments of the present disclosure.
Figure 31:
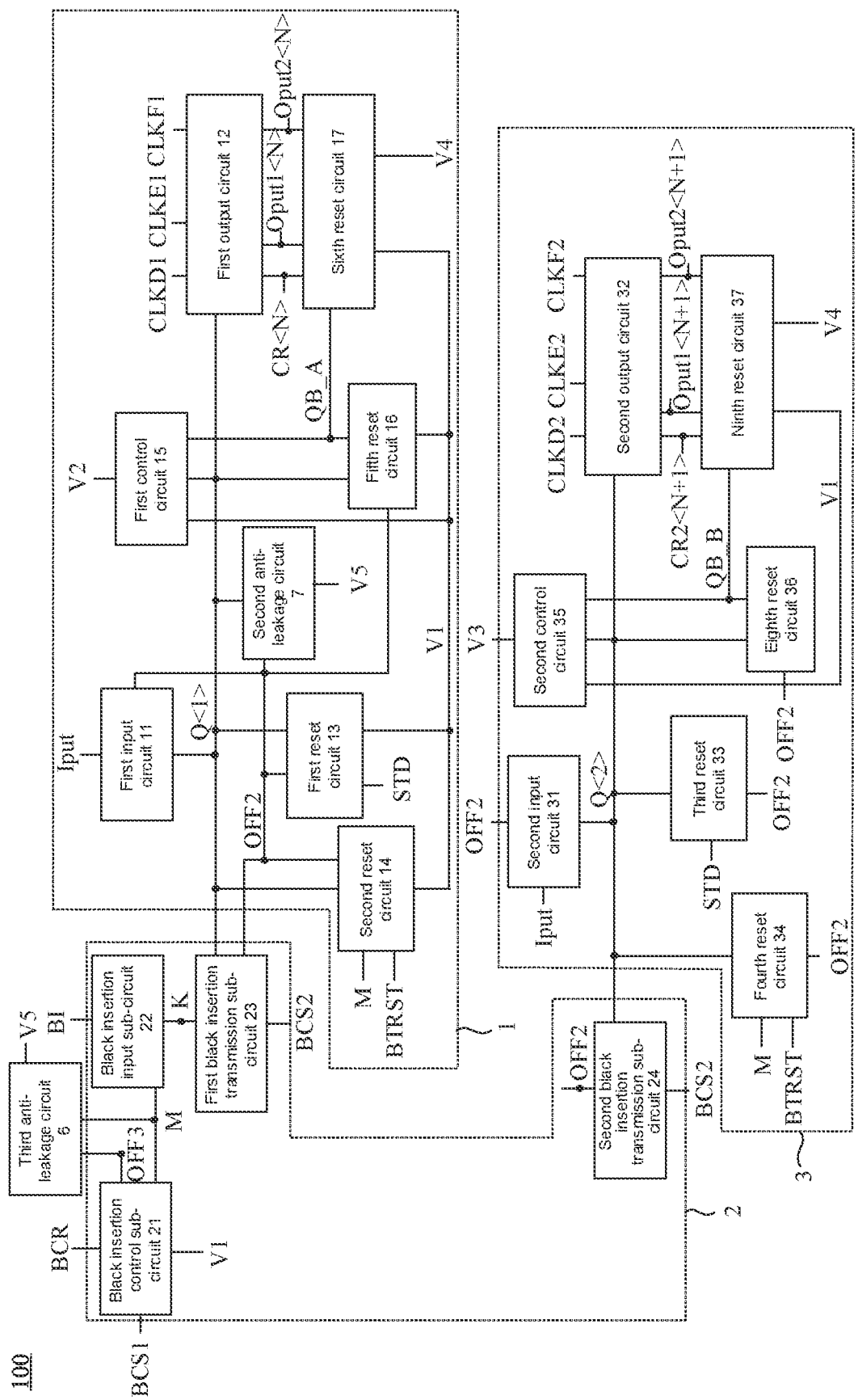
FIG. 31 is a structural diagram of yet another shift register, in accordance with some embodiments of the present disclosure.
Figure 32:
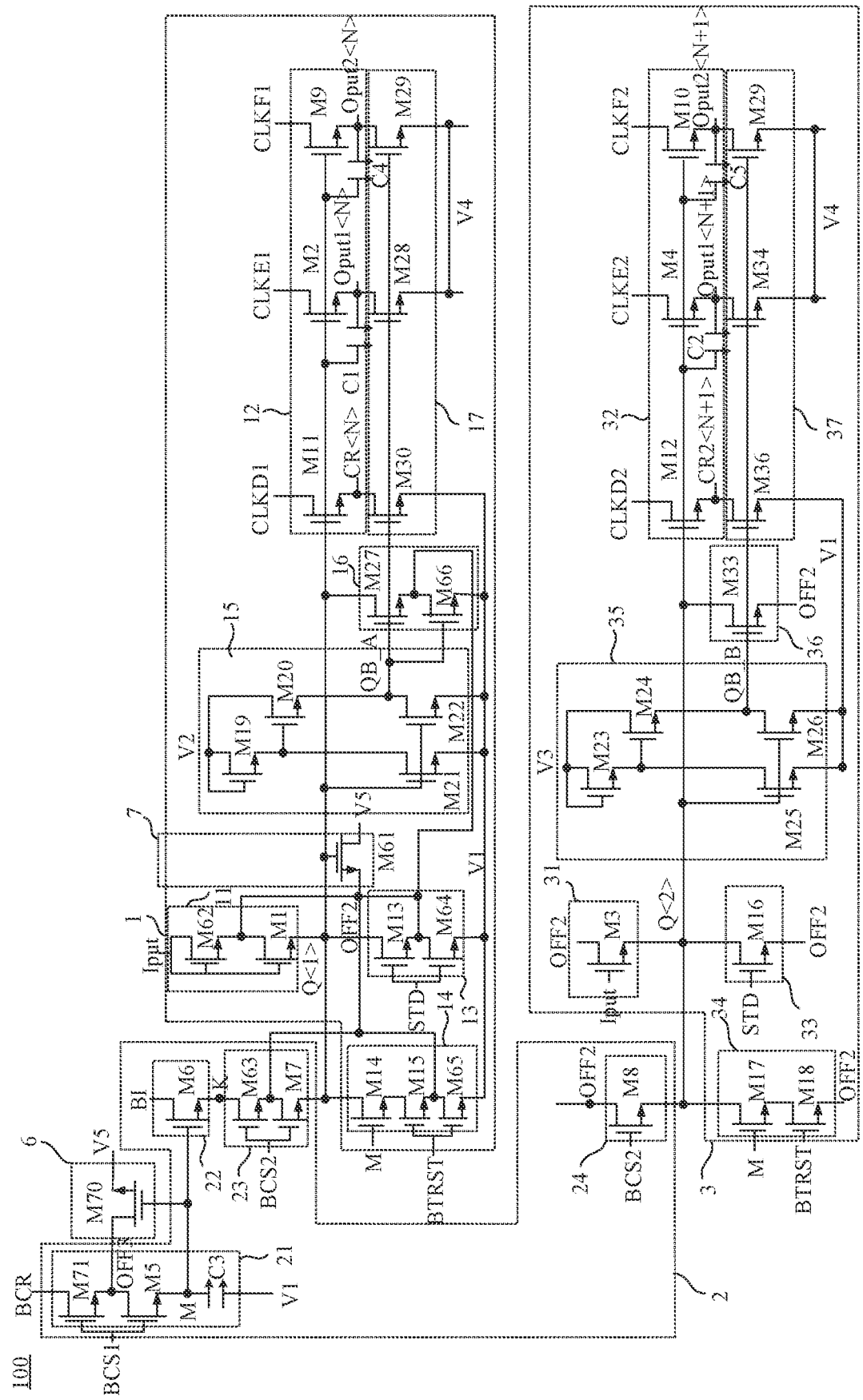
FIG. 32 is a circuit diagram of yet another shift register, in accordance with some embodiments of the present disclosure.
Figure 33:
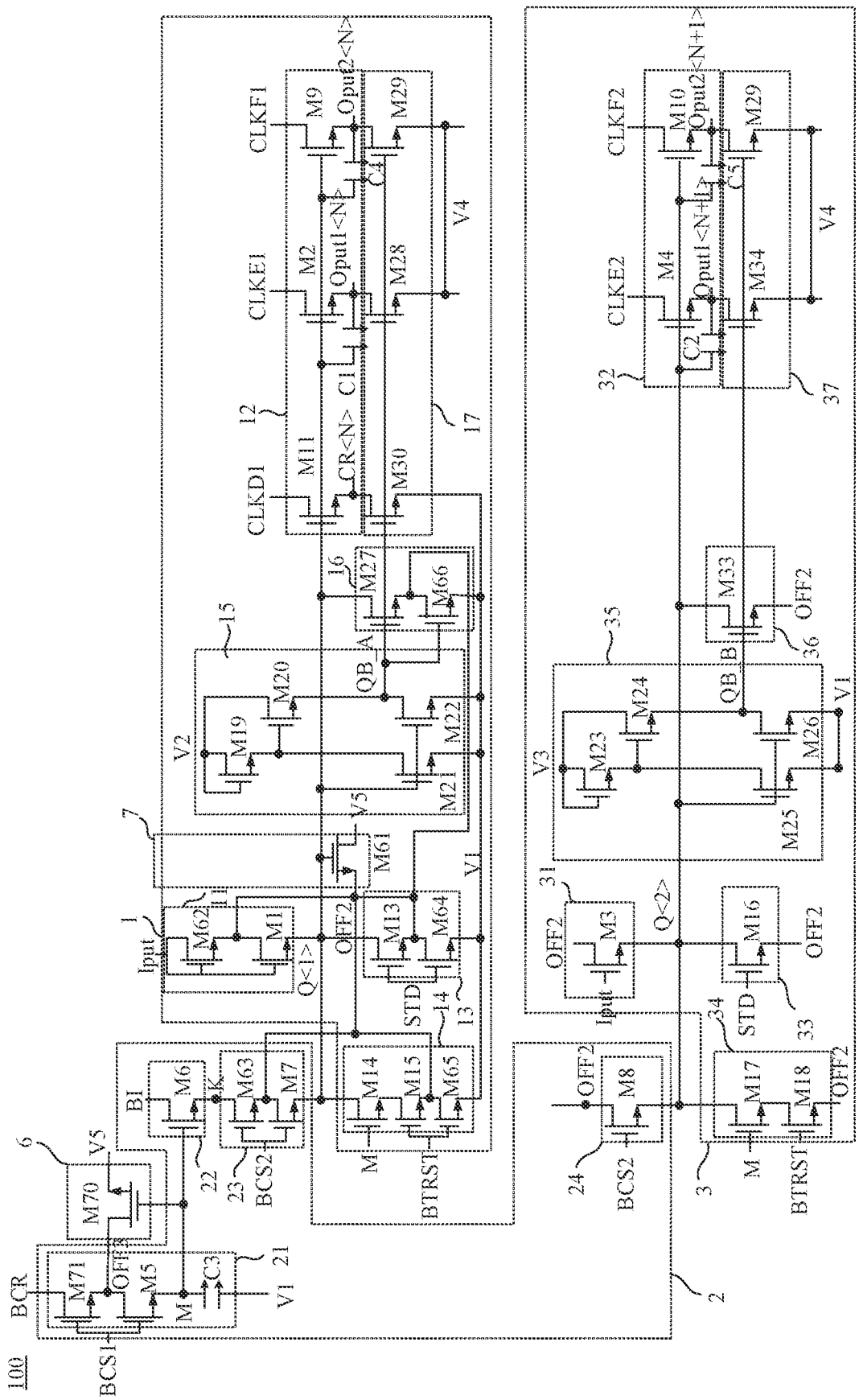
FIG. 33 is a circuit diagram of yet another shift register, in accordance with some embodiments of the present disclosure.

In some examples, as shown in FIGS. 29 to 30, the shift register 100 may further include a third anti-leakage circuit 6. The third anti-leakage circuit 6 is electrically connected to the first black insertion node M, a fifth voltage signal terminal V5 and a third anti-leakage node OFF3. The third anti-leakage circuit 6 is configured to transmit a fifth voltage signal received at the fifth voltage signal terminal V5 to the third anti-leakage node OFF3 under the control of the voltage of the first black insertion node M.

Here, the fifth voltage signal terminal V5 is configured to, for example, transmit a direct current high-level signal (e.g., higher than or equal to a high-level section of a clock signal).

For example, in the case where the voltage of the first black insertion node M is at the high level, the third anti-leakage circuit 6 is turned on under the control of the voltage of the first black insertion node M, receives the fifth voltage signal, and transmits the fifth voltage signal to the third anti-leakage node OFF3, so as to charge the third anti-leakage node OFF3. As a result, a voltage of the third anti-leakage node OFF3 increases.

In some examples, as shown in FIGS. 29 to 30, the black insertion control sub-circuit 21 is further electrically connected to the third anti-leakage node OFF3.

In a case where the fifth transistor M5 in the black insertion control sub-circuit 21 is turned off and the third capacitor C3 discharges so that the voltage of the first black insertion node M remains at a high level, the black insertion control sub-circuit 21 is electrically connected to the third anti-leakage node OFF3, so that a voltage difference between the third anti-leakage node OFF3 and the first black insertion node M may be reduced, so as to avoid a leakage of the first black insertion node M through the black insertion control sub-circuit 21. As a result, the first black insertion node M remains at a relatively high and relatively stable voltage to avoid affecting the turn-on state of the black insertion control sub-circuit 21.

The structures of the third anti-leakage circuit 6 and the black insertion control sub-circuit 21 are schematically described below with reference to the accompanying drawings.

In some examples, as shown in FIG. 30, the third anti-leakage circuit 6 includes a seventieth transistor M70.

For example, as shown in FIG. 30, a control electrode of the seventieth transistor M70 is electrically connected to the first black insertion node M, a first electrode of the seventieth transistor M70 is electrically connected to the fifth voltage signal terminal V5, and a second electrode of the seventieth transistor M70 is electrically connected to the third anti-leakage node OFF3.

For example, in the case where the voltage of the first black insertion node M is at the high level, the seventieth transistor M70 is turned on under the control of the voltage of the first black insertion node M, receives the fifth voltage signal, and transmits the fifth voltage signal to the third anti-leakage node OFF3, so as to charge the third anti-leakage node OFF3. As a result, the voltage of the third anti-leakage node OFF3 increases.

Based on this, in some examples, as shown in FIG. 30, the black insertion control sub-circuit 21 further includes a seventy-first transistor M71.

For example, a control electrode of the seventy-first transistor M71 is electrically connected to the first control signal terminal BCS1, a first electrode of the seventy-first transistor M71 is electrically connected to the black insertion cascade signal terminal BCR, and a second electrode of the seventy-first transistor M71 is electrically connected to the third anti-leakage node OFF3. The first electrode of the fifth transistor M5 in the black insertion control sub-circuit 21 is electrically connected to the third anti-leakage node OFF3, and is electrically connected to the black insertion cascade signal terminal BCR through the seventy-first transistor M71.

For example, in the case where the first control signal is at the high level, the fifth transistor M5 and the seventy-first transistor M71 may be simultaneously turned on due to an action of the first control signal. The seventy-first transistor M71 may receive the black insertion cascade signal, and transmit the black insertion cascade signal to the third anti-leakage node OFF3, and the fifth transistor M5 may receive the black insertion cascade signal, and transmit the black insertion cascade signal to the first black insertion node M to charge the first black insertion node M.

In a case where the first control signal is at a low level, the fifth transistor M5 and the seventy-first transistor M71 may be simultaneously turned off due to the action of the first control signal. The third capacitor C3 in the black insertion control sub-circuit 21 starts to discharge, so that the voltage of the first black insertion node M remains at a high level. In this process, the seventieth transistor M70 in the third anti-leakage circuit 6 may transmit the fifth voltage signal to the third anti-leakage node OFF3 to charge the third anti-leakage node OFF3, which reduces the voltage difference between the third anti-leakage node OFF3 and the first black insertion node M and makes a voltage difference between the control electrode and the first electrode of the fifth transistor M5 less than zero, thereby ensuring that the fifth transistor M5 is completely or relatively completely turned off. In this way, the leakage of the first black insertion node M through the black insertion control sub-circuit 21 may be avoided, so that the first black insertion node M remains at the relatively high and relatively stable voltage.

In some embodiments, the shift register 100 may further include other circuit structures, which may be specifically set according to actual needs.

In some examples, as shown in FIGS. 19 to 22, the first scan unit 1 in the shift register 100 may further include a first reset circuit 13 and a second reset circuit 14.

For example, as shown in FIGS. 19 to 22, the first reset circuit 13 is electrically connected to a first reset signal terminal STD, the first pull-up node Q<1> and the first voltage signal terminal V1. The first reset circuit 13 is configured to transmit a first voltage signal received at the first voltage signal terminal V1 to the first pull-up node Q<1> under control of a first reset signal transmitted by the first reset signal terminal STD.

For example, in a case where the first reset signal is at a high level, the first reset circuit 13 is turned on under the control of the first reset signal, and transmits the first voltage signal received at the first voltage signal terminal V1 to the first pull-up node Q<1>, so as to perform pull-down reset on the first pull-up node Q<1>.

It will be noted that after the plurality stages of shift registers 100 are cascaded to constitute the scan driving circuit 1000, except first few stages of shift registers 100 (e.g., a first stage shift register 100 and a second stage shift register 100), a first reset signal terminal STD of each of remaining stages of shift registers may be electrically connected to a first shift signal terminal CR<N> of a subsequent stage of shift register 100. Therefore, a first shift signal output by a shift register 100 may serve as a first reset signal of a corresponding shift register 100.

Correspondingly, first reset signal terminals STD of a part of the shift registers 100 may be electrically connected to a display reset signal line, so as to receive a display reset signal transmitted by the display reset signal line as the first reset signal. The part of the shift registers 100 may be, for example, last two stages of shift registers 100 in the scan driving circuit 1000. In this way, cascade reset may be achieved.

For example, as shown in FIGS. 19 to 22, in the case where the black insertion circuit 2 includes the black insertion control sub-circuit 21, the second reset circuit 14 is electrically connected to a second reset signal terminal BTRST, the first black insertion node M, the first pull-up node Q<1> and the first voltage signal terminal V1. The second reset circuit 14 is configured to transmit the first voltage signal to the first pull-up node Q<1> under control of the voltage of the first black insertion node M and a second reset signal transmitted by the second reset signal terminal BTRST.

For example, in a case where the voltage of the first black insertion node M is at a high level and the second reset signal is at a high level, the second reset circuit 14 is turned on under the control of the voltage of the first black insertion node M and the second reset signal, and transmits the first voltage signal received at the first voltage signal terminal V1 to the first pull-up node Q<1>, so as to perform the pull-down reset on the first pull-up node Q<1>.

Here, for example, the second reset circuit 14 resets the first pull-up node Q<1> after the black insertion sub-period (i.e., after the black image is displayed).

Figure 21:
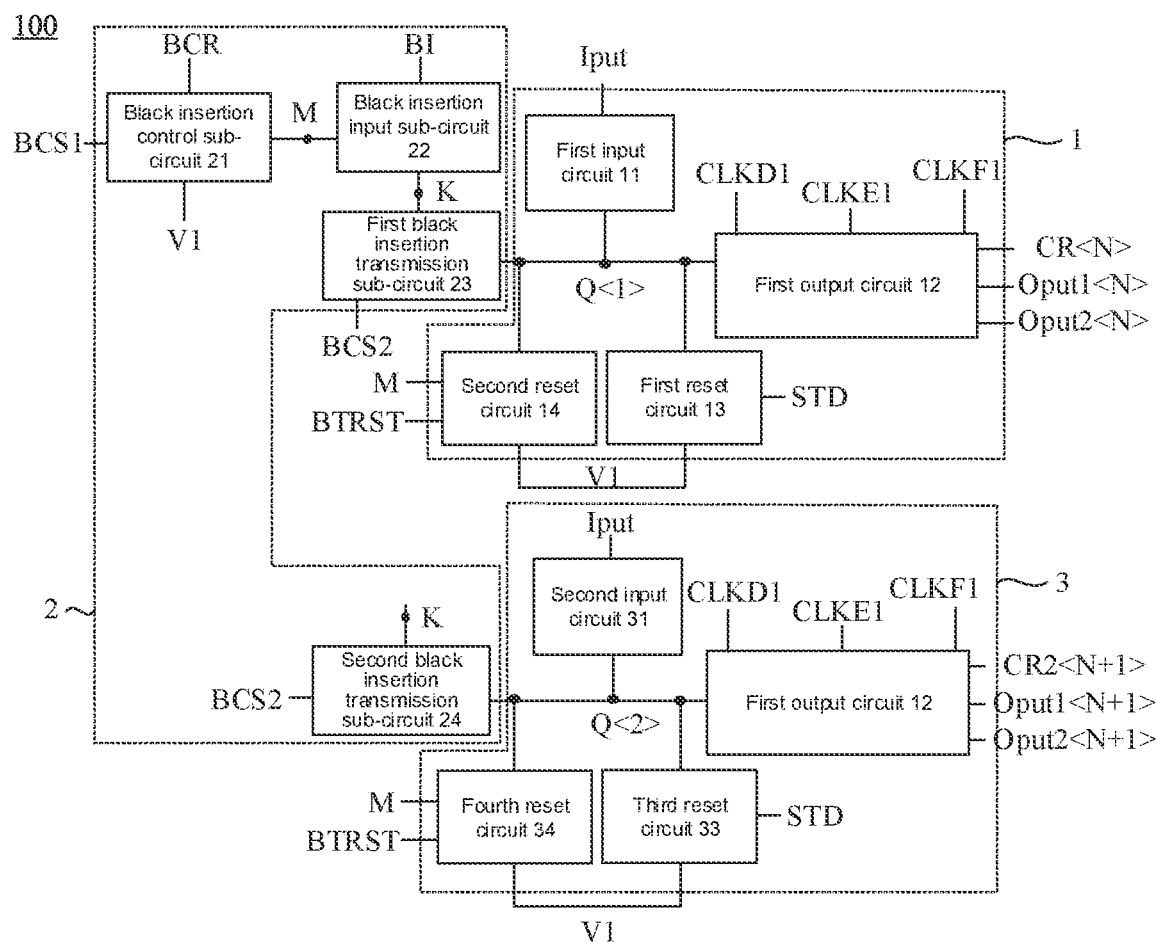
FIG. 21 is a structural diagram of yet another shift register, in accordance with some embodiments of the present disclosure.
Figure 22:
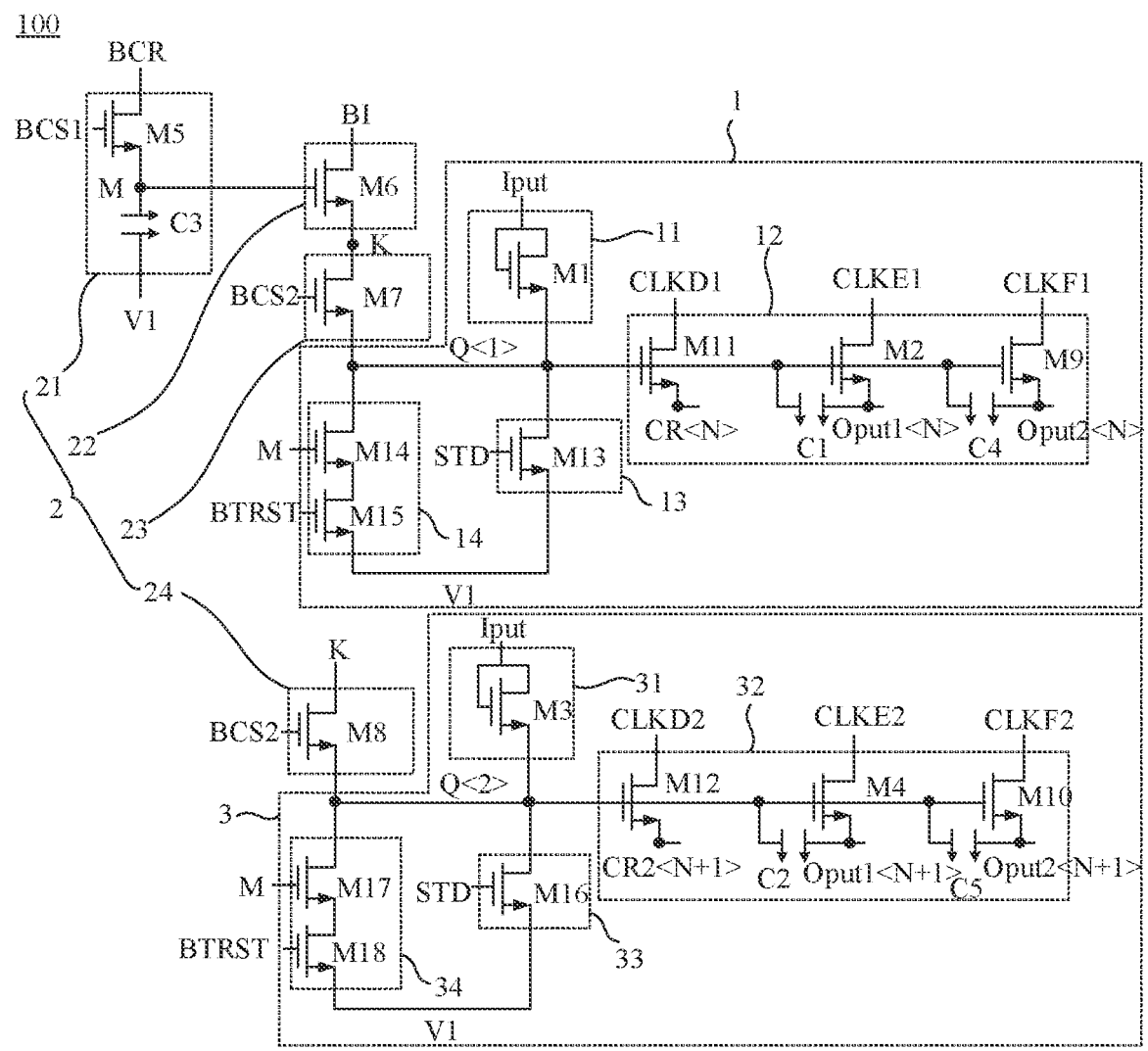
FIG. 22 is a circuit diagram of yet another shift register, in accordance with some embodiments of the present disclosure.

In some examples, as shown in FIGS. 21 to 22, in the case where the shift register 100 further includes the second scan unit 3, the second scan unit 3 may further include a third reset circuit 33 and a fourth reset circuit 34.

For example, as shown in FIGS. 21 to 22, the third reset circuit 33 is electrically connected to the first reset signal terminal STD, the second pull-up node Q<2> and the first voltage signal terminal V1. The third reset circuit 33 is configured to transmit the first voltage signal to the second pull-up node Q<2> under the control of the first reset signal.

For example, in the case where the first reset signal is at the high level, the third reset circuit 33 is turned on under the control of the first reset signal, and transmits the first voltage signal received at the first voltage signal terminal V1 to the second pull-up node Q<2>, so as to perform pull-down reset on the second pull-up node Q<2>.

Since the third reset circuit 33 and the first reset circuit 13 are both electrically connected to the first reset signal terminal STD, in the case where the first reset signal is at the high level, the third reset circuit 33 and the first reset circuit 13 are both turned on, so as to respectively perform the pull-down reset on the first pull-up node Q<1> and the second pull-up node Q<2> at the same time.

For example, as shown in FIGS. 21 to 22, the fourth reset circuit 34 is electrically connected to the second reset signal terminal BTRST, the first black insertion node M, the second pull-up node Q<2> and the first voltage signal terminal V1. The fourth reset circuit 34 is configured to transmit the first voltage signal to the second pull-up node Q<2> under the control of the voltage of the first black insertion node M and the second reset signal.

For example, in the case where the voltage of the first black insertion node M is at the high level and the second reset signal is at the high level, the fourth reset circuit 34 is turned on under the control of the voltage of the first black insertion node M and the second reset signal, and transmits the first voltage signal received at the first voltage signal terminal V1 to the second pull-up node Q<2>, so as to perform the pull-down reset on the second pull-up node Q<2>.

Since the fourth reset circuit 34 and the second reset circuit 14 are both electrically connected to the first black insertion node M and the second reset signal terminal BTRST, in the case where the voltage of the first black insertion node M is at the high level and the second reset signal is at the high level, the fourth reset circuit 34 and the second reset circuit 14 may be both turned on, so as to respectively perform the pull-down reset on the first pull-up node Q<1> and the second pull-up node Q<2> at the same time.

The structures of the first reset circuit 13, the second reset circuit 14, the third reset circuit 33 and the fourth reset circuit 44 are schematically described below with reference to the accompanying drawings.

Figure 20:
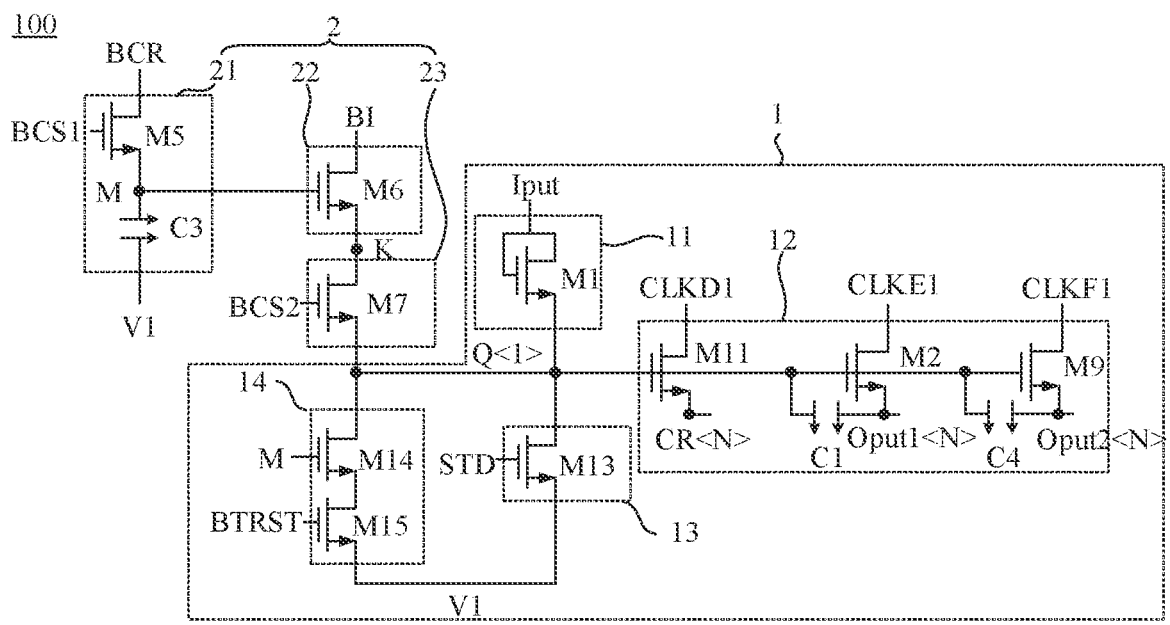
FIG. 20 is a circuit diagram of yet another shift register, in accordance with some embodiments of the present disclosure.

In some examples, as shown in FIGS. 20 and 22, the first reset circuit 13 includes a thirteenth transistor M13.

For example, as shown in FIGS. 20 and 22, a control electrode of the thirteenth transistor M13 is electrically connected to the first reset signal terminal STD, a first electrode of the thirteenth transistor M13 is electrically connected to the first pull-up node Q<1>, and a second electrode of the thirteenth transistor M13 is electrically connected to the first voltage signal terminal V1.

For example, in the case where the first reset signal is at the high level, the thirteenth transistor M13 is turned on under the control of the first reset signal, receives the first voltage signal, and transmits the first voltage signal to the first pull-up node Q<1>, so as to perform the pull-down reset on the first pull-up node Q<1>.

In some examples, as shown in FIGS. 20 and 22, the second reset circuit 14 includes a fourteenth transistor M14 and a fifteenth transistor M15.

For example, as shown in FIGS. 20 and 22, a control electrode of the fourteenth transistor M14 is electrically connected to the first black insertion node M, a first electrode of the fourteenth transistor M14 is electrically connected to the first pull-up node Q<1>, and a second electrode of the fourteenth transistor M14 is electrically connected to a first electrode of the fifteenth transistor M15. A control electrode of the fifteenth transistor M15 is electrically connected to the second reset signal terminal BTRST, and a second electrode of the fifteenth transistor M15 is electrically connected to the first voltage signal terminal V1.

For example, in the case where the voltage of the first black insertion node M is at the high level and the second reset signal is at the high level, the fourteenth transistor M14 is turned on under the control of the voltage of the first black insertion node M, and the fifteenth transistor M15 is turned on under the control of the second reset signal; the fifteenth transistor M15 receives the first voltage signal, and transmit the first voltage signal to the second electrode of the fourteenth transistor M14, and the fourteenth transistor M14 transmits the first voltage signal to the first pull-up node Q<1>, so as to perform the pull-down reset on the first pull-up node Q<1>.

In some examples, as shown in FIG. 22, the third reset circuit 33 includes a sixteenth transistor M16.

For example, as shown in FIG. 22, a control electrode of the sixteenth transistor M16 is electrically connected to the first reset signal terminal STD, a first electrode of the sixteenth transistor M16 is electrically connected to the second pull-up node Q<2>, and a second electrode of the sixteenth transistor M16 is electrically connected to the first voltage signal terminal V1.

For example, in the case where the first reset signal is at the high level, the sixteenth transistor M16 is turned on under the control of the first reset signal, receives the first voltage signal, and transmits the first voltage signal to the second pull-up node Q<2>, so as to perform the pull-down reset on the second pull-up node Q<2>.

In some examples, as shown in FIG. 22, the fourth reset circuit 34 includes a seventeenth transistor M17 and an eighteenth transistor M18.

For example, as shown in FIG. 22, a control electrode of the seventeenth transistor M17 is electrically connected to the first black insertion node M, a first electrode of the seventeenth transistor M17 is electrically connected to the second pull-up node Q<2>, and a second electrode of the seventeenth transistor M17 is electrically connected to a first electrode of the eighteenth transistor M18. A control electrode of the eighteenth transistor M18 is electrically connected to the second reset signal terminal BTRST, and a second electrode of the eighteenth transistor M18 is electrically connected to the first voltage signal terminal V1.

For example, in the case where the voltage of the first black insertion node M is at the high level and the second reset signal is at the high level, the seventeenth transistor M17 is turned on under the control of the voltage of the first black insertion node M, and the eighteenth transistor M18 is turned on under the control of the second reset signal; the eighteenth transistor M18 receives the first voltage signal, and transmits the first voltage signal to the second electrode of the seventeenth transistor M17, and the seventeenth transistor M17 transmits the first voltage signal to the second pull-up node Q<2>, so as to perform the pull-down reset on the second pull-up node Q<2>.

In some embodiments, the shift register 100 may further include other circuit structures, which may be specifically set according to actual needs.

Figure 23:
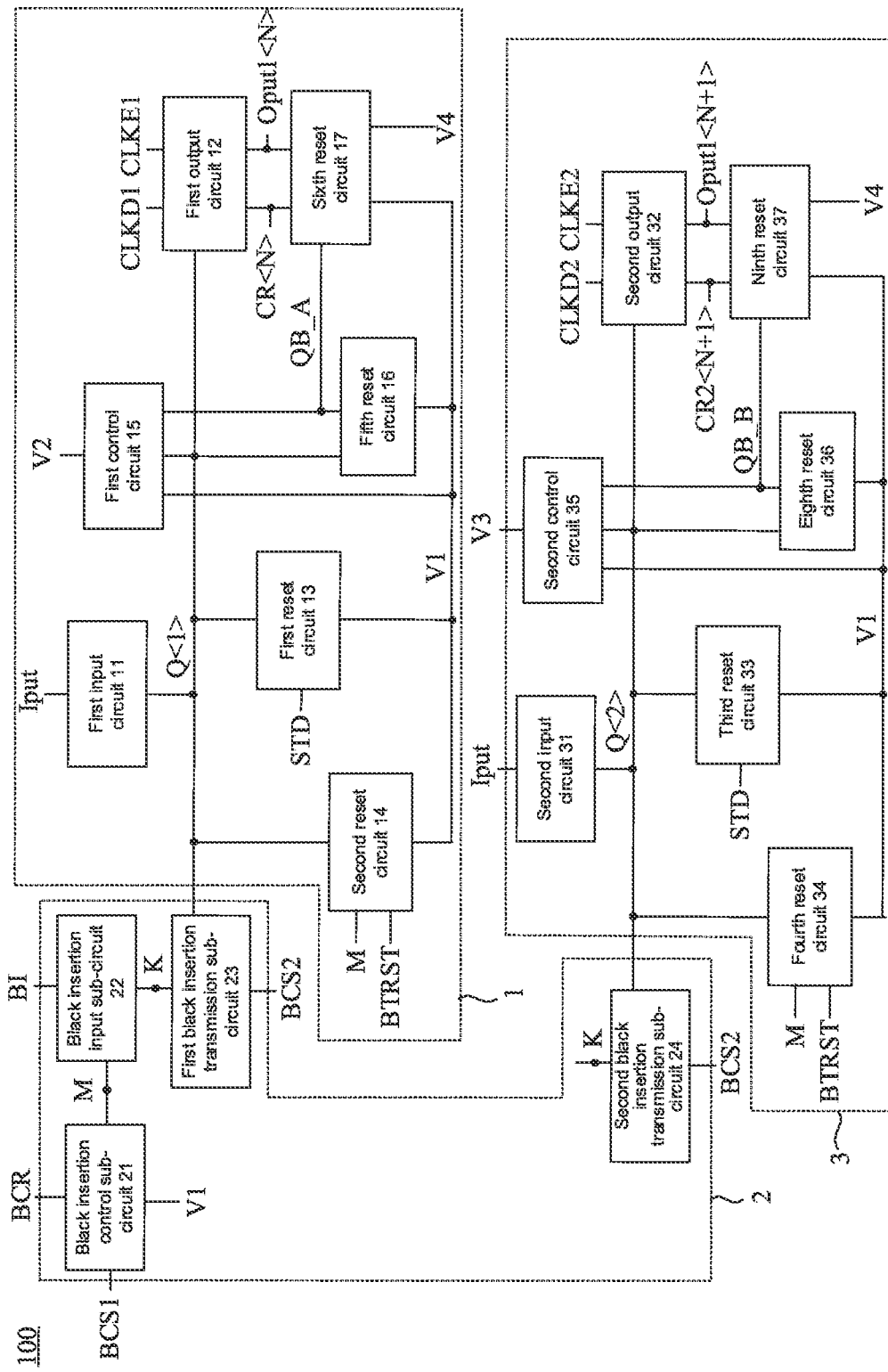
FIG. 23 is a structural diagram of yet another shift register, in accordance with some embodiments of the present disclosure.
Figure 24:
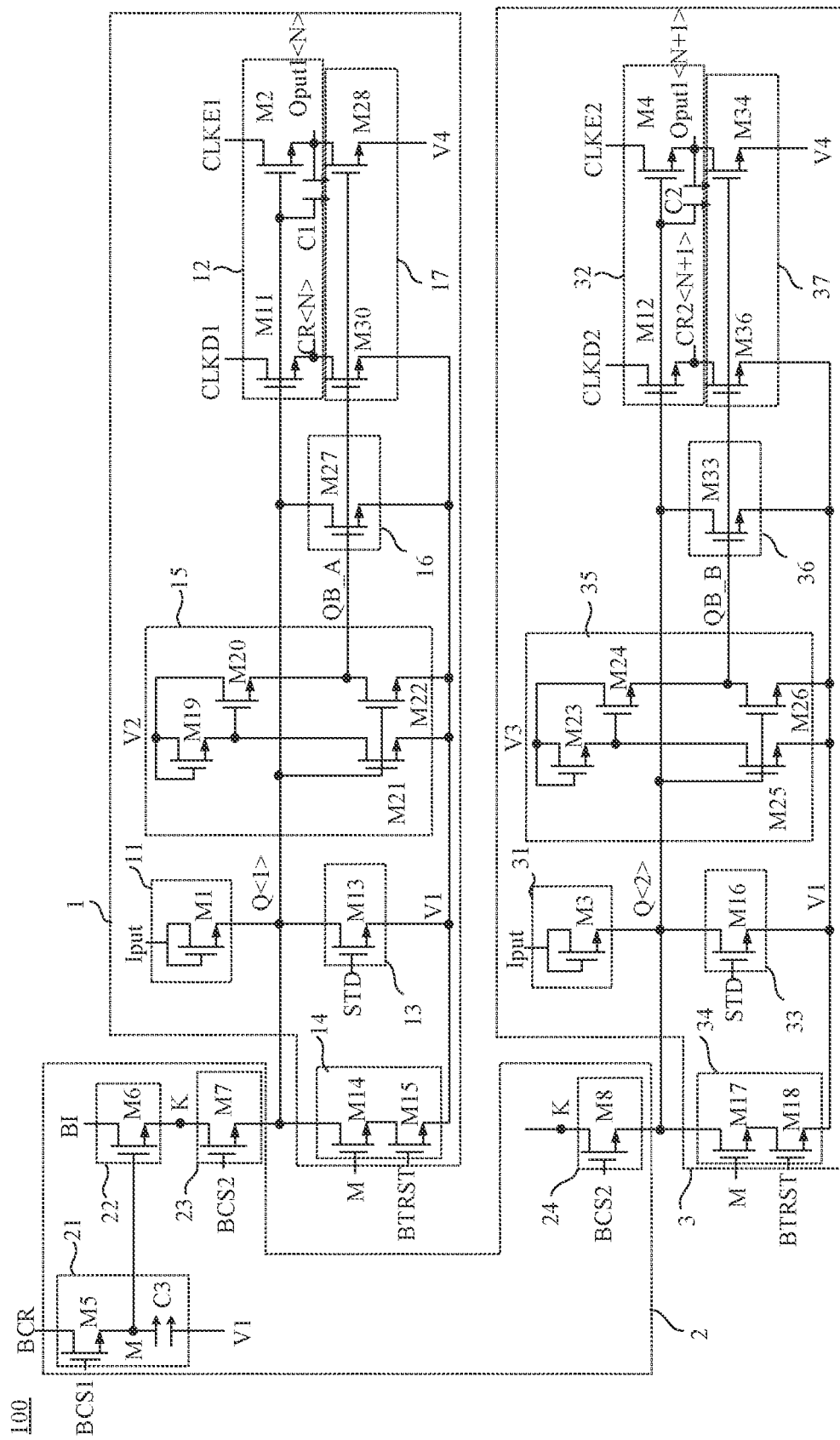
FIG. 24 is a circuit diagram of yet another shift register, in accordance with some embodiments of the present disclosure.
Figure 25:
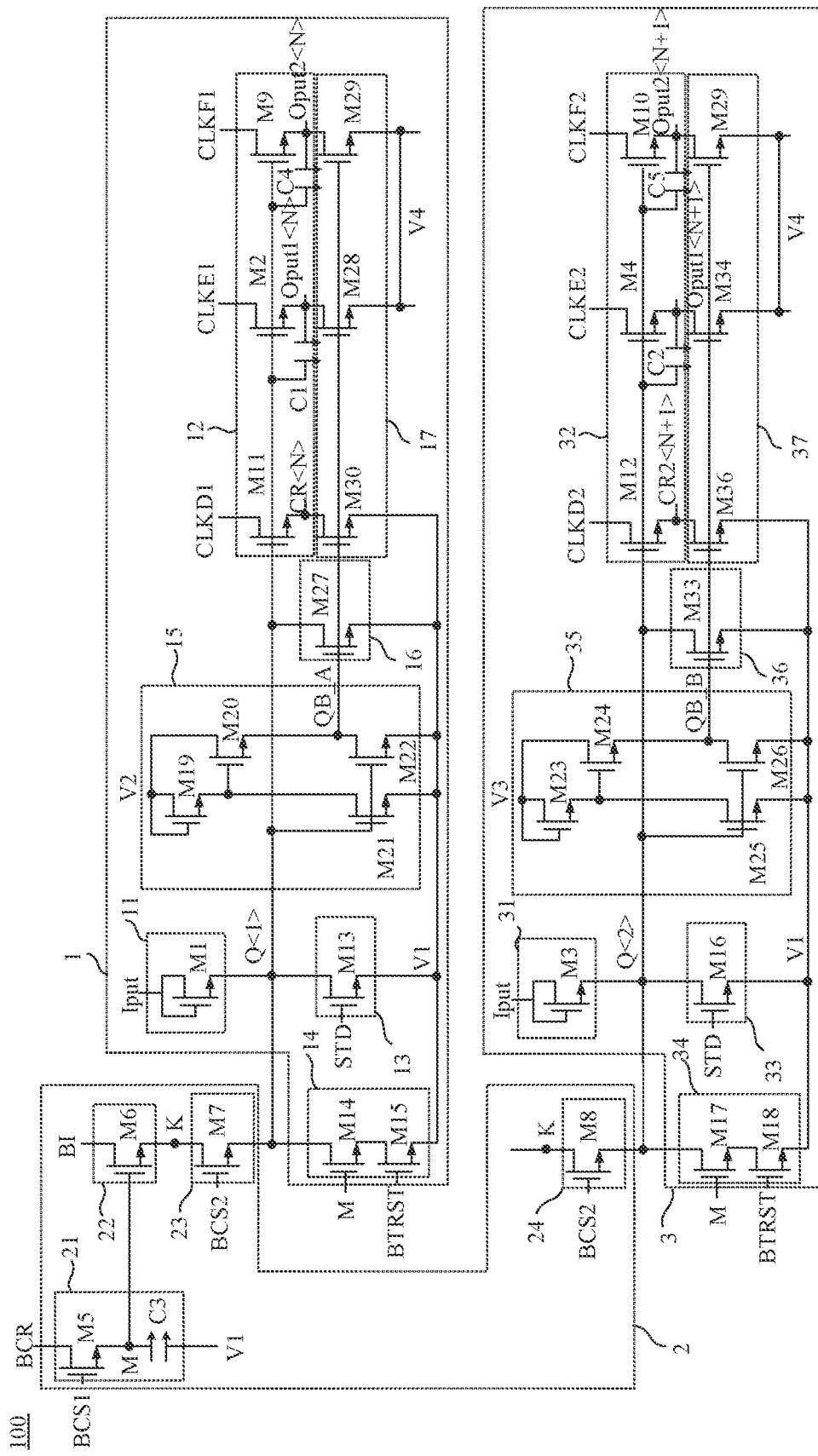
FIG. 25 is a circuit diagram of yet another shift register, in accordance with some embodiments of the present disclosure.

In some examples, as shown in FIGS. 23 to 25, the first scan unit 1 in the shift register 100 may further include a first control circuit 15.

For example, as shown in FIGS. 23 to 25, the first control circuit 15 is electrically connected to the first pull-up node Q<1>, a first pull-down node QB_A, the first voltage signal terminal V1 and a second voltage signal terminal V2. The first control circuit 15 is configured to: in response to a second voltage signal received at the second voltage signal terminal V2, transmit the second voltage signal to the first pull-down node QB_A; and, under the control of the voltage of the first pull-up node Q<1>, transmit the first voltage signal received at the first voltage signal terminal V1 to the first pull-down node QB_A.

For example, the first control circuit 15 may receive the second voltage signal and transmit the second voltage signal to the first pull-down node QB_A under control of the second voltage signal. In the case where the voltage of the first pull-up node Q<1> is at the high level, the first control circuit 15 may receive the first voltage signal and transmit the first voltage signal to the first pull-down node QB_A under the control of the voltage of the first pull-up node Q<1>, so as to perform pull-down reset on the first pull-down node QB_A.

In some examples, as shown in FIGS. 23 to 25, in the case where the shift register 100 further includes the second scan unit 3, the second scan unit 3 may further include a second control circuit 35.

For example, as shown in FIGS. 23 to 25, the second control circuit 35 is electrically connected to the second pull-up node Q<2>, a second pull-down node QB_B, the first voltage signal terminal V1 and a third voltage signal terminal V3. The second control circuit 35 is configured to: in response to a third voltage signal received at the third voltage signal terminal V3, transmit the third voltage signal to the second pull-down node QB_B; and, under the control of the voltage of the second pull-up node Q<2>, transmit the first voltage signal to the second pull-down node QB_B.

For example, the second control circuit 35 may receive the third voltage signal and transmit the third voltage signal to the second pull-down node QB_B under control of the third voltage signal. In the case where the voltage of the second pull-up node Q<2> is at the high level, the second control circuit 35 may receive the first voltage signal and transmit the first voltage signal to the second pull-down node QB_B under the control of the voltage of the second pull-up node Q<2>, so as to perform pull-down reset on the second pull-down node QB_B.

Here, for example, the second voltage signal terminal V2 may be configured to transmit a direct current high-level signal (e.g., higher than or equal to a high-level section of a clock signal). For example, the third voltage signal terminal V3 may be configured to transmit a direct current high-level signal (e.g., higher than or equal to a high-level section of a clock signal). "The high level" and "the low level" mentioned herein are relative. For example, a voltage value of the second voltage signal is greater than a voltage value of the first voltage signal.

In addition, for example, the second voltage signal terminal V2 may be configured to transmit the direct current high-level signal (e.g., higher than or equal to the high-level section of the clock signal) in the display phase of the frame. For example, the third voltage signal terminal V3 may be configured to transmit the direct current high-level signal (e.g., higher than or equal to the high-level section of the clock signal) in the display phase of the frame. The second voltage signal and the third voltage signal are mutually inverted signals.

The structures of the first control circuit 15 and the second control circuit 35 are schematically described below with reference to the accompanying drawings.

In some examples, as shown in FIGS. 24 and 25, the first control circuit 15 includes a nineteenth transistor M19, a twentieth transistor M20, a twenty-first transistor M21 and a twenty-second transistor M22.

For example, as shown in FIGS. 24 and 25, a control electrode of the nineteenth transistor M19 is electrically connected to the second voltage signal terminal V2, a first electrode of the nineteenth transistor M19 is electrically connected to the second voltage signal terminal V2, and a second electrode of the nineteenth transistor M19 is electrically connected to a control electrode of the twentieth transistor M20 and a first electrode of the twenty-first transistor M21. A first electrode of the twentieth transistor M20 is electrically connected to the second voltage signal terminal V2, and a second electrode of the twentieth transistor M20 is electrically connected to the first pull-down node QB_A.

For example, the nineteenth transistor M19 may be turned on under the control of the second voltage signal, receive the second voltage signal, and transmit the second voltage signal to the control electrode of the twentieth transistor M20. The twentieth transistor M20 may be turned on under the control of the second voltage signal, receive the second voltage signal, and transmit the second voltage signal to the first pull-down node QB_A, so as to charge the first pull-down node QB_A. As a result, a voltage of the first pull-down node QB_A increases.

For example, as shown in FIGS. 24 and 25, a control electrode of the twenty-first transistor M21 is electrically connected to the first pull-up node Q<1>, and a second electrode of the twenty-first transistor M21 is electrically connected to the first voltage signal terminal V1.

For example, in the case where the voltage of the first pull-up node Q<1> is at the high level, the twenty-first transistor M21 may be turned on under the control of the first pull-up node Q<1>, receive the first voltage signal, and transmit the first voltage signal to the control electrode of the twentieth transistor M20. The twentieth transistor M20 may be turned off under control of the first voltage signal.

For example, as shown in FIGS. 24 and 25, a control electrode of the twenty-second transistor M22 is electrically connected to the first pull-up node Q<1>, a first electrode of the twenty-second transistor M22 is electrically connected to the first pull-down node QB_A, and a second electrode of the twenty-second transistor M22 is electrically connected to the first voltage signal terminal V1.

For example, in the case where the voltage of the first pull-up node Q<1> is at the high level, the twenty-second transistor M22 may be turned on under the control of the first pull-up node Q<1>, receive the first voltage signal, and transmit the first voltage signal to the first pull-down node QB_A, so as to perform the pull-down reset on the first pull-down node QB_A.

In some examples, as shown in FIGS. 24 and 25, the second control circuit 35 includes a twenty-third transistor M23, a twenty-fourth transistor M24, a twenty-fifth transistor M25 and a twenty-sixth transistor M26.

For example, as shown in FIGS. 24 and 25, a control electrode of the twenty-third transistor M23 is electrically connected to the third voltage signal terminal V3, a first electrode of the twenty-third transistor M23 is electrically connected to the third voltage signal terminal V3, and a second electrode of the twenty-third transistor M23 is electrically connected to a control electrode of the twenty-fourth transistor M24 and a first electrode of the twenty-fifth transistor M25. A first electrode of the twenty-fourth transistor M24 is electrically connected to the third voltage signal terminal V3, and a second electrode of the twenty-fourth transistor M24 is electrically connected to the second pull-down node QB_B.

For example, the twenty-third transistor M23 may be turned on under the control of the third voltage signal, receive the third voltage signal, and transmit the third voltage signal to the control electrode of the twenty-fourth transistor M24. The twenty-fourth transistor M24 may be turned on under the control of the third voltage signal, receive the third voltage signal, and transmit the third voltage signal to the second pull-down node QB_B, so as to charge the second pull-down node QB_B. As a result, a voltage of the second pull-down node QB_B increases.

For example, as shown in FIGS. 24 and 25, a control electrode of the twenty-fifth transistor M25 is electrically connected to the second pull-up node Q<2>, and a second electrode of the twenty-fifth transistor M25 is electrically connected to the first voltage signal terminal V1.

For example, in the case where the voltage of the second pull-up node Q<2> is at the high level, the twenty-fifth transistor M25 may be turned on under the control of the second pull-up node Q<2>, receive the first voltage signal, and transmit the first voltage signal to the control electrode of the twenty-fourth transistor M24. The twenty-fourth transistor M24 may be turned off under the control of the first voltage signal.

For example, as shown in FIGS. 24 and 25, a control electrode of the twenty-sixth transistor M26 is electrically connected to the second pull-up node Q<2>, a first electrode of the twenty-sixth transistor M26 is electrically connected to the second pull-down node QB_B, and a second electrode of the twenty-sixth transistor M26 is electrically connected to the first voltage signal terminal V1.

For example, in the case where the voltage of the second pull-up node Q<2> is at the high level, the twenty-sixth transistor M26 may be turned on under the control of the second pull-up node Q<2>, receive the first voltage signal, and transmit the first voltage signal to the second pull-down node QB_B, so as to perform the pull-down reset on the second pull-down node QB_B.

In some embodiments, the shift register 100 may further include other circuit structures, which may be specifically set according to actual needs.

Figure 26:
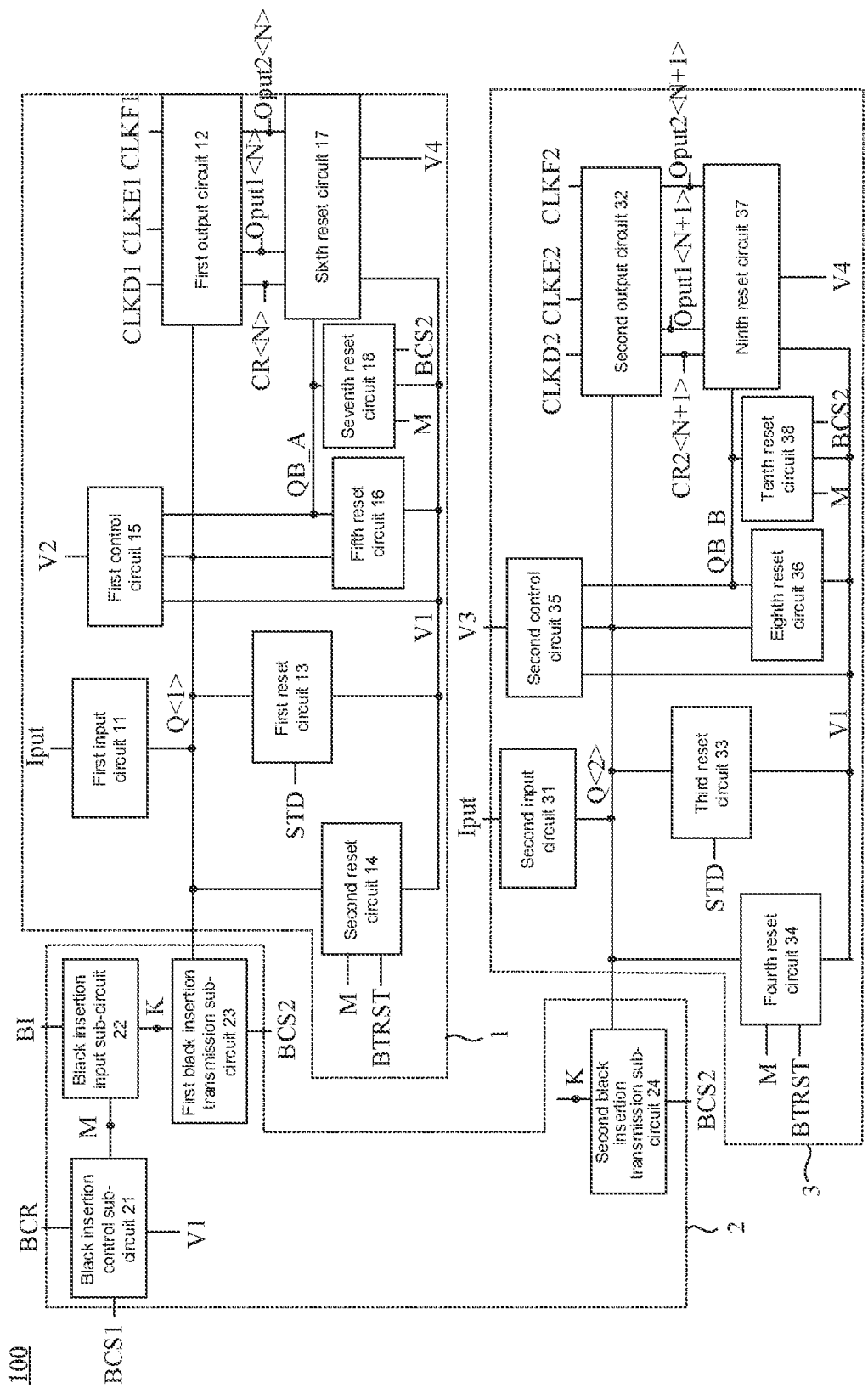
FIG. 26 is a structural diagram of yet another shift register, in accordance with some embodiments of the present disclosure.
Figure 27:
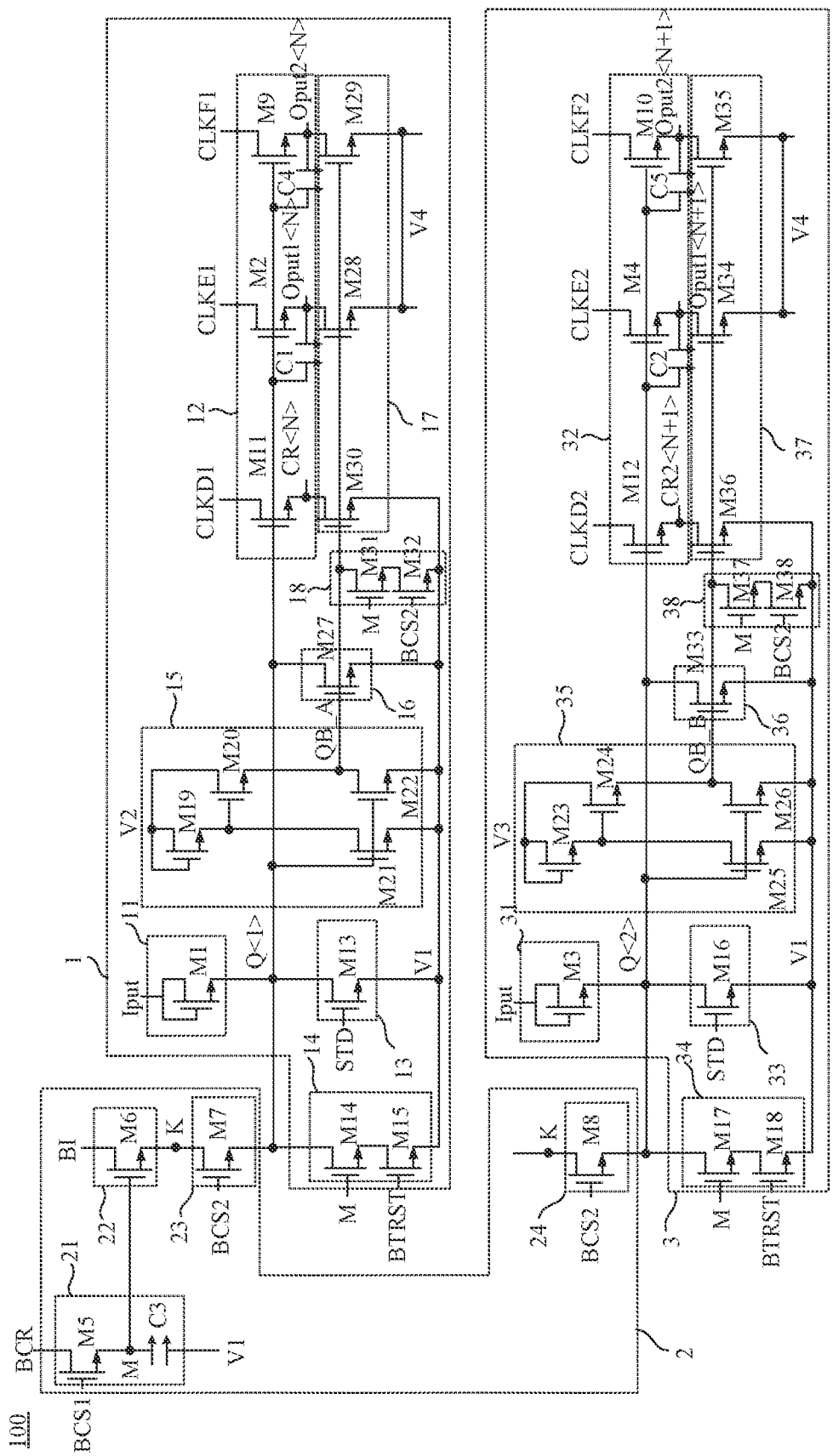
FIG. 27 is a circuit diagram of yet another shift register, in accordance with some embodiments of the present disclosure.

In some examples, as shown in FIGS. 26 and 27, the first scan unit 1 further includes a fifth reset circuit 16, a sixth reset circuit 17 and a seventh reset circuit 18.

Figure 28:
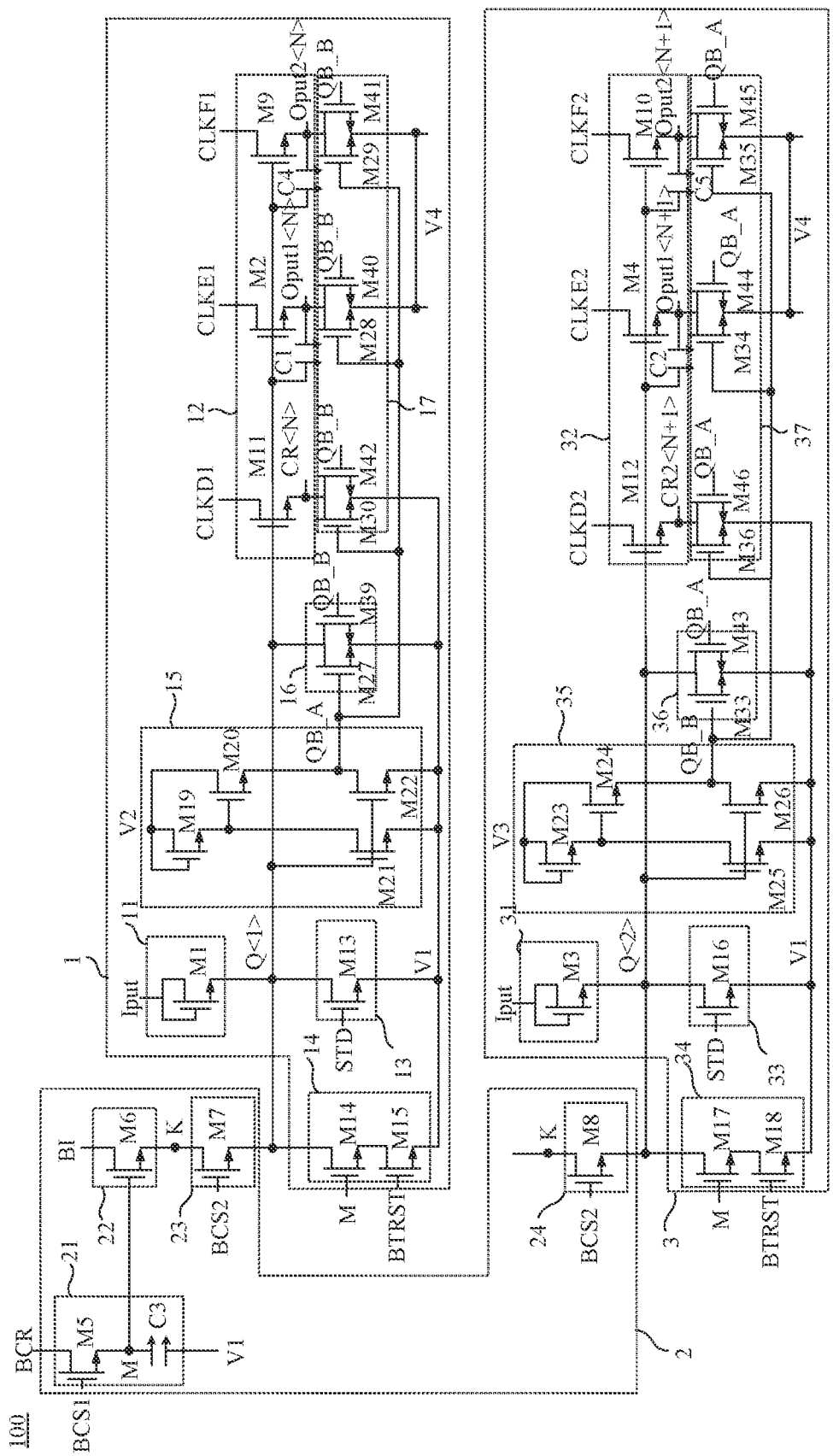
FIG. 28 is a circuit diagram of yet another shift register, in accordance with some embodiments of the present disclosure.

For example, as shown in FIGS. 26 to 28, the fifth reset circuit 16 is electrically connected to the first pull-down node QB_A, the first pull-up node Q<1> and the first voltage signal terminal V1. The fifth reset circuit 16 is configured to transmit the first voltage signal to the first pull-up node Q<1> under control of a voltage of the first pull-down node QB_A.

For example, in a case where the voltage of the first pull-down node QB_A is at a high level, the fifth reset circuit 16 may be turned on under the control of the voltage of the first pull-down node QB_A, and transmit the first voltage signal received at the first voltage signal terminal V1 to the first pull-up node Q<1>, so as to perform the pull-down reset on the first pull-up node Q<1>.

For example, as shown in FIGS. 26 to 28, the sixth reset circuit 17 is electrically connected to the first pull-down node QB_A, the first scan signal terminal Oput1<N> and a fourth voltage signal terminal V4. The sixth reset circuit 17 is configured to transmit a fourth voltage signal received at the fourth voltage signal terminal V4 to the first scan signal terminal Oput1<N> under the control of the voltage of the first pull-down node QB_A.

For example, in the case where the voltage of the first pull-down node QB_A is at the high level, the sixth reset circuit 17 may be turned on under the control of the voltage of the first pull-down node QB_A, and transmit the fourth voltage signal received at the fourth voltage signal terminal V4 to the first scan signal terminal Oput1<N>, so as to perform pull-down reset on the first scan signal terminal Oput1<N>.

Here, for example, the fourth voltage signal terminal V4 may be configured to transmit a direct current low-level signal (e.g., lower than or equal to a low-level section of a clock signal). For example, the fourth voltage signal terminal V4 is grounded. The voltage value of the first voltage signal and a voltage value of the fourth voltage signal may be or may not be equal.

For example, as shown in FIGS. 26 to 28, in the case where the first output circuit 12 is further electrically connected to the third clock signal terminal CLKF1 and the first sensing signal terminal Oput2<N>, the sixth reset circuit 17 is further electrically connected to the first sensing signal terminal Oput2<N>. The sixth reset circuit 17 is further configured to transmit the fourth voltage signal to the first sensing signal terminal Oput2<N> under the control of the voltage of the first pull-down node QB_A.

For example, in the case where the voltage of the first pull-down node QB_A is at the high level, the sixth reset circuit 17 may be turned on under the control of the voltage of the first pull-down node QB_A, and transmit the fourth voltage signal received at the fourth voltage signal terminal V4 to the first sensing signal terminal Oput2<N>, so as to perform pull-down reset on the first sensing signal terminal Oput2<N>.

For example, as shown in FIGS. 26 to 28, in a case where the first output circuit 12 is further electrically connected to the fifth clock signal terminal CLKD1 and the first shift signal terminal CR<N>, the sixth reset circuit 17 is further electrically connected to the first shift signal terminal CR<N> and the first voltage signal terminal V1. The sixth reset circuit 17 is further configured to transmit the first voltage signal to the first shift signal terminal CR<N> under the control of the voltage of the first pull-down node QB_A.

For example, in the case where the voltage of the first pull-down node QB_A is at the high level, the sixth reset circuit 17 may be turned on under the control of the voltage of the first pull-down node QB_A, and transmit the first voltage signal received at the first voltage signal terminal V1 to the first shift signal terminal CR<N>, so as to perform pull-down reset on the first shift signal terminal CR<N>.

For example, as shown in FIGS. 26 and 27, in the case where the black insertion circuit 2 includes the black insertion control sub-circuit 21, the seventh reset circuit 18 is electrically connected to the first black insertion node M, the second control signal terminal BCS2, the first pull-down node QB_A and the first voltage signal terminal V1. The seventh reset circuit 18 is configured to transmit the first voltage signal to the first pull-down node QB_A under control of the voltage of the first black insertion node M and the second control signal.

For example, in a case where the voltage of the first black insertion node M is at a high level and the second control signal is at a high level, the seventh reset circuit 18 may be turned on under the control of the voltage of the first black insertion node M and the second control signal, and transmit the first voltage signal received at the first voltage signal terminal V1 to the first pull-down node QB_A, so as to perform pull-down reset on the first pull-down node QB_A.

In some examples, as shown in FIGS. 26 and 27, the second scan unit 3 further includes an eighth reset circuit 36, a ninth reset circuit 37 and a tenth reset circuit 38.

For example, as shown in FIGS. 26 to 28, the eighth reset circuit 36 is electrically connected to the second pull-down node QB_B, the second pull-up node Q<2> and the first voltage signal terminal V1. The eighth reset circuit 36 is configured to transmit the first voltage signal to the second pull-up node Q<2> under control of the voltage of the second pull-down node QB_B.

For example, in a case where the voltage of the second pull-down node QB_B is at a high level, the eighth reset circuit 36 may be turned on under the control of the voltage of the second pull-down node QB_B, and transmit the first voltage signal received at the first voltage signal terminal V1 to the second pull-up node Q<2>, so as to perform the pull-down reset on the second pull-up node Q<2>.

For example, as shown in FIGS. 26 to 28, the ninth reset circuit 37 is electrically connected to the second pull-down node QB_B, the second scan signal terminal Oput1<N+1> and the fourth voltage signal terminal V4. The ninth reset circuit 37 is configured to transmit the fourth voltage signal to the second scan signal terminal Oput1<N+1> under the control of the voltage of the second pull-down node QB_B.

For example, in the case where the voltage of the second pull-down node QB_B is at the high level, the ninth reset circuit 37 may be turned on under the control of the voltage of the second pull-down node QB_B, and transmit the fourth voltage signal received at the fourth voltage signal terminal V4 to the second scan signal terminal Oput1<N+1>, so as to perform pull-down reset on the second scan signal terminal Oput1<N+1>.

For example, as shown in FIGS. 26 to 28, in the case where the second output circuit 32 is further electrically connected to the fourth clock signal terminal CLKF2 and the second sensing signal terminal Oput2<N+1>, the ninth reset circuit 37 is further electrically connected to the second sensing signal terminal Oput2<N+1>. The ninth reset circuit 37 is further configured to transmit the fourth voltage signal to the second sensing signal terminal Oput2<N+1> under the control of the voltage of the second pull-down node QB_B.

For example, in the case where the voltage of the second pull-down node QB_B is at the high level, the ninth reset circuit 37 may be turned on under the control of the voltage of the second pull-down node QB_B, and transmit the fourth voltage signal received at the fourth voltage signal terminal V4 to the second sensing signal terminal Oput2<N+1>, so as to perform pull-down reset on the second sensing signal terminal Oput2<N+1>.

For example, as shown in FIGS. 26 to 28, in a case where the second output circuit 32 is further electrically connected to the sixth clock signal terminal CLKD2 and the second shift signal terminal CR2<N+1>, the ninth reset circuit 37 is further electrically connected to the second shift signal terminal CR2<N+1> and the first voltage signal terminal V1. The ninth reset circuit 37 is further configured to transmit the first voltage signal to the second shift signal terminal CR2<N+1> under the control of the voltage of the second pull-down node QB_B.

For example, in the case where the voltage of the second pull-down node QB_B is at the high level, the ninth reset circuit 37 may be turned on under the control of the voltage of the second pull-down node QB_B, and transmit the first voltage signal received at the first voltage signal terminal V1 to the second shift signal terminal CR2<N+1>, so as to perform pull-down reset on the second shift signal terminal CR2<N+1>.

For example, as shown in FIGS. 26 and 27, the tenth reset circuit 38 is electrically connected to the first black insertion node M, the second control signal terminal BCS2, the second pull-down node QB_B and the first voltage signal terminal V1. The tenth reset circuit 38 is configured to transmit the first voltage signal to the second pull-down node QB_B under the control of the voltage of the first black insertion node M and the second control signal.

For example, in the case where the voltage of the first black insertion node M is at the high level and the second control signal is at the high level, the tenth reset circuit 38 may be turned on under the control of the voltage of the first black insertion node M and the second control signal, and transmit the first voltage signal received at the first voltage signal terminal V1 to the second pull-down node QB_B, so as to perform the pull-down reset on the second pull-down node QB_B.

The structures of the fifth reset circuit 16, the sixth reset circuit 17, the seventh reset circuit 18, the eighth reset circuit 36, the ninth reset circuit 37 and the tenth reset circuit 38 are schematically described below with reference to the accompanying drawings.

In some examples, as shown in FIGS. 27 and 28, the fifth reset circuit 16 includes a twenty-seventh transistor M27.

For example, as shown in FIGS. 27 and 28, a control electrode of the twenty-seventh transistor M27 is electrically connected to the first pull-down node QB_A, a first electrode of the twenty-seventh transistor M27 is electrically connected to the first pull-up node Q<1>, and a second electrode of the twenty-seventh transistor M27 is electrically connected to the first voltage signal terminal V1.

For example, in the case where the voltage of the first pull-down node QB_A is at the high level, the twenty-seventh transistor M27 may be turned on under the control of the voltage of the first pull-down node QB_A, receive the first voltage signal, and transmit the first voltage signal to the first pull-up node Q<1>, so as to perform the pull-down reset on the first pull-up node Q<1>.

In some examples, as shown in FIGS. 27 and 28, the sixth reset circuit 17 includes a twenty-eighth transistor M28, a twenty-ninth transistor M29 and a thirtieth transistor M30.

For example, as shown in FIGS. 27 and 28, a control electrode of the twenty-eighth transistor M28 is electrically connected to the first pull-down node QB_A, a first electrode of the twenty-eighth transistor M28 is electrically connected to the first scan signal terminal Oput1<N>, and a second electrode of the twenty-eighth transistor M28 is electrically connected to the fourth voltage signal terminal V4.

For example, in the case where the voltage of the first pull-down node QB_A is at the high level, the twenty-eighth transistor M28 may be turned on under the control of the voltage of the first pull-down node QB_A, receive the fourth voltage signal, and transmit the fourth voltage signal to the first scan signal terminal Oput1<N>, so as to perform the pull-down reset on the first scan signal terminal Oput1<N>.

For example, as shown in FIGS. 27 and 28, a control electrode of the twenty-ninth transistor M29 is electrically connected to the first pull-down node QB_A, a first electrode of the twenty-ninth transistor M29 is electrically connected to the first sensing signal terminal Oput2<N>, and a second electrode of the twenty-ninth transistor M29 is electrically connected to the fourth voltage signal terminal V4.

For example, in the case where the voltage of the first pull-down node QB_A is at the high level, the twenty-ninth transistor M29 may be turned on under the control of the voltage of the first pull-down node QB_A, receive the fourth voltage signal, and transmit the fourth voltage signal to the first sensing signal terminal Oput2<N>, so as to perform the pull-down reset on the first sensing signal terminal Oput2<N>.

For example, as shown in FIGS. 27 and 23, a control electrode of the thirtieth transistor M30 is electrically connected to the first pull-down node QB_A, a first electrode of the thirtieth transistor M30 is electrically connected to the first shift signal terminal CR<N>, and a second electrode of the thirtieth transistor M30 is electrically connected to the first voltage signal terminal V1.

For example, in the case where the voltage of the first pull-down node QB_A is at the high level, the thirtieth transistor M30 may be turned on under the control of the voltage of the first pull-down node QB_A, receive the first voltage signal, and transmit the first voltage signal to the first shift signal terminal CR<N>, so as to perform the pull-down reset on the first shift signal terminal CR<N>.

In some examples, as shown in FIG. 27, the seventh reset circuit 18 includes a thirty-first transistor M31 and a thirty-second transistor M32.

For example, as shown in FIG. 27, a control electrode of the thirty-first transistor M31 is electrically connected to the first black insertion node M, a first electrode of the thirty-first transistor M31 is electrically connected to the first pull-down node QB_A, and a second electrode of the thirty-first transistor M31 is electrically connected to a first electrode of the thirty-second transistor M32. A control electrode of the thirty-second transistor M32 is electrically connected to the second control signal terminal BCS2, and a second electrode of the thirty-second transistor M32 is electrically connected to the first voltage signal terminal V1.

For example, in the case where the voltage of the first black insertion node M is at the high level and the second control signal is at the high level, the thirty-first transistor M31 may be turned on under the control of the voltage of the first black insertion node M, and the thirty-second transistor M32 may be turned on under the control of the second control signal; the thirty-second transistor M32 may receive the first voltage signal and transmit the first voltage signal to the second electrode of the thirty-first transistor M31, and the thirty-first transistor M31 may transmit the first voltage signal to the first pull-down node QB_A, so as to perform the pull-down reset on the first pull-down node QB_A.

In some examples, as shown in FIGS. 27 and 28, the eighth reset circuit 36 includes a thirty-third transistor M33.

For example, as shown in FIGS. 27 and 23, a control electrode of the thirty-third transistor M33 is electrically connected to the second pull-down node QB_B, a first electrode of the thirty-third transistor M33 is electrically connected to the second pull-up node Q<2>, and a second electrode of the thirty-third transistor M33 is electrically connected to the first voltage signal terminal V1.

For example, in the case where the voltage of the second pull-down node QB_B is at the high level, the thirty-third transistor M33 may be turned on under the control of the voltage of the second pull-down node QB_B, receive the first voltage signal, and transmit the first voltage signal to the second pull-up node Q<2>, so as to perform the pull-down reset on the second pull-up node Q<2>.

In some examples, as shown in FIGS. 27 and 28, the ninth reset circuit 37 includes a thirty-fourth transistor M34, a thirty-fifth transistor M35 and a thirty-sixth transistor M36.

For example, as shown in FIGS. 27 and 28, a control electrode of the thirty-fourth transistor M34 is electrically connected to the second pull-down node QB_B, a first electrode of the thirty-fourth transistor M34 is electrically connected to the second scan signal terminal Oput1<N+1>, and a second electrode of the thirty-fourth transistor M34 is electrically connected to the fourth voltage signal terminal V4.

For example, in the case where the voltage of the second pull-down node QB_B is at the high level, the thirty-fourth transistor M34 may be turned on under the control of the voltage of the second pull-down node QB_B, receive the fourth voltage signal, and transmit the fourth voltage signal to the second scan signal terminal Oput1<N+1->, so as to perform the pull-down reset on the second scan signal terminal Oput1<N+1>.

For example, as shown in FIGS. 27 and 28, a control electrode of the thirty-fifth transistor M35 is electrically connected to the second pull-down node QB_B, a first electrode of the thirty-fifth transistor M35 is electrically connected to the second sensing signal terminal Oput2<N+1>, and a second electrode of the thirty-fifth transistor M35 is electrically connected to the fourth voltage signal terminal V4.

For example, in the case where the voltage of the second pull-down node QB_B is at the high level, the thirty-fifth transistor M35 may be turned on under the control of the voltage of the second pull-down node QB_B, receive the fourth voltage signal, and transmit the fourth voltage signal to the second sensing signal terminal Oput2<N+1>, so as to perform the pull-down reset on the second sensing signal terminal Oput2<N+1>.

For example, as shown in FIGS. 27 and 28, a control electrode of the thirty-sixth transistor M36 is electrically connected to the second pull-down node QB_B, a first electrode of the thirty-sixth transistor M36 is electrically connected to the second shift signal terminal CR2<N+1>, and a second electrode of the thirty-sixth transistor M36 is electrically connected to the first voltage signal terminal V1.

For example, in the case where the voltage of the second pull-down node QB_B is at the high level, the thirty-sixth transistor M36 may be turned on under the control of the voltage of the second pull-down node QB_B, receive the first voltage signal, and transmit the first voltage signal to the second shift signal terminal CR2<N+1>, so as to perform the pull-down reset on the second shift signal terminal CR2<N+1>.

In some examples, as shown in FIG. 27, the tenth reset circuit 38 includes a thirty-seventh transistor M37 and a thirty-eighth transistor M38.

For example, as shown in FIG. 27, a control electrode of the thirty-seventh transistor M37 is electrically connected to the first black insertion node M, a first electrode of the thirty-seventh transistor M37 is electrically connected to the second pull-down node QB_B, and a second electrode of the thirty-seventh transistor M37 is electrically connected to a first electrode of the thirty-eighth transistor M38. A control electrode of the thirty-eighth transistor M38 is electrically connected to the second control signal terminal BCS2, and a second electrode of the thirty-eighth transistor M38 is electrically connected to the first voltage signal terminal V1.

For example, in the case where the voltage of the first black insertion node M is at the high level and the second control signal is at the high level, the thirty-seventh transistor M37 may be turned on under the control of the voltage of the first black insertion node M, and the thirty-eighth transistor M38 may be turned on under the control of the second control signal; the thirty-eighth transistor M38 may receive the first voltage signal and transmit the first voltage signal to the second electrode of the thirty-seventh transistor M37, and the thirty-seventh transistor M37 may transmit the first voltage signal to the second pull-down node QB_B, so as to perform the pull-down reset on the second pull-down node QB_B.

In some embodiments, the shift register 100 may further include other circuit structures, which may be specifically set according to actual needs.

In some examples, as shown in FIG. 28, the fifth reset circuit 16 is further electrically connected to the second pull-down node QB_B. The fifth reset circuit 16 is further configured to transmit the first voltage signal to the first pull-up node Q<1> under the control of the voltage of the second pull-down node QB_B.

For example, in the case where the voltage of the second pull-down node QB_B is at the high level, the fifth reset circuit 16 may be turned on under the control of the voltage of the second pull-down node QB_B, and transmit the first voltage signal received at the first voltage signal terminal V1 to the first pull-up node Q<1>, so as to perform the pull-down reset on the first pull-up node Q<1>.

In some examples, as shown in FIG. 28, the sixth reset circuit 17 is further electrically connected to the second pull-down node QB_B. The sixth reset circuit 17 is further configured to, under the control of the voltage of the second pull-down node QB_B, transmit the fourth voltage signal to the first scan signal terminal Oput1<N>, transmit the fourth voltage signal to the first sensing signal terminal Oput2<N>, and transmit the first voltage signal to the first shift signal terminal CR<N>.

For example, in the case where the voltage of the second pull-down node QB_B is at the high level, the sixth reset circuit 17 may be turned on under the control of the voltage of the second pull-down node QB_B, receive the fourth voltage signal and transmit the fourth voltage signal to the first scan signal terminal Oput1<N> to perform the pull-down reset on the first scan signal terminal Oput1<N>, receive the fourth voltage signal and transmit the fourth voltage signal to the first sensing signal terminal Oput2<N> to perform the pull-down reset on the first sensing signal terminal Oput2<N>, and receive the first voltage signal and transmit the first voltage signal to the first shift signal terminal CR<N> to perform the pull-down reset on the first shift signal terminal CR<N>.

In some examples, as shown in FIG. 28, the eighth reset circuit 36 is further electrically connected to the first pull-down node QB_A. The eighth reset circuit 36 is further configured to transmit the first voltage signal to the second pull-up node Q<2> under the control of the voltage of the first pull-down node QB_A.

For example, in the case where the voltage of the first pull-down node QB_A is at the high level, the eighth reset circuit 36 may be turned on under the control of the voltage of the first pull-down node QB_A, transmit the first voltage signal received at the first voltage signal terminal V1 to the second pull-up node Q<2>, so as to perform the pull-down reset on the second pull-up node Q<2>.

In some examples, as shown in FIG. 28, the ninth reset circuit 37 is further electrically connected to the first pull-down node QB_A. The ninth reset circuit 37 is further configured to, under the control of the voltage of the first pull-down node QB_A, transmit the fourth voltage signal to the second scan signal terminal Oput1<N+1>, transmit the fourth voltage signal to the second sensing signal terminal Oput2<N+1>, and transmit the first voltage signal to the second shift signal terminal CR2<N+1>.

For example, in the case where the voltage of the first pull-down node QB_A is at the high level, the ninth reset circuit 37 may be turned on under the control of the voltage of the first pull-down node QB_A, receive the fourth voltage signal and transmit the fourth voltage signal to the second scan signal terminal Oput1<N+1> to perform the pull-down reset on the second scan signal terminal Oput1<N+1>, receive the fourth voltage signal and transmit the fourth voltage signal to the second sensing signal terminal Oput2<N+1> to perform the pull-down reset on the second sensing signal terminal Oput2<N+1>, and receive the first voltage signal and transmits the first voltage signal to the second shift signal terminal CR2<N+1> to perform the pull-down reset on the second shift signal terminal CR2<N+1>.

In the above examples, the second voltage signal and the third voltage signal may be, for example, inversion signals. In this way, different reset circuits with different structures may be used to reset the first pull-down node QB_A or the second pull-down node QB_B in different display periods, thereby reducing working time of the reset circuit with the corresponding structure and improving service lives of the shift register 100 and the scan driving circuit 1000.

The structures of the fifth reset circuit 16, the sixth reset circuit 17, the eighth reset circuit 36 and the ninth reset circuit 37 are schematically described below with reference to the accompanying drawings.

In some examples, as shown in FIG. 23, the fifth reset circuit 16 further includes a thirty-ninth transistor M39.

For example, as shown in FIG. 28, a control electrode of the thirty-ninth transistor M39 is electrically connected to the second pull-down node QB_B, a first electrode of the thirty-ninth transistor M39 is electrically connected to the first pull-up node Q<1>, and a second electrode of the thirty-ninth transistor M39 is electrically connected to the first voltage signal terminal V1.

For example, in the case where the voltage of the second pull-down node QB_B is at the high level, the thirty-ninth transistor M39 may be turned on under the control of the voltage of the second pull-down node QB_B, receive the first voltage signal, and transmit the first voltage signal to the first pull-up node Q<1>, so as to perform the pull-down reset on the first pull-up node Q<1>.

In some examples, as shown in FIG. 28, the sixth reset circuit 17 further includes a fortieth transistor M40, a forty-first transistor M41 and a forty-second transistor M42.

For example, as shown in FIG. 28, a control electrode of the fortieth transistor M40 is electrically connected to the second pull-down node QB_B, a first electrode of the fortieth transistor M40 is electrically connected to the first scan signal terminal Oput1<N>, and a second electrode of the fortieth transistor M40 is electrically connected to the fourth voltage signal terminal V4.

For example, in the case where the voltage of the second pull-down node QB_B is at the high level, the fortieth transistor M40 may be turned on under the control of the voltage of the second pull-down node QB_B, receive the fourth voltage signal, and transmit the fourth voltage signal to the first scan signal terminal Oput1<N>, so as to perform the pull-down reset on the first scan signal terminal Oput1<N>.

For example, as shown in FIG. 28, a control electrode of the forty-first transistor M41 is electrically connected to the second pull-down node QB_B, a first electrode of the forty-first transistor M41 is electrically connected to the first sensing signal terminal Oput2<N>, and a second electrode of the forty-first transistor M41 is electrically connected to the fourth voltage signal terminal V4.

For example, in the case where the voltage of the second pull-down node QB_B is at the high level, the forty-first transistor M41 may be turned on under the control of the voltage of the second pull-down node QB_B, receive the fourth voltage signal, and transmit the fourth voltage signal to the first sensing signal terminal Oput2<N>, so as to perform the pull-down reset on the first sensing signal terminal Oput2<N>.

For example, as shown in FIG. 28, a control electrode of the forty-second transistor M42 is electrically connected to the second pull-down node QB_B, a first electrode of the forty-second transistor M42 is electrically connected to the first shift signal terminal CR<N>, and a second electrode of the forty-second transistor M42 is electrically connected to the first voltage signal terminal V1.

For example, in the case where the voltage of the second pull-down node QB_B is at the high level, the forty-second transistor M42 may be turned on under the control of the voltage of the second pull-down node QB_B, receive the first voltage signal, and transmit the first voltage signal to the first shift signal terminal CR<N>, so as to perform the pull-down reset on the first shift signal terminal CR<N>.

In some examples, as shown in FIG. 28, the eighth reset circuit 36 further includes a forty-third transistor M43.

For example, as shown in FIG. 28, a control electrode of the forty-third transistor M43 is electrically connected to the first pull-down node QB_A, a first electrode of the forty-third transistor M43 is electrically connected to the second pull-up node Q<2>, and a second electrode of the forty-third transistor M43 is electrically connected to the first voltage signal terminal V1.

For example, in the case where the voltage of the first pull-down node QB_A is at the high level, the forty-third transistor M43 may be turned on under the control of the voltage of the first pull-down node QB_A, receive the first voltage signal, and transmit the first voltage signal to the second pull-up node Q<2>, so as to perform the pull-down reset on the second pull-up node Q<2>.

In some examples, as shown in FIG. 28, the ninth reset circuit 37 further includes a forty-fourth transistor M44, a forty-fifth transistor M45 and a forty-sixth transistor M46.

For example, as shown in FIG. 28, a control electrode of the forty-fourth transistor M44 is electrically connected to the first pull-down node QB_A, a first electrode of the forty-fourth transistor M44 is electrically connected to the second scan signal terminal Oput1<N+1>, and a second electrode of the forty-fourth transistor M44 is electrically connected to the fourth voltage signal terminal V4.

For example, in the case where the voltage of the first pull-down node QB_A is at the high level, the forty-fourth transistor M44 may be turned on under the control of the voltage of the first pull-down node QB_A, receive the fourth voltage signal, and transmit the fourth voltage signal to the second scan signal terminal Oput1<N+1>, so as to perform the pull-down reset on the second scan signal terminal Oput1<N+1>.

For example, as shown in FIG. 28, a control electrode of the forty-fifth transistor M45 is electrically connected to the first pull-down node QB_A, a first electrode of the forty-fifth transistor M45 is electrically connected to the second sensing signal terminal Oput2<N+1>, and a second electrode of the forty-fifth transistor M45 is electrically connected to the fourth voltage signal terminal V4.

For example, in the case where the voltage of the first pull-down node QB_A is at the high level, the forty-fifth transistor M45 may be turned on under the control of the voltage of the first pull-down node QB_A, receive the fourth voltage signal, and transmit the fourth voltage signal to the second sensing signal terminal Oput2<N+1>, so as to perform the pull-down reset on the second sensing signal terminal Oput2<N+1>.

For example, as shown in FIG. 28, a control electrode of the forty-sixth transistor M46 is electrically connected to the first pull-down node QB_A, a first electrode of the forty-sixth transistor M46 is electrically connected to the second shift signal terminal CR2<N+1>, and a second electrode of the forty-sixth transistor M46 is electrically connected to the first voltage signal terminal V1.

For example, in the case where the voltage of the first pull-down node QB_A is at the high level, the forty-sixth transistor M46 may be turned on under the control of the voltage of the first pull-down node QB_A, receive the first voltage signal, and transmit the first voltage signal to the second shift signal terminal CR2<N+1>, so as to perform the pull-down reset on the second shift signal terminal CR2<N+1>.

It can be seen from the foregoing that, the display phase of the frame may include, for example, the display period and the blanking period that are performed in sequence. In the display period, the shift register 100 may drive corresponding sub-pixels P in the display apparatus 2000 to display an image; in the blanking period, the shift register 100 may drive the corresponding sub-pixels P in the display apparatus 2000 to perform the external compensation.

Figure 34:
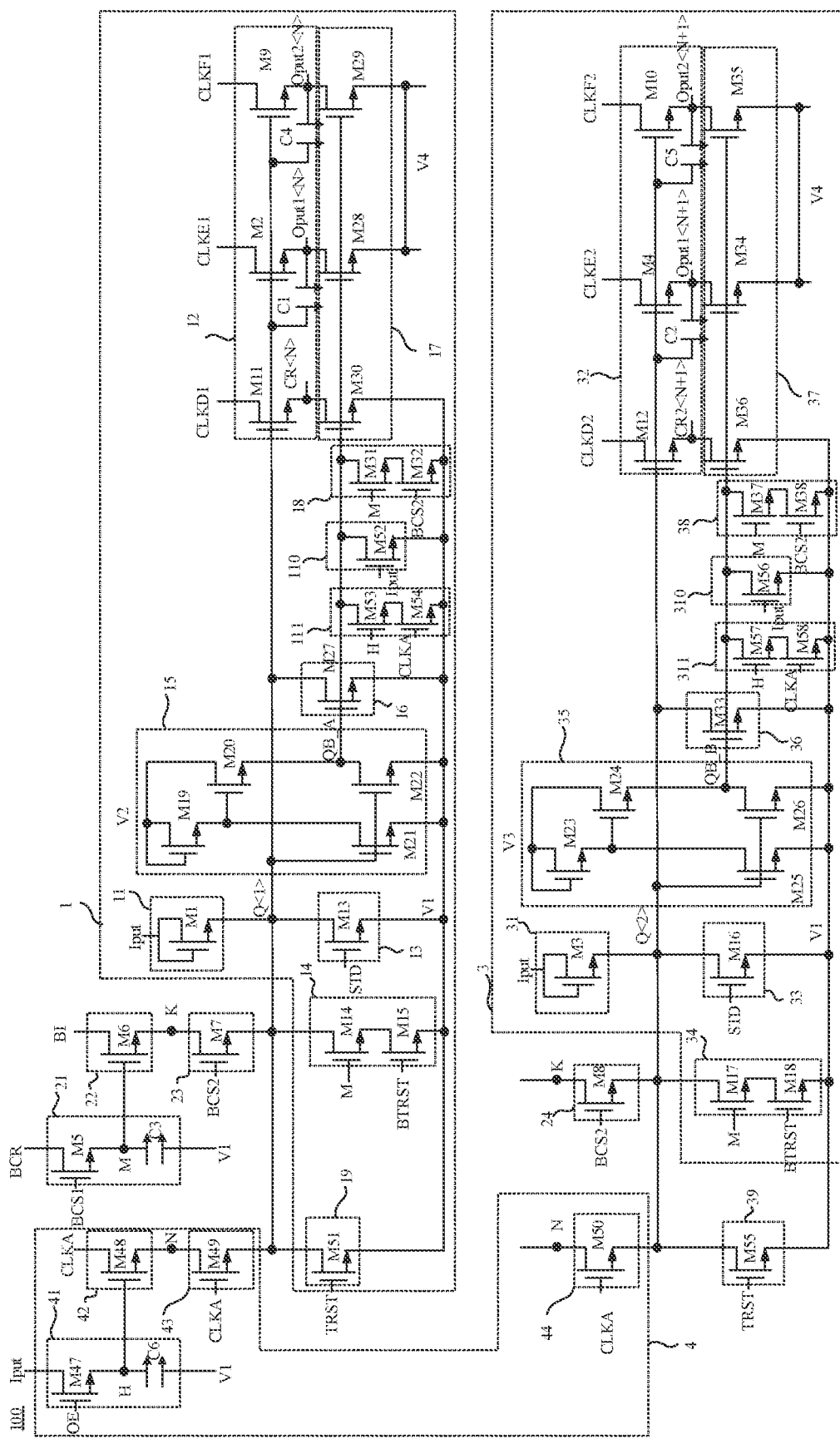
FIG. 34 is a circuit diagram of yet another shift register, in accordance with some embodiments of the present disclosure.
Figure 35:
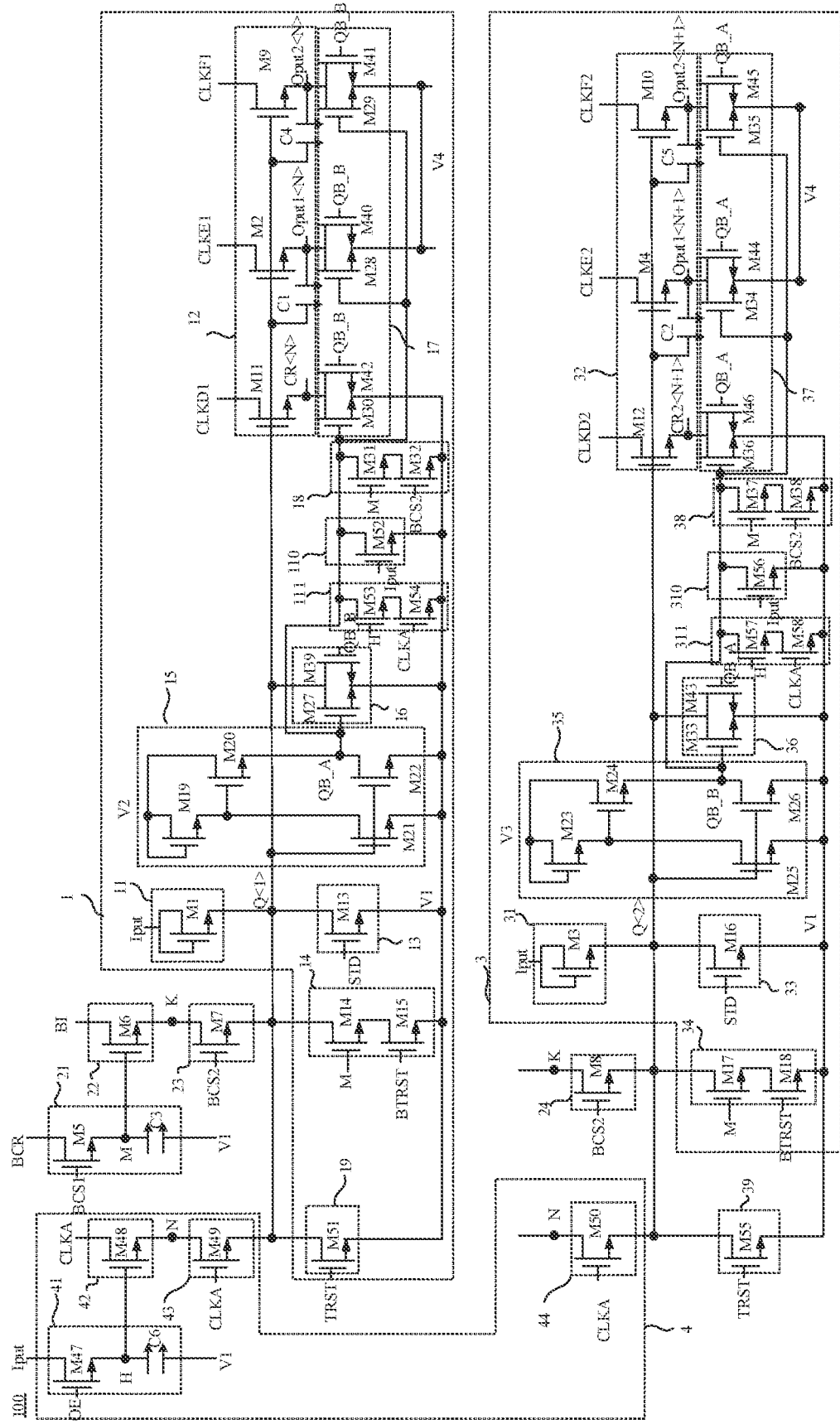
FIG. 35 is a circuit diagram of yet another shift register, in accordance with some embodiments of the present disclosure.

Base on this, in some embodiments, as shown in FIGS. 34 and 35, the shift register 100 may further include a blanking circuit 4.

In some examples, as shown in FIGS. 34 and 35, the blanking circuit 4 is electrically connected to a third control signal terminal OE, the display input signal terminal Iput, a seventh clock signal terminal CLKA, the first pull-up node Q<1> and the first voltage signal terminal V1. The blanking circuit 4 is configured to transmit the seventh clock signal to the first pull-up node Q<1> under control of a third control signal transmitted by the third control signal terminal OE, the display input signal and a seventh clock signal transmitted by the seventh clock signal terminal CLKA.

In addition, as shown in FIGS. 34 and 35, in the case where the shift register 100 further includes the second scan unit 3, the blanking circuit 4 is further electrically connected to the second pull-up node Q<2>. The blanking circuit 4 is further configured to transmit the seventh clock signal to the second pull-up node Q<2>.

For example, in the blanking period of the display phase of the frame, in a case where the third control signal is at a high level, the display input signal is at a high level, and the seventh clock signal is at a high level, the blanking circuit 4 may be turned on under the control of the third control signal, the display input signal and the seventh clock signal, transmit the seventh clock signal received at the seventh clock signal terminal CLKA to the first pull-up node Q<1> and the second pull-up node Q<2>, so as to charge the first pull-up node Q<1> and the second pull-up node Q<2>.

After the voltage of the first pull-up node Q<1> is increased, the first output circuit 12 may be turned on under the control of the voltage of the first pull-up node Q<1>. If the first output circuit 12 is not electrically connected to the first sensing signal terminal Oput2<N>, the first output circuit 12 may output the first clock signal received at the first clock signal terminal CLKE1 as the first scan signal and a first sensing driving signal simultaneously from the first scan signal terminal Oput1<N>. If the first output circuit 12 is electrically connected to the first sensing signal terminal Oput2<N>, the first output circuit 12 may output the third clock signal received at the third clock signal terminal CLKF1 as the first sensing signal from the first sensing signal terminal Oput2<N>. The corresponding sub-pixels P may be driven to perform the external compensation by using the first sensing signal.

After the voltage of the second pull-up node Q<2> is increased, the second output circuit 32 may be turned on under the control of the voltage of the second pull-up node Q<2>. If the second output circuit 32 is not electrically connected to the second sensing signal terminal Oput2<N+1>, the second output circuit 32 may output the second clock signal received at the second clock signal terminal CLKE2 as the second scan signal and a second sensing driving signal simultaneously from the second scan signal terminal Oput1<N+1>. If the second output circuit 32 is electrically connected to the second sensing signal terminal Oput2<N+1>, the second output circuit 32 may output the fourth clock signal received at the fourth clock signal terminal CLKF2 as the second sensing signal from the second sensing signal terminal Oput2<N+1>. The corresponding sub-pixels P may be driven to perform the external compensation by using the second sensing signal.

It can be seen from the above that, in the case where the shift register 100 includes the second scan unit 3, the first scan unit 1 and the second scan unit 3 may share the blanking circuit 4. In this way, it is conducive to simplifying the structures of the shift register 100 and the scan driving circuit 1000, and improving the yields of the shift register 100 and the scan driving circuit 1000.

In addition, in a case where the shift register 100 further includes other scan units, the blanking circuit 4 may further include other blanking transmission sub-circuits to enable a plurality of scan units to share the blanking circuit 4.

In some embodiments, as shown in FIGS. 34 and 35, the blanking circuit 4 includes a selection control sub-circuit 41, a blanking input sub-circuit 42, a first blanking transmission sub-circuit 43 and a second blanking transmission sub-circuit 44.

In some examples, as shown in FIGS. 34 and 35, the selection control sub-circuit 41 is electrically connected to the third control signal terminal OE, the display input signal terminal Iput, a first blanking node H and the first voltage signal terminal V1. The selection control sub-circuit 41 is configured to transmit the display input signal to the first blanking node H under the control of the third control signal.

For example, in a case where the third control signal is at a high level, the selection control sub-circuit 41 may be turned on under the control of the third control signal, and transmit the received display input signal to the first blanking node H to charge the first blanking node H, so that a voltage of the first blanking node H increases.

For example, when the shift register 100 needs to output sensing signal(s), a waveform timing of the third control signal and a waveform timing of the display input signal may be the same, thereby causing the selection control sub-circuit 41 to be turned on.

In some examples, as shown in FIGS. 34 and 35, a blanking input sub-circuit 42 is electrically connected to the first blanking node H, the seventh clock signal terminal CLKA and a second blanking node N. The blanking input sub-circuit 42 is configured to transmit the seventh clock signal to the second blanking node N under control of the voltage of the first blanking node H.

For example, in a case where the selection control sub-circuit 41 is turned on so that the voltage of the first blanking node H is increased, the blanking input sub-circuit 42 may be turned on under the control of the voltage of the first blanking node H, receive the seventh clock signal transmitted by the seventh clock signal terminal CLKA, and transmit the seventh clock signal to the second blanking node N.

In some examples, as shown in FIGS. 34 and 35, the first blanking transmission sub-circuit 43 is electrically connected to the seventh clock signal terminal CLKA, the second blanking node N and the first pull-up node Q<1>. The first blanking transmission sub-circuit 43 is configured to transmit the seventh clock signal from the second blanking node N to the first pull-up node Q<1> under the control of the seventh clock signal.

For example, in a case where the seventh clock signal is at a high level, the first blanking transmission sub-circuit 43 may be turned on under the control of the seventh clock signal, receive the seventh clock signal from the second blanking node N, and transmit the received seventh clock signal to the first pull-up node Q<1>, so as to charge the first pull-up node Q<1>. As a result, the voltage of the first pull-up node Q<1> increases.

In some examples, as shown in FIGS. 34 and 35, the second blanking transmission sub-circuit 44 is electrically connected to the seventh clock signal terminal CLKA, the second blanking node N and the second pull-up node Q<2>. The second blanking transmission sub-circuit 44 is configured to transmit the seventh clock signal from the second blanking node N to the second pull-up node Q<2> under the control of the seventh clock signal.

For example, in the case where the seventh clock signal is at the high level, the second blanking transmission sub-circuit 44 may be turned on under the control of the seventh clock signal, receive the seventh clock signal from the second blanking node N, and transmit the received seventh clock signal to the second pull-up node Q<2>, so as to charge the second pull-up node Q<2>. As a result, the voltage of the second pull-up node Q<2> increases.

The structures of the selection control sub-circuit 41, the blanking input sub-circuit 42, the first blanking transmission sub-circuit 43 and the second blanking transmission sub-circuit 44 that are included in the blanking circuit 4 are schematically described below with reference to the accompanying drawings.

In some examples, as shown in FIGS. 34 and 35, the selection control sub-circuit 41 includes a forty-seventh transistor M47 and a sixth capacitor C6.

For example, as shown in FIGS. 34 and 35, a control electrode of the forty-seventh transistor M47 is electrically connected to the third control signal terminal OE, a first electrode of the forty-seventh transistor M47 is electrically connected to the display input signal terminal Iput, and a second electrode of the forty-seventh transistor M47 is electrically connected to the first blanking node H.

For example, in a case where the third control signal transmitted by the third control signal terminal OE is at a high level, the forty-seventh transistor M47 may be turned on due to an action of the third control signal, receive the display input signal, and transmit the display input signal to the first blanking node H, so as to charge the first blanking node H. As a result, the voltage of the first blanking node H increases.

For example, as shown in FIGS. 34 and 35, a first terminal of the sixth capacitor C6 is electrically connected to the first blanking node H, and a second terminal of the sixth capacitor C6 is electrically connected to the first voltage signal terminal V1.

For example, in a process that the forty-seventh transistor M47 is turned on and charges the first blanking node H, the sixth capacitor C6 is also charged. In this way, in a case where the forty-seventh transistor M47 is turned off, the sixth capacitor C6 may discharge, so that the voltage of the first blanking node H remains at a high level.

In some examples, as shown in FIGS. 34 and 35, the blanking input sub-circuit 42 includes a forty-eighth transistor M48.

For example, as shown in FIGS. 34 and 35, a control electrode of the forty-eighth transistor M48 is electrically connected to the first blanking node H, a first electrode of the forty-eighth transistor M48 is electrically connected to the seventh clock signal terminal CLKA, and a second electrode of the forty-eighth transistor M48 is electrically connected to the second blanking node N.

For example, in a case where the voltage of the first blanking node H is at a high level, the forty-eighth transistor M48 may be turned on under the control of the voltage of the first blanking node H, and transmit the seventh clock signal received at the seventh clock signal terminal CLKA to the second blanking node N.

In some examples, as shown in FIGS. 34 and 35, the first blanking transmission sub-circuit 43 includes a forty-ninth transistor M49.

For example, as shown in FIGS. 34 and 35, a control electrode of the forty-ninth transistor M49 is electrically connected to the seventh clock signal terminal CLKA, a first electrode of the forty-ninth transistor M49 is electrically connected to the second blanking node N, and a second electrode of the forty-ninth transistor M49 is electrically connected to the first pull-up node Q<1>.

For example, in the case where the seventh clock signal transmitted by the seventh clock signal terminal CLKA is the high level, the forty-ninth transistor M49 may be turned on due to an action of the seventh clock signal, receive the seventh clock signal from the second blanking node N and transmit the seventh clock signal to the first pull-up node Q<1>, so as to charge the first pull-up node Q<1>.

In some examples, as shown in FIGS. 34 and 35, the second blanking transmission sub-circuit 44 includes a fiftieth transistor M50.

For example, as shown in FIGS. 34 and 35, a control electrode of the fiftieth transistor M50 is electrically connected to the seventh clock signal terminal CLKA, a first electrode of the fiftieth transistor M50 is electrically connected to the second blanking node N, and a second electrode of the fiftieth transistor M50 is electrically connected to the second pull-up node Q<2>.

For example, in the case where the seventh clock signal is at the high level, the fiftieth transistor M50 may be turned on due to the action of the seventh clock signal, receive the seventh clock signal from the second blanking node N, and transmit the seventh clock signal to the second pull-up node Q<2>, so as to charge the second pull-up node Q<2>.

In some embodiments, as shown in FIGS. 34 and 35, in the shift register 100, the first scan unit 1 further includes an eleventh reset circuit 19, a twelfth reset circuit 110 and a thirteenth reset circuit 111, and the second scan unit 3 further includes a fourteenth reset circuit 39, a fifteenth reset circuit 310 and a sixteenth reset circuit 311.

In some examples, as shown in FIGS. 34 and 35, the eleventh reset circuit 19 is electrically connected to a global reset signal terminal TRST, the first pull-up node Q<1> and the first voltage signal terminal V1. The eleventh reset circuit 19 is configured to transmit the first voltage signal to the first pull-up node Q<1> under control of a global reset signal transmitted by the global reset signal terminal TRST.

For example, in a case where the global reset signal is at a high level, the eleventh reset circuit 19 may be turned on due to an action of the global reset signal, and transmit the first voltage signal transmitted by the first voltage signal terminal V1 to the first pull-up node Q<1>, so as to perform the pull-down reset on the first pull-up node Q<1>.

In some examples, as shown in FIGS. 34 and 35, the twelfth reset circuit 110 is electrically connected to the display input signal terminal Iput, the first pull-down node QB_A and the first voltage signal terminal V1. The twelfth reset circuit 110 is configured to transmit the first voltage signal to the first pull-down node QB_A under the control of the display input signal.

For example, in the case where the display input signal is at the high level, the twelfth reset circuit 110 may be turned on due to the action of the display input signal, and transmit the first voltage signal to the first pull-down node QB_A, so as to perform the pull-down reset on the first pull-down node QB_A.

In some examples, as shown in FIGS. 34 and 35, in a case where the blanking circuit 4 includes the selection control sub-circuit 41, the thirteenth reset circuit 111 is electrically connected to the first blanking node H, the seventh clock signal terminal CLKA, the first pull-down node QB_A and the first voltage signal terminal V1. The thirteenth reset circuit 111 is configured to transmit the first voltage signal to the first pull-down node QB_A under control of the voltage of the first blanking node H and the seventh clock signal.

For example, in a case where the voltage of the first blanking node H is at a high level, and the seventh clock signal is at a high level, the thirteenth reset circuit 111 may be turned on due to actions of the voltage of the first blanking node H and the seventh clock signal, and transmit the first voltage signal to the first pull-down node QB_A, so as to perform the pull-down reset on the first pull-down node QB_A.

In some examples, as shown in FIGS. 34 and 35, the fourteenth reset circuit 39 is electrically connected to the global reset signal terminal TRST, the second pull-up node Q<2> and the first voltage signal terminal V1. The fourteenth reset circuit 39 is configured to transmit the first voltage signal to the second pull-up node Q<2> under the control of the global reset signal.

For example, in the case where the global reset signal is at the high level, the fourteenth reset circuit 39 may be turned on due to the action of the global reset signal, and transmit the first voltage signal transmitted by the first voltage signal terminal V1 to the second pull-up node Q<2>, so as to perform the pull-down reset on the second pull-up node Q<2>.

In some examples, as shown in FIGS. 34 and 35, the fifteenth reset circuit 310 is electrically connected to the display input signal terminal Iput, the second pull-down node QB_B and the first voltage signal terminal V1. The fifteenth reset circuit 310 is configured to transmit the first voltage signal to the second pull-down node QB_B under the control of the display input signal.

For example, in the case where the display input signal is at the high level, the fifteenth reset circuit 310 may be turned on due to the action of the display input signal, and transmit the first voltage signal to the second pull-down node QB_B, so as to perform the pull-down reset for the second pull-down node QB_B.

In some examples, as shown in FIGS. 34 and 35, the sixteenth reset circuit 311 is electrically connected to the first blanking node H, the seventh clock signal terminal CLKA, the second pull-down node QB_B and the first voltage signal terminal V1. The sixteenth reset circuit 311 is configured to transmit the first voltage signal to the second pull-down node QB_B under the control of the voltage of the first blanking node H and the seventh clock signal.

For example, in the case where the voltage of the first blanking node H is at the high level, and the seventh clock signal is at the high level, the sixteenth reset circuit 311 may be turned on due to the actions of the voltage of the first blanking node H and the seventh clock signal, and transmit the first voltage signal to the second pull-down node QB_B, so as to perform the pull-down reset on the second pull-down node QB_B.

The structures of the eleventh reset circuit 19, the twelfth reset circuit 110, the thirteenth reset circuit 111, the fourteenth reset circuit 39, the fifteenth reset circuit 310 and the sixteenth reset circuit 311 are schematically described below with reference to the accompanying drawings.

In some examples, as shown in FIGS. 34 and 35, the eleventh reset circuit 19 includes a fifty-first transistor M51.

For example, as shown in FIGS. 34 and 35, a control electrode of the fifty-first transistor M51 is electrically connected to the global reset signal terminal TRST, a first electrode of the fifty-first transistor M51 is electrically connected to the first pull-up node Q<1>, and a second electrode of the fifty-first transistor M51 is electrically connected to the first voltage signal terminal V1.

For example, in the case where the global reset signal is at the high level, the fifty-first transistor M51 may be turned on due to the action of the global reset signal, and transmit the first voltage signal transmitted by the first voltage signal terminal V1 to the first pull-up node Q<1>, so as to perform the pull-down reset on the first pull-up node Q<1>.

In some examples, as shown in FIGS. 34 and 35, the twelfth reset circuit 110 includes a fifty-second transistor M52.

For example, as shown in FIGS. 34 and 35, a control electrode of the fifty-second transistor M52 is electrically connected to the display input signal terminal Iput, a first electrode of the fifty-second transistor M52 is electrically connected to the first pull-down node QB_A, and a second electrode of the fifty-second transistor M52 is electrically connected to the first voltage signal terminal V1.

For example, in the case where the display input signal is at the high level, the fifty-second transistor M52 may be turned on due to the action of the display input signal, and transmit the first voltage signal to the first pull-down node QB_A, so as to perform the pull-down reset on the first pull-down node QB_A.

In some examples, as shown in FIGS. 34 and 35, the thirteenth reset circuit 111 includes a fifty-third transistor M53 and a fifty-fourth transistor M54.

For example, as shown in FIGS. 34 and 35, a control electrode of the fifty-third transistor M53 is electrically connected to the first blanking node H, a first electrode of the fifty-third transistor M53 is electrically connected to the first pull-down node QB_A, and a second electrode of the fifty-third transistor M53 is electrically connected to a first electrode of the fifty-fourth transistor M54. A control electrode of the fifty-fourth transistor M54 is electrically connected to the seventh clock signal terminal CLKA, and a second electrode of the fifty-fourth transistor M54 is electrically connected to the first voltage signal terminal V1.

For example, in the case where the voltage of the first blanking node H is at the high level, and the seventh clock signal is at the high level, the fifty-third transistor M53 may be turned on due to the action of the voltage of the first blanking node H, and the fifty-fourth transistor M54 may be turned on due to the action of the seventh clock signal; the fifty-fourth transistor M54 receive the first voltage signal and transmit the first voltage signal to the second electrode of the fifty-third transistor M53; the fifty-third transistor M53 receive the first voltage signal and transmit the first voltage signal to the first pull-down node QB_A, so as to perform the pull-down reset on the first pull-down node QB_A.

In some examples, as shown in FIGS. 34 and 35, the fourteenth reset circuit 39 includes a fifty-fifth transistor M55.

For example, as shown in FIGS. 34 and 35, a control electrode of the fifty-fifth transistor M55 is electrically connected to the global reset signal terminal TRST, a first electrode of the fifty-fifth transistor M55 is electrically connected to the second pull-up node Q<2>, and a second electrode of the fifty-fifth transistor M55 is electrically connected to the first voltage signal terminal V1.

For example, in the case where the global reset signal is at the high level, the fifty-fifth transistor M55 may be turned on due to the action of the global reset signal, and transmit the first voltage signal transmitted by the first voltage signal terminal V1 to the second pull-up node Q<2>, so as to perform the pull-down reset on the second pull-up node Q<2>.

In some examples, as shown in FIGS. 34 and 35, the fifteenth reset circuit 310 includes a fifty-sixth transistor M56.

For example, as shown in FIGS. 34 and 35, a control electrode of the fifty-sixth transistor M56 is electrically connected to the display input signal terminal Iput, a first electrode of the fifty-sixth transistor M56 is electrically connected to the second pull-down node QB_B, and a second electrode of the fifty-sixth transistor M56 is electrically connected to the first voltage signal terminal V1.

For example, in the case where the display input signal is at the high level, the fifty-sixth transistor M56 may be turned on due to the action of the display input signal, and transmit the first voltage signal to the second pull-down node QB_B, so as to perform the pull-down reset on the second pull-down node QB_B.

In some examples, as shown in FIGS. 34 and 35, the sixteenth reset circuit 311 includes a fifty-seventh transistor M57 and a fifty-eighth transistor M58.

For example, as shown in FIGS. 34 and 35, a control electrode of the fifty-seventh transistor M57 is electrically connected to the first blanking node H, a first electrode of the fifty-seventh transistor M57 is electrically connected to the second pull-down node QB_B, and a second electrode of the fifty-seventh transistor M57 is electrically connected to a first electrode of the fifty-eighth transistor M58. A control electrode of the fifty-eighth transistor M58 is electrically connected to the seventh clock signal terminal CLKA, and a second electrode of the fifty-eighth transistor M58 is electrically connected to the first voltage signal terminal V1.

For example, in the case where the voltage of the first blanking node H is at the high level, and the seventh clock signal is at the high level, the fifty-seventh transistor M57 may be turned on due to the action of the voltage of the first blanking node H, and the fifty-eighth transistor M58 may be turned on due to the action of the seventh clock signal; the fifty-eighth transistor M58 may receive the first voltage signal and transmit the first voltage signal to the second electrode of the fifty-seventh transistor M57; the fifty-seventh transistor M57 may receive the first voltage signal and transmit the first voltage signal to the second pull-down node QB_B, so as to perform the pull-down reset on the second pull-down node QB_B.

Figure 37:
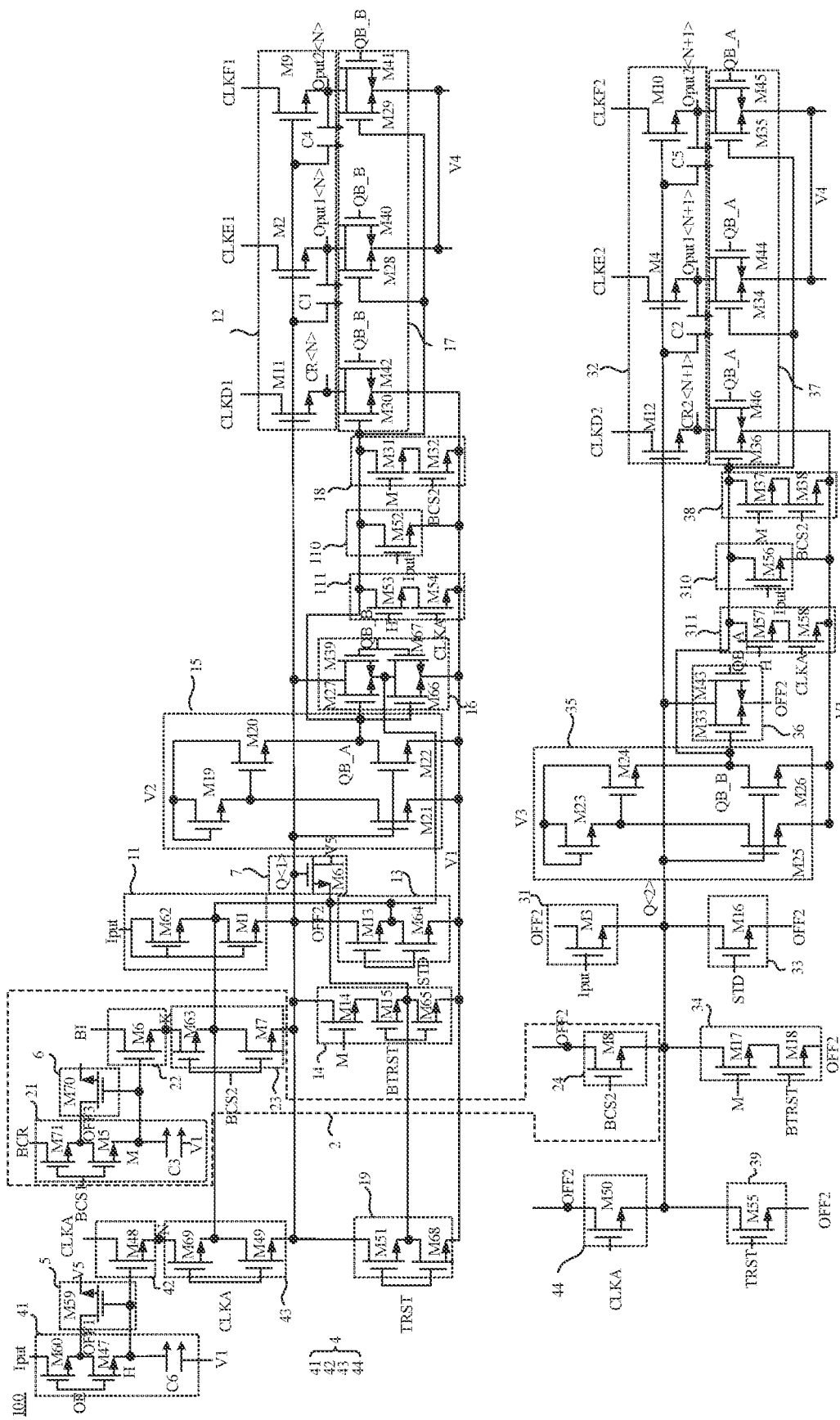
FIG. 37 is a circuit diagram of yet another shift register, in accordance with some embodiments of the present disclosure.

In some embodiments, as shown in FIG. 37, the shift register 100 further includes a first anti-leakage circuit 5.

In some examples, as shown in FIG. 37, the first anti-leakage circuit 5 is electrically connected to the first blanking node H, the fifth voltage signal terminal V5 and a first anti-leakage node OFF1. The first anti-leakage circuit 5 is configured to transmit the fifth voltage signal received at the fifth voltage signal terminal V5 to the first anti-leakage node OFF1 under the control of the voltage of the first blanking node H.

For example, in the case where the voltage of the first blanking node H is at the high level, the first anti-leakage circuit 5 may be turned on under the control of the voltage of the first blanking node H, receive the fifth voltage signal and transmit the fifth voltage signal to the first anti-leakage node OFF1, so as to charge the first anti-leakage node OFF1. As a result, a voltage of the first anti-leakage node OFF1 increases.

In some examples, as shown in FIG. 37, the selection control sub-circuit 41 is further electrically connected to the first anti-leakage node OFF1.

In a case where the forty-seventh transistor M47 in the selection control sub-circuit 41 is turned off and the sixth capacitor C6 discharges so that the voltage of the first blanking node H remains at a high level, the selection control sub-circuit 41 is electrically connected to the first anti-leakage node OFF1, so that a voltage difference between the first anti-leakage node OFF1 and the first blanking node H may be reduced, so as to avoid a leakage of the first blanking node H through the selection control sub-circuit 41. As a result, the first blanking node H remains at a relatively high and relatively stable voltage to avoid affecting the turn-on state of the blanking input sub-circuit 42.

The structures of the first anti-leakage circuit 5 and the selection control sub-circuit 41 are schematically described below with reference to the accompanying drawings.

In some examples, as shown in FIG. 37, the first anti-leakage circuit 5 includes a fifty-ninth transistor M59.

For example, as shown in FIG. 37, a control electrode of the fifty-ninth transistor M59 is electrically connected to the first blanking node H, a first electrode of the fifty-ninth transistor M59 is electrically connected to the fifth voltage signal terminal V5, and a second electrode of the fifty-ninth transistor M59 is electrically connected to the first anti-leakage node OFF1.

For example, in the case where the voltage of the first blanking node H is at the high level, the fifty-ninth transistor M59 may be turned on under the control of the voltage of the first blanking node H, receive the fifth voltage signal, and transmit the fifth voltage signal to the first anti-leakage node OFF1, so as to charge the first anti-leakage node OFF1. As a result, the voltage of the first anti-leakage node OFF1 increases.

Based on this, in some examples, as shown in FIG. 37, the selection control sub-circuit 41 may further include a sixtieth transistor M60.

For example, as shown in FIG. 37, a control electrode of the sixtieth transistor M60 is electrically connected to the third control signal terminal OE, a first electrode of the sixtieth transistor M60 is electrically connected to the display input signal terminal Iput, and a second electrode of the sixtieth transistor M60 is electrically connected to the first anti-leakage node OFF1. The first electrode of the forty-seventh transistor M47 of the selection control sub-circuit 41 is electrically connected to the first anti-leakage node OFF1, and is electrically connected to the display input signal terminal Iput through the sixtieth transistor M60.

For example, in the case where the third control signal is at the high level, the forty-seventh transistor M47 and the sixtieth transistor M60 may be simultaneously turned on due to an action of the third control signal; the sixtieth transistor M60 may receive the display input signal and transmit the display input signal to the first anti-leakage node OFF1, and the forty-seventh transistor M47 may receive the display input signal and transmit the display input signal to the first blanking node H to charge the first blanking node H.

In a case where the third control signal is at a low level, the forty-seventh transistor M47 and the sixtieth transistor M60 may be simultaneously turned off due to the action of the third control signal. The sixth capacitor C6 in the selection control sub-circuit 41 starts to discharge, so that the voltage of the first blanking node H remains at a high level. In this process, the fifty-ninth transistor M59 in the first anti-leakage circuit 5 may transmit the fifth voltage signal to the first anti-leakage node OFF1 to charge the first anti-leakage node OFF1, which reduces the voltage difference between the first anti-leakage node OFF1 and the first blanking node H and makes a voltage difference between the control electrode and the first electrode of the forty-seventh transistor M47 less than zero, thereby ensuring that the forty-seventh transistor M47 is completely or relatively completely turned off. In this way, the leakage of the first blanking node H through the selection control sub-circuit 41 may be avoided, so that the first blanking node H remains at the relatively high and relatively stable voltage.

The shift register 100 may further include other circuit structures, which may be specifically set according to actual needs.

In some embodiments, as shown in FIGS. 31 to 33, 36 and 37, the shift register 100 further includes a second anti-leakage circuit 7.

In some examples, as shown in FIGS. 31 to 33, 36 and 37, the second anti-leakage circuit 7 is electrically connected to the first pull-up node Q<1>, the fifth voltage signal terminal V5 and a second anti-leakage node OFF2. The second anti-leakage circuit 7 is configured to transmit the fifth voltage signal received at the fifth voltage signal terminal V5 to the second anti-leakage node OFF2 under the control of the voltage of the first pull-up node Q<1>.

For example, in the case where the voltage of the first pull-up node Q<1> is at the high level, the second anti-leakage circuit 7 may be turned on under the control of the voltage of the first pull-up node Q<1>, receive the fifth voltage signal and transmit the fifth voltage signal to the second anti-leakage node OFF2, so as to charge the second anti-leakage node OFF2. As a result, a voltage of the second anti-leakage node OFF2 increases.

The structure of the second anti-leakage circuit 7 is schematically described below with reference to the accompanying drawings.

In some examples, as shown in FIGS. 32, 33, 36 and 37, the second anti-leakage circuit 7 includes a sixty-first transistor M61.

For example, as shown in FIGS. 32, 33, 36 and 37, a control electrode of the sixty-first transistor M61 is electrically connected to the first pull-up node Q<1>, a first electrode of the sixty-first transistor M61 is electrically connected to the fifth voltage signal terminal V5, and a second electrode of the sixty-first transistor M61 is electrically connected to the second anti-leakage node OFF2.

For example, in the case where the voltage of the first pull-up node Q<1> is at the high level, the sixty-first transistor M61 may be turned on under the control of the voltage of the first pull-up node Q<1>, receive the fifth voltage signal and transmit the fifth voltage signal to the second anti-leakage node OFF2, so as to charge the second anti-leakage node OFF2. As a result, the voltage of the second anti-leakage node OFF2 increases.

It will be noted that other circuits included in the shift register 100 may also be electrically connected to the second anti-leakage node OFF2.

In some embodiments, as shown in FIGS. 32, 33, 36 and 37, the first input circuit 11 is further electrically connected to the second anti-leakage node OFF2.

In a case where the first input circuit 11 is turned off and the first capacitor C1 in the first output circuit 12 discharges so that the voltage of the first pull-up node Q<1> remains at a high level, the first input circuit 11 is electrically connected to the second anti-leakage node OFF2, so that a voltage difference between the second anti-leakage node OFF2 and the first pull-up node Q<1> may be reduced, so as to avoid a leakage of the first pull-up node Q<1> through the first input circuit 11. As a result, the first pull-up node Q<1> remains at a relatively high and relatively stable voltage to avoid affecting the turn-on state of the first output circuit 12.

Based on this, in some examples, as shown in FIGS. 32, 33, 36 and 37, the first input circuit 11 further includes a sixty-second transistor M62.

For example, as shown in FIGS. 32, 33, 36 and 37, a control electrode of the sixty-second transistor M62 is electrically connected to the display input signal terminal Iput, a first electrode of the sixty-second transistor M62 is electrically connected to the display input signal terminal Iput, and a second electrode of the sixty-second transistor M62 is electrically connected to the second anti-leakage node OFF2. The first electrode of the first transistor M1 is electrically connected to the second anti-leakage node OFF2, and is electrically connected to the display input signal terminal Iput through the sixty-second transistor M62.

For example, in the case where the display input signal is at the high level, the first transistor M1 and the sixty-second transistor M62 may be simultaneously turned on due to the action of the display input signal. The sixty-second transistor M62 may receive the display input signal and transmit the display input signal to the second anti-leakage node OFF2, and the first transistor M1 may receive the display input signal and transmit the display input signal to the first pull-up node Q<1> to charge the first pull-up node Q<1>.

In a case where the display input signal is at a low level, the first transistor M1 and the sixty-second transistor M62 may be simultaneously turned off due to the action of the display input signal. The first capacitor C1 in the first output circuit 12 starts to discharge, so that the voltage of the first pull-up node Q<1> remains at a high level. In this process, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the first pull-up node Q<1> and makes a voltage difference between the control electrode and the first electrode of the first transistor M1 less than zero, thereby ensuring that the first transistor M1 is completely or relatively completely turned off. In this way, the leakage of the first pull-up node Q<1> through the first input circuit 11 may be avoided, so that the first pull-up node Q<1> remains at the relatively high and relatively stable voltage.

In some embodiments, as shown in FIGS. 32, 33, 36 and 37, in the case where the shift register 100 further includes the second scan unit 3, the second input circuit 31 is further electrically connected to the second anti-leakage node OFF2.

In a case where the second input circuit 31 is turned off and the second capacitor C2 in the second output circuit 32 discharges so that the voltage of the second pull-up node Q<2> remains at a high level, the second input circuit 31 is electrically connected to the second anti-leakage node OFF2, so that a voltage difference between the second anti-leakage node OFF2 and the second pull-up node Q<2> may be reduced, so as to avoid a leakage of the second pull-up node Q<2> through the second input circuit 31. As a result, the second pull-up node Q<2> remains at a relatively high and relatively stable voltage to avoid affecting the turn-on state of the second output circuit 32.

Based on this, in some examples, as shown in FIGS. 32, 33, 36 and 37, the first electrode of the third transistor M3 in the second input circuit 31 is electrically connected to the second anti-leakage node OFF2, and is electrically connected to the display input signal terminal Iput through the sixty-second transistor M62.

For example, in the case where the display input signal is at the high level, the third transistor M3 and the sixty-second transistor M62 may be simultaneously turned on due to the action of the display input signal; the sixty-second transistor M62 may receive the display input signal and transmit the display input signal to the second anti-leakage node OFF2, and the third transistor M3 may receive the display input signal and transmit the display input signal to the second pull-up node Q<2> to charge the second pull-up node Q<2>.

In the case where the display input signal is at the low level, the third transistor M3 and the sixty-second transistor M62 may be simultaneously turned off due to the action of the display input signal. The second capacitor C2 in the second output circuit 32 starts to discharge, so that the voltage of the second pull-up node Q<2> remains at a high level. In this process, the voltage of the first pull-up node Q<1> remains at the high level, and the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the second pull-up node Q<2> and makes a voltage difference between the control electrode and the first electrode of the third transistor M3 less than zero, thereby ensuring that the third transistor M3 is completely or relatively completely turned off. In this way, the leakage of the second pull-up node Q<2> through the second input circuit 31 may be avoided, so that the second pull-up node Q<2> remains at the relatively high and relatively stable voltage.

In addition, the second input circuit 31 shares the sixty-second transistor M62 with the first input circuit 11, which is conducive to simplifying the structure of the shift register 100 and reducing the area occupied by the shift register 100.

In some embodiments, as shown in FIGS. 32, 33, 36 and 37, the black insertion circuit 2 is further electrically connected to the second anti-leakage node OFF2.

Based on this, in some examples, as shown in FIGS. 32, 33, 36 and 37, in a case where the black insertion circuit 2 includes the first black insertion transmission sub-circuit 23, the first black insertion transmission sub-circuit 23 further includes a sixty-third transistor M63.

For example, as shown in FIGS. 32, 33, 36 and 37, a control electrode of the sixty-third transistor M63 is electrically connected to the second control signal terminal BCS2, a first electrode of the sixty-third transistor M63 is electrically connected to the second black insertion node K, and a second electrode of the sixty-third transistor M63 is electrically connected to the second anti-leakage node OFF2. The first electrode of the seventh transistor M7 in the first black insertion transmission sub-circuit 23 is electrically connected to the second anti-leakage node OFF2, and is electrically connected to the second black insertion node K through the sixty-third transistor M63.

For example, in the case where the second control signal is at the high level, the seventh transistor M7 and the sixty-third transistor M63 may be simultaneously turned on due to an action of the second control signal. The sixty-third transistor M63 may receive the black insertion input signal from the second black insertion node K and transmit the black insertion input signal to the second anti-leakage node OFF2, and the seventh transistor M7 may receive the black insertion input signal and transmit the black insertion input signal to the first pull-up node Q<1> to charge the first pull-up node Q<1>.

In a case where the second control signal is at a low level, the seventh transistor M7 and the sixty-third transistor M63 may be simultaneously turned off due to the action of the second control signal. The first capacitor C1 in the first output circuit 12 starts to discharge, so that the voltage of the first pull-up node Q<1> remains at the high level. In this process, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the first pull-up node Q<1> and makes a voltage difference between the control electrode and the first electrode of the seventh transistor M7 less than zero, thereby ensuring that the seventh transistor M7 is completely or relatively completely turned off. In this way, a leakage of the first pull-up node Q<1> through the first black insertion transmission sub-circuit 23 may be avoided, so that the first pull-up node Q<1> remains at the relatively high and relatively stable voltage.

In some examples, as shown in FIGS. 32, 33, 36 and 37, the first electrode of the eighth transistor M8 in the second black insertion transmission sub-circuit 24 is electrically connected to the second anti-leakage node OFF2, and is electrically connected to the second black insertion node K through the sixty-third transistor M63.

For example, in the case where the second control signal is at the high level, the eighth transistor M8 and the sixty-third transistor M63 may be simultaneously turned on due to the action of the second control signal; the sixty-third transistor M63 may receive the black insertion input signal from the second black insertion node K and transmit the black insertion input signal to the second anti-leakage node OFF2, and the eighth transistor M8 may receive the black insertion input signal and transmit the black insertion input signal to the second pull-up node Q<2> to charge the second pull-up node Q<2>.

In the case where the second control signal is at the low level, the eighth transistor M8 and the sixty-third transistor M63 may be simultaneously turned off due to the action of the second control signal; the second capacitor C2 in the second output circuit 32 starts to discharge, so that the voltage of the second pull-up node Q<2> remains at the high level. In this process, the voltage of the first pull-up node Q<1> remains at the high level, and the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the second pull-up node Q<2> and makes the voltage difference between the control electrode and the first electrode of the eighth transistor M8 less than zero, thereby ensuring that the eighth transistor M8 is completely or relatively completely turned off. In this way, a leakage of the second pull-up node Q<2> through the second black insertion transmission sub-circuit 24 may be avoided, so that the second pull-up node Q<2> remains at the relatively high and relatively stable voltage.

In addition, the second black insertion transmission sub-circuit 24 shares the sixty-third transistor M63 with the first black insertion transmission sub-circuit 23, which is conducive to simplifying the structure of the shift register 100 and reducing the area occupied by the shift register 100.

In some embodiments, as shown in FIGS. 32, 33, 36 and 37, in a case where the first scan unit 1 further includes the first reset circuit 13, the first reset circuit 13 is further electrically connected to the second anti-leakage node OFF2.

In a case where the voltage of the first pull-up node Q<1> is at a high level and the first reset circuit 13 is not working, the first reset circuit 13 is electrically connected to the second anti-leakage node OFF2, so that the voltage difference between the second anti-leakage node OFF2 and the first pull-up node Q<1> may be reduced, so as to avoid a leakage of the first pull-up node Q<1> through the first reset circuit 13. As a result, the first pull-up node Q<1> remains at the relatively high and relatively stable voltage to avoid affecting the turn-on state of the first output circuit 12.

Based on this, in some examples, as shown in FIGS. 32, 33, 36 and 37, the first reset circuit 13 further includes a sixty-fourth transistor M64.

For example, as shown in FIGS. 32, 33, 36 and 37, a control electrode of the sixty-fourth transistor M64 is electrically connected to the first reset signal terminal STD, a first electrode of the sixty-fourth transistor M64 is electrically connected to the second anti-leakage node OFF2, and a second electrode of the sixty-fourth transistor M64 is electrically connected to the first voltage signal terminal V1. The second electrode of the thirteenth transistor M13 in the first reset circuit 13 is electrically connected to the second anti-leakage node OFF2, and is electrically connected to the first voltage signal terminal V1 through the sixty-fourth transistor M64.

For example, in the case where the first reset signal is at the high level, the thirteenth transistor M13 and the sixty-fourth transistor M64 may be simultaneously turned on due to an action of the first reset signal. The sixty-fourth transistor M64 may receive the first voltage signal and transmit the first voltage signal to the second anti-leakage node OFF2, and the thirteenth transistor M13 may transmit the first voltage signal to the first pull-up node Q<1> to perform the pull-down reset on the first pull-up node Q<1>.

In a case where the first reset signal is at a low level, the thirteenth transistor M13 and the sixty-fourth transistor M64 may be simultaneously turned off due to the action of the first reset signal. In a case where the voltage of the first pull-up node Q<1> remains at a high level, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the first pull-up node Q<1>, and makes a voltage difference between the control electrode and the second electrode of the thirteenth transistor M13 less than zero, thereby ensuring that the thirteenth transistor M13 is completely or relatively completely turned off. In this way, the leakage of the first pull-up node Q<1> through the first reset circuit 13 may be avoided, so that the first pull-up node Q<1> remains at a relatively high and relatively stable voltage.

In some embodiments, as shown in FIGS. 32, 33, 36 and 37, in a case where the second scan unit 3 further includes the third reset circuit 33, the third reset circuit 33 is further electrically connected to the second anti-leakage node OFF2.

In a case where the voltage of the first pull-up node Q<1> is at a high level, the voltage of the second pull-up node Q<2> is at a high level, and the third reset circuit 33 is not working, the third reset circuit 33 is electrically connected to the second anti-leakage node OFF2, so that the voltage difference between the second anti-leakage node OFF2 and the second pull-up node Q<2> may be reduced, so as to avoid a leakage of the second pull-up node Q<2> through the third reset circuit 33. As a result, the second pull-up node Q<2> remains at a relatively high and relatively stable voltage to avoid affecting the turn-on state of the second output circuit 32.

Based on this, in some examples, as shown in FIGS. 32, 33, 36 and 37, the second electrode of the sixteenth transistor M16 in the third reset circuit 33 is electrically connected to the second anti-leakage node OFF2, and is electrically connected to the first voltage signal terminal V1 through the sixty-fourth transistor M64.

For example, in the case where the first reset signal is at the high level, the sixteenth transistor M16 and the sixty-fourth transistor M64 may be simultaneously turned on due to the action of the first reset signal. The sixty-fourth transistor M64 may receive the first voltage signal and transmit the first voltage signal to the second anti-leakage node OFF2, and the sixteenth transistor M16 may transmit the first voltage signal to the second pull-up node Q<2> to perform the pull-down reset on the second pull-up node Q<2>.

In the case where the first reset signal is at the low level, the sixteenth transistor M16 and the sixty-fourth transistor M64 may be simultaneously turned off due to the action of the first reset signal. In a case where the voltage of the first pull-up node Q<1> and the voltage of the second pull-up node Q<2> both remains at a high level, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the second pull-up node Q<2>, and makes a voltage difference between the control electrode and the second electrode of the sixteenth transistor M16 less than zero, thereby ensuring that the sixteenth transistor M16 is completely or relatively completely turned off. In this way, the leakage of the second pull-up node Q<2> through the third reset circuit 33 may be avoided, so that the second pull-up node Q<2> remains at a relatively high and relatively stable voltage.

In addition, the third reset circuit 33 shares the sixty-fourth transistor M64 with the first reset circuit 13, which is conducive to simplifying the structure of the shift register 100 and reducing the area occupied by the shift register 100.

In some embodiments, as shown in FIGS. 32, 33, 36 and 37, in a case where the first scan unit 1 further includes the second reset circuit 14, the second reset circuit 14 is further electrically connected to the second anti-leakage node OFF2.

In a case where the voltage of the first pull-up node Q<1> is at a high level and the second reset circuit 14 is not working, the second reset circuit 14 is electrically connected to the second anti-leakage node OFF2, so that the voltage difference between the second anti-leakage node OFF2 and the first pull-up node Q<1> may be reduced, so as to avoid a leakage of the first pull-up node Q<1> through the second reset circuit 14. As a result, the first pull-up node Q<1> remains at a relatively high and relatively stable voltage to avoid affecting the turn-on state of the first output circuit 12.

Based on this, in some examples, as shown in FIGS. 32, 33, 36 and 37, the second reset circuit 14 further includes a sixty-fifth transistor M65.

For example, as shown in FIGS. 32, 33, 36 and 37, a control electrode of the sixty-fifth transistor M65 is electrically connected to the second reset signal terminal BTRST, a first electrode of the sixty-fifth transistor M65 is electrically connected to the second anti-leakage node OFF2, and a second electrode of the sixty-fifth transistor M65 is electrically connected to the first voltage signal terminal V1. The second electrode of the fifteenth transistor M15 in the second reset circuit 14 is electrically connected to the second anti-leakage node OFF2, and is electrically connected to the first voltage signal terminal V1 through the sixty-fifth transistor M65.

For example, in the case where the second reset signal is at the high level and the voltage of the first black insertion node M is at the high level, the fourteenth transistor M14 may be turned on due to an action of the voltage of the first black insertion node M, and the fifteenth transistor M15 and the sixty-fifth transistor M65 may be simultaneously turned on due to an action of the second reset signal; the sixty-fifth transistor M65 may receive the first voltage signal and transmit the first voltage signal to the second anti-leakage node OFF2, and the fifteenth transistor M15 and the fourteenth transistor M14 may transmit the first voltage signal to the first pull-up node Q<1> to perform the pull-down reset on the first pull-up node Q<1>.

In a case where the second reset signal is at a low level and the voltage of the first black insertion node M is at a low level, the fourteenth transistor M14, the fifteenth transistor M15 and the sixty-fifth transistor M65 may be turned off. In the case where the voltage of the first pull-up node Q<1> remains at the high level, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the first pull-up node Q<1>, and makes a voltage difference between the control electrode and the second electrode of the fifteenth transistor M15 less than zero, thereby ensuring that the fifteenth transistor M15 is completely or relatively completely turned off. In this way, the leakage of the first pull-up node Q<1> through the second reset circuit 14 may be avoided, so that the first pull-up node Q<1> remains at a relatively high and relatively stable voltage.

In some embodiments, as shown in FIGS. 32, 33, 36 and 37, in a case where the second scan unit 3 further includes the fourth reset circuit 34, the fourth reset circuit 34 is further electrically connected to the second anti-leakage node OFF2.

In a case where the voltage of the first pull-up node Q<1> is at a high level, the voltage of the second pull-up node Q<2> is at a high level, and the fourth reset circuit 34 is not working, the fourth reset circuit 34 is electrically connected to the second anti-leakage node OFF2, so that the voltage difference between the second anti-leakage node OFF2 and the second pull-up node Q<2> may be reduced, so as to avoid a leakage of the second pull-up node Q<2> through the fourth reset circuit 34. As a result, the second pull-up node Q<2> remains at a relatively high and relatively stable voltage to avoid affecting the turn-on state of the second output circuit 32.

Based on this, in some examples, as shown in FIGS. 32, 33, 36 and 37, the second electrode of the eighteenth transistor M18 in the fourth reset circuit 34 is electrically connected to the second anti-leakage node OFF2, and is electrically connected to the first voltage signal terminal V1 through the sixty-fifth transistor M65.

For example, in the case where the second reset signal is at the high level and the voltage of the first black insertion node M is at the high level, the seventeenth transistor M17 may be turned on due to the action of the voltage of the first black insertion node M, and the eighteenth transistor M18 and the sixty-fifth transistor M65 may be simultaneously turned on due to the action of the second reset signal. The sixty-fifth transistor M65 may receive the first voltage signal and transmit the first voltage signal to the second anti-leakage node OFF2, and the eighteenth transistor M18 and the seventeenth transistor M17 may transmit the first voltage signal to the second pull-up node Q<2> to perform the pull-down reset on the second pull-up node Q<2>.

In the case where the second reset signal is at the low level and the voltage of the first black insertion node M is at the low level, the seventeenth transistor M17, the eighteenth transistor M18 and the sixty-fifth transistor M65 may be turned off. In the case where the voltage of the first pull-up node Q<1> remains at the high level, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the second pull-up node Q<2>, and makes a voltage difference between the control electrode and the second electrode of the eighteenth transistor M18 less than zero, thereby ensuring that the eighteenth transistor M18 is completely or relatively completely turned off. In this way, the leakage of the second pull-up node Q<2> through the fourth reset circuit 34 may be avoided, so that the second pull-up node Q<2> remains at the relatively high and relatively stable voltage.

In addition, the fourth reset circuit 34 shares the sixty-fifth transistor M65 with the second reset circuit 14, which is conducive to simplifying the structure of the shift register 100 and reducing the area occupied by the shift register 100.

In some embodiments, as shown in FIGS. 32, 33, 36 and 37, in a case where the first scan unit 1 further includes the fifth reset circuit 16, the fifth reset circuit 16 is further electrically connected to the second anti-leakage node OFF2.

In a case where the voltage of the first pull-up node Q<1> is at a high level and the fifth reset circuit 16 is not working, the fifth reset circuit 16 is electrically connected to the second anti-leakage node OFF2, so that the voltage difference between the second anti-leakage node OFF2 and the first pull-up node Q<1> may be reduced, so as to avoid a leakage of the first pull-up node Q<1> through the fifth reset circuit 16. As a result, the first pull-up node Q<1> remains at a relatively high and relatively stable voltage to avoid affecting the turn-on state of the first output circuit 12.

Based on this, in some examples, as shown in FIGS. 32, 33, 36 and 37, the fifth reset circuit 16 further includes a sixty-sixth transistor M66.

For example, as shown in FIGS. 32, 33, 36 and 37, a control electrode of the sixty-sixth transistor M66 is electrically connected to the first pull-down node QB_A, a first electrode of the sixty-sixth transistor M66 is electrically connected to the second anti-leakage node OFF2, and a second electrode of the sixty-sixth transistor M66 is electrically connected to the first voltage signal terminal V1. The second electrode of the twenty-seventh transistor M27 in the fifth reset circuit 16 is electrically connected to the second anti-leakage node OFF2, and is electrically connected to the first voltage signal terminal V1 through the sixty-sixth transistor M66.

For example, in the case where the voltage of the first pull-down node QB_A is at the high level, the twenty-seventh transistor M27 and the sixty-sixth transistor M66 may be simultaneously turned on due to an action of the voltage of the first pull-down node QB_A. The sixty-sixth transistor M66 may receive the first voltage signal and transmit the first voltage signal to the second anti-leakage node OFF2, and the twenty-seventh transistor M27 may transmit the first voltage signal to the first pull-up node Q<1> to perform the pull-down reset on the first pull-up node Q<1>.

In a case where the voltage of the first pull-down node QB_A is at a low level, the voltage of the first pull-up node Q<1> is at a high level. The twenty-seventh transistor M27 and the sixty-sixth transistor M66 may be turned off. The sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the first pull-up node Q<1>, and makes a voltage difference between the control electrode and the second electrode of the twenty-seventh transistor M27 less than zero, thereby ensuring that the twenty-seventh transistor M27 is completely or relatively completely turned off. In this way, the leakage of the first pull-up node Q<1> through the fifth reset circuit 16 may be avoided, so that the first pull-up node Q<1> remains at a relatively high and relatively stable voltage.

Figure 36:
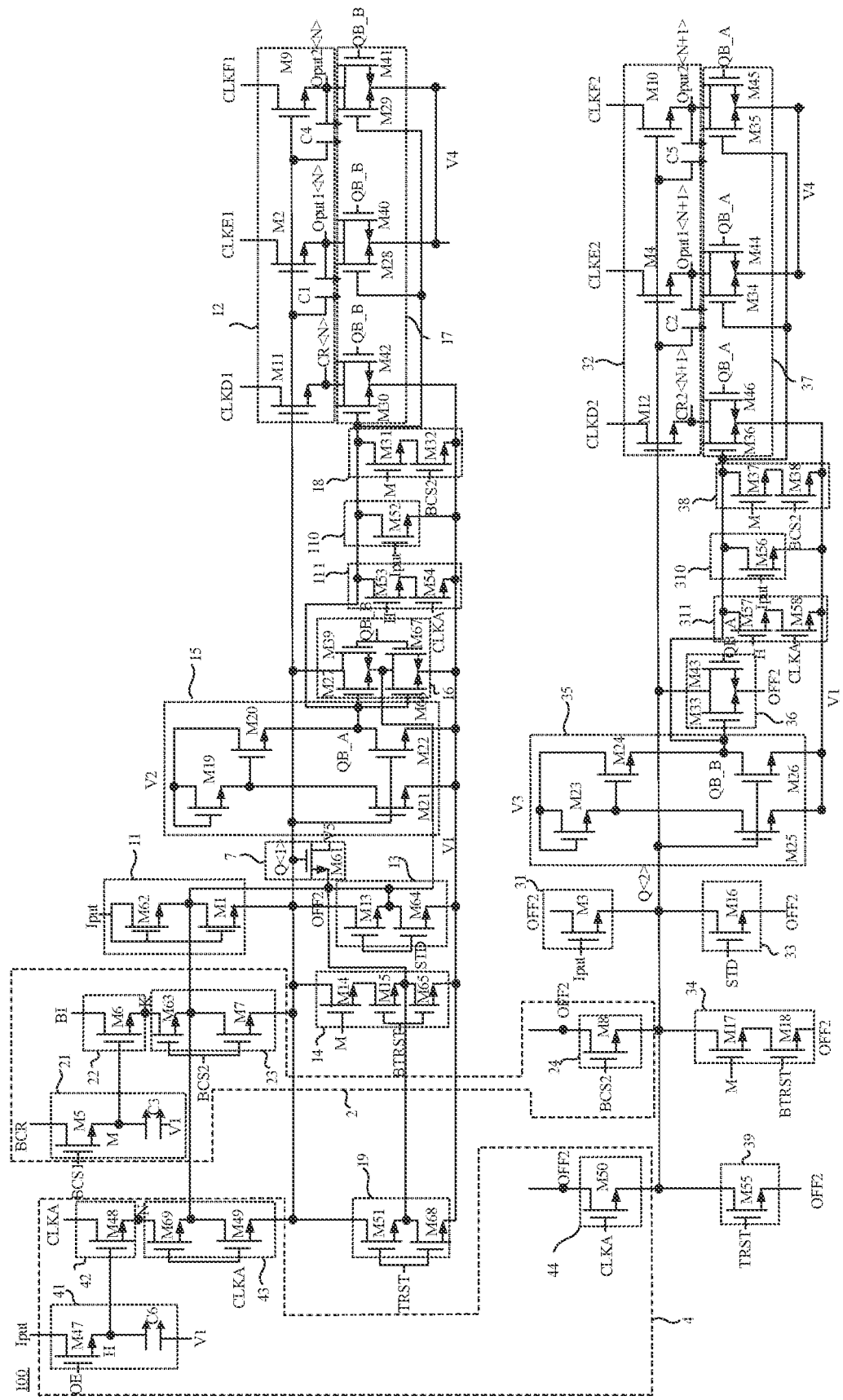
FIG. 36 is a circuit diagram of yet another shift register, in accordance with some embodiments of the present disclosure.

It will be noted that, as shown in FIGS. 36 and 37, in a case where the fifth reset circuit 16 is further electrically connected to the second pull-down node QB_B, the fifth reset circuit 16 further includes a sixty-seventh transistor M67.

For example, as shown in FIGS. 36 and 37, a control electrode of the sixty-seventh transistor M67 is electrically connected to the second pull-down node QB_B, a first electrode of the sixty-seventh transistor M67 is electrically connected to the second anti-leakage node OFF2, and a second electrode of the sixty-seventh transistor M67 is electrically connected to the first voltage signal terminal V1. The second electrode of the thirty-ninth transistor M39 in the fifth reset circuit 16 is electrically connected to the second anti-leakage node OFF2, and is electrically connected to the first voltage signal terminal V1 through the sixty-seventh transistor M67.

For example, in the case where the voltage of the second pull-down node QB_B is at the high level, the thirty-ninth transistor M39 and the sixty-seventh transistor M67 may be simultaneously turned on due to an action of the voltage of the second pull-down node QB_B. The sixty-seventh transistor M67 may receive the first voltage signal and transmit the first voltage signal to the second anti-leakage node OFF2, and the thirty-ninth transistor M39 may transmit the first voltage signal to the first pull-up node Q<1> to perform the pull-down reset on the first pull-up node Q<1>.

In a case where the voltage of the second pull-down node QB_B is at a low level, the voltage of the first pull-up node Q<1> is at a high level. The thirty-ninth transistor M39 and the sixty-seventh transistor M67 may be turned off. The sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the first pull-up node Q<1>, and makes a voltage difference between the control electrode and the second electrode of the thirty-ninth transistor M39 less than zero, thereby ensuring that the thirty-ninth transistor M39 is completely or relatively completely turned off. In this way, the leakage of the first pull-up node Q<1> through the fifth reset circuit 16 may be avoided, so that the first pull-up node Q<1> remains at the relatively high and relatively stable voltage.

In some embodiments, as shown in FIGS. 32, 33, 36 and 37, in a case where the second scan unit 3 further includes the eighth reset circuit 36, the eighth reset circuit 36 is further electrically connected to the second anti-leakage node OFF2.

In a case where the voltage of the first pull-up node Q<1> is at a high level, the voltage of the second pull-up node Q<2> is at a high level, and the eighth reset circuit 36 is not working, the eighth reset circuit 36 is electrically connected to the second anti-leakage node OFF2, the voltage difference between the second anti-leakage node OFF2 and the second pull-up node Q<2> may be reduced, so as to avoid a leakage of the second pull-up node Q<2> through the eighth reset circuit 36. As a result, the second pull-up node Q<2> remains at a relatively high and relatively stable voltage to avoid affecting the turn-on state of the second output circuit 32.

Based on this, in some examples, as shown in FIGS. 32, 33, 36 and 37, the second electrode of the thirty-third transistor M33 in the eighth reset circuit 36 is electrically connected to the second anti-leakage node OFF2, and is electrically connected to the first voltage signal terminal V1 through the sixty-sixth transistor M66.

For example, in the case where the voltage of the second pull-down node QB_B is at the high level, the voltage of the first pull-down node QB_A is at a high level. The thirty-third transistor M33 may be turned on due to the action of the voltage of the second pull-down node QB_B, and the sixty-sixth transistor M66 may be turned on due to the action of the voltage of the first pull-down node QB_A. The sixty-sixth transistor M66 may receive the first voltage signal and transmit the first voltage signal to the second anti-leakage node OFF2, and the thirty-third transistor M33 may transmit the first voltage signal to the second pull-up node Q<2> to perform the pull-down reset on the second pull-up node Q<2>.

In the case where the voltage of the second pull-down node QB_B is at the low level, the voltage of the first pull-down node QB_A is at a low level, and the voltage of the first pull-up node Q<1> is at the high level, the thirty-third transistor M33 and the sixty-sixth transistor M66 may be turned off; the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the second pull-up node Q<2>, and makes a voltage difference between the control electrode and the second electrode of the thirty-third transistor M33 less than zero, thereby ensuring that the thirty-third transistor M33 is completely or relatively completely turned off. In this way, the leakage of the second pull-up node Q<2> through the eighth reset circuit 36 may be avoided, so that the second pull-up node Q<2> remains at a relatively high and relatively stable voltage.

It will be noted that, as shown in FIGS. 36 and 37, in a case where the eighth reset circuit 36 is further electrically connected to the first pull-down node QB_A, the second electrode of the forty-third transistor M43 in the eighth reset circuit 36 is electrically connected to the second anti-leakage node OFF2, and is electrically connected to the first voltage signal terminal V1 through the sixty-seventh transistor M67.

For example, in the case where the voltage of the second pull-down node QB_B is at the high level, the voltage of the first pull-down node QB_A is at the high level; the forty-third transistor M43 and the sixty-seventh transistor M67 may be turned on, the sixty-seventh transistor M67 may receive the first voltage signal and transmit the first voltage signal to the second anti-leakage node OFF2, and the forty-third transistor M43 may transmit the first voltage signal to the second pull-up node Q<2> to perform the pull-down reset on the second pull-up node Q<2>.

In the case where the voltage of the second pull-down node QB_B is at the low level; the voltage of the first pull-down node QB_A is at the low level, and the voltage of the first pull-up node Q<1> is at the high level; the forty-third transistor M43 and the sixty-seventh transistor M67 may be turned off; the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the second pull-up node Q<2>, and makes a voltage difference between the control electrode and the second electrode of the forty-third transistor M43 less than zero, thereby ensuring that the forty-third transistor M43 is completely or relatively completely turned off. In this way, the leakage of the second pull-up node Q<2> through the eighth reset circuit 36 may be avoided, so that the second pull-up node Q<2> remains at a relatively high and relatively stable voltage.

In addition, the eighth reset circuit 36 shares the sixty-sixth transistor M66 and the sixty-seventh transistor M67 with the fifth reset circuit 16, which is conducive to simplifying the structure of the shift register 100 and reducing the area occupied by the shift register 100.

In some embodiments, as shown in FIGS. 36 and 37, in a case where the first scan unit 1 further includes the eleventh reset circuit 19, the eleventh reset circuit 19 is further electrically connected to the second anti-leakage node OFF2.

In a case where the voltage of the first pull-up node Q<1> is at a high level, and the eleventh reset circuit 19 is not working, the eleventh reset circuit 19 is electrically connected to the second anti-leakage node OFF2, so that the voltage difference between the second anti-leakage node OFF2 and the first pull-up node Q<1> may be reduced, so as to avoid a leakage of the first pull-up node Q<1> through the eleventh reset circuit 19. As a result, the first pull-up node Q<1> remains at a relatively high and relatively stable voltage to avoid affecting the turn-on state of the first output circuit 12.

Based on this, in some examples, as shown in FIGS. 36 and 37, the eleventh reset circuit 19 further includes a sixty-eighth transistor M68.

For example, as shown in FIGS. 36 and 37, a control electrode of the sixty-eighth transistor M68 is electrically connected to the global reset signal terminal TRST, a first electrode of the sixty-eighth transistor M68 is electrically connected to the second anti-leakage node OFF2, and a second electrode of the sixty-eighth transistor M68 is electrically connected to the first voltage signal terminal V1 The second electrode of the fifty-first transistor M51 in the eleventh reset circuit 36 is electrically connected to the second anti-leakage node OFF2, and is electrically connected to the first voltage signal terminal V1 through the sixty-eighth transistor M68.

For example, in the case where the global reset signal is at the high level, the fifty-first transistor M51 and the sixty-eighth transistor M68 may be simultaneously turned on due to the action of the global reset signal. The sixty-eighth transistor M68 may receive the first voltage signal and transmit the first voltage signal to the second anti-leakage node OFF2, and the fifty-first transistor M51 may transmit the first voltage signal to the first pull-up node Q<1> to perform the pull-down reset on the first pull-up node Q<1>.

For example, in a case where the global reset signal is a low level, the fifty-first transistor M51 and the sixty-eighth transistor M68 may be simultaneously turned off due to the action of the global reset signal. In the case where the voltage of the first pull-up node Q<1> remains at the high level, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the first pull-up node Q<1>, and makes a voltage difference between the control electrode and the second electrode of the fifty-first transistor M51 less than zero, thereby ensuring that the fifty-first transistor M51 is completely or relatively completely turned off. In this way, the leakage of the first pull-up node Q<1> through the eleventh reset circuit 19 may be avoided, so that the first pull-up node Q<1> remains at a relatively high and relatively stable voltage.

In some embodiments, as shown in FIGS. 36 and 37, in a case where the second scan unit 3 further includes the fourteenth reset circuit 39, the fourteenth reset circuit 39 is further electrically connected to the second anti-leakage node OFF2.

In a case where the voltage of the first pull-up node Q<1> is at a high level, the voltage of the second pull-up node Q<2> is at a high level, and the fourteenth reset circuit 39 is not working, the fourteenth reset circuit 39 is electrically connected to the second anti-leakage node OFF2, so that the voltage difference between the second anti-leakage node OFF2 and the second pull-up node Q<2> may be reduced, so as to avoid a leakage of the second pull-up node Q<2> through the fourteenth reset circuit 39. As a result, the second pull-up node Q<2> remains at a relatively high and relatively stable voltage to avoid affecting the turn-on state of the second output circuit 32.

Based on this, in some examples, as shown in FIGS. 36 and 37, the second electrode of the fifty-fifth transistor M55 in the fourteenth reset circuit 39 is electrically connected to the second anti-leakage node OFF2, and is electrically connected to the first voltage signal terminal V1 through the sixty-eighth transistor M68.

For example, in the case where the global reset signal is at the high level, the fifty-fifth transistor M55 and the sixty-eighth transistor M63 may be simultaneously turned on due to the action of the global reset signal. The sixty-eighth transistor M68 may receive the first voltage signal and transmit the first voltage signal to the second anti-leakage node OFF2, and the fifty-fifth transistor M55 may transmit the first voltage signal to the second pull-up node Q<2> to perform the pull-down reset on the second pull-up node Q<2>.

For example, in the case where the global reset signal is at the low level, the fifty-fifth transistor M55 and the sixty-eighth transistor M68 may be simultaneously turned off due to the action of the global reset signal. In the case where the voltage of the first pull-up node Q<1> and the voltage of the second pull-up node Q<2> both remains at the high level, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the second pull-up node Q<2>, and makes a voltage difference between the control electrode and the second electrode of the fifty-fifth transistor M55 less than zero, thereby ensuring that the fifty-fifth transistor M55 is completely or relatively completely turned off. In this way, the leakage of the second pull-up node Q<2> through the fourteenth reset circuit 39 may be avoided, so that the second pull-up node Q<2> remains at a relatively high and relatively stable voltage.

In addition, the fourteenth reset circuit 39 shares the sixty-eighth transistor M68 with the eleventh reset circuit 19, which is conducive to simplifying the structure of the shift register 100 and reducing the area occupied by the shift register 100.

In some embodiments, as shown in FIGS. 36 and 37, in a case where the shift register 100 further includes the blanking circuit 4, the blanking circuit 4 is further electrically connected to the second anti-leakage node OFF2.

Based on this, in some examples, as shown in FIGS. 36 and 37, in a case where the blanking circuit 4 includes the first blanking transmission sub-circuit 43, the first blanking transmission sub-circuit 43 further includes a sixty-ninth transistor M69.

For example, as shown in FIGS. 36 and 37, a control electrode of the sixty-ninth transistor M69 is electrically connected to the seventh clock signal terminal CLKA, a first electrode of the sixty-ninth transistor M69 is electrically connected to the second blanking node N, and a second electrode of the sixty-ninth transistor M69 is electrically connected to the second anti-leakage node OFF2. The first electrode of the forty-ninth transistor M49 in the first blanking transmission sub-circuit 43 is electrically connected to the second anti-leakage node OFF2, and is electrically connected to the second blanking node N through the sixty-ninth transistor M69.

For example, in the case where the seventh clock signal is at the high level, the forty-ninth transistor M49 and the sixty-ninth transistor M69 may be simultaneously turned on due to the action of the seventh clock signal. The sixty-ninth transistor M69 may receive the seventh clock signal from the second blanking node N and transmit the seventh clock signal to the second anti-leakage node OFF2, and the forty-ninth transistor M49 may receive the seventh clock signal and transmit the seventh clock signal to the first pull-up node Q<1> to charge the first pull-up node Q<1>.

In a case where the seventh clock signal is at a low level, the forty-ninth transistor M49 and the sixty-ninth transistor M69 may be simultaneously turned off due to the action of the seventh clock signal. In the case where the voltage of the first pull-up node Q<1> remains at the high level, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the first pull-up node Q<1>, and makes a voltage difference between the control electrode and the first electrode of the forty-ninth transistor M49 less than zero, thereby ensuring that the forty-ninth transistor M49 is completely or relatively completely turned off. In this way, a leakage of the first pull-up node Q<1> through the first blanking transmission sub-circuit 43 may be avoided, so that the first pull-up node Q<1> remains at a relatively high and relatively stable voltage.

In some examples, as shown in FIGS. 36 and 37, the first electrode of the fiftieth transistor M50 in the second blanking transmission sub-circuit 44 is electrically connected to the second anti-leakage node OFF2, and is electrically connected to the second blanking node N through the sixty-ninth transistor M69.

For example, in the case where the seventh clock signal is at the high level, the fiftieth transistor M50 and the sixty-ninth transistor M69 may be simultaneously turned on due to the action of the seventh clock signal. The sixty-ninth transistor M69 may receive the seventh clock signal from the second blanking node N and transmit the seventh clock signal to the second anti-leakage node OFF2, and the fiftieth transistor M50 may receive the seventh clock signal and transmit the seventh clock signal to the second pull-up node Q<2> to charge the second pull-up node Q<2>.

In the case where the seventh clock signal is at the low level, the fiftieth transistor M50 and the sixty-ninth transistor M69 may be simultaneously turned off due to the action of the seventh clock signal. In the case where the voltage of the first pull-up node Q<1> remains at the high level, the sixty-first transistor M61 in the second anti-leakage circuit 7 may transmit the fifth voltage signal to the second anti-leakage node OFF2 to charge the second anti-leakage node OFF2, which reduces the voltage difference between the second anti-leakage node OFF2 and the second pull-up node Q<2>, and makes a voltage difference between the control electrode and the first electrode of the fiftieth transistor M50 less than zero, thereby ensuring that the fiftieth transistor M50 is completely or relatively completely turned off. In this way, a leakage of the second pull-up node Q<2> through the second blanking transmission sub-circuit 44 may be avoided, so that the second pull-up node Q<2> remains at a relatively high and relatively stable voltage.

In the scan driving circuit 1000 provided in some embodiments of the present disclosure, as shown in FIGS. 38 to 42, the plurality stages of cascaded shift registers 100 included in the scan driving circuit 1000 include a plurality of first shift register groups C and a plurality of second shift register groups D. The first shift register groups C and the second shift register groups D are alternately arranged.

In some examples, each of the shift registers 100 may include the first scan unit 1.

In some other examples, as shown in FIGS. 38 to 42, each of the shift registers 100 may include the first scan unit 1 and the second scan unit 3.

The structure of the scan driving circuit 1000 is schematically described below by taking an example where each of the shift registers 100 includes the first scan unit 1 and the second scan unit 3.

In some examples, the first shift register group C may include 2N stages of shift registers 100, and the second shift register group includes 2N stages of shift registers 100, where N is a positive integer. That is, each shift register group includes the same number of shift registers 100.

For example, in a case where N is equal to 2 (N=2), the first shift register group C may include 4 stages of shift registers 100, and the second shift register group includes 4 stages of shift registers 100. Each shift register 100 includes the first scan unit 1 and the second scan unit 3. Correspondingly, each shift register group (e.g., each first shift register group C and each second shift register group D) may have eight scan signal terminals (i.e., 4 first scan signal terminals Oput1<N> and 4 second scan signal terminals Oput1<N+1>). For example, the eight scan signal terminals may be electrically connected to eight rows of sub-pixels P, respectively.

For example, in a case where N is equal to 4 (N=4), the first shift register group C may include 8 stages of shift registers 100, and the second shift register group includes 8 stages of shift registers 100. Each shift register 100 includes the first scan unit 1 and the second scan unit 3. Correspondingly, each shift register group (e.g., each first shift register group C and each second shift register group D) may have sixteen scan signal terminals (i.e., 8 first scan signal terminals Oput1<N> and 8 second scan signal terminals Oput1<N+1>). For example, the sixteen scan signal terminals may be electrically connected to sixteen rows of sub-pixels F, respectively.

Figure 43:
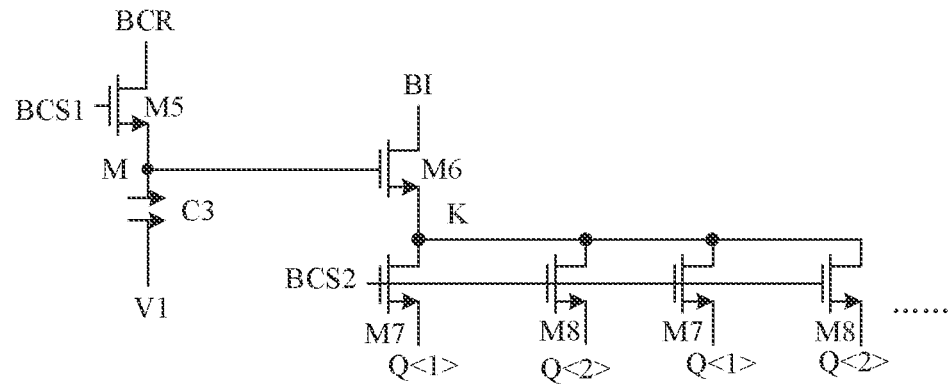
FIG. 43 is a circuit diagram of a black insertion circuit in a first shift register group or a second shift register group, in accordance with some embodiments of the present disclosure.
Figure 44:
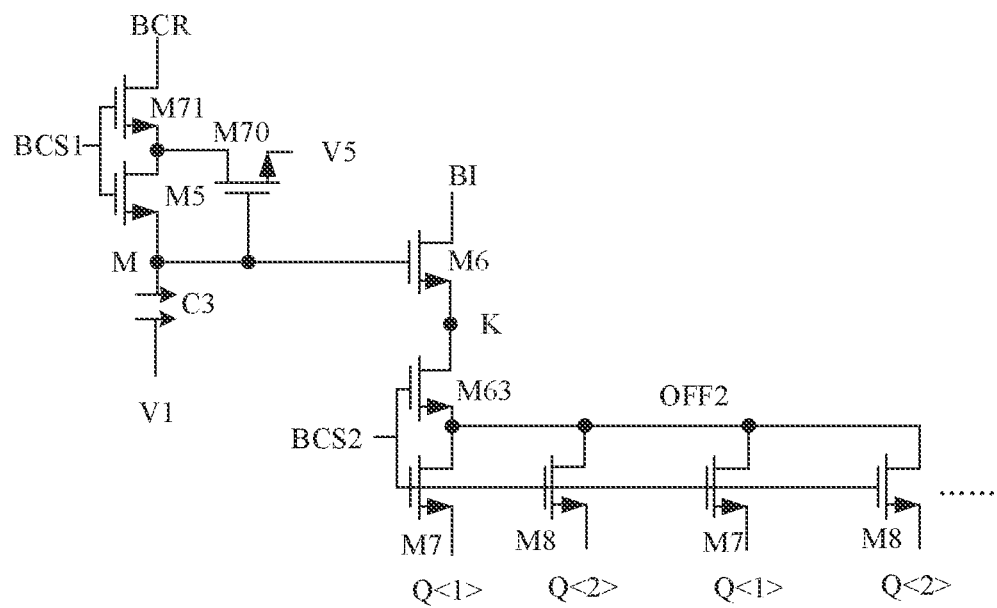
FIG. 44 is a circuit diagram of another black insertion circuit in a first shift register group or a second shift register group, in accordance with some embodiments of the present disclosure.

In some examples, as shown in FIGS. 43 and 44, in the first shift register group C, at least two shift registers 100 share a black insertion circuit 2; in the second shift register group D, at least two shift registers 100 share a single black insertion circuit 2.

In an example where N is equal to 2 (N=2).

For example, in each shift register group, every two stages of shift registers 100 may share a single black insertion circuit 2. In this case, each shift register group may have only two black insertion circuits 2.

For another example, in each shift register group, 4 stages of shift registers 100 may share a single black insertion circuit 2. In this case, each shift register group may have only one black insertion circuit 2.

With the arrangement manner, one black insertion circuit 2 may be used to transmit the black insertion input signal to first pull-up nodes Q<1> and second pull-up nodes Q<2> of at least two shift registers 100 corresponding thereto, so as to achieve control of the at least two shift registers 100, which is conducive to improving the signal transmission efficiency and simplifying the structure of the scan driving circuit 1000.

It will be noted that, based on a fact that the shift register 100 has a plurality of signal terminals, the scan driving circuit 1000 may include a plurality of signal lines.

In some examples, the scan driving circuit 1000 further includes a first control signal line group.

For example, as shown in FIGS. 38 to 41, 45, 48, 50 and 52, the first control signal line group may include first control signal sub-line(s) BCK1 and second control signal sub-line(s) BCK2. The first control signal sub-line BCK1 is electrically connected to first control signal terminals BCS1 of all the shift registers 100 in the first shift register group C, and the second control signal sub-line BCK2 is electrically connected to first control signal terminals BCS1 of all the shift registers 100 in the second shift register group D.

For example, the first control signal line group includes only a single first control signal sub-line BCK1 and a single second control signal sub-line BCK2.

In this way, in a working process of the scan driving circuit 1000, the first control signal may be transmitted to the first control signal terminals BCS1 in each first shift register group C through the first control signal sub-line BCK1, so as to control black insertion control sub-circuits 21 of black insertion circuits 2 in each first shift register group C to be turned on and to store the received black insertion cascade signal; the first control signal may be transmitted to the first control signal terminals BCS1 in each second shift register group D through the second control signal sub-line BCK2, so as to control black insertion control sub-circuits 21 of black insertion circuits 2 in each second shift register group D to be turned on and to store the received black insertion cascade signal.

Here, in a case where the black insertion cascade signal is at a high level, the corresponding black insertion input sub-circuits 22 may be in a turn-on state to transmit the black insertion input signal to the second black insertion node K. In a case where the black insertion cascade signal is at a low level, the corresponding black insertion input sub-circuits 22 may be in a turn-off state.

In some examples, the scan driving circuit 1000 further includes a second control signal line group.

For example, as shown in FIGS. 38 to 41, 45, 48, 50 and 52, the second control signal line group 300 may include third control signal sub-line(s) BCK3 and fourth control signal sub-line(s) BCK4. The third sub-control signal line BCK3 is electrically connected to second control signal terminals BCS2 of all the shift registers 100 in the first shift register group C, and the fourth sub-control signal line BCK4 is electrically connected to second control signal terminals BCS2 of all the shift registers 100 in the second shift register group D.

For example, the second control signal line group includes only a single third sub-control signal line BCK3 and three fourth sub-control signal lines BCK4.

In this case, the second control signal terminals BCS2 of all the shift registers 100 in each first shift register group C may simultaneously receive the second control signal; the second control signal terminals BCS2 of all the shift registers 100 in each second shift register group D may simultaneously receive the second control signal.

Optionally, as shown in FIGS. 45, 48, 50 and 52, in a case where the second control signal terminal BCS2 and the black insertion input signal terminal BI are electrically connected to the same signal terminal, the third control signal sub-line BCK3 is further electrically connected to black insertion input signal terminals BI of all the shift registers 100 in the first shift register group C, and the fourth control signal sub-line BCK4 is further electrically connected to black insertion input signal terminals BI of all the shift registers 100 in the second shift register group D.

In this case, the second control signal terminals BCS2 and the black insertion input signal terminals BI of all the shift registers 100 in each first shift register group C may receive a signal from the same third control signal sub-line BCK3, and the second control signal terminals BCS2 and the black insertion input signal terminals BI of all the shift registers 100 in each second shift register group D may receive a signal from the same fourth control signal sub-line BCK4. In this way, it is conducive to reducing the number of signal lines and simplifying the structure of the scan driving circuit 1000.

In the working process of the scan driving circuit 1000, the same signal may be transmitted to the second control signal terminals BCS2 and the black insertion input signal terminals BI in each first shift register group C through the third sub-control signal line BCK3, to control the turn-on state of each of first black insertion transmission sub-circuits 23 and second black insertion transmission sub-circuits 24 of the black insertion circuits 2 in each first shift register group C. In a case where a third control sub-signal transmitted by the third control signal sub-line BCK3 is at a high level, the first black insertion transmission sub-circuit 23 may be turned on and transmit the high-level third control sub-signal to the first pull-up node Q<1> to increase the voltage of the first pull-up node Q<1>; the second black insertion transmission sub-circuit 24 may be turned on and transmit the high-level third control sub-signal to the second pull-up node Q<2> to increase the voltage of the second pull-up node Q<2>. After that, rows of sub-pixels P corresponding to the first shift register group C may be controlled to display a black image at the same time by the first clock signal transmitted by the first clock signal terminal CLKE1 and the second clock signal transmitted by the second clock signal terminal CLKE2.

Similarly, as for a working process of the second shift register group D, reference may be made to the above description, and details will not be repeated here.

Optionally, in a case where the second control signal terminal BCS2 and the black insertion input signal terminal BI are respectively electrically connected to different signal terminals, the black insertion input signal terminal BI of each shift register 100 may be, for example, electrically connected to a line transmitting a direct current high-level signal.

In this case, as for the working processes of the first shift register group C and the second shift register group D, reference may be made to the above description, and details will not be repeated here.

It will be noted that in a process that, the rows of sub-pixels P corresponding to the first shift register group C display a black image, rows of sub-pixels P corresponding to the second shift register group D display an image.

Figure 42:
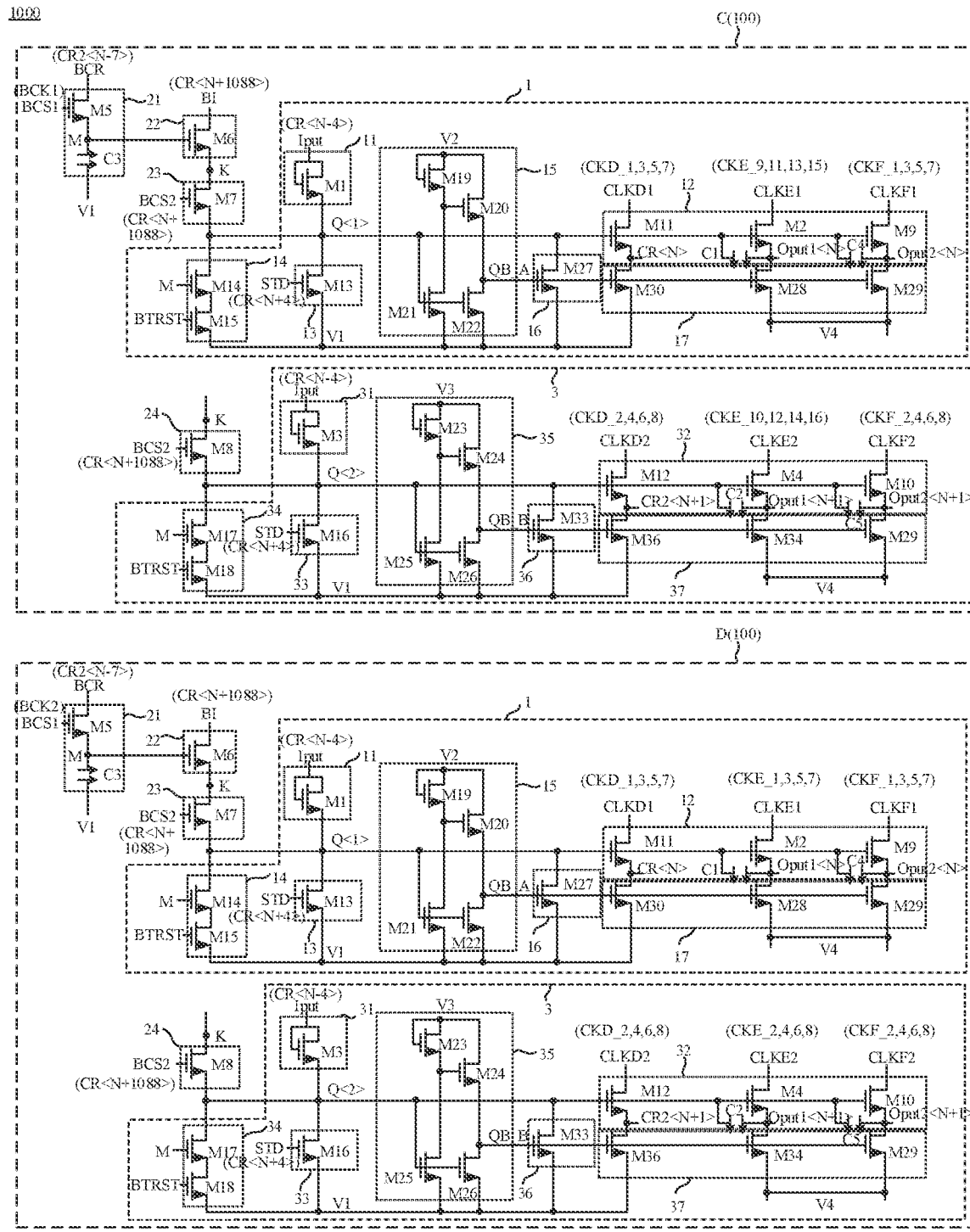
FIG. 42 is a structural diagram of yet another scan driving circuit, in accordance with some embodiments of the present disclosure.

In addition, in some examples, as shown in FIG. 42, the black insertion input signal terminals BI of all shift registers 100 may be each electrically connected to a first shift signal terminal CR<N> of a certain shift register 100, as long as the black insertion circuit 2 can realize the function of black insertion to enable the display apparatus 2000 display a black image.

For example, the first shift signal terminal CR<N> may be a shift signal terminal in a 1099th row, i.e., a first shift signal terminal CR<N> in a 545th shift register 100.

In this way, it is conducive to reducing the number of signal lines included in the scan driving circuit 1000 and simplifying the structure of the scan driving circuit 1000.

In some examples, the scan driving circuit 1000 further includes a first clock signal line group.

For example, as shown in FIGS. 38 to 42, 45, 48, 50 and 52, the first clock signal line group may include 8N first clock signal sub-lines CKE. The 8N first clock signal sub-lines CKE are electrically connected to first clock signal terminals CLKE1 and second clock signal terminals CLKE2 of all shift registers 100 in the first shift register group C and first clock signal terminals CLKE1 and second clock signal terminals CLKE2 of all shift registers 100 in the second shift register group D, respectively.

That is, the number of first clock signal sub-lines CKE included in the first clock signal line group may be equal to a sum of the number of scan signal terminals (i.e., first scan signal terminals Oput1<N> and second scan signal terminals Oput1<N+1>) included in a single first shift register group C and the number of scan signal terminals (i.e., first scan signal terminals Oput1<N> and second scan signal terminals Oput1<N+1>) included in a single second shift register group D. A first clock signal sub-line CKE may correspond to a scan signal terminal.

For example, first clock signal sub-lines CKE electrically connected to all first shift register groups C are the same, and first clock signal sub-lines CKE electrically connected to all second shift register groups D are the same.

For example, as shown in FIGS. 38 to 42, 45, 48, 50 and 52, in the example where N is equal to 2 (N=2), the first clock signal line group may include 16 first clock signal sub-lines CKE.

The 16 first clock signal sub-lines CKE may include: the ninth first clock signal sub-line CKE_9 of the first clock signal sub-lines and the tenth first clock signal sub-line CKE_10 of the first clock signal sub-lines that are electrically connected to a first clock signal terminal CLKE1 and a second clock signal terminal CLKE2 of a first-stage shift register 100 in each first shift register group C, respectively; the eleventh first clock signal sub-line CKE_11 of the first clock signal sub-lines and the twelfth first clock signal sub-line CKE_12 of the first clock signal sub-lines that are electrically connected to a first clock signal terminal CLKE1 and a second clock signal terminal CLKE2 of a second-stage shift register 100 in each first shift register group C, respectively; the thirteenth first clock signal sub-line CKE_13 of the first clock signal sub-lines and the fourteenth first clock signal sub-line CKE_14 of the first clock signal sub-lines that are electrically connected to a first clock signal terminal CLKE1 and a second clock signal terminal CLKE2 of a third-stage shift register 100 in each first shift register group C, respectively; the fifteenth first clock signal sub-line CKE_15 of the first clock signal sub-lines and the sixteenth first clock signal sub-line CKE_16 of the first clock signal sub-lines that are electrically connected to a first clock signal terminal CLKE1 and a second clock signal terminal CLKE2 of a fourth-stage shift register 100 in each first shift register group C, respectively; the first first clock signal sub-line CKE_1 of the first clock signal sub-lines and the second first clock signal sub-line CKE_2 of the first clock signal sub-lines that are electrically connected to a first clock signal terminal CLKE1 and a second clock signal terminal CLKE2 of a first-stage shift register 100 in each second shift register group D, respectively; the third first clock signal sub-line CKE_3 of the first clock signal sub-lines and the fourth first clock signal sub-line CKE_4 of the first clock signal sub-lines that are electrically connected to a first clock signal terminal CLKE1 and a second clock signal terminal CLKE2 of a second-stage shift register 100 in each second shift register group D, respectively; the fifth first clock signal sub-line CKE_5 of the first clock signal sub-lines and the sixth first clock signal sub-line CKE_6 of the first clock signal sub-lines that are electrically connected to a first clock signal terminal CLKE1 and a second clock signal terminal CLKE2 of a third-stage shift register 100 in each second shift register group D, respectively; and the seventh first clock signal sub-line CKE_7 of the first clock signal sub-lines and the eighth first clock signal sub-line CKE_8 of the first clock signal sub-lines that are electrically connected to a first clock signal terminal CLKE1 and a second clock signal terminal CLKE2 of a fourth-stage shift register 100 in each second shift register group D, respectively.

Of course, the connection order of the first clock signal sub-lines CKE may be changed, which is not limited to the above connection manner.

In some examples, in a case where the first output circuit 12 of the shift register 100 is further electrically connected to the third clock signal terminal CLKF1 and the first sensing signal terminal Oput2<N>, and the second output circuit 32 is further electrically connected to the fourth clock signal terminal CLKF2 and the second sensing signal terminal Oput2<N+1>, the scan driving circuit 1000 further includes a second clock signal line group.

The arrangement manner of the second clock signal line group and the connection manner of which to the shift register 100 vary, which may be determined according to actual needs.

Figure 39:
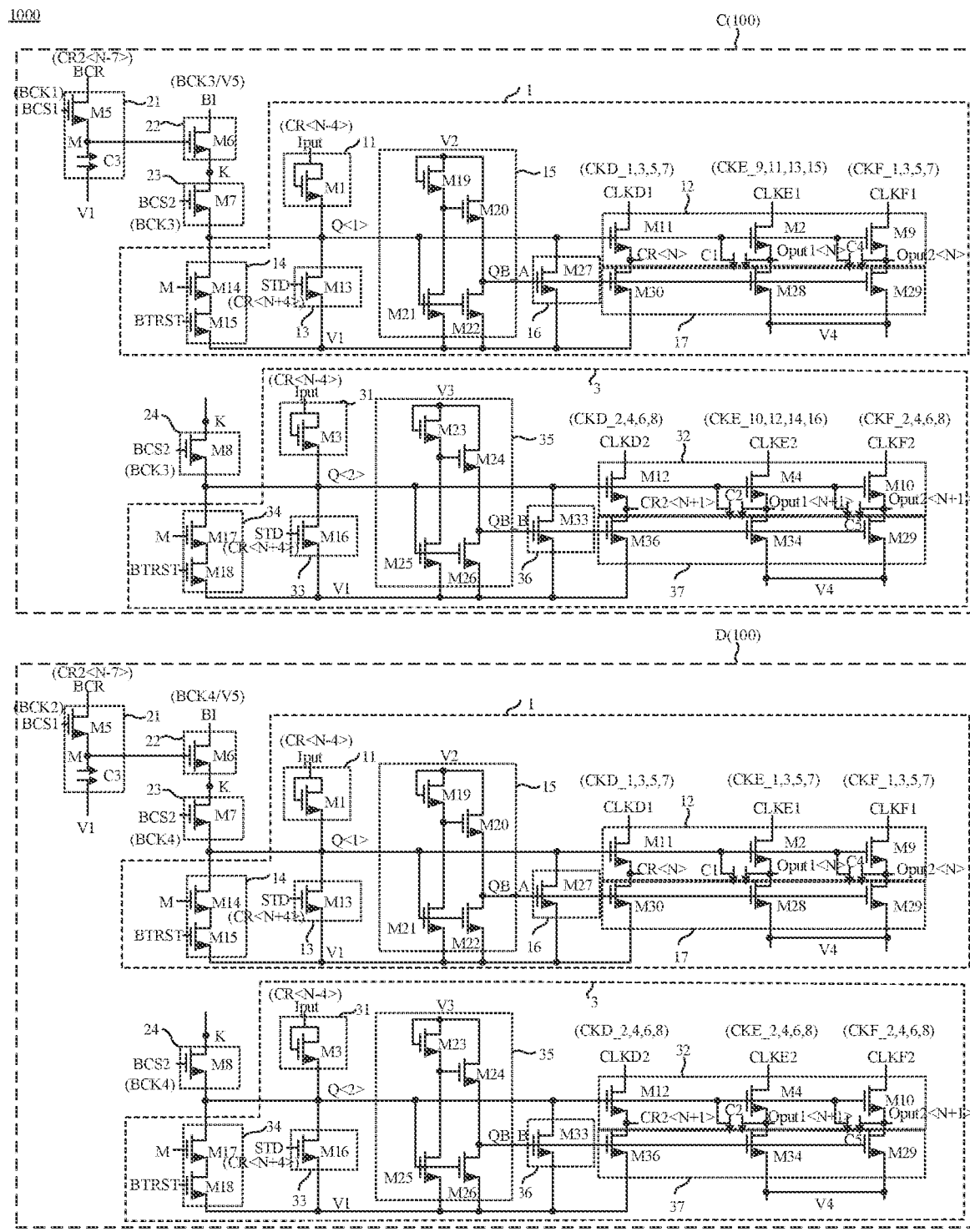
FIG. 39 is a structural diagram of another scan driving circuit, in accordance with some embodiments of the present disclosure.
Figure 48:
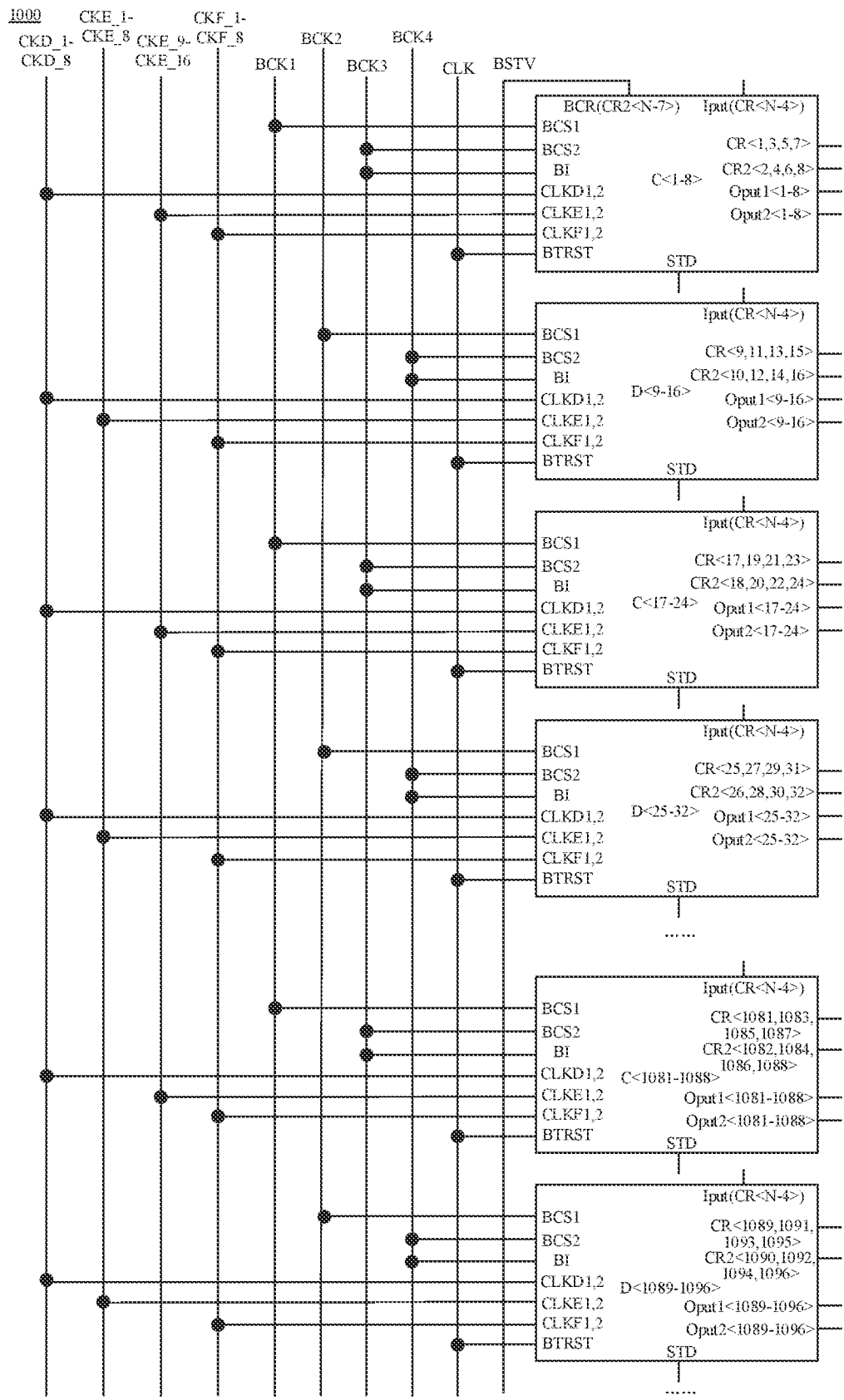
FIG. 48 is a structural diagram of yet another scan driving circuit, in accordance with some embodiments of the present disclosure.
Figure 52:
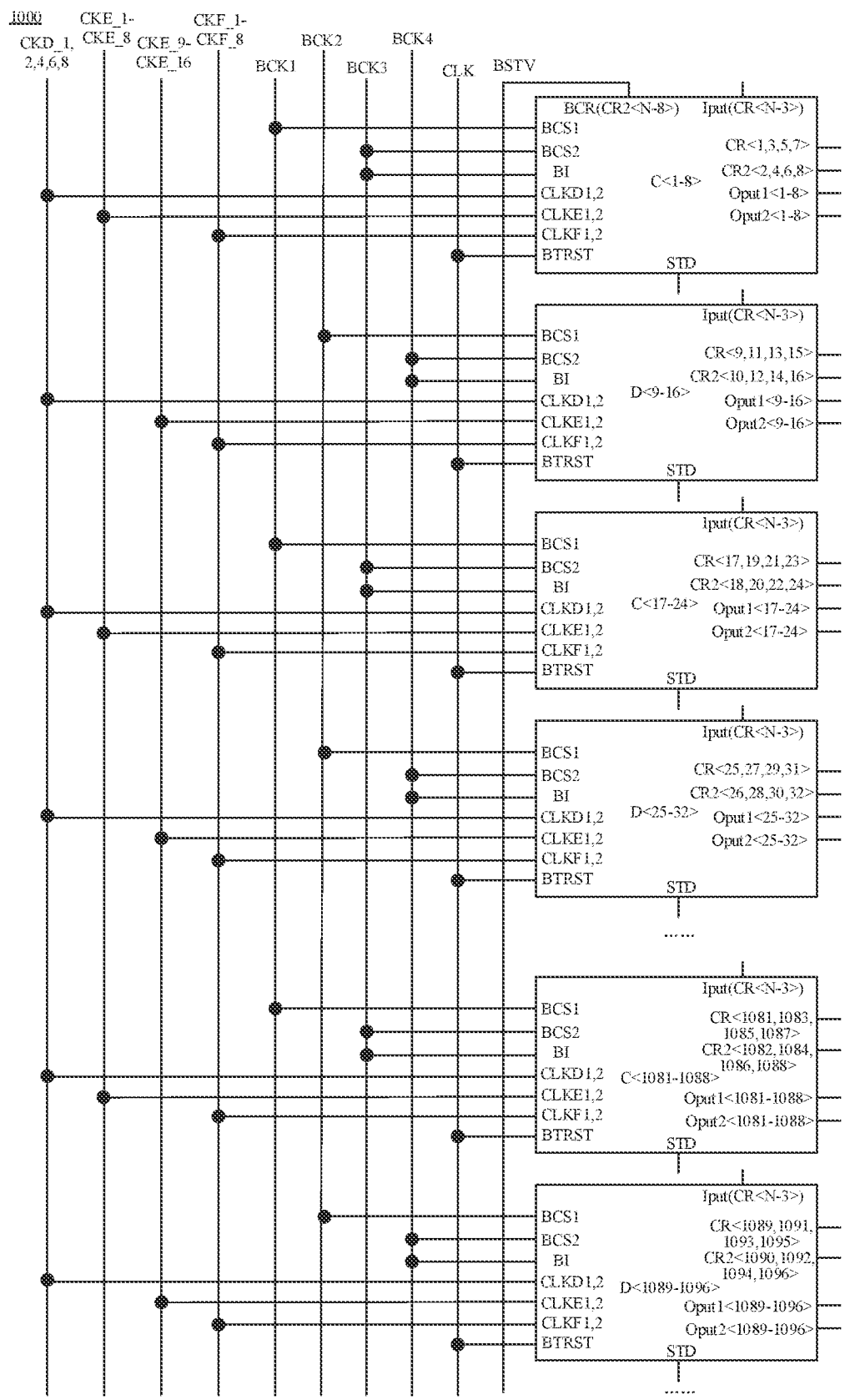
FIG. 52 is a structural diagram of yet another scan driving circuit, in accordance with some embodiments of the present disclosure.

Optionally, as shown in FIGS. 39, 48 and 52, the second clock signal line group includes 4N second clock signal sub-lines CKF. The 4N second clock signal sub-lines CKF are electrically connected to third clock signal terminals CLKF1 and fourth clock signal terminals CLKF2 of all shift registers 100 in the first shift register group C, respectively, and are electrically connected to third clock signal terminals CLKF1 and fourth clock signal terminals CLKF2 of all shift registers 100 in the second shift register group D, respectively.

That is, the number of second clock signal sub-lines CKF included in the second clock signal line group may be equal to the number of sensing signal terminals (i.e., first sensing signal terminals Oput2<N> and second sensing signal terminals Oput2<N+1>) included in a single first shift register group C or the number of sensing signal terminals (i.e., first sensing signal terminals Oput2<N> and second sensing signal terminals Oput2<N+1>) included in a single second shift register group D. A second clock signal sub-line CKF may correspond to a sensing signal terminal included in a single first shift register group C or a single second shift register group D. Second clock signal sub-lines CKF electrically connected to all shift register groups are the same.

For example, as shown in FIGS. 39, 48 and 52, in the example where N is equal to 2 (N=2), the second clock signal line group may include 8 second clock signal sub-lines CKF.

The 8 second clock signal sub-lines CKF may include: the first second clock signal sub-line CKF_1 of the second clock signal sub-lines electrically connected to a third clock signal terminal CLKF1 of the first-stage shift register 100 in each first shift register group C and a third clock signal terminal CLKF1 of the first-stage shift register 100 in each second shift register group D; the second second clock signal sub-line CKF_2 of the second clock signal sub-lines electrically connected to a fourth clock signal terminal CLKF2 of the first-stage shift register 100 in each first shift register group C and a fourth clock signal terminal CLKF2 of the first-stage shift register 100 in each second shift register group D; the third second clock signal sub-line CKF_3 of the second clock signal sub-lines electrically connected to a third clock signal terminal CLKF1 of the second-stage shift register 100 in each first shift register group C and a third clock signal terminal CLKF1 of the second-stage shift register 100 in each second shift register group D; the fourth second clock signal sub-line CKF_4 of the second sub-clock signal lines electrically connected to a fourth clock signal terminal CLKF2 of the second-stage shift register 100 in each first shift register group C and a fourth clock signal terminal CLKF2 of the second-stage shift register 100 in each second shift register group D; the fifth second clock signal sub-line CKF_5 of the second sub-clock signal lines electrically connected to a third clock signal terminal CLKF1 of the third-stage shift register 100 in each first shift register group C and a third clock signal terminal CLKF1 of the third-stage shift register 100 in each second shift register group D; the sixth second clock signal sub-line CKF_6 of the second sub-clock signal lines electrically connected to a fourth clock signal terminal CLKF2 of the third-stage shift register 100 in each first shift register group C and a fourth clock signal terminal CLKF2 of the third-stage shift register 100 in each second shift register group D; the seventh second clock signal sub-line CKF_7 of the second sub-clock signal lines electrically connected to a third clock signal terminal CLKF1 of the fourth-stage shift register 100 in each first shift register group C and a third clock signal terminal CLKF1 of the fourth-stage shift register 100 in each second shift register group D; and the eighth second clock signal sub-line CKF_8 of the second sub-clock signal lines electrically connected to a fourth clock signal terminal CLKF2 of the fourth-stage shift register 100 in each first shift register group C and a fourth clock signal terminal CLKF2 of the fourth-stage shift register 100 in each second shift register group D.

Figure 38:
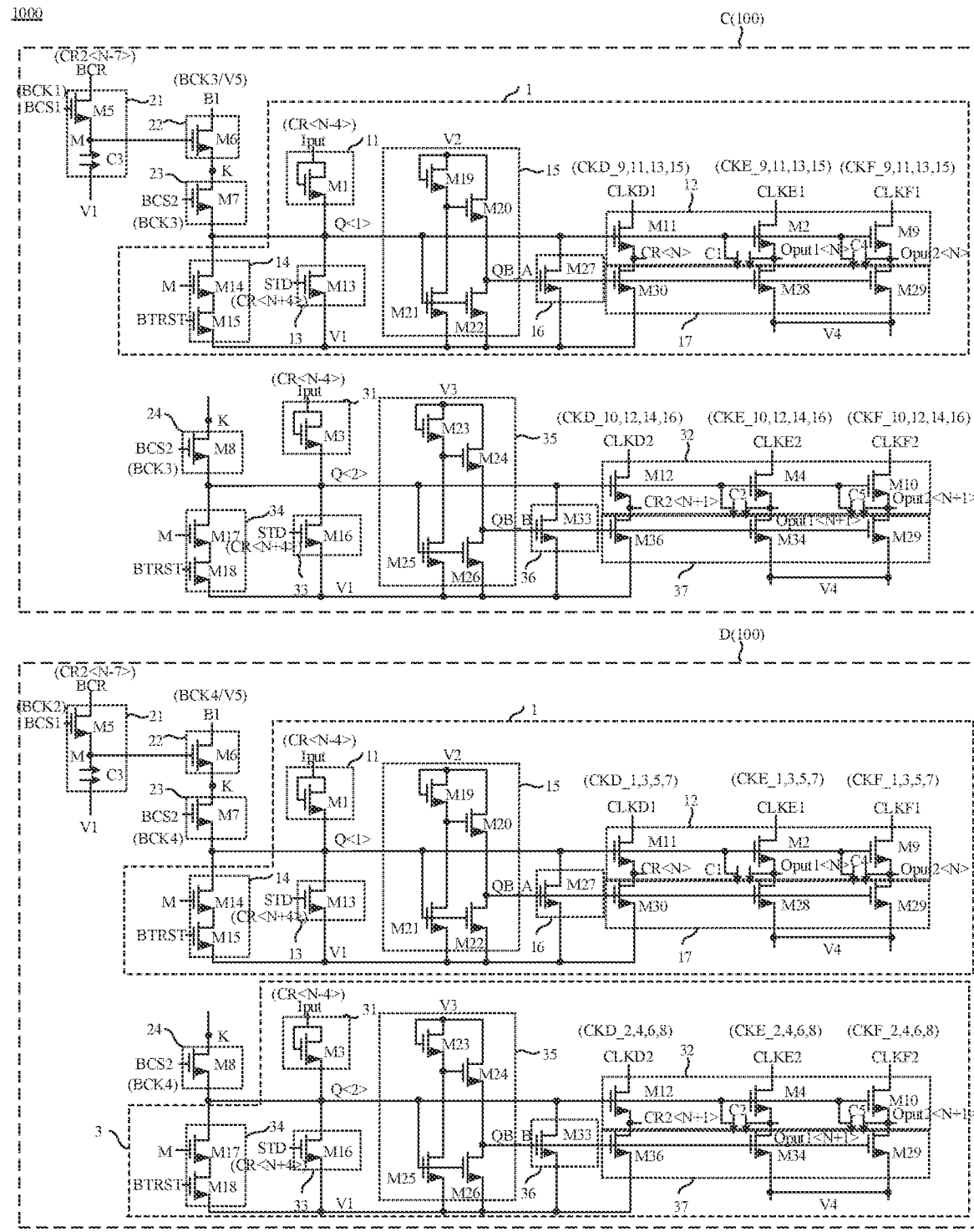
FIG. 38 is a structural diagram of a scan driving circuit, in accordance with some embodiments of the present disclosure.
Figure 41:
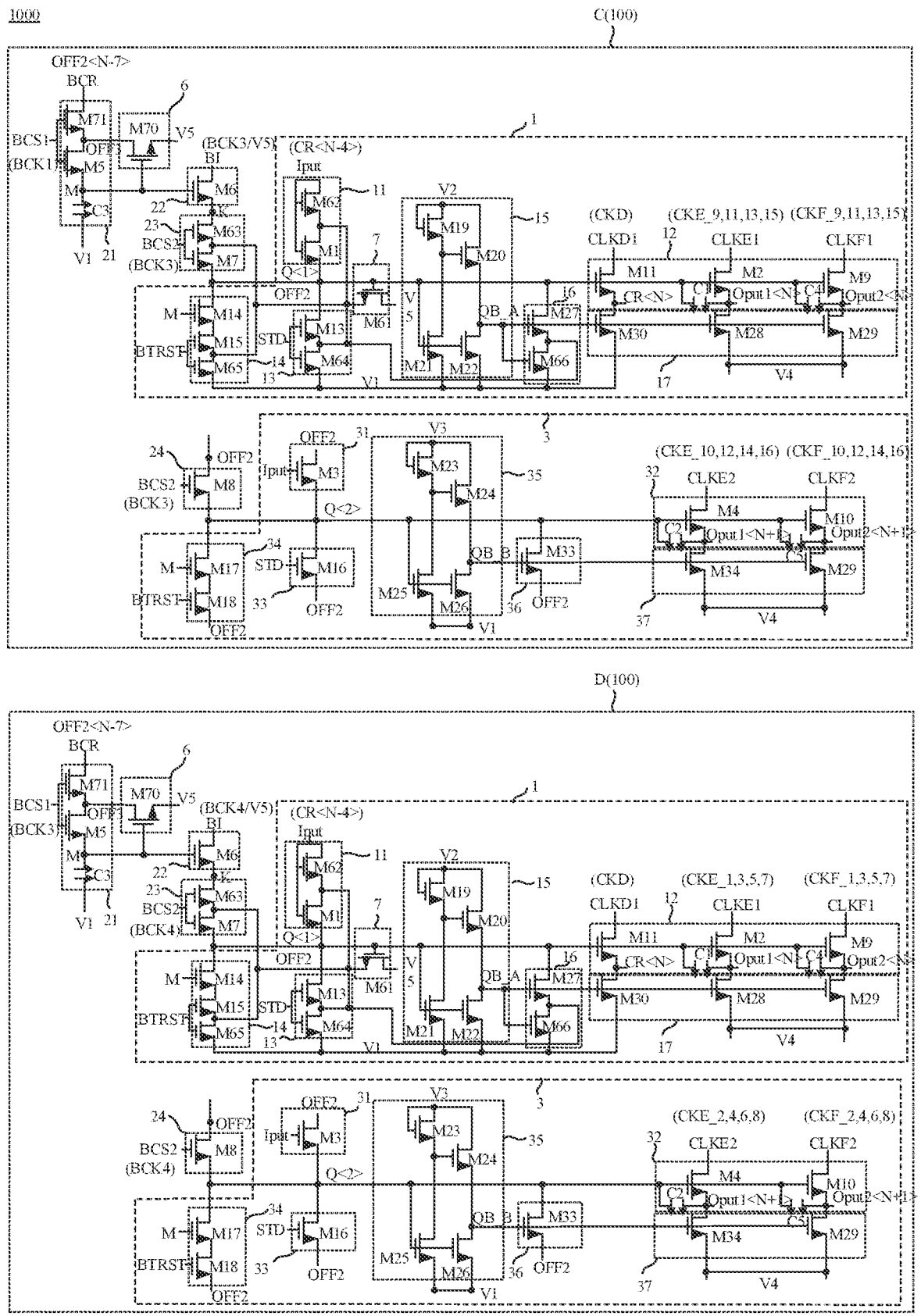
FIG. 41 is a structural diagram of yet another scan driving circuit, in accordance with some embodiments of the present disclosure.
Figure 45:
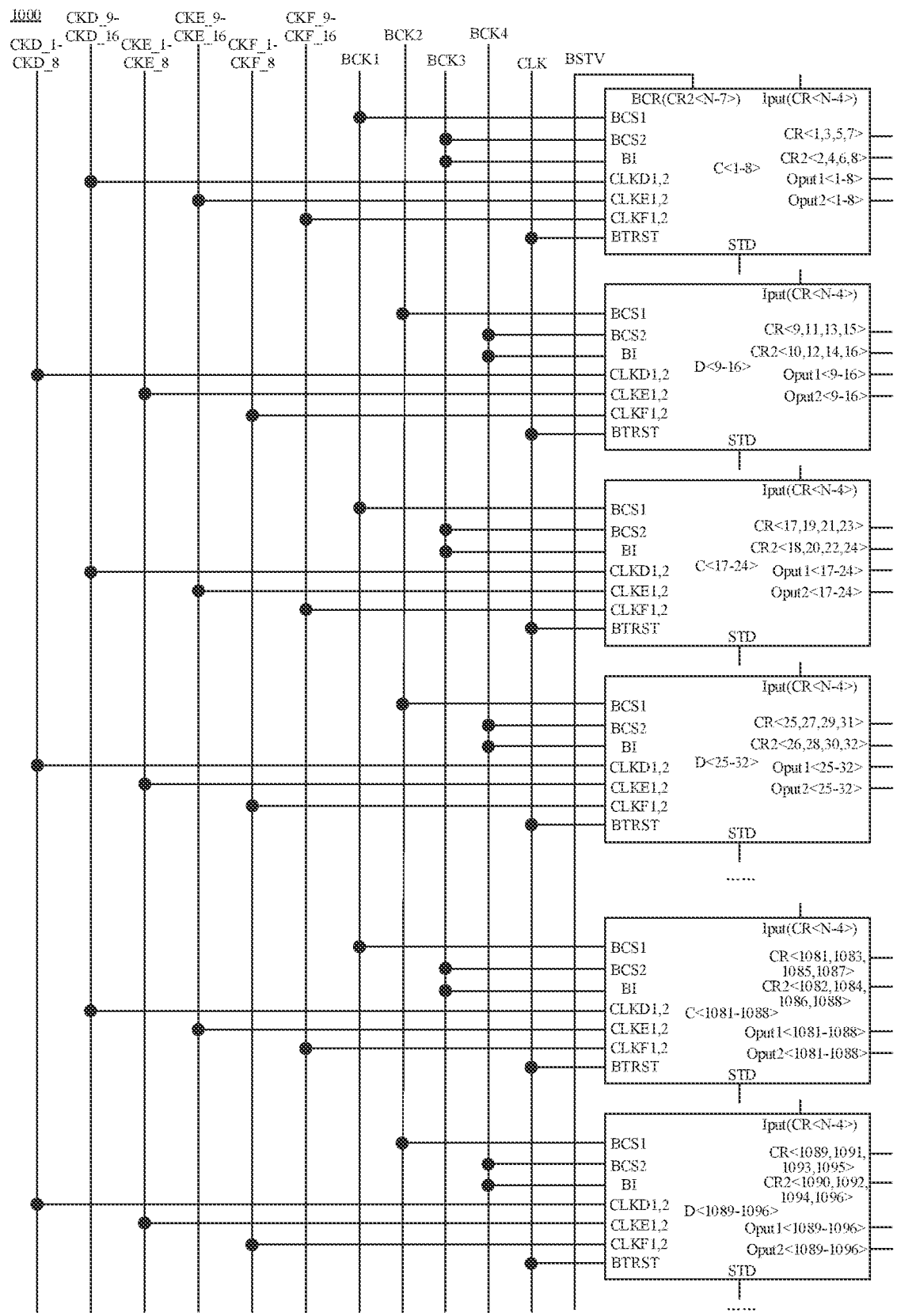
FIG. 45 is a structural diagram of yet another scan driving circuit, in accordance with some embodiments of the present disclosure.

Optionally, as shown in FIGS. 38, 41 and 45, the second clock signal line group includes 8N second clock signal sub-lines CKF. The 8N second clock signal sub-lines CKF are electrically connected to the third clock signal terminals CLKF1 and the fourth clock signal terminals CLKF2 of all shift registers 100 in the first shift register group C and the third clock signal terminals CLKF1 and the fourth clock signal terminals CLKF2 of all shift registers 100 in the second shift register group D, respectively.

That is, the number of second clock signal sub-lines CKF included in the second clock signal line group may be equal to a sum of the number of sensing signal terminals (i.e., first sensing signal terminals Oput2<N> and second sensing signal terminals Oput2<N+1>) included in a single first shift register group C and the number of sensing signal terminals (i.e., first sensing signal terminals Oput2<N> and second sensing signal terminals Oput2<N+1>) included in a single second shift register group D. A second clock signal sub-line CKF may correspond to a sensing signal terminal.

For example, second clock signal sub-lines CKF electrically connected to all first shift register groups C are the same, and second clock signal sub-lines CKF electrically connected to all second shift register groups D are the same.

For example, as shown in FIGS. 38, 41 and 45, in the example where N is equal to 2 (N=2), the second clock signal line group may include 16 second clock signal sub-lines CKF.

The sixteen second clock signal sub-lines CKF may include: the ninth second clock signal sub-line CKF_9 of the second clock signal sub-lines and the tenth second clock signal sub-line CKF_10 of the second clock signal sub-lines that are electrically connected to the third clock signal terminal CLKF1 and the fourth clock signal terminal CLKF2 of the first-stage shift register 100 in each first shift register group C, respectively; the eleventh second clock signal sub-line CKF_11 of the second clock signal sub-lines and the twelfth second clock signal sub-line CKF_12 of the second clock signal sub-lines that are electrically connected to the third clock signal terminal CLKF1 and the fourth clock signal terminal CLKF2 of the second-stage shift register 100 in each first shift register group C, respectively; the thirteenth second clock signal sub-line CKF_13 of the second clock signal sub-lines and the fourteenth second clock signal sub-line CKF_14 of the second clock signal sub-lines that are electrically connected to the third clock signal terminal CLKF1 and the fourth clock signal terminal CLKF2 of the third-stage shift register 100 in each first shift register group C, respectively; the fifteenth second clock signal sub-line CKF_15 of the second clock signal sub-lines and the sixteenth second clock signal sub-line CKF_16 of the second clock signal sub-lines that are electrically connected to the third clock signal terminal CLKF1 and the fourth clock signal terminal CLKF2 of the fourth-stage shift register 100 in each first shift register group C, respectively; the first second clock signal sub-line CKF_1 of the second clock signal sub-lines and the second second clock signal sub-line CKF_2 of the second clock signal sub-lines that are electrically connected to the third clock signal terminal CLKF1 and the fourth clock signal terminal CLKF2 of the first-stage shift register 100 in each second shift register group D, respectively; the third second clock signal sub-line CKF_3 of the second clock signal sub-lines and the fourth second clock signal sub-line CKF_4 of the second clock signal sub-lines that are electrically connected to the third clock signal terminal CLKF1 and the fourth clock signal terminal CLKF2 of the second-stage shift register 100 in each second shift register group D, respectively; the fifth second clock signal sub-line CKF_5 of the second clock signal sub-lines and the sixth second clock signal sub-line CKF_6 of the second clock signal sub-lines that are electrically connected to the third clock signal terminal CLKF1 and the fourth clock signal terminal CLKF2 of the third-stage shift register 100 in each second shift register group D, respectively; and the seventh second clock signal sub-line CKF_7 of the second clock signal sub-lines and the eighth second clock signal sub-line CKF_8 of the second clock signal sub-lines that are electrically connected to the third clock signal terminal CLKF1 and the fourth clock signal terminal CLKF2 of the fourth-stage shift register 100 in each second shift register group D, respectively.

Of course, the connection order of the second clock signal sub-lines CKF may be changed, which is not limited to the above connection manner.

In addition, since a timing of a scan signal and a timing of a sensing signal may be the same, a third clock signal terminal CLKF1 and a first clock signal terminal CLKE1 of a first scan unit 1 to which the third clock signal terminal CLKF1 belongs are connected to the same first clock signal sub-line CKE, and a fourth clock signal terminal CLKF2 and a second clock signal terminal CLKE2 of a second scan unit 3 to which the second clock signal terminal CLKE2 belongs are connected to the same first clock signal sub-line CKE.

It will be noted that the cascade manner of the plurality of stages of shift registers 100 in the scan driving circuit 1000 varies, which may be determined according to actual needs.

In some examples, the first output circuit 12 of the shift register 100 is further electrically connected to the fifth clock signal terminal CLKD1 and the first shift signal terminal CR<N>, and the second output circuit 32 is further electrically connected to the sixth clock signal terminal CLKD2 and the second shift signal terminal CR2<N+1>.

In this case, in the plurality stages of shift registers 100, except for first at least one stage of shift register 100, a display input signal terminal Iput of each of remaining stages of shift registers 100 is electrically connected to a first shift signal terminal CR<N> of a certain stage, before the current stage, of shift register 100. Except for first at least two stages of shift registers 100, a black insertion cascade signal terminal BCR of each of remaining stages of shift registers 100 is electrically connected to a second shift signal terminal CR2<N+1> of a certain stage, before the current stage, of shift register 100.

That is, a shift signal transmitted by a shift signal terminal in an odd row serves as a display cascade signal, and a shift signal transmitted by a shift signal terminal in an even row serves as the black insertion cascade signal.

For example, as shown in FIGS. 38 and 39, in the example where N is equal to 2 (N=2), except for first two stages of shift registers 100, a display input signal terminal Iput of each of remaining stages of shift registers 100 is electrically connected to a first shift signal terminal CR<N> of a stage, before and spaced apart from the current stage by one stage, of shift register 100. Except for first four stages of shift registers 100, a black insertion cascade signal terminal BCR of each of remaining stages of shift registers 100 is electrically connected to a second shift signal terminal CR2<N+1> of a stage, before and spaced apart from the current stage by three stages, of shift register 100.

Figure 40:
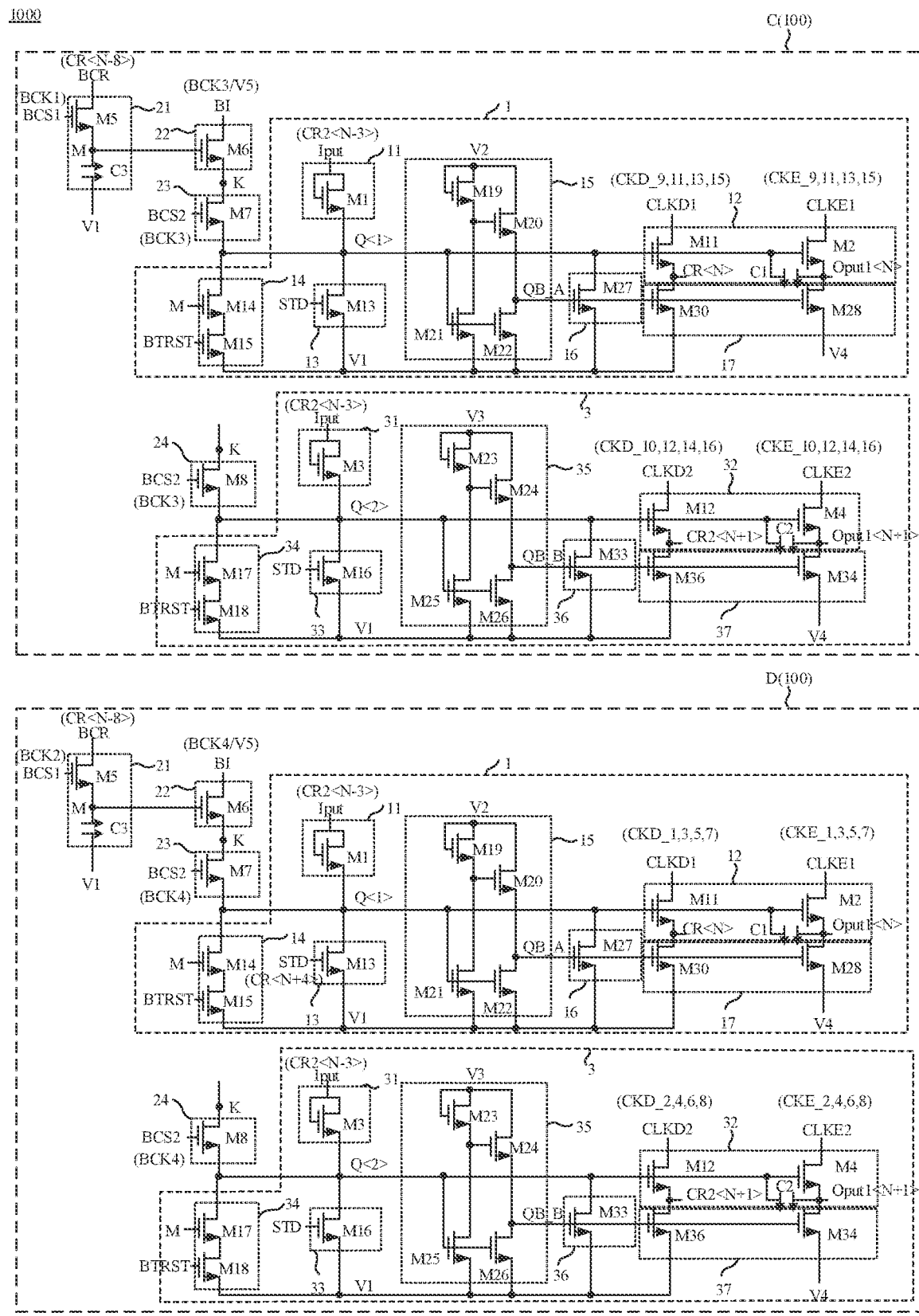
FIG. 40 is a structural diagram of yet another scan driving circuit, in accordance with some embodiments of the present disclosure.

In other examples, as shown in FIG. 40, the first output circuit 12 of the shift register 100 is further electrically connected to the fifth clock signal terminal CLKD1 and the first shift signal terminal CR<N>, and the second output circuit 32 is further electrically connected to the sixth clock signal terminal CLKD2 and the second shift signal terminal CR2<N+1>.

In this case, in the plurality stages of shift registers 100, except for the first at least one stage of shift register 100, the display input signal terminal Iput of each of the remaining stages of shift registers is electrically connected to a second shift signal terminal CR2<N+1> of a certain stage, before the current stage, of shift register 100. Except for the first at least two stages of shift registers 100, the black insertion cascade signal terminal BCR of each of the remaining stages of shift registers 100 is electrically connected to first shift signal terminal CR<N> of a certain stage, before the current stage, of shift register 100.

That is, the shift signal transmitted by the shift signal terminal in the odd row serves as the black insertion cascade signal, and the shift signal transmitted by the shift signal terminal in the even row serves as the display cascade signal.

In the example where N is equal to 2 (N=2), except for the first two stages of shift registers 100, the display input signal terminal Iput of each of the remaining stages of shift registers 100 is electrically connected to a second shift signal terminal CR2<N+1> of a stage, before and spaced apart from the current stage by one stage, of shift register 100. Except for the first four stages of shift registers 100, a black insertion cascade signal terminal BCR of each of the remaining stages of shift registers 100 is electrically connected to a first shift signal terminal CR<N> of a stage, before and spaced apart from the current stage by three stages, of shift register 100.

In yet other examples, as shown in FIG. 41, the first output circuit 12 of the shift register 100 is further electrically connected to the fifth clock signal terminal CLKD1 and the first shift signal terminal CR<N>, and the shift register 100 further includes the second anti-leakage circuit 7.

In this case, in the plurality stages of shift registers 100, except for the first at least one stage of shift register 100, the display input signal terminal Iput of each of the remaining stages of shift registers is electrically connected to a first shift signal terminal CR<N> of a stage, before the current stage, of shift register 100. Except for the first at least two stages of shift registers 100, the black insertion cascade signal terminal BCR of each of the remaining stages of shift registers 100 is electrically connected to a second anti-leakage node OFF2 of a stage, before the current stage, of shift register 100.

That is, the shift signal transmitted by the shift signal terminal in the odd row serves as the display cascade signal, and the fifth voltage signal transmitted by the second anti-leakage node OFF2 serves as the display cascade signal. Here, since the first scan unit 1 and the second scan unit 3 of the shift register 100 share the second anti-leakage circuit 7, a second anti-leakage node OFF2 in the even row may also be referred to as a second anti-leakage node OFF2 in the odd row.

For example, as shown in FIG. 41, in the example where N is equal to 2 (N=2), except for the first two stages of shift registers 100, the display input signal terminal Iput of each of the remaining stages of shift registers 100 is electrically connected to a first shift signal terminal CR<N> of a stage, before and spaced apart from the current stage by one stage, of shift register 100. Except for the first four stages of shift registers 100, the black insertion cascade signal terminal BCR of each of the remaining stages of shift registers 100 is electrically connected to a second anti-leakage node OFF2 of a stage, before and spaced apart from the current stage by three stages, of shift register 100.

In this way, it is conducive to simplifying the structures of the shift register 100 and the scan driving circuit 1000, and then, it is conducive to reducing the areas occupied by the shift register 100 and the scan driving circuit 1000 and improving the yields of the shift register 100 and the scan driving circuit 1000.

Based on the above examples, the scan driving circuit 1000 may further include a third clock signal line group.

Optionally, as shown in FIGS. 38 to 40, 42, 45, 48, 50 and 52, in a case where the first output circuit 12 of the shift register 100 is further electrically connected to the fifth clock signal terminal CLKD1 and the first shift signal terminal CR<N>, and the second output circuit 32 of the shift register 100 is further electrically connected to the sixth clock signal terminal CLKD2 and the second shift signal terminal CR2<N+1>, the third clock signal line group may include 8N third clock signal sub-lines CKD. The 8N third clock signal sub-lines CKD are electrically connected to fifth clock signal terminals CLKD1 and sixth clock signal terminals CLKD2 of all shift registers 100 in the first shift register group C and fifth clock signal terminals CLKD1 and sixth clock signal terminals CLKD2 of all shift registers 100 in the second shift register group D, respectively.

For example, third clock signal sub-lines CKD electrically connected to all first shift register groups C are the same, and third clock signal sub-lines CKD electrically connected to all second shift register groups D are the same.

For example, as shown in FIGS. 38, 40 and 45, in the example where N is equal to 2 (N=2), the third clock signal line group may include 16 third clock signal sub-lines CKD.

The 16 third clock signal sub-lines CKD may include: the ninth third clock signal sub-line CKD_9 of the third clock signal sub-lines and the tenth third clock signal sub-line CKD_10 of the third clock signal sub-lines electrically connected to a fifth clock signal terminal CLKD1 and a sixth clock signal terminal CLKD2 of the first stage shift register 100 in each first shift register group C, respectively; the eleventh third clock signal sub-line CKD_11 of the third clock signal sub-lines and the twelfth third clock signal sub-line CKD_12 of the third clock signal sub-lines electrically connected to a fifth clock signal terminal CLKD1 and a sixth clock signal terminal CLKD2 of the second stage shift register 100 in each first shift register group C, respectively; the thirteenth third clock signal sub-line CKD_13 of the third clock signal sub-lines and the fourteenth third clock signal sub-line CKD_14 of the third clock signal sub-lines electrically connected to a fifth clock signal terminal CLKD1 and a sixth clock signal terminal CLKD2 of the third stage shift register 100 in each first shift register group C, respectively; the fifteenth third clock signal sub-line CKD_15 of the third clock signal sub-lines and the sixteenth third clock signal sub-line CKD_16 of the third clock signal sub-lines electrically connected to a fifth clock signal terminal CLKD1 and a sixth clock signal terminal CLKD2 of the fourth stage shift register 100 in each first shift register group C, respectively; the first third clock signal sub-line CKD_1 of the third clock signal sub-lines and the second third clock signal sub-line CKD_2 of the third clock signal sub-lines electrically connected to a fifth clock signal terminal CLKD1 and a sixth clock signal terminal CLKD2 of the first stage shift register 100 in each second shift register group D, respectively; the third third clock signal sub-line CKD_3 of the third clock signal sub-lines and the fourth third clock signal sub-line CKD_4 of the third clock signal sub-lines electrically connected to a fifth clock signal terminal CLKD1 and a sixth clock signal terminal CLKD2 of the second stage shift register 100 in each second shift register group D, respectively; the fifth third clock signal sub-line CKD_5 of the third clock signal sub-lines and the sixth third clock signal sub-line CKD_6 of the third clock signal sub-lines electrically connected to a fifth clock signal terminal CLKD1 and a sixth clock signal terminal CLKD2 of the third stage shift register 100 in each second shift register group D, respectively; and the seventh third clock signal sub-line CKD_7 of the third clock signal sub-lines and the eighth third clock signal sub-line CKD_8 of the third clock signal sub-lines electrically connected to a fifth clock signal terminal CLKD1 and a sixth clock signal terminal CLKD2 of the fourth stage shift register 100 in each second shift register group D, respectively.

Of course, the connection order of the third clock signal sub-lines CKD may be changed, which is not limited to the above connection manner.

Optionally, as shown in FIGS. 38 to 40, 42, 45, 48, 50 and 52, in the case where the first output circuit 12 of the shift register 100 is further electrically connected to the fifth clock signal terminal CLKD1 and the first shift signal terminal CR<N>, and the second output circuit 32 is further electrically connected to the sixth clock signal terminal CLKD2 and the second shift signal terminal CR2<N+1>, the third clock signal line group may include 4N third clock signal sub-lines CKD. The 4N third clock signal sub-lines CKD are electrically connected to the fifth clock signal terminals CLKD1 and the sixth clock signal terminals CLKD2 of all shift registers 100 in the first shift register group C, respectively, and are electrically connected to the fifth clock signal terminals CLKD1 and the sixth clock signal terminals CLKD2 of all shift registers 100 in the second shift register group D, respectively.

That is, the number of third clock signal sub-lines CKD included in the third clock signal line group may be equal to the number of shift signal terminals (i.e., first shift signal terminal CR<N> and second shift signal terminal CR2<N+1>) included in a single first shift register group C or the number of shift signal terminals (i.e., first shift signal terminal CR<N> and second shift signal terminal CR2<N+1>) included in a single second shift register group D. A third clock signal sub-line CKD may correspond to a shift signal terminal included in a single first shift register group C or a single second shift register group D. Third clock signal sub-lines CKD electrically connected to all shift register groups are the same.

For example, as shown in FIGS. 39, 42 and 48, in the example where N is equal to 2 (N=2), the third clock signal line group may include 8 third clock signal sub-lines CKD.

The 8 third clock signal sub-lines CKD may include: the first third clock signal sub-line CKD_1 of the third clock signal sub-lines electrically connected to the fifth clock signal terminal CLKD1 of the first stage shift register 100 in each first shift register group C and the fifth clock signal terminal CLKD1 of the first stage shift register 100 in each second shift register group D; the second third clock signal sub-line CKD_2 of the third clock signal sub-lines electrically connected to the sixth clock signal terminal CLKD2 of the first stage shift register 100 in each first shift register group C and the sixth clock signal terminal CLKD2 of the first stage shift register 100 in each second shift register group D; the third third clock signal sub-line CKD_3 of the third clock signal sub-lines electrically connected to the fifth clock signal terminal CLKD1 of the second stage shift register 100 in each first shift register group C and the fifth clock signal terminal CLKD1 of the second stage shift register 100 in each second shift register group D; the fourth third clock signal sub-line CKD_4 of the third clock signal sub-lines electrically connected to the sixth signal terminal CLKD2 of the second stage shift register 100 in each first shift register group C and the sixth clock signal terminal CLKD2 of the second stage shift register 100 in each second shift register group D; the fifth third clock signal sub-line CKD_5 of the third clock signal sub-lines electrically connected to the fifth clock signal terminal CLKD1 of the third stage shift register 100 in each first shift register group C and the fifth clock signal terminal CLKD1 of the third stage shift register 100 in each second shift register group D; the sixth third clock signal sub-line CKD_6 of the third clock signal sub-lines electrically connected to the sixth clock signal terminal CLKD2 of the third stage shift register 100 in each first shift register group C and the sixth clock signal terminal CLKD2 of the third stage shift register 100 in each second shift register group D; the seventh third clock signal sub-line CKD_7 of the third clock signal sub-lines electrically connected to the fifth clock signal terminal CLKD1 of the fourth stage shift register 100 in each first shift register group C and the fifth clock signal terminal CLKD1 of the fourth stage shift register 100 in each second shift register group D; and the eighth third clock signal sub-line CKD_8 of the third clock signal sub-lines electrically connected to the sixth clock signal terminal CLKD2 of the fourth stage shift register 100 in each first shift register group C and the sixth clock signal terminal CLKD2 of the fourth stage shift register 100 in each second shift register group D.

That is, a timing of a fifth clock signal transmitted by the fifth clock signal terminal CLKD1 of the first stage shift register 100 in each first shift register group C and a timing of a fifth clock signal transmitted by the fifth clock signal terminal CLKD1 of the first stage shift register 100 in each second shift register group D may be the same. For example, timings of signals transmitted by the first third clock signal sub-line CKD_1 and the ninth third clock signal sub-line CKD_9 shown in FIG. 46 may be combined as a timing of a signal transmitted by the first third clock signal sub-line CKD_1 in this example.

A timing of a sixth clock signal transmitted by the sixth clock signal terminal CLKD2 of the first stage shift register 100 in each first shift register group C and a timing of a sixth clock signal transmitted by the sixth clock signal terminal CLKD2 of the first stage shift register 100 in each second shift register group D may be the same. For example, timings of signals transmitted by the second third clock signal sub-line CKD_2 and signals transmitted by the tenth third clock signal sub-line CKD_10 shown in FIG. 46 may be combined as a timing of a signal transmitted by the second third clock signal sub-line CKD_2 in this example.

A timing of a fifth clock signal transmitted by the fifth clock signal terminal CLKD1 of the second stage shift register 100 in each first shift register group C and a timing of a fifth clock signal transmitted by the fifth clock signal terminal CLKD1 of the second stage shift register 100 in each second shift register group D may be the same. For example, timings of signals transmitted by the third third clock signal sub-line CKD_3 and the eleventh third clock signal sub-line CKD_11 shown in FIG. 46 may be combined as a timing of a signal transmitted by the third third clock signal sub-line CKD_3 in this example.

A timing of a sixth clock signal transmitted by the sixth clock signal terminal CLKD2 of the second stage shift register 100 in each first shift register group C and a timing of a sixth clock signal transmitted by the sixth clock signal terminal CLKD2 of the second stage shift register 100 in each second shift register group D may be the same. For example, timings of signals transmitted by the fourth third clock signal sub-line CKD_4 and the twelfth third clock signal sub-line CKD_12 shown in FIG. 46 may be combined as a timing of a signal transmitted by the fourth third clock signal sub-line CKD_4 in this example.

A timing of a fifth clock signal transmitted by the fifth clock signal terminal CLKD1 of the third stage shift register 100 in each first shift register group C and a timing of a fifth clock signal transmitted by the fifth clock signal terminal CLKD1 of the third stage shift register 100 in each second shift register group D may be the same. For example, timings of signals transmitted by the fifth third clock signal sub-line CKD_5 and the thirteenth third clock signal sub-line CKD_13 shown in FIG. 46 may be combined as a timing of a signal transmitted by the fifth third clock signal sub-line CKD_5 in this example.

A timing of a sixth clock signal transmitted by the sixth clock signal terminal CLKD2 of the third stage shift register 100 in each first shift register group C and a timing of a sixth clock signal transmitted by the sixth clock signal terminal CLKD2 of the third stage shift register 100 in each second shift register group D may be the same. For example, timings of signals transmitted by the sixth third clock signal sub-line CKD_6 and the fourteenth third clock signal sub-line CKD_14 shown in FIG. 46 may be combined as a timing of a signal transmitted by the sixth third clock signal sub-line CKD_6 in this example.

A timing of a fifth clock signal transmitted by the fifth clock signal terminal CLKD1 of the fourth stage shift register 100 in each first shift register group C and a timing of a fifth clock signal transmitted by the fifth clock signal terminal CLKD1 of the fourth stage shift register 100 in each second shift register group D may be the same. For example, timings of signals transmitted by the seventh third clock signal sub-line CKD_7 and the fifteenth third clock signal sub-line CKD_15 shown in FIG. 46 may be combined as a timing of a signal transmitted by the seventh third clock signal sub-line CKD_7 in this example.

A timing of a sixth clock signal transmitted by the sixth clock signal terminal CLKD2 of the fourth stage shift register 100 in each first shift register group C and a timing of a sixth clock signal transmitted by the sixth clock signal terminal CLKD2 of the fourth stage shift register 100 in each second shift register group D may be the same. For example, timings of signals transmitted by the eighth third clock signal sub-line CKD_8 and the sixteenth third clock signal sub-line CKD_16 shown in FIG. 46 may be merged into a timing of a signal transmitted by the eighth third clock signal sub-line CKD_S in this example.

Compared with a working process of the scan driving circuit 1000 in an example where 2N third clock signal sub-lines CKD are adopted, the working process of the scan driving circuit 1000 in this example is basically unchanged. In this way, it is conducive to reducing the number of signal lines included in the scan driving circuit 1000 and simplifying the structure of the scan driving circuit 1000.

In addition, in a case where the sub-pixels P in the display apparatus 2000 may be caused to display a black image and increase the MPRT, the third clock signal sub-lines CKD may be combined in other manners, which is not limited in the present disclosure.

For example, as shown in FIG. 52, in a case where the shift signal transmitted by the shift signal terminal in the odd row serves as the black insertion cascade signal and the shift signal transmitted by the shift signal terminal in the even row serves as the display cascade signal, the timings of signals transmitted by the first third clock signal sub-line CKD_1, the third third clock signal sub-line CKD_3, the fifth third clock signal sub-line CKD_5 and the seventh third clock signal sub-line CKD_7 in this example may be the same, so that the first third clock signal sub-line CKD_1, the third third clock signal sub-line CKD_3, the fifth third clock signal sub-line CKD_5 and the seventh third clock signal sub-line CKD_7 may be merged into the first third clock signal sub-line CKD_1. As a result, the scan driving circuit 1000 includes only 5 third clock signal sub-lines CKD. In this way, it is conducive to further reducing the number of signal lines included in the scan driving circuit 1000 and further simplifying the structure of the scan driving circuit 1000.

Optionally, as shown in FIG. 41, in the case where the first output circuit 12 of the shift register 100 is further electrically connected to the fifth clock signal terminal CLKD1 and the first shift signal terminal CR<N>, the third clock signal line group may include 4N third clock signal sub-lines CKD. 2N third clock signal sub-lines CKD of the 4N third clock signal sub-lines CKD are electrically connected to the fifth clock signal terminals CLKD1 of all shift registers 100 in the first shift register group C, respectively, and the other 2N third clock signal sub-lines CKD of the 4N third clock signal sub-lines CKD are electrically connected to the fifth clock signal terminals CLKD1 of all shift registers 100 in the second shift register group D, respectively.

Since the second output circuit 32 is not electrically connected to the sixth clock signal terminal CLKD2, corresponding signal lines may be avoided being provided, and then, it is conducive to reducing the number of signal lines included in the scan driving circuit 1000 and simplifying the structure of the scan driving circuit 1000.

In addition, it will be noted that as shown in FIGS. 45, 48, 50 and 52, the scan driving circuit 1000 may further include: a fourth clock signal sub-line CLK electrically connected to the second reset signal terminals BTRST of all shift registers 100, and a starting signal line BSTV electrically connected to black insertion cascade signal terminals BCR of the first at least two stages of shift registers 100.

Of course, the scan driving circuit 1000 may further include a signal line electrically connected to another signal terminal (e.g., the global reset signal terminal TRST or each voltage signal terminal), and details will not be repeated here.

It will be noted that in FIGS. 45, 48, 50 and 52, C<1-8>, D<9-16>, C<17-24>, D<25-32> . . . C<1081-1088> and D<1089-1096> respectively represent a respective shift register group (i.e., the first shift register group C or the second shift register group D) and four shift registers 100 therein, and each shift register 100 includes the first scan unit 1 and the second scan unit 3.

Figure 46:
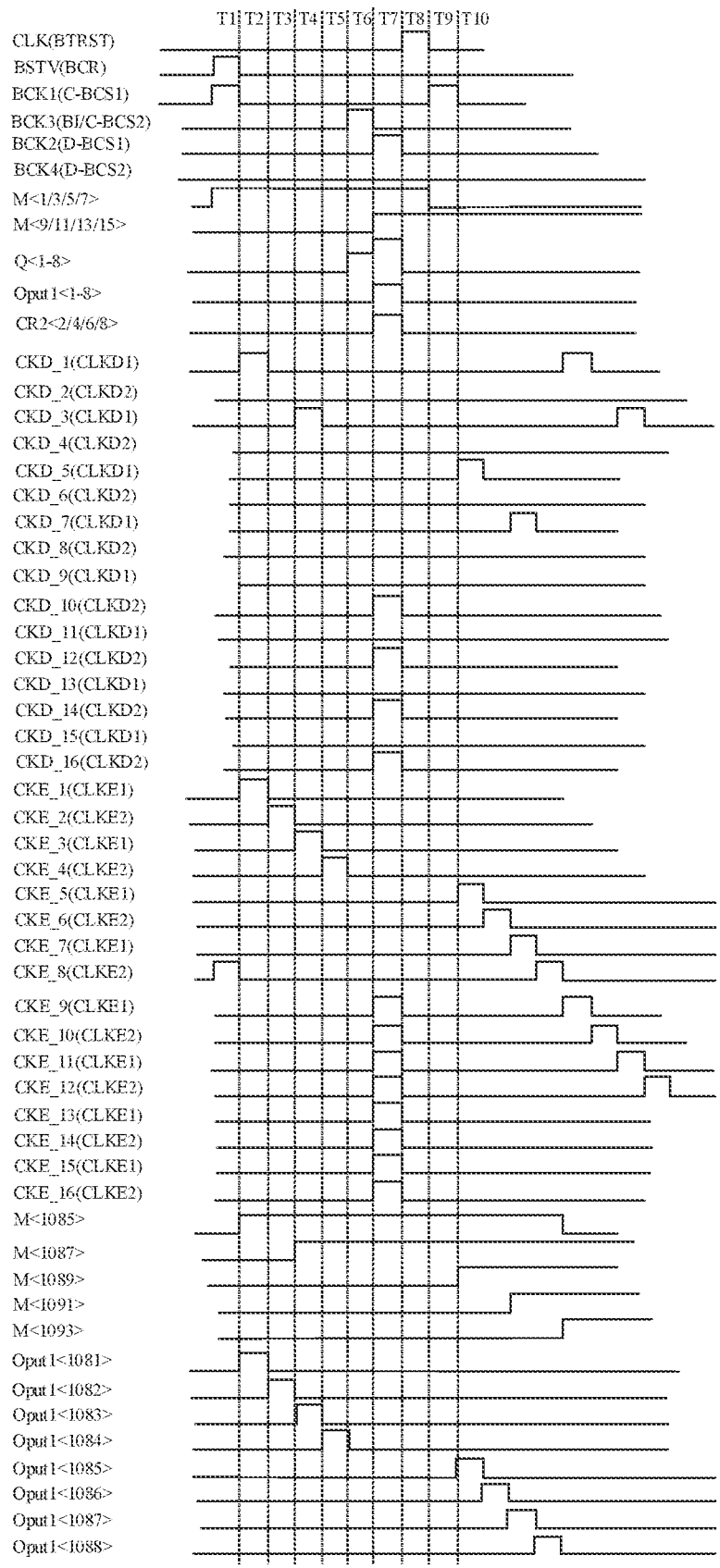
FIG. 46 is a timing control diagram corresponding to the scan driving circuit shown in FIG. 38, in accordance with some embodiments of the present disclosure.

The method of driving the scan driving circuit 1000 shown in FIG. 38 is schematically described below with reference to FIGS. 45 and 46. A scan signal terminal (e.g., a first scan signal terminal Oput1<N> or a second scan signal terminal Oput1<N+1>) is electrically connected to a row of sub-pixels P.

In a first phase T1, a starting signal transmitted by the starting signal line BSTV and the first control signal transmitted by the first control signal sub-line BCK1 are both at a high level.

In the first of the first shift register groups C, the black insertion control sub-circuit 21 of each shift register 100 is turned on, and the fifth transistor M5 in each black insertion control sub-circuit 21 may receive the starting signal and transmit the starting signal to the first black insertion node M, so as to charge the first black insertion node M. As a result, voltages of first black insertion nodes M<1/3/5/7> are at a high level.

In a second phase T2 to a fifth phase T5, 1081st to 1084th output circuits are turned on, and respectively transmit high-level clock signals to 1081st to 1084th rows of sub-pixels P in sequence, so that the 1081st to 1084th rows of sub-pixels P perform display in sequence. After data is written into the 1084th row of sub-pixels P, black insertion circuits 2 in a 136th shift register group (i.e., the first shift register group C) are turned on and charge first black insertion nodes M<1081/1083/1085/1087>, to pull up voltages of the first black insertion nodes M<1081/1083/1085/1087> in the 136th shift register group C.

In a sixth phase T6, the second control signal transmitted by the third control signal sub-line BCK3 changes to be at a high level. In the first of the first shift register groups C, the first black insertion transmission sub-circuit 23 and the second black insertion transmission sub-circuit 24 of each shift register 100 are turned on, the seventh transistor M7 in each first black insertion transmission sub-circuit 23 may transmit the high-level black insertion input signal to the first pull-up node Q<1>, and the eighth transistor M8 in each second black insertion transmission sub-circuit 24 may transmit the high-level black insertion input signal to the second pull-up node Q<2>, so that voltages of pull-up nodes Q<1-8> in the first of the first shift register groups C may be increased.

In a seventh phase T7, clock signals transmitted by the ninth first clock signal sub-line CKE_9 to the sixteenth first clock signal sub-line CKE_16 each change to be at a high level, second clock signals transmitted by the tenth third clock signal sub-line CKD_10, the twelfth third clock signal sub-line CKD_12, the fourteenth third clock signal sub-line CKD_14 and the sixteenth third clock signal sub-line CKD_16 each change to be at a high level, and the first control signal transmitted by the second control signal sub-line BCK2 changes to be at a high level.

In the first of the first shift register groups C, scan signals output by all output circuits (i.e. the first output circuits and the second output circuits) are each at a high level. In this case, the data signal is at a low level, so that a driving transistor T2 of a respective sub-pixel P is turned off. As a result, 1st to 8th rows of sub-pixels P display a black image to achieve the black insertion.

In this phase, each of the second shift signal terminals CR2<2/4/6/8> in the first of the first shift register groups C outputs a high-level second clock signal.

In the second of the first shift register groups C, the black insertion control sub-circuits 21 of all the shift registers 100 may be turned on under the control of the first control signal, respectively receive the high-level second clock signals output by the second shift signal terminals CR2<2/4/6/8> to charge the respective first black insertion nodes M<9/11/13/15>, so as to maintain each of the first black insertion nodes M<9/11/13/15> to be at a high level until a next black insertion phase.

In an eighth phase T8, a second reset signal transmitted by the fourth clock signal sub-line CLK is at a high level, and the voltages of the first black insertion nodes M<1/3/5/7> are at a high level.

In the first of the first shift register groups C, all second reset circuits 14 and all fourth reset circuits 34 are turned on under control of the second reset signal and the voltages of the first black insertion nodes M<1/3/5/7>, respectively transmit the first voltage signal to the respective pull-up nodes Q<1-8>, so as to perform the pull-down reset on the pull-up nodes Q<1-8>.

Since voltages of first black insertion nodes M<1081-1088> are at a low level, voltages of pull-up nodes Q<1081-1088> may remain at a high level.

In a ninth phase T9, the first control signal transmitted by the first control signal sub-line BCK1 is at a high level.

In the first of the first shift register groups C, the black insertion control sub-circuits 21 of all the shift registers 100 are turned on, and transmit a low-level starting signal to the respective first black insertion nodes M, so that the voltages of the first black insertion nodes M<1/3/5/7> are at a low level.

In a tenth phase T10, 1085th to 1888th output circuits are turned on, and respectively transmit high-level clock signals to 1085th to 1888th rows of sub-pixels P in sequence, so that the 1085th to 1088th rows of sub-pixels P perform display in sequence.

The first phase T1 to the tenth phase T10 may be continuously cycled, so that the combination of the display and the black insertion may be achieved. Of course, in the present solution, the 1st to 8th rows of sub-pixels P performs the black insertion while the 1081st to 1088th rows of sub-pixels P performs the display is only an embodiment; alternatively, sub-pixels P corresponding to any first shift register group C and any second shift register group D may perform the display and the black insertion.

Figure 47:
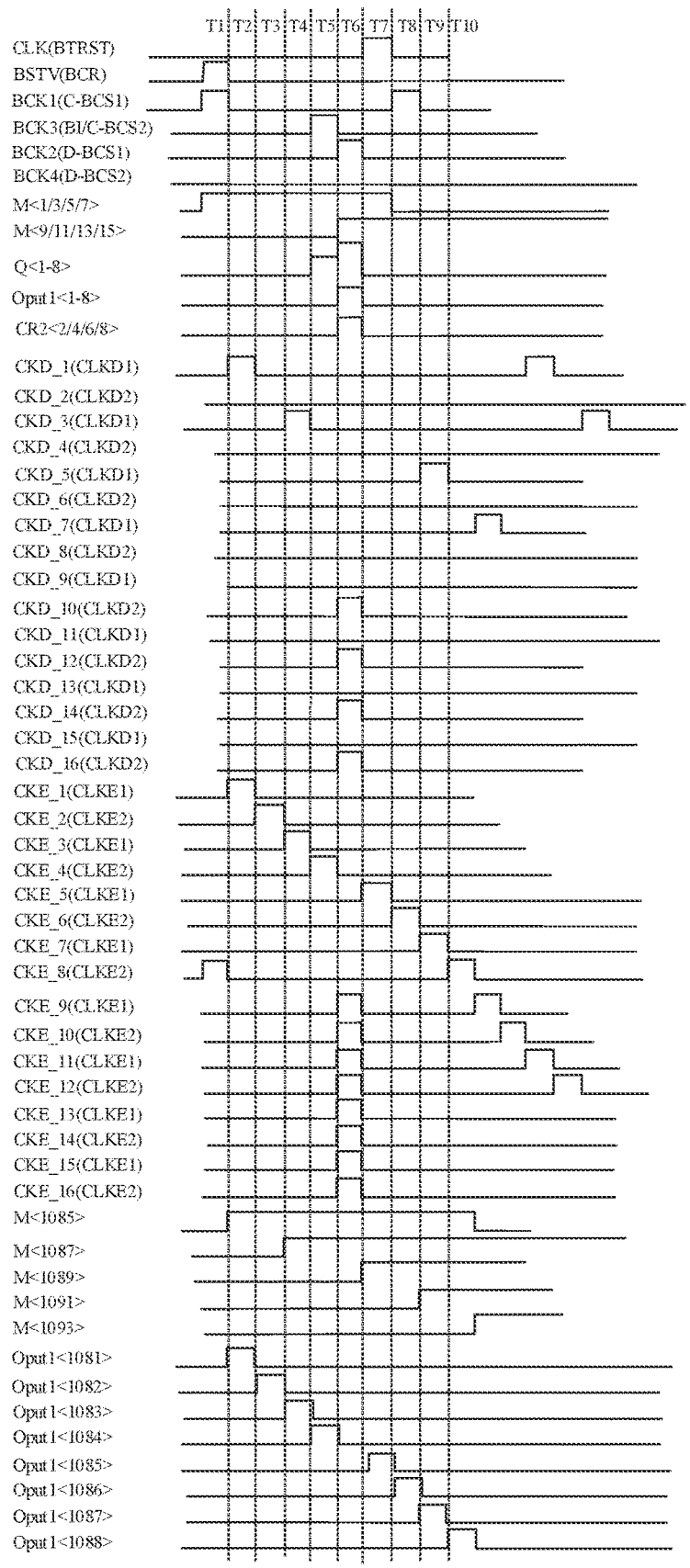
FIG. 47 is another timing control diagram corresponding to the scan driving circuit shown in FIG. 38, in accordance with some embodiments of the present disclosure.

In some examples, the sixth phase T6 and the fifth phase T5 may be performed synchronously, and the tenth phase T10 and the eighth phase T8 may also be performed synchronously. After the sixth phase T6 and the fifth phase T5 are combined, and the tenth phase T10 and the eighth phase T8 are combined, a working timing of the scan driving circuit 1000 may be as shown in FIG. 47. In this way, it is conducive to reducing the time needed to display a black image and improving the display efficiency.

The method of driving the scan driving circuit 1000 shown in FIG. 39 is schematically described below with reference to FIGS. 48 and 49. A scan signal terminal (e.g., a first scan signal terminal Oput1<N> or a second scan signal terminal Oput1<N+1>) is electrically connected to a row of sub-pixels P.

For example, in the scan driving circuit 1000 shown in FIG. 39, scan signal terminals (the first scan signal terminals Oput1<N> and the second scan signal terminals Oput1<N+1>) of first two stages of shift registers 100 may be in a floating state.

Here, considering an example in which the scan signal terminals (i.e., the first scan signal terminals and the second scan signal terminals) of the first two stages of shift registers 100 are not in a floating state, which facilitates the description of the method of driving the scan driving circuit 1000.

In a first phase T1, the starting signal transmitted by the starting signal line BSTV is at a high level.

In the first of the first shift register groups C, the black insertion control sub-circuits 21 of all the shift register 100 are turned on.

In a second phase T2, the first control signal transmitted by the first control signal sub-line BCK1 is at a high level.

In the first of the first shift register groups C, each black insertion control sub-circuit 21 may receive the starting signal and transmit the starting signal to the first black insertion node M, so as to charge the first black insertion node M. As a result, the voltages of the first black insertion nodes M<1/3/5/7> are at a high level.

In a third phase T3, the second reset signal transmitted by the fourth clock signal sub-line CLK is at a high level.

In this case, the pull-up node of each scan unit (i.e., the first scan unit and the second scan unit) of which the voltage of the first black insertion node M is at a high level may be performed the pull-down reset.

In a fourth phase T4, 25th to 28th output circuits are turned on, and respectively transmit high-level clock signals to 25th to 28th rows of sub-pixels P in sequence, so that the 25th to 28th rows of sub-pixels P perform display in sequence. After data is written into the 28th row of sub-pixels P, black insertion circuits 2 in a 4th shift register group (i.e., the second shift register group D) are turned on and charge first black insertion nodes M <25/27/29/31>.

In this phase, a voltage of each of the first black insertion nodes M<25/27/29/31> in the 4th shift register group (i.e., the second shift register group D) increases to a high level.

In a fifth phase T5, the second control signal transmitted by the third control signal sub-line BCK3 is at a high level.

In the first of the first shift register groups C, the first black insertion transmission sub-circuit 23 and the second black insertion transmission sub-circuit 24 of each shift register 100 are turned on, the seventh transistor M7 in each first black insertion transmission sub-circuit 23 may transmit the high-level black insertion input signal to the first pull-up node Q<1>, and the eighth transistor M8 in each second black insertion transmission sub-circuit 24 may transmit the high-level black insertion input signal to the second pull-up node Q<2>. Therefore, the voltages of the pull-up nodes Q<1-8> in the first of the first shift register groups C may be increased.

In a sixth phase T6, the clock signals transmitted by the first first clock signal sub-line CKE_1 to the eighth first clock signal sub-line CKE_8 change to be at a high level, the second clock signals transmitted by the second third clock signal sub-line CKD_2, the fourth third clock signal sub-line CKD_4, the sixth third clock signal sub-line CKD_6 and the eighth third clock signal sub-line CKD_8 change to be at a high level, and the first control signal transmitted by the second control signal sub-line BCK2 changes to be at a high level.

In the first of the first shift register groups C, the scan signal output by each output circuit is at a high level. In this case, the data signal is at a low level, so that the driving transistor T2 of the respective sub-pixel P is turned off. As a result, the 1st to 8th rows of sub-pixels P display a black image to achieve the black insertion.

In this phase, each of the second shift signal terminals CR2<2/4/6/8> in the first of the first shift register groups C outputs a high-level second clock signal.

In the second of the first shift register groups C, the black insertion control sub-circuits 21 of all the shift register 100 may be turned on under the control of the first control signal, and respectively receive the high-level second clock signals output by the second shift signal terminals CR2<2/4/6/8> to charge the respective first black insertion nodes M<9/11/13/15>, so as to maintain each of the first black insertion nodes M<9/11/13/15> to be at a high level until a next black insertion phase.

In this process, voltages of pull-up nodes Q<25-32> are at a high level, so that the second shift signal terminals CR2<28/30/32/34> of corresponding output circuits respectively output the second shift signal. However, since the first control signal received by a black insertion control sub-circuit 21 in a fifth shift register group (i.e., the first shift register group C<33-40>) is at a low level, it will not affect the display.

In a seventh phase T7, the second reset signal transmitted by the fourth clock signal sub-line CLK is at a high level.

Since the voltages of the first black insertion nodes M<1/3/5/7> are at the high level, in the first of the first shift register groups C, all second reset circuits 14 and all fourth reset circuits 34 are turned on under the control of the second reset signal and the voltages of the first black insertion nodes M<1/3/5/7>, and transmit the first voltage signal to the respective pull-up nodes Q<1-8>, so as to perform the pull-down reset on the pull-up nodes Q<1-8>.

Since the voltages of the first black insertion nodes M<25/27/29/31> are at a low level, voltages of the pull-up nodes Q<24-32> remains at high levels.

In an eighth phase T8, the first control signal transmitted by the first control signal sub-line BCK1 is at a high level.

In the first of the first shift register groups C, the black insertion control sub-circuit 21 of each shift register 100 is turned on, and transmits the low-level starting signal to each first black insertion node M, so that the voltages of the first black insertion nodes M<1/3/5/7> are at a low level.

In addition, 29th to 32nd output circuits are turned on, and respectively transmit high-level clock signals to 29th to 32nd rows of sub-pixels P in sequence, so that the 29th to 32nd rows of sub-pixels P perform display in sequence.

By continuously cycling in this way, the combination of the display and the black insertion may be achieved. Of course, in the present solution, the 1st to 8th rows of sub-pixels P performs the black insertion while 24th to 32nd rows of sub-pixels P performs the display is only an embodiment; alternatively, sub-pixels P corresponding to any first shift register group C and any second shift register group D may perform the display and the black insertion.

Figure 50:
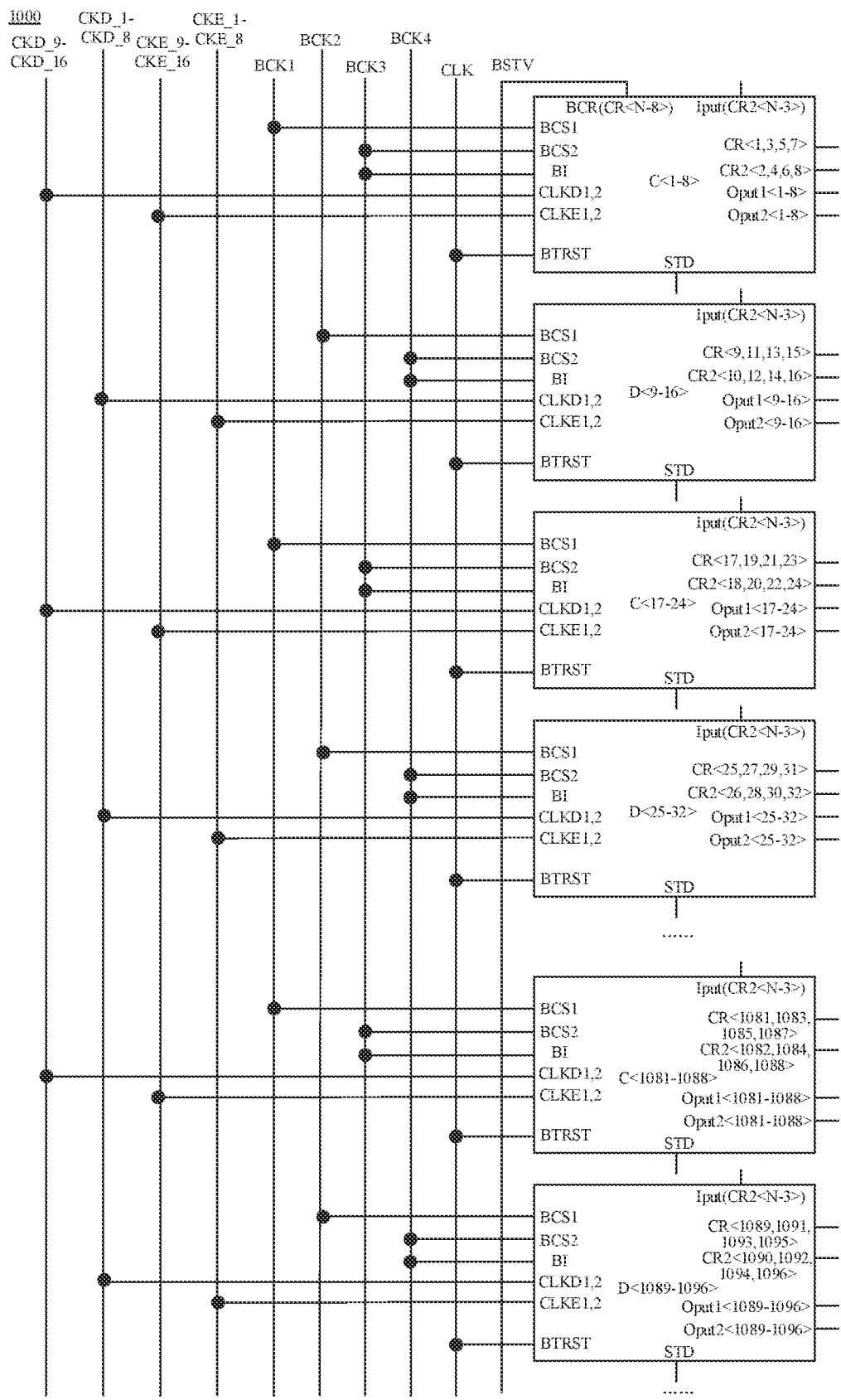
FIG. 50 is a structural diagram of yet another scan driving circuit, in accordance with some embodiments of the present disclosure.
Figure 51:
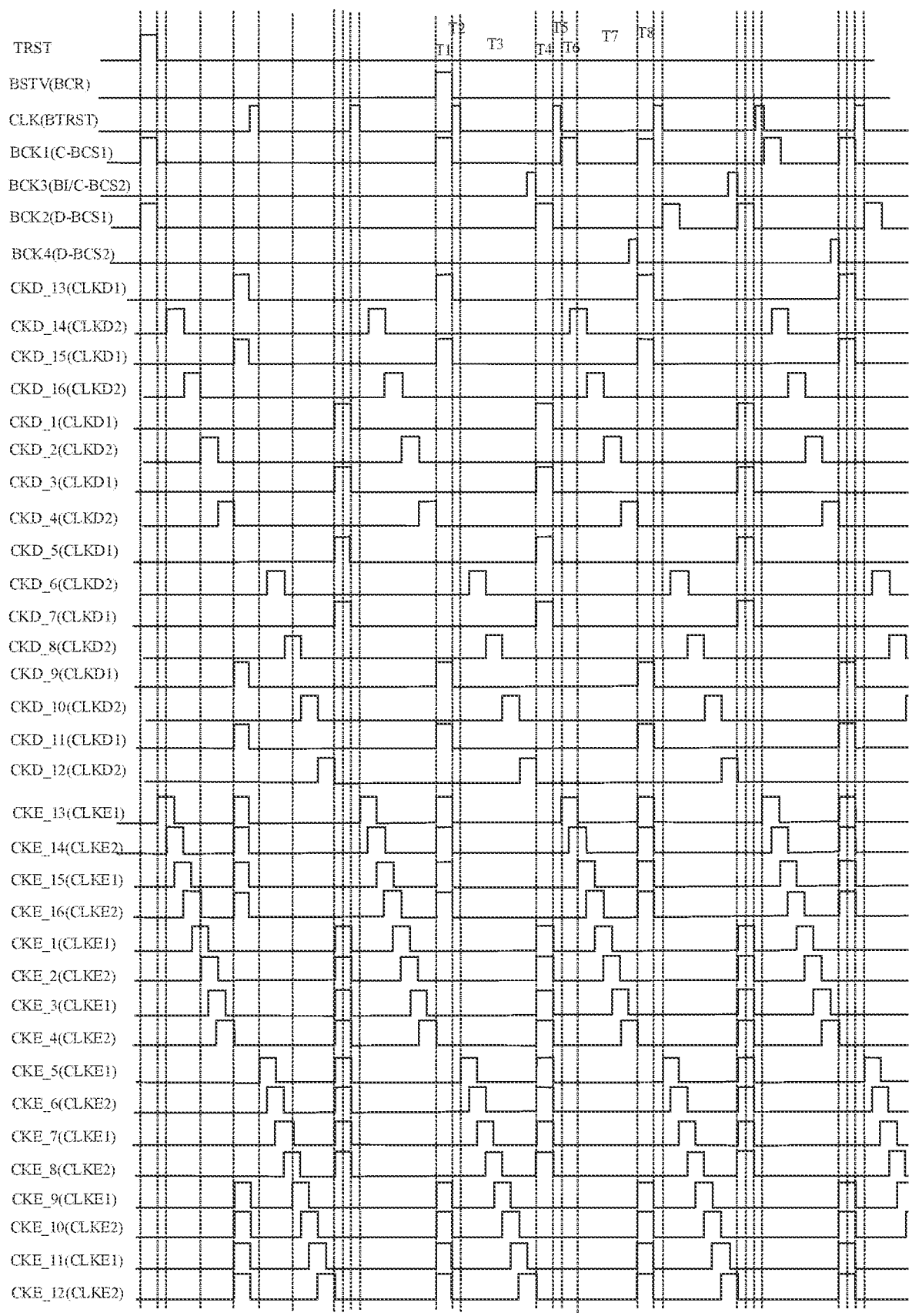
FIG. 51 is a timing control diagram corresponding to the scan driving circuit shown in FIG. 40, in accordance with some embodiments of the present disclosure.

The method of driving the scan driving circuit 1000 shown in FIG. 40 is schematically described below with reference to FIGS. 50 and 51. A scan signal terminal (e.g., a first scan signal terminal Oput1<N> or a second scan signal terminal Oput1<N+1>) is electrically connected to a row of sub-pixels P.

Figure 49:
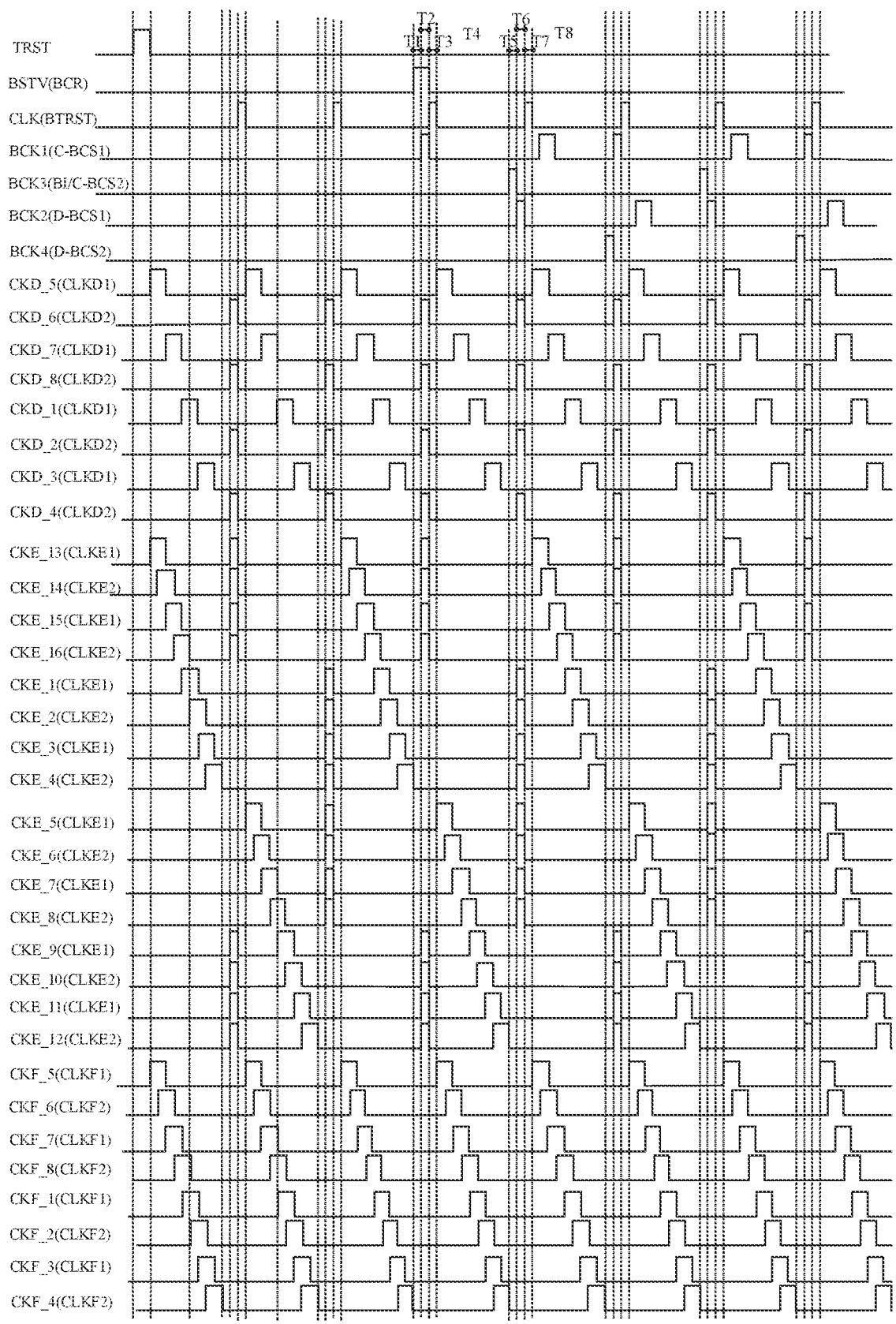
FIG. 49 is a timing control diagram corresponding to the scan driving circuit shown in FIG. 39, in accordance with some embodiments of the present disclosure.

In this example, as for the method of driving the scan driving circuit 1000, reference may be made to the driving method corresponding to FIGS. 48 and 49, and details will not be repeated here.

It will be noted that in this example, the second shift signal serves as the display input signal, and the first shift signal serves as the black insertion cascade signal. In the first phase T1 shown in FIG. 51, a black insertion output phase may be combined into the third phase T3 (an output phase of the fifth first clock signal sub-line CKE_5). Since a pulse width of the fifth first clock signal sub-line CKE_5 in this phase is two lines, and display data is not written in a former line of the pulse width, the black inserted first clock signal sub-line CKE may be used to write black insertion data, and in the second phase T2 shown in FIG. 51, the pull-up node Q in the row of which the voltage of the first black insertion node M is at a high level may be reset after the black insertion data is written. In this way, compared with a shift register without the function of black insertion, it only takes more time for a pre-charging phase of the fifth first clock signal sub-line CKE_5, which will not affect the output of the shift register at a high refresh frequency.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register configured to be applied to a display apparatus, the display apparatus including a plurality of rows of sub-pixels; the shift register being configured to be electrically connected to at least one row of sub-pixels; the shift register comprising a first scan unit and a black insertion circuit; wherein the first scan unit includes a first input circuit and a first output circuit;

the first input circuit is electrically connected to a display input signal terminal and a first pull-up node; the first input circuit is configured to, in response to a display input signal received at the display input signal terminal, transmit the display input signal to the first pull-up node; and the first output circuit is electrically connected to the first pull-up node, a first clock signal terminal and a first scan signal terminal; the first output circuit is configured to, in a case where the first input circuit transmits the display input signal to the first pull-up node, transmit a first clock signal received at the first clock signal terminal to the first scan signal terminal under control of a voltage of the first pull-up node, so as to drive the at least one row of sub-pixels to display an image; and the black insertion circuit is electrically connected to a first control signal terminal, a black insertion cascade signal terminal, a second control signal terminal, a black insertion input signal terminal, the first pull-up node and a first voltage signal terminal; the black insertion circuit is configured to transmit a black insertion input signal received at the black insertion input signal terminal to the first pull-up node under control of a first control signal transmitted by the first control signal terminal, a black insertion cascade signal transmitted by the black insertion cascade signal terminal and a second control signal transmitted by the second control signal terminal; wherein the first output circuit is further configured to, in a case where the black insertion circuit transmits the black insertion input signal to the first pull-up node, transmit the first clock signal to the first scan signal terminal under control of another voltage of the first pull-up node, so as to drive the at least one row of sub-pixels to display a black image.

2. The shift register according to claim 1, further comprising a second scan unit; wherein the shift register is configured to be electrically connected to at least two rows of sub-pixels;
the second scan unit includes a second input circuit and a second output circuit;
the second input circuit is electrically connected to the display input signal terminal and a second pull-up node; the second input circuit is configured to, in response to the display input signal, transmit the display input signal to the second pull-up node;
the second output circuit is electrically connected to the second pull-up node, a second clock signal terminal and a second scan signal terminal; the second output circuit is configured to, in a case where the second input circuit transmits the display input signal to the second pull-up node, transmit a second clock signal received at the second clock signal terminal to the second scan signal terminal under control of a voltage of the second pull-up node, so as to drive another at least one row of sub-pixels to display an image;
the black insertion circuit is further electrically connected to the second pull-up node; the black insertion circuit is further configured to transmit the black insertion input signal to the second pull-up node while the black insertion input signal is transmitted to the first pull-up node;
the second output circuit is further configured to, in a case where the black insertion circuit transmits the black insertion input signal to the second pull-up node, transmit the second clock signal to the second scan signal terminal under control of another voltage of the second pull-up node, so as to drive the another at least one row of sub-pixels to display a black image.

3. The shift register according to claim 1, wherein the black insertion circuit includes a black insertion control sub-circuit, a black insertion input sub-circuit and a first black insertion transmission sub-circuit; wherein
the black insertion control sub-circuit is electrically connected to the first control signal terminal, the black insertion cascade signal terminal, the first voltage signal terminal and a first black insertion node; the black insertion control sub-circuit is configured to transmit the black insertion cascade signal to the first black insertion node under the control of the first control signal;
the black insertion input sub-circuit is electrically connected to the first black insertion node, the black insertion input signal terminal and a second black insertion node; the black insertion input sub-circuit is configured to transmit the black insertion input signal to the second black insertion node under control of a voltage of the first black insertion node; and
the first black insertion transmission sub-circuit is electrically connected to the second control signal terminal, the second black insertion node and the first pull-up node; the first black insertion transmission sub-circuit is configured to transmit the black insertion input signal from the second black insertion node to the first pull-up node under the control of the second control signal; or
the shift register further comprises a second scan unit, the second scan unit includes a second input circuit and a second output circuit, the second input circuit is electrically connected to the display input signal terminal and a second pull-up node, and the second output circuit is electrically connected to the second pull-up node, a second clock signal terminal and a second scan signal terminal; the black insertion circuit includes a black insertion control sub-circuit, a black insertion input sub-circuit and a first black insertion transmission sub-circuit, and a second black insertion transmission sub-circuit; wherein
the black insertion control sub-circuit is electrically connected to the first control signal terminal, the black insertion cascade signal terminal, the first voltage signal terminal and a first black insertion node; the black insertion control sub-circuit is configured to transmit the black insertion cascade signal to the first black insertion node under the control of the first control signal;
the black insertion input sub-circuit is electrically connected to the first black insertion node, the black insertion input signal terminal and a second black insertion node; the black insertion input sub-circuit is configured to transmit the black insertion input signal to the second black insertion node under control of a voltage of the first black insertion node;
the first black insertion transmission sub-circuit is electrically connected to the second control signal terminal, the second black insertion node and the first pull-up node; the first black insertion transmission sub-circuit is configured to transmit the black insertion input signal from the second black insertion node to the first pull-up node under the control of the second control signal; and
the second black insertion transmission sub-circuit is electrically connected to the second control signal terminal, the second black insertion node and the second pull-up node; the second black insertion transmission sub-circuit is configured to transmit the black insertion input signal from the second black insertion node to the second pull-up node under the control of the second control signal.

4. The shift register according to claim 3, further comprising a third anti-leakage circuit; wherein
the third anti-leakage circuit is electrically connected to the first black insertion node, a fifth voltage signal terminal and a third anti-leakage node; the third anti-leakage circuit is configured to transmit a fifth voltage signal received at the fifth voltage signal terminal to the third anti-leakage node under the control of the voltage of the first black insertion node; and
the black insertion control sub-circuit is further electrically connected to the third anti-leakage node.

5. The shift register according to claim 1, wherein the first output circuit is further electrically connected to a third clock signal terminal and a first sensing signal terminal; and the first output circuit is further configured to:
in the case where the first input circuit transmits the display input signal to the first pull-up node, transmit a third clock signal received at the third clock signal terminal to the first sensing signal terminal under the control of the voltage of the first pull-up node, so as to drive the at least one row of sub-pixels to be reset; or
in the case where the black insertion circuit transmits the black insertion input signal to the first pull-up node, transmit the third clock signal to the first sensing signal terminal under the control of the another voltage of the first pull-up node, so as to drive the at least one row of sub-pixels to display a black image; or the shift register further comprises a second scan unit, and the shift register is configured to be electrically connected to at least two rows of sub-pixels; wherein the second scan unit includes a second input circuit and a second output circuit;

the second input circuit is electrically connected to the display input signal terminal and a second pull-up node, and the second output circuit is electrically connected to the second pull-up node, a second clock signal terminal and a second scan signal terminal;

the first output circuit is further electrically connected to a third clock signal terminal and a first sensing signal terminal; and the first output circuit is further configured to:

in the case where the first input circuit transmits the display input signal to the first pull-up node, transmit a third clock signal received at the third clock signal terminal to the first sensing signal terminal under the control of the voltage of the first pull-up node, so as to drive the at least one row of sub-pixels to be reset; or in the case where the black insertion circuit transmits the black insertion input signal to the first pull-up node, transmit the third clock signal to the first sensing signal terminal under the control of the another voltage of the first pull-up node, so as to drive the at least one row of sub-pixels to display a black image; and the second output circuit is further electrically connected to a fourth clock signal terminal and a second sensing signal terminal; and the second output circuit is configured to:

in a case where the second input circuit transmits the display input signal to the second pull-up node, transmit a fourth clock signal received at the fourth clock signal terminal to the second sensing signal terminal under the control of the voltage of the second pull-up node, so as to drive another at least one row of sub-pixels to be reset; or in a case where the black insertion circuit transmits the black insertion input signal to the second pull-up node, transmit the fourth clock signal to the second sensing signal terminal under the control of the voltage of the second pull-up node, so as to drive the another at least one row of sub-pixels to display a black image.

6. The shift register according to claim 1, wherein the first output circuit is further electrically connected to a fifth clock signal terminal and a first shift signal terminal; and the first output circuit is further configured to transmit a fifth clock signal received at the fifth clock signal terminal to the first shift signal terminal under the control of the voltage of the first pull-up node; or wherein the first output circuit is further electrically connected to a fifth clock signal terminal and a first shift signal terminal; the first output circuit is further configured to transmit a fifth clock signal received at the fifth clock signal terminal to the first shift signal terminal under the control of the voltage of the first pull-up node; and the shift register further comprises a second scan unit, wherein the second scan unit includes a second input circuit and a second output circuit, the second input circuit is electrically connected to the display input signal terminal and a second pull-up node, the second output circuit is electrically connected to the second pull-up node, a second clock signal terminal and a second scan signal terminal, and further electrically connected to a sixth clock signal terminal and a second shift signal terminal; and the second output circuit is configured to transmit a sixth clock signal received at the sixth clock signal terminal to the second shift signal terminal under control of a voltage of the second pull-up node.

7. The shift register according to claim 1, wherein the first scan unit further includes a first reset circuit and a second reset circuit; wherein the first reset circuit is electrically connected to a first reset signal terminal, the first pull-up node and the first voltage signal terminal; the first reset circuit is configured to transmit a first voltage signal received at the first voltage signal terminal to the first pull-up node under control of a first reset signal transmitted by the first reset signal terminal;

the black insertion circuit includes a black insertion control sub-circuit, and the black insertion control sub-circuit is electrically connected to the first control signal terminal, the black insertion cascade signal terminal, the first voltage signal terminal and a first black insertion node; and the second reset circuit is electrically connected to a second reset signal terminal, the first black insertion node, the first pull-up node and the first voltage signal terminal; the second reset circuit is configured to transmit the first voltage signal to the first pull-up node under control of a voltage of the first black insertion node and a second reset signal transmitted by the second reset signal terminal; or the shift register further comprises a second scan unit, the second scan unit includes a second input circuit and a second output circuit; the second input circuit is electrically connected to the display input signal terminal and a second pull-up node, and the second output circuit is electrically connected to the second pull-up node, a second clock signal terminal and a second scan signal terminal; wherein the first scan unit further includes a first reset circuit and a second reset circuit; the first reset circuit is electrically connected to a first reset signal terminal, the first pull-up node and the first voltage signal terminal; the first reset circuit is configured to transmit a first voltage signal received at the first voltage signal terminal to the first pull-up node under control of a first reset signal transmitted by the first reset signal terminal; the black insertion circuit includes a black insertion control sub-circuit, and the black insertion control sub-circuit is electrically connected to the first control signal terminal, the black insertion cascade signal terminal, the first voltage signal terminal and a first black insertion node; the second reset circuit is electrically connected to a second reset signal terminal, the first black insertion node, the first pull-up node and the first voltage signal terminal; the second reset circuit is configured to transmit the first voltage signal to the first pull-up node under control of a voltage of the first black insertion node and a second reset signal transmitted by the second reset signal terminal; and the second scan unit further includes a third reset circuit and a fourth reset circuit, wherein the third reset circuit is electrically connected to the first reset signal terminal, the second pull-up node and the first voltage signal terminal; the third reset circuit is configured to transmit the first voltage signal to the second pull-up node under the control of the first reset signal; and the fourth reset circuit is electrically connected to the second reset signal terminal, the first black insertion node, the second pull-up node and the first voltage signal terminal; the fourth reset circuit is configured to transmit the first voltage signal to the second pull-up node under control of the voltage of the first black insertion node and the second reset signal.

8. The shift register according to claim 1, wherein
the first scan unit further includes: a first control circuit electrically connected to the first pull-up node, a first pull-down node, the first voltage signal terminal and a second voltage signal terminal; wherein the first control circuit is configured to: transmit the second voltage signal to the first pull-down node in response to a second voltage signal received at the second voltage signal terminal; and transmit a first voltage signal received at the first voltage signal terminal to the first pull-down node under the control of the voltage of the first pull-up node; or
the shift register further comprises a second scan unit, wherein the second scan unit includes a second input circuit and a second output circuit, the second input circuit is electrically connected to the display input signal terminal and a second pull-up node, and the second output circuit is electrically connected to the second pull-up node, a second clock signal terminal and a second scan signal terminal; wherein
the first scan unit further includes: a first control circuit electrically connected to the first pull-up node, a first pull-down node, the first voltage signal terminal and a second voltage signal terminal; wherein the first control circuit is configured to: transmit the second voltage signal to the first pull-down node in response to a second voltage signal received at the second voltage signal terminal; and transmit a first voltage signal received at the first voltage signal terminal to the first pull-down node under the control of the voltage of the first pull-up node; and
the second scan unit further includes: a second control circuit electrically connected to the second pull-up node, a second pull-down node, the first voltage signal terminal and a third voltage signal terminal; wherein the second control circuit is configured to: in response to a third voltage signal received at the third voltage signal terminal, transmit the third voltage signal to the second pull-down node; and under the control of the voltage of the second pull-up node, transmit the first voltage signal to the second pull-down node.

9. The shift register according to claim 8, wherein
the first scan unit further includes a fifth reset circuit, a sixth reset circuit and a seventh reset circuit;
the fifth reset circuit is electrically connected to the first pull-down node, the first pull-up node and the first voltage signal terminal; the fifth reset circuit is configured to transmit the first voltage signal to the first pull-up node under control of a voltage of the first pull-down node;
the sixth reset circuit is electrically connected to the first pull-down node, the first scan signal terminal and a fourth voltage signal terminal; the sixth reset circuit is configured to transmit a fourth voltage signal received at the fourth voltage signal terminal to the first scan signal terminal under the control of the voltage of the first pull-down node;
the first output circuit is further electrically connected to a third clock signal terminal and a first sensing signal terminal,
the sixth reset circuit is further electrically connected to the first sensing signal terminal; the sixth reset circuit is further configured to transmit the fourth voltage signal to the first sensing signal terminal under the control of the voltage of the first pull-down node;
the first output circuit is further electrically connected to a fifth clock signal terminal and a first shift signal terminal,
the sixth reset circuit is further electrically connected to the first shift signal terminal and the first voltage signal terminal; the sixth reset circuit is further configured to transmit the first voltage signal to the first shift signal terminal under the control of the voltage of the first pull-down node;
the black insertion circuit includes a black insertion control sub-circuit,
the seventh reset circuit is electrically connected to a first black insertion node, the second control signal terminal, the first pull-down node and the first voltage signal terminal; the seventh reset circuit is configured to transmit the first voltage signal to the first pull-down node under control of a voltage of the first black insertion node and the second control signal;
in a case where the shift register further comprises a second scan unit, the second scan unit further includes an eighth reset circuit, a ninth reset circuit and a tenth reset circuit;
the eighth reset circuit is electrically connected to the second pull-down node, the second pull-up node and the first voltage signal terminal; the eighth reset circuit is configured to transmit the first voltage signal to the second pull-up node under control of a voltage of the second pull-down node;
the ninth reset circuit is electrically connected to the second pull-down node, the second scan signal terminal and the fourth voltage signal terminal; the ninth reset circuit is configured to transmit the fourth voltage signal to the second scan signal terminal under the control of the voltage of the second pull-down node;
the second output circuit is further electrically connected to a fourth clock signal terminal and a second sensing signal terminal,
the ninth reset circuit is further electrically connected to the second sensing signal terminal; the ninth reset circuit is further configured to transmit the fourth voltage signal to the second sensing signal terminal under the control of the voltage of the second pull-down node;
the second output circuit is further electrically connected to a sixth clock signal terminal and a second shift signal terminal,
the ninth reset circuit is further electrically connected to the second shift signal terminal and the first voltage signal terminal; the ninth reset circuit is further configured to transmit the first voltage signal to the second shift signal terminal under the control of the voltage of the second pull-down node; and
the tenth reset circuit is electrically connected to the first black insertion node, the second control signal terminal, the second pull-down node and the first voltage signal terminal; the tenth reset circuit is configured to transmit the first voltage signal to the second pull-down node under the control of the voltage of the first black insertion node and the second control signal.

10. The shift register according to claim 9, wherein
the fifth reset circuit is further electrically connected to the second pull-down node; the fifth reset circuit is further configured to transmit the first voltage signal to the first pull-up node under the control of the voltage of the second pull-down node;
the sixth reset circuit is further electrically connected to the second pull-down node; the sixth reset circuit is further configured to, under the control of the voltage of the second pull-down node, transmit the fourth voltage signal to the first scan signal terminal, transmit the fourth voltage signal to the first sensing signal terminal, and transmit the first voltage signal to the first shift signal terminal;
the eighth reset circuit is further electrically connected to the first pull-down node; the eighth reset circuit is further configured to transmit the first voltage signal to the second pull-up node under the control of the voltage of the first pull-down node; and
the ninth reset circuit is further electrically connected to the first pull-down node; the ninth reset circuit is further configured to, under the control of the voltage of the first pull-down node, transmit the fourth voltage signal to the second scan signal terminal, transmit the fourth voltage signal to the second sensing signal terminal, and transmit the first voltage signal to the second shift signal terminal.

11. The shift register according to claim 8, further comprising a blanking circuit, wherein
the blanking circuit is electrically connected to a third control signal terminal, the display input signal terminal, a seventh clock signal terminal, the first pull-up node and the first voltage signal terminal; and
the blanking circuit is configured to transmit the seventh clock signal to the first pull-up node under control of a third control signal transmitted by the third control signal terminal, the display input signal and a seventh clock signal transmitted by the seventh clock signal terminal; or
the shift register further comprising the second scan unit, the shift register further comprising a blanking circuit, wherein
the blanking circuit is electrically connected to a third control signal terminal, the display input signal terminal, a seventh clock signal terminal, the first pull-up node and the first voltage signal terminal;
the blanking circuit is configured to transmit the seventh clock signal to the first pull-up node under control of a third control signal transmitted by the third control signal terminal, the display input signal and a seventh clock signal transmitted by the seventh clock signal terminal; and
the blanking circuit is further electrically connected to the second pull-up node; the blanking circuit is further configured to transmit the seventh clock signal to the second pull-up node.

12. The shift register according to claim 11, wherein the blanking circuit includes a selection control sub-circuit, a blanking input sub-circuit, a first blanking transmission sub-circuit and a second blanking transmission sub-circuit; wherein the selection control sub-circuit is electrically connected to the third control signal terminal, the display input signal terminal, a first blanking node and the first voltage signal terminal; the selection control sub-circuit is configured to transmit the display input signal to the first blanking node under the control of the third control signal;
the blanking input sub-circuit is electrically connected to the first blanking node, the seventh clock signal terminal and a second blanking node; the blanking input sub-circuit is configured to transmit the seventh clock signal to the second blanking node under control of a voltage of the first blanking node;
the first blanking transmission sub-circuit is electrically connected to the seventh clock signal terminal, the second blanking node and the first pull-up node; the first blanking transmission sub-circuit is configured to transmit the seventh clock signal from the second blanking node to the first pull-up node under the control of the seventh clock signal; and
the second blanking transmission sub-circuit is electrically connected to the seventh clock signal terminal, the second blanking node and the second pull-up node; the second blanking transmission sub-circuit is configured to transmit the seventh clock signal from the second blanking node to the second pull-up node under the control of the seventh clock signal; or
wherein the blanking circuit includes a selection control sub-circuit, a blanking input sub-circuit, a first blanking transmission sub-circuit and a second blanking transmission sub-circuit; wherein
the selection control sub-circuit is electrically connected to the third control signal terminal, the display input signal terminal, a first blanking node and the first voltage signal terminal; the selection control sub-circuit is configured to transmit the display input signal to the first blanking node under the control of the third control signal;
the blanking input sub-circuit is electrically connected to the first blanking node, the seventh clock signal terminal and a second blanking node; the blanking input sub-circuit is configured to transmit the seventh clock signal to the second blanking node under control of a voltage of the first blanking node;
the first blanking transmission sub-circuit is electrically connected to the seventh clock signal terminal, the second blanking node and the first pull-up node; the first blanking transmission sub-circuit is configured to transmit the seventh clock signal from the second blanking node to the first pull-up node under the control of the seventh clock signal; and
the second blanking transmission sub-circuit is electrically connected to the seventh clock signal terminal, the second blanking node and the second pull-up node; the second blanking transmission sub-circuit is configured to transmit the seventh clock signal from the second blanking node to the second pull-up node under the control of the seventh clock signal; and
the shift register further comprises a first anti-leakage circuit; wherein
the first anti-leakage circuit is electrically connected to the first blanking node, a fifth voltage signal terminal and a first anti-leakage node; the first anti-leakage circuit is configured to transmit a fifth voltage signal received at the fifth voltage signal terminal to the first anti-leakage node under the control of the voltage of the first blanking node; and the selection control sub-circuit is further electrically connected to the first anti-leakage node.

13. The shift register according to claim 11, wherein the first scan unit further includes an eleventh reset circuit, a twelfth reset circuit and a thirteenth reset circuit; wherein
the eleventh reset circuit is electrically connected to a global reset signal terminal, the first pull-up node and the first voltage signal terminal; the eleventh reset circuit is configured to transmit the first voltage signal to the first pull-up node under control of a global reset signal transmitted by the global reset signal terminal;
the twelfth reset circuit is electrically connected to the display input signal terminal, the first pull-down node and the first voltage signal terminal; the twelfth reset circuit is configured to transmit the first voltage signal to the first pull-down node under the control of the display input signal; and
the blanking circuit includes a selection control sub-circuit, the selection control sub-circuit is electrically connected to the third control signal terminal, the display input signal terminal, a first blanking node and the first voltage signal terminal, the thirteenth reset circuit is electrically connected to the first blanking node, the seventh clock signal terminal, the first pull-down node and the first voltage signal terminal; the thirteenth reset circuit is configured to transmit the first voltage signal to the first pull-down node under control of a voltage of the first blanking node and the seventh clock signal;
the second scan unit further includes a fourteenth reset circuit, a fifteenth reset circuit and a sixteenth reset circuit; wherein
the fourteenth reset circuit is electrically connected to the global reset signal terminal, the second pull-up node and the first voltage signal terminal; the fourteenth reset circuit is configured to transmit the first voltage signal to the second pull-up node under the control of the global reset signal;
the fifteenth reset circuit is electrically connected to the display input signal terminal, the second pull-down node and the first voltage signal terminal; the fifteenth reset circuit is configured to transmit the first voltage signal to the second pull-down node under the control of the display input signal; and
the sixteenth reset circuit is electrically connected to the first blanking node, the seventh clock signal terminal, the second pull-down node and the first voltage signal terminal; the sixteenth reset circuit is configured to transmit the first voltage signal to the second pull-down node under the control of the voltage of the first blanking node and the seventh clock signal.

14. The shift register according to claim 1, further comprising a second anti-leakage circuit; wherein
the second anti-leakage circuit is electrically connected to the first pull-up node, a fifth voltage signal terminal and a second anti-leakage node; the second anti-leakage circuit is configured to transmit a fifth voltage signal received at the fifth voltage signal terminal to the second anti-leakage node under the control of the voltage of the first pull-up node; and
the first input circuit is further electrically connected to the second anti-leakage node.

15. A scan driving circuit, comprising a plurality stages of shift registers each according to claim 1 that are cascaded.

16. The scan driving circuit according to claim 15, wherein the plurality stages of shift registers include a plurality of first shift register groups and a plurality of second shift register groups, and the first shift register groups and the second shift register groups are alternately arranged; the shift register includes the first scan unit and a second scan unit, a first shift register group includes 2N stages of shift registers, and a second shift register group includes 2N stages of shift registers; N is a positive integer; and
the scan driving circuit further comprises:
a first control signal line group including a first control signal sub-line and a second control signal sub-line; wherein the first control signal sub-line is electrically connected to first control signal terminals of all the shift registers in the first shift register group, and the second control signal sub-line is electrically connected to first control signal terminals of all the shift registers in the second shift register group; and
a first clock signal line group including 8N first clock signal sub-lines; wherein the 8N first sub-clock signal lines are electrically connected to first clock signal terminals and second clock signal terminals of all the shift registers in the first shift register group and first clock signal terminals and second clock signal terminals of all the shift registers in the second shift register group, respectively; or
wherein the plurality of shift registers include a plurality of first shift register groups and a plurality of second shift register groups, and the first shift register groups and the second shift register groups are alternately arranged; the shift register includes the first scan unit and a second scan unit, a first shift register group includes 2N stages of shift registers, and a second shift register group includes 2N stages of shift registers; N is a positive integer;
the scan driving circuit further comprises:
a first control signal line group including a first control signal sub-line and a second control signal sub-line; wherein the first control signal sub-line is electrically connected to first control signal terminals of all the shift registers in the first shift register group, and the second control signal sub-line is electrically connected to first control signal terminals of all the shift registers in the second shift register group; and
a first clock signal line group including 8N first clock signal sub-lines; wherein the 8N first sub-clock signal lines are electrically connected to first clock signal terminals and second clock signal terminals of all the shift registers in the first shift register group and first clock signal terminals and second clock signal terminals of all the shift registers in the second shift register group, respectively; and
the second scan unit includes a second output circuit, the second output circuit is electrically connected to the second pull-up node, a second clock signal terminal and a second scan signal terminal; the first output circuit of the shift register is further electrically connected to a third clock signal terminal and a first sensing signal terminal, and the second output circuit is further electrically connected to a fourth clock signal terminal and a second sensing signal terminal, the scan driving circuit further comprises a second clock signal line group; wherein
the second clock signal line group includes 4N second clock signal sub-lines; the 4N second clock signal sub-lines are electrically connected to third clock signal terminals and fourth clock signal terminals of all the shift registers in the first shift register group, respectively, and are electrically connected to third clock signal terminals and fourth clock signal terminals of all the shift registers in the second shift register group, respectively; or the second clock signal line group includes 8N second clock signal sub-lines; the 8N second clock signal sub-lines are electrically connected to the third clock signal terminals and the fourth clock signal terminals of all the shift registers in the first shift register group and the third clock signal terminals and the fourth clock signal terminals of all the shift registers in the second shift register group, respectively; or wherein the plurality of stages of shift registers include a plurality of first shift register groups and a plurality of second shift register groups, and the first shift register groups and the second shift register groups are alternately arranged; the shift register includes the first scan unit and a second scan unit, a first shift register group includes 2N stages of shift registers, and a second shift register group includes 2N stages of shift registers; N is a positive integer;

the scan driving circuit further comprises:

a first control signal line group including a first control signal sub-line and a second control signal sub-line; wherein the first control signal sub-line is electrically connected to first control signal terminals of all the shift registers in the first shift register group, and the second control signal sub-line is electrically connected to first control signal terminals of all the shift registers in the second shift register group; and a first clock signal line group including 8N first clock signal sub-lines; wherein the 8N first sub-clock signal lines are electrically connected to first clock signal terminals and second clock signal terminals of all the shift registers in the first shift register group and first clock signal terminals and second clock signal terminals of all the shift registers in the second shift register group, respectively; and the second scan unit includes a second output circuit, the second output circuit is electrically connected to the second pull-up node, a second clock signal terminal and a second scan signal terminal; the first output circuit of the shift register is further electrically connected to a fifth clock signal terminal and a first shift signal terminal, and the second output circuit is further electrically connected to a sixth clock signal terminal and a second shift signal terminal, the scan driving circuit further comprises a third clock signal line group; wherein the third clock signal line group includes 4N third clock signal sub-lines, wherein the 4N third clock signal sub-lines are electrically connected to fifth clock signal terminals and sixth clock signal terminals of all the shift registers in the first shift register group, respectively, and are electrically connected to fifth clock signal terminals and sixth clock signal terminals of all the shift registers in the second shift register group, respectively; or 2N third clock signal sub-lines of the 4N third clock signal sub-lines are electrically connected to the fifth clock signal terminals of all shift registers in the first shift register group, respectively, and another 2N third clock signal sub-lines of the 4N third clock signal sub-lines are electrically connected to the fifth clock signal terminals of all shift registers in the second shift register group, respectively; or the third clock signal line group includes 8N third clock signal sub-lines, wherein the 8N third clock signal sub-lines are electrically connected to the fifth clock signal terminals and the sixth clock signal terminals of all shift registers in the first shift register group and the fifth clock signal terminals and the sixth clock signal terminals of all shift registers in the second shift register group, respectively.

17. The scan driving circuit according to claim 16, further comprising a second control signal line group; wherein the second control signal line group includes a third control signal sub-line and a fourth control signal sub-line; and the third sub-control signal line is electrically connected to second control signal terminals of all shift registers in the first shift register group, and the fourth sub-control signal line is electrically connected to second control signal terminals of all shift registers in the second shift register group; or the second control signal line group includes a third control signal sub-line and a fourth control signal sub-line; the third sub-control signal line is electrically connected to second control signal terminals of all shift registers in the first shift register group, and the fourth sub-control signal line is electrically connected to second control signal terminals of all shift registers in the second shift register group; and the third control signal sub-line is further electrically connected to black insertion input signal terminals of all the shift registers in the first shift register group, and the fourth control signal sub-line is further electrically connected to black insertion input signal terminals of all the shift registers in the second shift register group.

18. The scan driving circuit according to claim 16, wherein in the plurality stages of shift registers, except for first at least one stage of shift register, a display input signal terminal of each of remaining shift registers is electrically connected to a first shift signal terminal of a certain stage, before a current stage, of shift register; and except for first at least two stages of shift registers, a black insertion cascade signal terminal of each of remaining shift registers is electrically connected to a second shift signal terminal of a certain stage, before the current stage, of shift register; or the shift register further includes a second anti-leakage circuit, except for the first at least two stages of shift registers, a black insertion cascade signal terminal of each of the remaining shift registers is electrically connected to a second anti-leakage node of a certain stage, before the current stage, of shift register; or in the plurality stages of shift registers, except for first at least one stage of shift register, a display input signal terminal of each of remaining shift registers is electrically connected to a second shift signal terminal of a certain stage, before a current stage, of shift register; and except for first at least two stages of shift registers, a black insertion cascade signal terminal of each of remaining shift registers is electrically connected to a first shift signal terminal of a certain stage, before a current stage, of shift register.

19. The scan driving circuit according to claim 16, wherein in the first shift register group, at least two stages of shift registers share a single black insertion circuit; and in the second shift register group, at least two stages of shift registers share a single black insertion circuit.

20. A display apparatus, comprising:

a plurality of rows of sub-pixels; and the scan driving circuit according to claim 15;

wherein a stage of shift register in the scan driving circuit is electrically connected to at least one row of sub-pixels.

* * * * *